United States Patent

Nomura et al.

[11] Patent Number: 6,036,377
[45] Date of Patent: Mar. 14, 2000

[54] CAMERA WITH LENS BARRIER APPARATUS

[75] Inventors: Hiroshi Nomura; Yasushi Tabata; Norio Numako; Yoshinari Tanimura; Takuma Sato; Masaaki Kishimoto, all of Tokyo, Japan

[73] Assignee: Asahi Kogaku Kogyo Kabushiki Kaisha, Tokyo, Japan

[21] Appl. No.: 09/119,455

[22] Filed: Jul. 21, 1998

Related U.S. Application Data

[62] Division of application No. 08/775,239, Dec. 30, 1996, Pat. No. 5,842,057.

[30] Foreign Application Priority Data

| Jan. 26, 1996 | [JP] | Japan | 8-012317 |
| Feb. 20, 1996 | [JP] | Japan | 8-032522 |
| Feb. 20, 1996 | [JP] | Japan | 8-032523 |
| Feb. 21, 1996 | [JP] | Japan | 8-034126 |
| Feb. 21, 1996 | [JP] | Japan | 8-058335 |
| Feb. 21, 1996 | [JP] | Japan | 8-058350 |
| Feb. 22, 1996 | [JP] | Japan | 8-034822 |

[51] Int. Cl.⁷ .................................................. G03B 17/00
[52] U.S. Cl. .......................................................... 396/448
[58] Field of Search ............................................. 396/448

[56] References Cited

U.S. PATENT DOCUMENTS

| 4,410,253 | 10/1983 | Tsuboi | 396/448 |
| 4,457,604 | 7/1984 | Tsuboi | 396/205 |
| 4,696,559 | 9/1987 | Kondo | 396/110 |
| 4,752,796 | 6/1988 | Tsukahara et al. | 396/349 |
| 4,864,338 | 9/1989 | Wakabayashi | 396/349 |
| 4,868,590 | 9/1989 | Yokota | 396/75 |
| 4,876,563 | 10/1989 | Ishida et al. | 396/448 |
| 4,989,027 | 1/1991 | Ishii et al. | 396/448 |
| 5,157,429 | 10/1992 | Haraguchi et al. | 396/62 |

(List continued on next page.)

FOREIGN PATENT DOCUMENTS

| 0609910 | 8/1994 | European Pat. Off. . |
| 1-287640 | 11/1989 | Japan . |
| 3-71332 | 7/1991 | Japan . |
| 6303496 | 10/1994 | Japan . |
| 2030714 | 4/1980 | United Kingdom . |
| 2042748 | 9/1980 | United Kingdom . |
| 2202955 | 10/1988 | United Kingdom . |
| 2230354 | 10/1990 | United Kingdom . |
| 2224562 | 12/1991 | United Kingdom . |
| 2244562 | 12/1991 | United Kingdom . |

OTHER PUBLICATIONS

WPI Accession No. 95–017940/03.
Patent Abstracts of Japan, vol. 14, No. 64 (P–1002), dated Feb. 6, 1998.

*Primary Examiner*—W. B. Perkey
*Attorney, Agent, or Firm*—Greenblum & Bernstein, P.L.C.

[57] ABSTRACT

A camera with lens barrier apparatus in which the lens barrier apparatus is driven by a motor that is also used to drive another mechanical element in the camera. The motor is switched between the lens barrier apparatus and the mechanical element by the movement of a lens barrel. In this arrangement, the driving of the lens barrier apparatus and the mechanical element are controlled in accordance with the output of a single sensor, for example an encoder.

The driving of the lens barrier apparatus is controlled such that the barrier will not close unless the lens barrel is at the housed position and such that if the lens barrier does not open, the lens barrel will not move. The driving is further controlled such that if the lens barrier apparatus does not move to its intended state, the drive is reversed prior to again attempting to drive to the intended state.

The lens barrier apparatus is mechanically arranged such that barrier blades are nonresiliently driven during a portion of the closing or opening operation and are resiliently driven during the remainder of the closing or opening operation.

1 Claim, 92 Drawing Sheets

U.S. PATENT DOCUMENTS

| | | | |
|---|---|---|---|
| 5,231,449 | 7/1993 | Nomura | 396/542 |
| 5,245,476 | 9/1993 | Shono | 359/699 |
| 5,274,410 | 12/1993 | Kuwada et al. | 396/448 |
| 5,349,475 | 9/1994 | Nomura et al. | 359/694 |
| 5,430,516 | 7/1995 | Uziee et al. | 396/529 |
| 5,461,441 | 10/1995 | Kotani | 396/349 |
| 5,475,456 | 12/1995 | Haraguchi et al. | 396/85 |
| 5,485,315 | 1/1996 | Nomura et al. | 359/701 |
| 5,515,135 | 5/1996 | Katayama et al. | 396/85 |
| 5,546,147 | 8/1996 | Baxter et al. | 396/349 |
| 5,600,390 | 2/1997 | Tsuru et al. | 396/448 X |
| 5,617,167 | 4/1997 | Kaji | 396/448 |
| 5,625,852 | 4/1997 | Wada et al. | 396/349 |
| 5,774,748 | 6/1998 | Ito et al. | 396/80 |
| 5,892,998 | 4/1999 | Kodaira et al. | 396/448 |

| SHORT-CIRCUITED RESISTOR(S) | ZOOM CODE | Vo | THRESHOLD VOLTAGE |
|---|---|---|---|
| — | 0 | 0.56 × VDD | |
| | | | 0.53 × VDD (Va) |
| R2 | 5 | 0.50 × VDD | |
| | | | 0.48 × VDD (Vb) |
| R0 | 4 | 0.45 × VDD | |
| | | | 0.42 × VDD (Vc) |
| R1 | 3 | 0.40 × VDD | |
| | | | 0.35 × VDD (Vd) |
| R1 AND R2 | 6 | 0.30 × VDD | |
| | | | 0.24 × VDD (Ve) |
| R0 AND R1 | 1 | 0.19 × VDD | |
| | | | 0.09 × VDD (Vf) |
| R0, R1 AND R2 | 2 | 0.00 | | ent application Ser. No. 08/775,239, filed Dec. 30, 1996, now U.S. Pat. No. 5,842,057 the contents of which are hereby incorporated by reference in its entirety.

CAMERA WITH LENS BARRIER APPARATUS

This application is a divisional application of U.S. patent application Ser. No. 08/775,239, filed Dec. 30, 1996, now U.S. Pat. No. 5,842,057 the contents of which are hereby incorporated by reference in its entirety.

BACKGROUND OF THE INVENTION

1. Field of the Invention

The present invention relates to a camera provided with a lens barrier apparatus. In particular, the present invention is directed to a lens barrier apparatus which is provided as a barrier to cover the lens when the camera is not in use.

2. Description of the Related Art

A camera may include a lens barrier apparatus that operates such that when the camera is turned ON, a lens barrel containing the lens (or lens group) moves from a housed position in which the lens barrier is closed, to a photo-ready position in which the lens barrier is open. Similarly, when the camera is turned OFF, the lens barrel moves from the photo-ready position in which the barrier apparatus is open, to a housed position in which the barrier apparatus is closed.

In most cases, including zoom lens cameras, a lens barrel motor is provided to drive the lens barrel from the housed position to the photo-ready position. Thus, a conventional method of driving the barrier apparatus is to use the lens barrel motor to open and close the barrier apparatus.

One such method uses a spring-loaded barrier apparatus that is designed such that the barrier is constantly urged in the opening direction by a spring. In this case, as the lens barrel moves from the housed position to the photo-ready position, a catch is released such that a stored spring force is released to open the barrier. Then, when the lens barrel motor drives the lens bar barrel from the photo-ready position to the housed position, the barrier is closed against the force of the spring by a cam mechanism or the like and the spring is reset to prepare for the next opening operation.

With such a barrier apparatus, the motor must operate against the force of the spring in order to close the barrier. As such, the motor, and in particular, the contact points between a cam pin and a barrier driving ring are subject to a load. In this case, misalignment of the cam pin and the barrier driving ring could result in a failure. Further, in the particular case of a zoom lens, in which the lens barrel motor may be used to drive a number of lens barrels, the additional load may require a larger lens barrel motor.

Since in the above method the opening of the barrier is spring-biased, if the barrel has accidentally been exposed to a sticky liquid, such as juice or the like, the barrier may not open correctly because the spring force cannot overcome the external sticking force. In this case, a larger than usual force is required at the initial stages of the opening operation. However, if a stronger spring is used in order to provide a larger force to overcome the external force, the design choices available become more restricted and there is a higher probability of failure because of wear.

The above problem can be overcome if the barrier apparatus includes a barrier motor that drives the barrier apparatus independently. However, this method also has problems in that, for example, the size of the camera is increased due to the inclusion of an independent barrier motor and the components required for the operation of the barrier motor. Further, with this arrangement, a sensor that determines the condition of the barrier apparatus is required in order to prevent problems if the barrier motor fails. For example, if the barrier motor fails but the lens barrel motor does not, the user may not be aware of the problem and may attempt to take a photograph with the barrier closed, or, store the camera with the barrier open and damage the lens.

SUMMARY OF THE INVENTION

It is therefore an object of the present invention to provide an improved camera with lens barrier apparatus.

According to a first aspect of the present invention, there is provided a camera with a lens barrier apparatus. The lens barrier apparatus includes a lens barrier, a lens barrier opening/closing mechanism, and a signal generating device. The signal generating device generates a predetermined signal in response to the opening and closing of the lens barrier by the lens barrier opening/closing mechanism. In this way, the operation of the lens barrier apparatus can be monitored based on the signal.

In particular, the lens barrier apparatus may include a determining circuit that determines the state of the lens barrier on the basis of the signal generated by the signal generating device. Further, the lens barrier opening/closing mechanism may include a motor and the signal generating device could be a pulse generator, such as an encoder, that outputs predetermined pulses in response to a rotation of the motor.

In a particular case, the determining circuit determines that the lens barrier opening/closing mechanism has operated normally if the pulse generator outputs a predetermined number of pulses during the operation of the lens barrier opening/closing mechanism.

If the zoom camera uses a lens barrier apparatus as described above and the lens barrier opening/closing mechanism is arranged to drive the lens barrier in a first direction to open the lens barrier and a second direction to close the lens barrier, a controller in the camera can be set such that, when the lens barrier is being driven in the first direction, if the determining circuit determines that the lens barrier opening/closing mechanism has not operated normally, the lens barrier is driven in the second direction and then the first direction again. Similarly, when the lens barrier is being driven in the second direction, if the determining circuit determines that the lens barrier opening/closing mechanism has not operated normally, the lens barrier can be driven in the first direction and then the second direction again.

In this way, operation of the lens barrier apparatus can be re-tried a number of times, for example three times, to attempt to correct a faulty operation.

According to another aspect, a zoom camera includes a lens that can be moved between a housed position and a predetermined photo-ready range, a lens barrier, a first detector that detects the movement of the lens between the housed position and the photoready range, a second detector that detects whether the lens barrier is in an open condition or in a closed condition, and a controller that prevents the lens barrier from being closed unless the lens is at the housed position and prevents the lens from being moved from the housed position if the lens barrier is closed. With this arrangement, the zoom camera cannot be operated for photography unless the lens barrier is open.

According to yet another aspect, a compact camera includes a lens barrier that can be opened and closed, a lens barrier driving mechanism to open and close the lens barrier, a motor connected to the lens barrier driving mechanism for actuating the lens barrier driving mechanism to drive the lens barrier, and an encoder which outputs a predetermined signal synchronously with operation of the motor.

Preferably, the compact camera further includes a controller which judges whether movement of the barrier has completed in accordance with the predetermined signal generated by the encoder. Further, if the predetermined signal is a pulse signal including a plurality of pulses generated in response to operation of the motor, and the controller includes a counter which counts a number of the pulses carried by the pulse signal, the controller can determine that the movement of the barrier is complete when the counter has reached a predetermined value. Also, the controller can determine that the movement of the barrier is incomplete if a pulse is not generated within a predetermined time period and the counter has not reached the predetermined value.

Similar to the above, when the motor is driven in a predetermined direction in order to drive the lens barrier, if the controller determines that the movement is incomplete, the motor is driven in a direction opposite to the predetermined direction and then driven in the predetermined direction again. In this way, the operation of the barrier is retried in order to attempt to correct a fault.

According to yet another aspect, a zoom compact camera includes a lens barrier, a barrier driving mechanism, and a lens barrel housing a plurality of lens groups. The lens barrel may be movable in an optical axis direction within a predetermined movable range. The zoom compact camera also includes a lens moving mechanism provided in the lens barrel to move at least one group of the plurality of lens groups with respect to the lens barrel, a motor for generating driving force, a driving force transmitting mechanism which transmits driving force generated by the motor to one of the barrier driving mechanism and the lens moving mechanism through a first gear train and a second gear train, respectively, and a switching mechanism for selectively switching between the first gear train and the second gear train. With the arrangement of this aspect, one motor is used to drive two distinct mechanisms, such that the size and complexity of the camera is minimized.

Preferably, the switching mechanism selectively switches according to a position of the lens barrel within the movable range. In particular, where the movable range includes a zooming area and a housed position which is outside of the zooming area, the barrier can be arranged such that it is opened and closed only when the lens is located at the housed position by selecting the first gear train when the lens barrel is located at the housed position and selecting the second gear train when the lens barrel is located within the zooming area.

According to a further aspect, a zoom compact camera includes a movable barrel which is movable between a photo-ready range and a housed position, a lens barrier provided at the front end of the moving lens barrel, and a lens barrier mechanism, which opens and closes the lens barrier. The zoom compact camera further includes a shutter unit housed in the moving lens barrel, a movable lens which is supported by the shutter unit in a manner enabling movement in the optical axis direction, a motor which drives the movable lens and the lens barrier mechanism, and a driving system switching mechanism which connects the motor to the movable lens, as the moving barrel moves from the housed position to the photo-ready range and connects the motor to the lens barrier mechanism as the moving lens barrel moves from the photo-ready range to the housed position.

In the above arrangement, since the position of the moving lens barrel is used to determine which mechanism is driven, a separate controller or sensor is not needed in order to control the switching mechanism.

According to yet another aspect, a zoom compact camera is provided with a lens barrier opening/closing mechanism that includes at least two rotating barrier members, each of which rotates about a pivot, a drive ring which is driven to rotate about the optical axis, and at least two rotation force transmitting links, each of which is supported on the drive ring and is provided with an engaging part which engages with a respective one of the at least two rotating barrier members. The engaging part of each of the at least two rotation force transmitting links is formed with a first section that non-resiliently moves the at least two rotating barrier members in an opening direction when the drive ring rotates from a position at which the barrier is fully closed to a position at which the barrier is opened immediately. The first section also resiliently urges the at least two rotating barrier members towards the closing direction by a spring force when the drive ring rotates from the position at which the barrier is opened intermediately to the position at which the barrier is fully closed. The engaging part includes a second section that non-resiliently moves the pair of rotating barrier members in the closing direction, when the drive ring rotates from the position at which the barrier is fully opened to the position at which the barrier is opened intermediately and resiliently urges the pair of rotating barrier members towards the opening direction by a spring force when the drive ring rotates from the position at which the barrier is opened intermediately to the position at which the barrier is fully opened.

According to the arrangement of this aspect, at the beginning of driving, the lens barrier opening/closing mechanism is driven non-resiliently in order to overcome any initial external forces that may prevent the barrier from opening or closing. For example, if a sticky substance such as juice or the like is accidentally spilled on the barrier, thereafter the driving of the barriers is resilient and they are resiliently held at their final position such that, if an external force is applied, the barriers will not break. For example, if a finger is placed between the barriers as they are closing or the barriers are forced open from a closed position. Further, after the force is removed, the barriers will resiliently spring-back to the correct position.

According to yet a further aspect, a zoom compact camera is provided with a barrier mechanism that includes at least a pair of barrier blades, a first device for non-resiliently opening the barrier blades by at least a predetermined amount when the barrier blades are closed and to be opened, and a second device for resiliently and fully opening the barrier blades such that the barrier blades are spring biased against external forces. The zoom compact camera is provided with a third device for non-resiliently closing the barrier blades by at least a predetermined amount when the barrier blades are fully opened and to be closed, and a fourth device for resiliently and completely closing the barrier blades such that the barrier blades are spring biased against external forces.

According to still yet another aspect, a zoom compact camera is provided with a barrier mechanism that includes at least a pair of barrier blades having a projection formed on each of the barrier blades, a drive ring, at least a pair of engaging members that have an engaging opening formed thereon where each of the engaging members are rotatably supported on the drive ring, and a driving mechanism for driving the drive ring. The projection on each of the barrier blades is engaged with a corresponding one of the engaging openings, and when the drive rings is driven the engaging openings interact with the corresponding projections such that during one portion of the driving the projections are non-resiliently driven and during another portion of the driving the projections are resiliently driven.

According to a further aspect, a camera is provided with a lens barrier opening/closing mechanism that includes at least one barrier member which moves through a predetermined range, a drive element, at least one coupling element that transmits a driving force of the drive element to drive the at least one barrier member, and a spring member having a predetermined resilient force. The spring member acts on the coupling element only during a predetermined portion of the predetermined range of driving and decouples the transmission of the driving force in the event that an external force greater than the resilient force is applied to the barrier member.

According to a further aspect, a zoom compact camera is provided with a barrier mechanism, which opens and closes a camera aperture at the front end of a camera lens barrel, and which includes a pair of rotating barrier members which open and close the camera aperture which are centrally and rotatably supported on a pair of pivots that are positioned substantially opposite each other with respect to the optical axis, and which are provided with a boss protrusion at a position that is eccentric with respect to the pivot. The zoom compact camera is further provided with an opening/closing ring which is driven to rotate about the optical axis, a pair of rotation force transmitting links which are pivoted on the opening/closing ring, which are provided with an engaging part that engages with the boss protrusion of each rotating barrier member, and which open and close the pair of rotating barrier members upon rotation of the opening/closing ring, a single spring member which is positioned on a part of the opening/closing ring at one side of a line that joins the pair of pivots of the rotating barrier members and rotationally urges the pair of rotation force transmitting links, and a sector gear part which is positioned on a part of the opening/closing ring at the other side of the line that joins the pair of pivots of the rotating barrier members and drives the opening/closing ring to rotate.

In this aspect, because the components are minimized and appropriately positioned within the camera, the size of the camera can be minimized.

According to yet a further aspect, a camera includes a barrier mechanism, which opens and closes a camera aperture at the front end of a camera lens barrel. The barrier mechanism includes a drive ring, at least one barrier member, at least one coupling element provided on the drive ring that transmits a driving force of the drive element to drive the barrier member, a spring member provided on the drive ring which resiliently biases the coupling element in a predetermined manner, and a mechanical connection part provided on the drive ring to receive a driving force to allow the drive ring to be driven. In particular, the spring member and the mechanical connection part are provided on portions of the drive ring that are opposite to each other in relation to the coupling element.

According to yet another aspect, a zoom compact camera is provided with a lens barrier apparatus that includes a lens barrier which is able to be opened and closed and is provided on the front face of a lens barrel and protects a camera lens, a motor which drives the opening/closing of the lens barrier, an encoder which outputs a predetermined signal in accompaniment with the rotation of the motor, and a drive controller. When a battery is set in the camera, the drive controller drives the motor in the direction in which the lens barrier is closed, and when the predetermined signal is not output from the encoder in the driving process, the drive controller drives the motor in the direction in which the lens barrier is opened and then drives the motor in the direction in which the lens barrier is closed again.

With this arrangement, if the condition of the lens barrier is erased from memory due to the replacement of the battery or the like, the condition of the lens barrier can be determined without the need of any additional sensors or the like. Thus, the camera uses a minimal number of components and its size is minimized.

According to yet another aspect, a lens barrier apparatus includes a lens barrier that is movable between at least two states and that is provided on the front face of a lens barrel to protect a camera lens, a sensor that senses the state of the lens barrier, a motor that drives the lens barrier, and a drive controller. The drive controller operates such that, if, during driving of the lens barrier in a first direction, an intended state is not reached, the controller drives the motor in a second direction opposite to the first direction for a predetermined time period and then drives the motor in the first direction again.

In a particular case, the sensor is a signal generating device that outputs a pulsed signal in association with the movement of the lens barrier. Also in this case, the at least two states can be a plurality of states that are indicated by pulses output by the signal generating device.

With the arrangement of this aspect, the lens barrier is controlled such that if the lens barrier does not open or close correctly, the opening or closing operation will be retried after first driving in an opposite direction in order to attempt to dislodge the obstacle or the like that has caused the failure.

According to yet a further aspect, a zoom compact camera includes a lens barrier, a barrier driving mechanism, a lens barrel housing a plurality of lens groups and being movable in an optical axis direction within a predetermined movable range, and a lens moving mechanism provided in the lens barrel to move at least one group of the plurality of lens groups with respect to the lens barrel. The zoom compact camera is further provided with a motor for generating driving force, an encoder which outputs a predetermined signal synchronously with operation of the motor, a driving force transmitting mechanism which transmits driving force generated by the motor to one of the barrier driving mechanism and the lens moving mechanism through a first gear train and a second gear train, respectively, and a switching mechanism for selectively switching between the first gear train and the second gear train.

This aspect has the advantages of driving two mechanisms with one motor and using an encoder to determine the condition of both mechanisms without other sensors. According to yet another aspect, a zoom compact camera includes a lens barrier that can be opened and closed, a lens barrier driving mechanism to open and close the lens barrier, a motor for actuating the lens barrier driving mechanism to drive the lens barrier, and an encoder which outputs a predetermined signal synchronously with operation of the motor. The zoom compact camera also includes a first device for non-resiliently opening the barrier blades by at least a predetermined amount when the barrier blades are closed and to be opened, a second device for resiliently and fully opening the barrier blades such that the barrier blades are spring biased against external forces, a third device for non-resiliently closing the barrier blades by at least a predetermined amount when the barrier blades are fully opened and to be closed, and a fourth device for resiliently and completely closing the barrier blades such that the barrier blades are spring biased against external forces.

This aspect includes the advantages of using an encoder to monitor the driving of the lens barrier and of driving the lens barrier blades non-resiliently and resiliently, as discussed above.

According to yet another aspect, a zoom compact camera includes a lens barrier that includes a plurality of barrier blades, a barrier driving mechanism, a lens barrel housing a plurality of lens groups and being movable in an optical axis direction within a predetermined movable range, and a lens moving mechanism provided in the lens barrel to move at least one group of the plurality of lens groups with respect to the lens barrel. The zoom compact camera also includes a motor for generating driving force, a driving force transmitting mechanism which transmits driving force generated by the motor to one of the barrier driving mechanism and the lens moving mechanism through a first gear train and a second gear train, respectively, and a switching mechanism for selectively switching between the first gear train and the second gear train. The barrier driving mechanism includes a first device for non-resiliently opening the barrier blades by at least a predetermined amount when the barrier blades are closed and to be opened, a second device for resiliently and fully opening the barrier blades such that the barrier blades are spring biased against external forces, a third device for non-resiliently closing the barrier blades by at least a predetermined amount when the barrier blades are fully opened and to be closed, and a fourth device for resiliently and completely closing the barrier blades such that the barrier blades are spring biased against external forces.

This aspect includes the advantages of using a single motor to drive to mechanisms and of driving the lens barrier blades non-resiliently and resiliently, as described above.

According to yet another aspect, a zoom compact camera includes a lens barrier that includes a plurality of barrier blades, a barrier driving mechanism, a lens barrel housing a plurality of lens groups and being movable in an optical axis direction within a predetermined movable range, a lens moving mechanism provided in the lens barrel to move at least one group of the plurality of lens groups with respect to the lens barrel, and a motor for generating driving force. The zoom compact camera further includes an encoder which outputs a predetermined signal synchronously with operation of the motor, a driving force transmitting mechanism which transmits driving force generated by the motor to one of the barrier driving mechanism and the lens moving mechanism through a first gear train and a second gear train, respectively, and a switching mechanism for selectively switching between the first gear train and the second gear train.

The barrier driving mechanism includes a first device for non-resiliently opening the barrier blades by at least a predetermined amount when the barrier blades are closed and to be opened, a second device for resiliently and fully opening the barrier blades such that the barrier blades are spring biased against external forces, a third device for non-resiliently closing the barrier blades by at least a predetermined amount when the barrier blades are fully opened and to be closed, and a fourth device for resiliently and completely closing the barrier blades such that the barrier blades are spring biased against external forces.

This aspect includes the advantages of using an encoder to determine the condition of the barrier blades, the use of a single motor to drive two mechanisms, and of driving the barrier blades non-resiliently and resiliently, as described above.

BRIEF DESCRIPTION OF THE DRAWINGS

The invention will be described below in detail with reference to the accompanying drawings, in which similar parts are indicated by like reference numerals throughout the drawings, and wherein.

DESCRIPTION OF THE PREFERRED EMBODIMENTS

The present invention will now be described with reference to the attached drawings.

Figure 1:
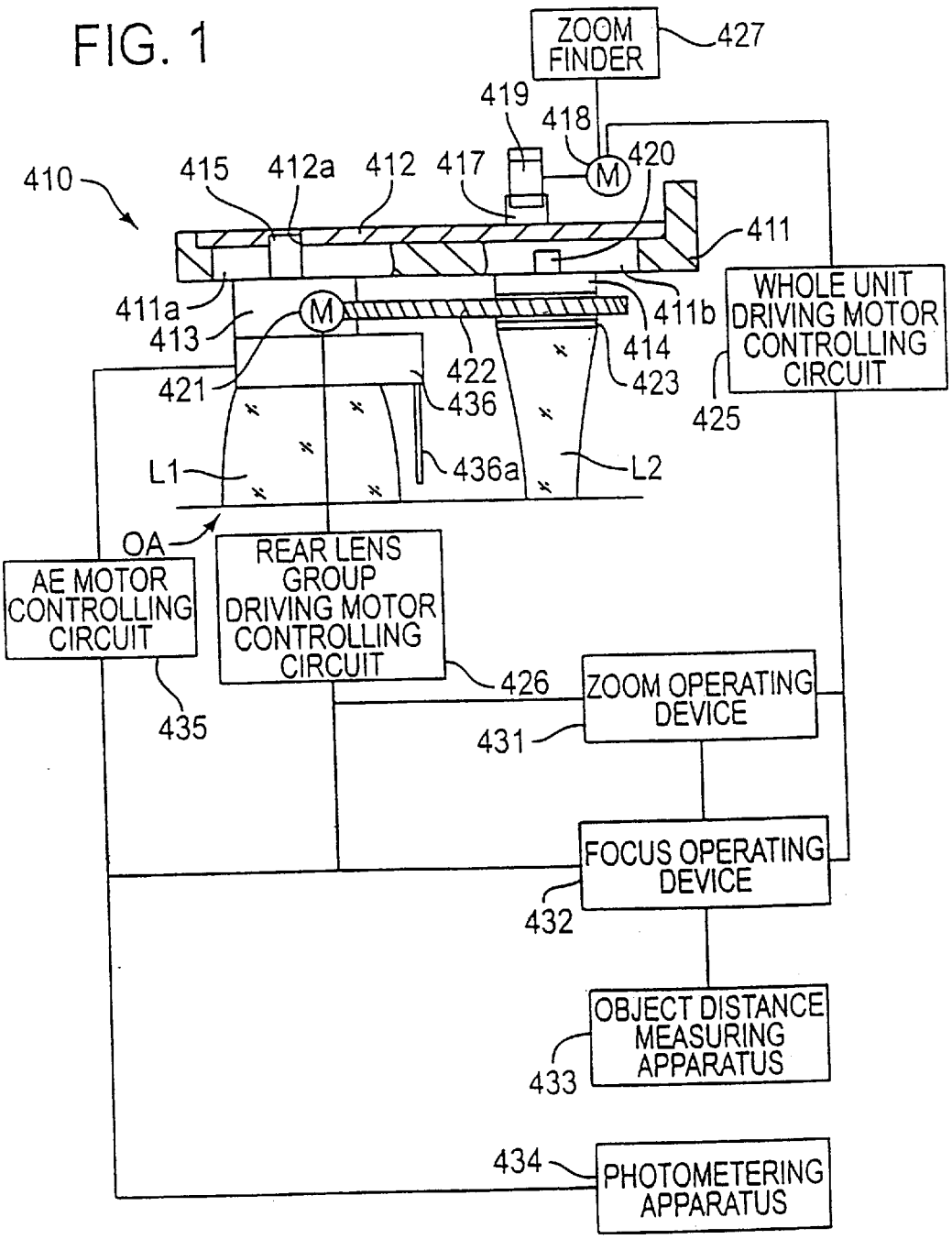
FIG. 1 is a schematic view and a block diagram of an example of a mechanical structure of a camera, to realize a method of focusing for a zoom lens camera of the present embodiment.
Figure 97:
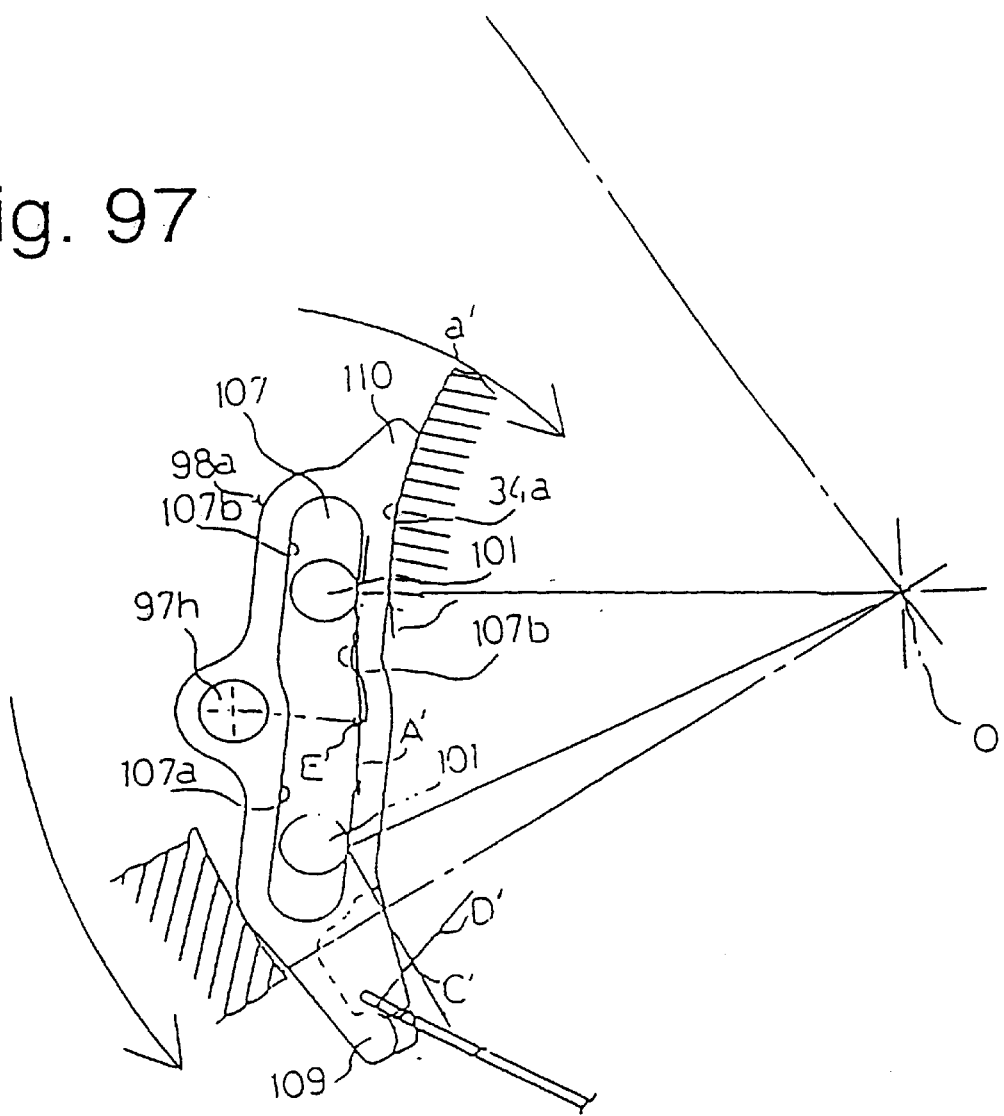
FIG. 97 is a front schematic view of the forces acting on the barrier driving lever for the process in which the main barrier blades are closed from the opened condition.

FIG. 1 is an (essentially) schematic representation of various elements which comprise a zoom lens camera according to the present invention. More specific details of such a camera are described hereinafter with reference to FIGS. 8–97. Thus, although they may describe similar and/or identical parts, the reference numerals used in FIG. 1 are not identical to those used in the other figures.

As shown in FIG. 1, a zoom lens barrel 410 is provided with a front lens group L1 of positive power and a rear lens group L2 of negative power shown in FIG. 1. On an outer periphery of a stationary ring 411, a driving ring 412 is rotatively supported, and on an inner periphery thereof, a front lens group supporting ring 413, which supports the front lens group L1, and a rear lens group supporting ring 414, which supports the rear lens group L2, are engaged. On the stationary ring 411, a linear guide groove 411a is formed parallel to an optical axis OA of the zoom lens barrel 410, and a radial pin 415, provided on the front lens group supporting ring 413, is engaged with a lead groove 412a formed on an inner peripheral surface of the driving ring 412. The radial pin 415 passes through the linear guide groove 411a to engage with the lead groove 412a. On an outer periphery of the driving ring 412, a gear 417 is fixedly engaged with a gear 419 of a whole unit driving (whole unit moving) motor 418.

On the stationary ring 411, a linear guide groove 411b is formed parallel to the optical axis of the zoom lens barrel 410. A radial pin 420, provided on the rear lens group supporting ring 414, engages with the linear guide groove 411b. On the front lens group supporting ring 413, a rear lens group driving (rear lens group moving) motor 421 and a driving screw 422 driven rotatively by the rear lens group driving motor 421, are provided. The driving screw 422 engages with an anti-rotating nut 423 provided on the rear lens group supporting ring 414.

In the above described structural arrangement, when the driving ring 412 is rotatively driven by the whole unit driving motor 418, in accordance with the relationship between the lead groove 412a and the linear guide groove 411a, the front lens group supporting ring 413 (i.e., the front lens group L1) moves in the optical axis direction. Since the rear lens group supporting ring 414 (i.e., the rear lens group L2) is secured to the front lens group supporting ring 413 through the driving screw 422 and the nut 423, the rear lens group supporting ring 414 moves together with the front lens group supporting ring 413 in the optical axis direction. Thus it can be understood that the whole unit driving motor 418 moves both lens groups, i.e., the front and rear lens groups, together as a whole.

On the other hand, when the driving screw 422 is rotatively driven by the rear lens group driving motor 421, the rear lens group supporting ring 414 (i.e., the rear lens group L2) moves relatively to the front lens group supporting ring 413 (i.e., the front lens group L1). Thus it can be understood that the rear lens group driving motor 421 is a motor which varies the distance between the rear lens group L2 and the front lens group L1.

The whole unit driving motor 418 and the rear lens group driving motor 421 are respectively controlled and driven by respective motor controlling circuits 425 and 426. The whole unit driving motor 418 is also connected to a zoom finder 427 so that a field of view of the finder varies when the whole unit driving motor 418 is actuated.

In the main body of the camera, a zoom operating device 431, a focus operating device 432, an object distance measuring device 433 and a photometering apparatus 434 are provided. The zoom operating device 431 provides a zooming command, namely commands to move from a "wide" position to a "tele" position, or vice versa, to the zoom lens barrel 410, i.e., the front lens group L1 and the rear lens group L2. The zoom operating device 431 consists of, for example, a switch according to a momentary mechanical system. The focus operating device 432 consists of, for example, of a release button. When the focus operating device 432 is depressed by a half-depression (half-step), object distance measurement information is input to the object distance measuring device 433 and photometering information is input to the photometering apparatus 434. When the focus operating device 432 is fully depressed (full step), the focusing operation commences, and a shutter 436, mounted to the front lens group supporting ring 413, is operated via a AE motor controlling circuit 435. The shutter 436 opens a shutter blade 436a for a predetermined time according to the photometering information output from the photometering apparatus 434.

In the zoom lens camera as above described, when the zoom operating device 431 is operated, the whole unit driving motor 418 is driven via at least the motor controlling circuit 425, and the front lens group L1 and the rear lens group L2 are moved as a whole. The rear lens group driving motor 421 may also be driven via the motor controlling circuit 426. With the above structural arrangement, it should be understood that the movement of the front lens group L1 and the rear lens group L2 by the zoom operating device 431 is not operated under the conventional concept of zooming in which the focal point does not move. When the zoom operating device 431 is operated, the following two modes are available, namely:

1. A mode to move the front lens group L1 and the rear lens group L2, in the optical axis direction, without varying the distance therebetween, by driving only the whole unit driving motor 418; and,
2. A mode to move the front lens group L1 and the rear lens group L2, in the optical axis direction, while varying the distance therebetween, by driving both the whole unit driving motor 418 and the rear lens group driving motor 421.

In mode 1, during the zooming operation it is impossible to focus on the subject. However, this is not a problem in a lens-shutter type camera, since the image is not observed through the photographing optical system, and it is sufficient that the subject is only focused when the shutter is released. In mode 2, during the zooming operation, the front lens group L1 and the rear lens group L2 are moved without consideration of whether the focal point moves, and when the shutter is released, focusing (focus adjusting) is carried out by moving both the whole unit driving motor 418 and the rear lens group driving motor 421.

On the other hand, when the whole unit driving motor 418 is actuated by the zoom operating device 431, the zoom finder 427 is driven so that the finder field of view thereof is changed in accordance with the focal length set. Specifically, as the set focal length changes from a short focal length to a longer focal length, the finder field of view (angle) changes from a wider field of view to a narrower field of view. The finder field of view of course corresponds to a photographing image size. This kind of zoom finder is well known and is therefore not shown.

In the present invention, as mentioned above, when the zoom operating device 431 is operated to set a focal length, the finder field of view (photographing image area) at the set focal length is observed through the zoom finder 427.

Further when the focus operating device 432 is operated in at least one part of the focal length range set by the zoom operating device 431, the whole unit driving motor 418 and the rear lens group driving motor 421 are driven and subject focusing is performed. The movement of the front lens group L1 and the rear lens group L2 by the whole unit driving motor 418 and the rear lens group driving motor 421 is determined, not only based on subject distance information provided from the object distance measuring device 433, but also in accordance with focal length information set by the zoom operating device 431. In such a manner, when the focus operating device 432 is operated, by moving both the whole unit driving motor 418 and the rear lens group driving motor 421, the position of the lenses can be flexibly controlled, i.e., the position of the lenses has a degree of flexibility.

In theory, during an operation of the zoom operating device 431, the magnification of the finder and the focal length information are only varied without driving the whole unit driving motor 418 or the rear lens group driving motor 421. When the focus operating device 432 is operated, both the whole unit driving motor 418 and the rear lens group driving motor 421 are moved simultaneously according to the focal length information and the subject distance information obtained by the object distance measuring device 433 to move the front lens group L1 and the rear lens group L2 to positions determined according to the focal length and the subject distance information.

Figure 2:
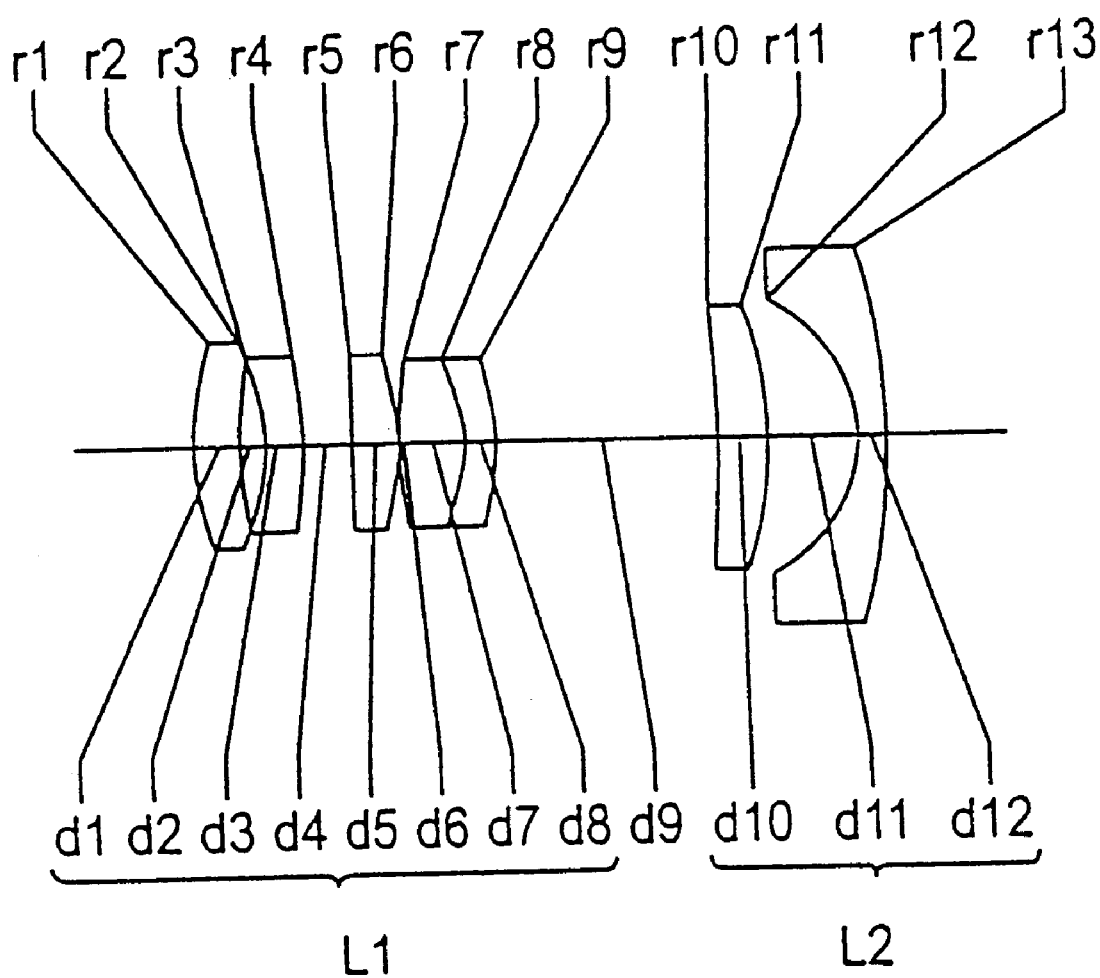
FIG. 2 is a schematic view of a structure of an example of a zoom lens system according to the method of focusing of the present embodiment.

The following discussion will illustrate several examples of a front lens group L1, a rear lens group L2, and a controlling of movement thereof. Table 1 shows lens data regarding the front lens group L1 and the rear lens group L2, and FIG. 2 is a drawing showing the structure of the lens groups. The lens data only shows a concrete example of the optical system which is applicable to a two-lens group type zoom lens according to the present invention. The front lens group L1 consists of four lens groups having five lens elements, and the rear lens group L2 consists of two lens groups having two lens elements (duplet).

In the following tables and the drawings (FIGS. 3 through 7), FNO represents the F number, f represents the focal length, ω represents the half angle of view, fB represents the back focal distance, ri represents the curvature of radius of each lens surface, di represents the thickness of a lens or the distance between lenses, n represents the refractive index of the d-line, and ν represents the Abbe number.

TABLE 1

FNO = 1:3.9–10
F = 39–102 (mm)
ω = 28.4°–12.0°
B = 9.47–63.1 (mm)

| Surface No. | ri | di | n | ν |
| --- | --- | --- | --- | --- |
| 1 | 20.550 | 2.10 | 1.48749 | 70.2 |
| 2 | 42.627 | 1.65 | — | — |
| 3 | −15.428 | 1.66 | 1.83400 | 37.2 |
| 4 | −30.458 | 3.06 | — | — |
| 5 | 631.122 | 2.80 | 1.51633 | 64.1 |
| 6 | −16.980 | 0.10 | — | — |
| 7 | 91.952 | 3.42 | 1.53996 | 59.5 |
| 8 | −11.244 | 1.60 | 1.80400 | 46.6 |
| 9 | −23.784 | 12.56–2.59 | — | — |
| 10* | −42.469 | 2.50 | 1.58547 | 29.9 |
| 11 | −26.490 | 5.04 | — | — |
| 12 | −10.416 | 1.50 | 1.71299 | 53.9 |
| 13 | −48.829 | — | — | — |

*denotes an aspherical surface having rotational symmetry
Aspherical Surface Data:
K = 0.0, A4 = 5.96223 $10^{-5}$, A6 = 2.52645 $10^{-7}$, A8 = 2.89629 $10^{-9}$ The shape of the aspherical surface having rotational symmetry can be generally expressed as follows:

$$x = Ch^2/\{1+[1-(1+K)C^2h^2]^{1/2}\} + A4h^4 + A6h^6 + A8h^8 + A10h^{10} + \ldots$$

wherein, h represents a height above the axis,

X represents a distance from a tangent plane of an aspherical vertex,

C represents a curvature of the aspherical vertex (1/r),

K represents a conic constant,

A4 represents a fourth-order aspherical factor,

A6 represents a sixth-order aspherical factor,

A8 represents an eighth-order aspherical factor,

A10 represents a tenth-order aspherical factor.

Data regarding zooming is shown in Table 2. In Table 2, TL represents the distance from the primary surface to the image surface, $d_{1G-2G}$ represents the distance between the front lens group L1 and the rear lens group L2. The values of TL and $d_{1G-2G}$ represent absolute positions of the first lens group L1 and the second lens group L2 when zooming while keeping the in-focus condition with respect to an object at infinite distance, and the lens positions are realized by a cam mechanism in a conventional zoom compact camera. Specifically, upon setting a focal length by a zoom switch, the first lens group L1 and the second lens group L2 move to positions defined in Table 2 which are determined by the focal length set.

However, according to the zoom lens camera of the present invention, upon setting a focal length by the zoom operating device 431, the first lens group L1 and the second lens group L2 do not move to positions defined in Table 2.

In Table 2, XA(f) represents the total movement distance of the first lens group L1 and the second lens group L2 at a respective focal length by the whole unit moving motor 418 from reference positions thereof. The reference positions (XA(f)=0) are defined by the positions of the lens groups L1 and L2 when the lens groups are located at the shortest focal length (39 mm) while focusing on an object at infinity.

In Table 2, XB(f) represents the total movement distance of the second lens group L2 with respect to the first lens group L1 at a respective focal length by the relative moving motor 421 from a reference position of the rear lens group L2. The reference position (XB(f)=0) is defined as the position of the second lens group L2 when the lens groups L1, L2 are located at the longest focal length (102 mm) while focusing on an object at infinity.

The point is that the movement distances XA(f) and XB(f) are not given just by setting a focal length, but are given when the focus operating device 432 is operated. Note that "0" in XA(f) and XB(f) represents reference positions and does not refer to stand-by positions of the lens groups L1, L2 before the motors 418 and 421 are actuated. In other words, "0" in XA(f) and XB(f) does not mean that the motors 418 and 421 are not driven when the focus operating device is operated. Mechanically, to realize a precise position control of the lens groups, it is preferred that the lens groups are positioned at waiting positions which are represented by negative values (positions moved in directions opposite from the reference position) in Table 2 and are moved to positions shown in Table 2 upon operation of the focus operating device from the waiting positions.

TABLE 2

| f | TL | $d_{1G-2G}$ | XA(f) | XB(f) |
|---|----|----|----|----|
| 39 | 47.45 | 12.56 | 0 | 9.97 |
| 45 | 50.36 | 10.44 | 2.91 | 7.85 |
| 70 | 66.66 | 5.42 | 19.21 | 2.83 |
| 95 | 85.56 | 3.05 | 38.11 | 0.46 |
| 102 | 91.11 | 2.59 | 43.66 | 0 |

As described above, in the zoom lens camera according to the present invention, the first lens group L1 and the second lens group L2 move to positions determined by set focal length information and detected object distance information by actuating the motors 418 and 421 using the zoom operating device 431 and the focus operating device 432. Accordingly, it is possible to make zooming control and focusing control without using the cam mechanism by storing lens position data, consisting of a combination of stepped focal length information and stepped object distance information, in a memory, and digitally controlling the motors 418 and 421 in accordance with the stored lens position data. Therefore, how to control the motors 418 and 421 in accordance with the information in combination with the set focal length information and the detected object distance information is not within the scope of the main subject of the present invention. The following discussion illustrates five advantageous examples of how to control the motors 418 and 421 (lens groups L1 and L2). It is possible to selectively employ these controls in accordance with the zoom lens of the present invention.

In the following examples XA represents movement due to the whole unit driving motor, XB represents movement due to the rear lens group driving motor, (f) represents the function of the focal length, (u) represents the function of the subject distance, and ΔXA and ΔXB respectively represent movement during focusing due to the whole unit driving motor and the rear lens group driving motor. Namely, XAmax represents the maximum movement during zooming and additional focusing due to the whole unit driving motor, XA(f)max represents the maximum movement during zooming due to the whole unit driving motor, ΔXF(u) represents the movement based only on subject distance regardless of the focal length, XBmax represents the maximum movement during zooming and additional focusing due to the rear lens group driving motor, and XB(f)max represents the maximum movement during zooming due to the rear lens group driving motor.

[EXAMPLE 1]

Figure 3:
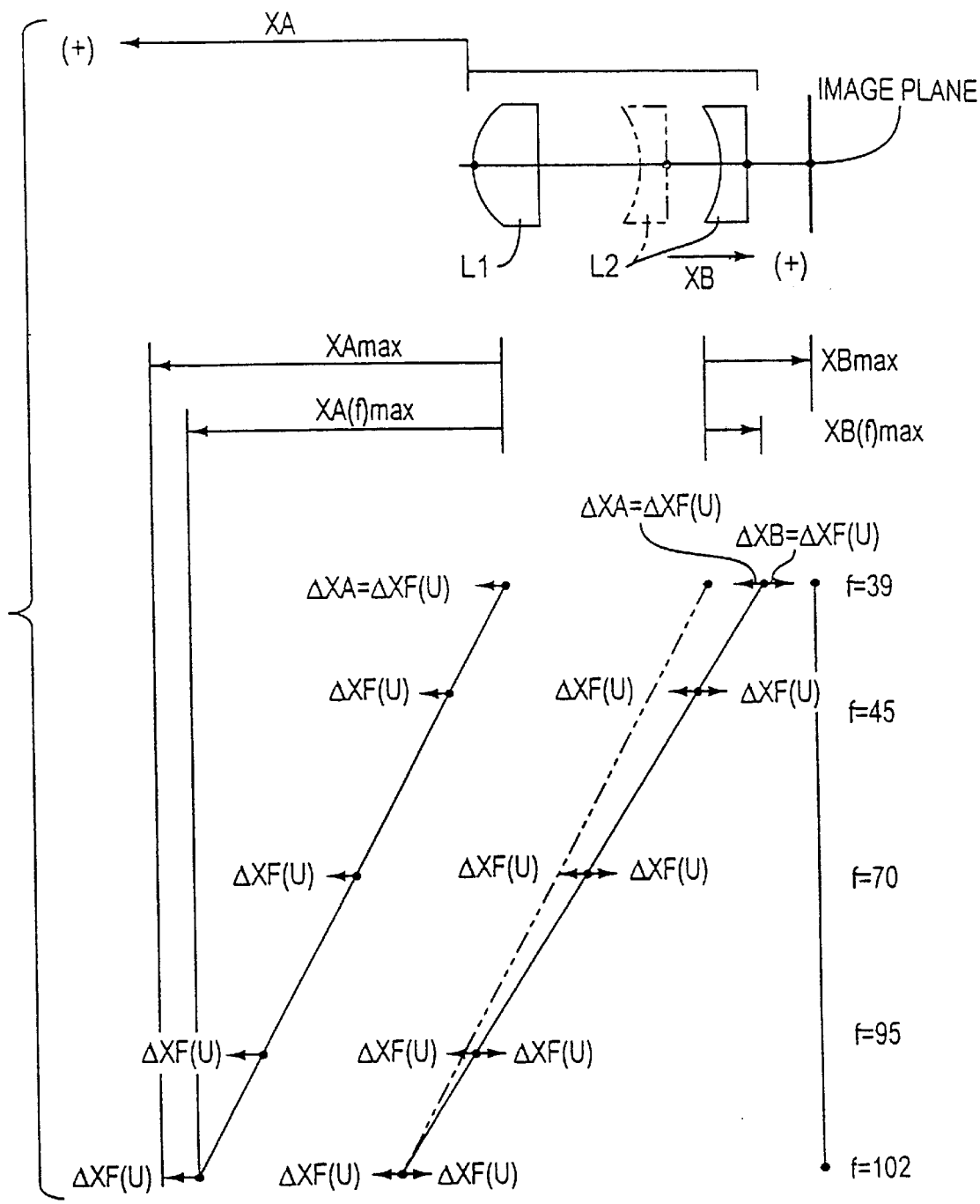
FIG. 3 is a graphic representation of an example of lens movement control according to the method of focusing of the present embodiment.

FIG. 3 is a first example of a front lens group L1 and a rear lens group L2. In FIGS. 3 through 7, the length of the arrows of ΔXA and ΔXB are exaggeratedly drawn compared with the arrows of XA and XB.

In the present example, throughout the whole focal length range, set by the zoom operating device 431, the total movement XA and the relative movement of the rear lens group XB are given by the following relationships:

$XA = XA(f) + \Delta XF(u)$ $XB = XB(f) + \Delta XF(u)$

In other words, XA and XB are defined by the addition of a similar quantity of ΔXF(u), without having any relationship to the focal length. When the same amount of 6 XF(u) is added to XA and XB, in regard to the function of the subject distance (u), the distance of the rear lens group L2 from the image surface does not vary. The position of the rear lens group L2 indicated by the broken line (two-dotted) represents its position without an operation of the rear lens group driving motor.

In the present example, if the shortest subject distance u=700 mm, when f=39 mm, then ΔXF(u)=1.17, and as f increases, the value of ΔXF(u) will increase slightly, but when f=102 mm, then ΔXF(u)=1.25 and therefore the amount of increase is very little. Considering the depth of focus, it is possible to control the movement (i.e., the movement of the lenses to the desired position) of the lenses only by the subject distance information, regardless of the focal length information from the zoom operation device 431.

In the present example, the following relationships are given:

$$XA\max = XA(f)\max + \Delta XF(u)\max$$

$$XB\max = XB(f)\max + \Delta XF(u)\max$$

[EXAMPLE 2]

Figure 4:
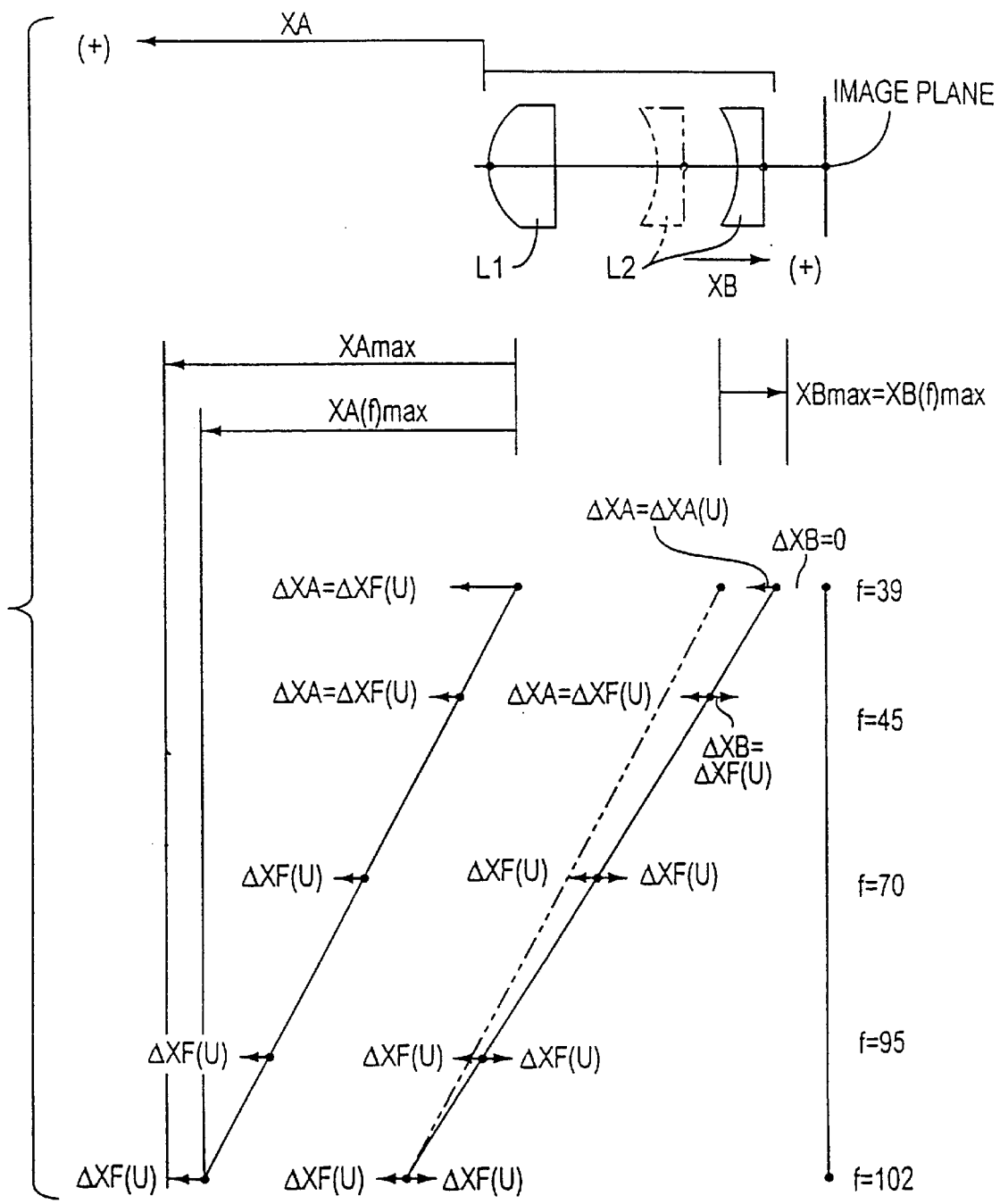
FIG. 4 is a graphic representation of another example of lens movement control according to the method of focusing of the present embodiment.

FIG. 4 shows a second example of a front lens group L1 and a rear lens group L2.

In the present example, around the short focal length end, set by the zoom operating device 431, the following relationships are defined:

$$XA = XA(f) + \Delta XA(u)$$

$$XB = XB(f) + 0$$

(i.e., regarding subject distance, the rear lens group L2 should not move relative to the front lens group L1)

At other focal lengths, the following relationships are defined:

$$XA = XA(f) + \Delta XF(u)$$

$$XB = XB(f) + \Delta XF(u)$$

In the present example, if the shortest subject distance u=700 mm, when f=39 mm, then ΔXA(u)=1.72. Regarding other focal lengths, the values of ΔXF(u) are approximately determined as follows:

when f=45 mm, then ΔXF(u)=1.17;
when f=70 mm, then ΔXF(u)=1.20;
when f=95 mm, then ΔXF(u)=1.24; and,
when f=102 mm, then ΔXF(u)=1.25.

Therefore, at focal lengths other than around the short focal length end, it is possible to control the position of the lenses only by the subject distance information, regardless of the focal length information.

In the present example, the following relationships are defined:

$$XA\max = XA(f)\max + \Delta XF(u)\max$$

$$XB\max = XB(f)\max$$

Therefore, the relative movement of the rear lens group can be minimized. In this example, XB(f)max is less than XB(f)max in Example 1.

[EXAMPLE 3]

Figure 5:
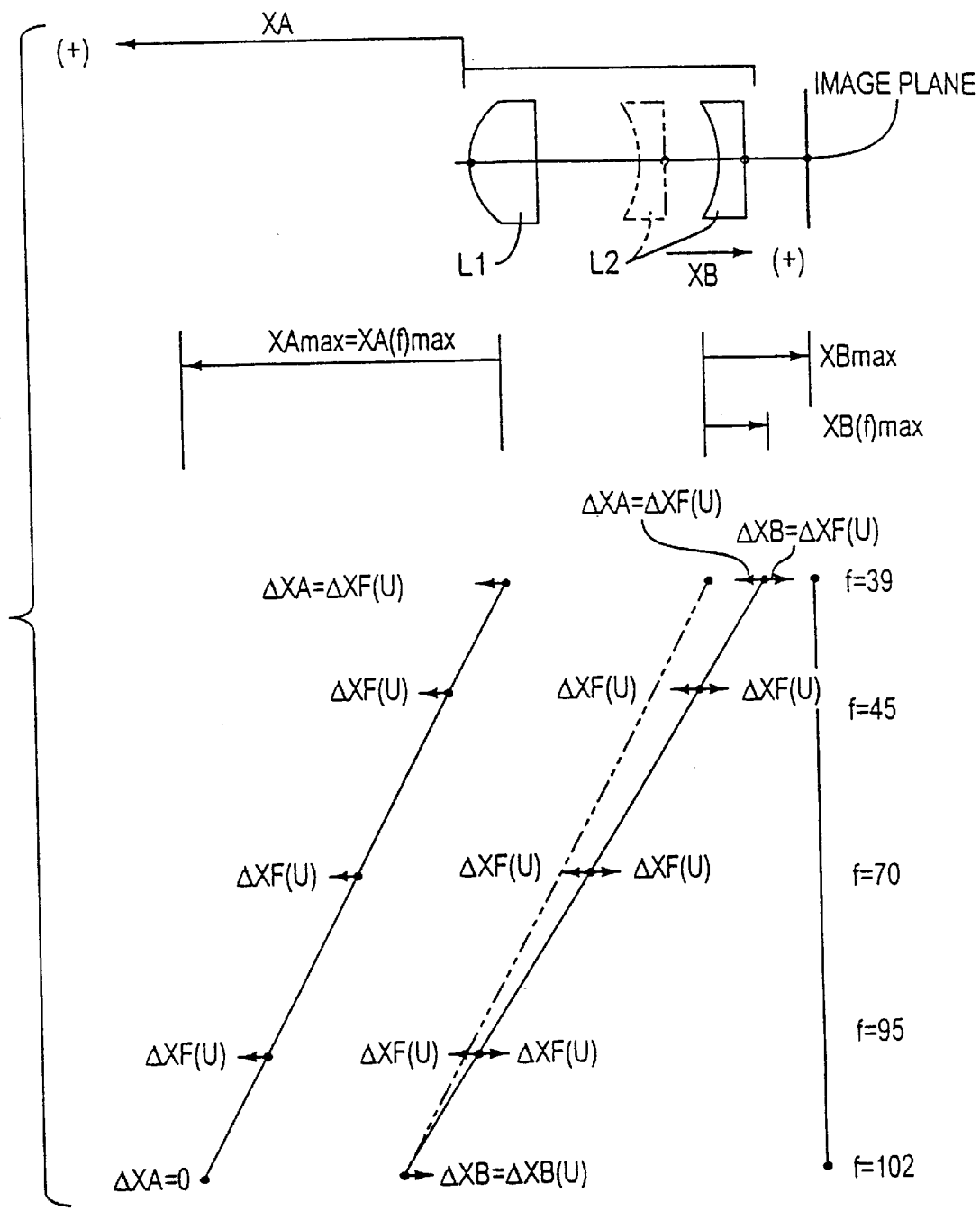
FIG. 5 is a graphic representation of another example of lens movement control according to the method of focusing of the present embodiment.

FIG. 5 shows a third example of a front lens group L1 and a rear lens group L2.

In the present example, around the long focal length end, set by the zoom operating device 431, the following relationships are defined:

$$XA = XA(f) + 0$$

(i.e., regarding subject distance, the front lens group L1 should not move)

$$XB = XB(f) + \Delta XB(u)$$

At other focal lengths, the following relationships are defined:

$$XA = XA(f) + \Delta XF(u)$$

$$XB = XB(f) + \Delta XF(u)$$

In the present example, if the shortest subject distance u=700 mm, the values of ΔXF(u) are approximately determined as follows:

when f=39 mm, then ΔXF(u)=1.17;
when f=45 mm, then ΔXF(u)=1.17;
when f=70 mm, then ΔXF(u)=1.20; and,
when f=95 mm, then ΔXF(u)=1.24.
However, when f=102 mm, then ΔXB(u)=1.35.

Therefore, at focal lengths other than around the long focal length end, it is possible to control the position of the lenses only by the subject distance information, regardless of the focal length information.

In the present example, the following relationships are defined:

$$XA\max = XA(f)\max$$

$$XB\max = XB(f)\max + \Delta XB(u)\max$$

Therefore, the total movement by the whole unit driving motor is minimized.

[EXAMPLE 4]

Figure 6:
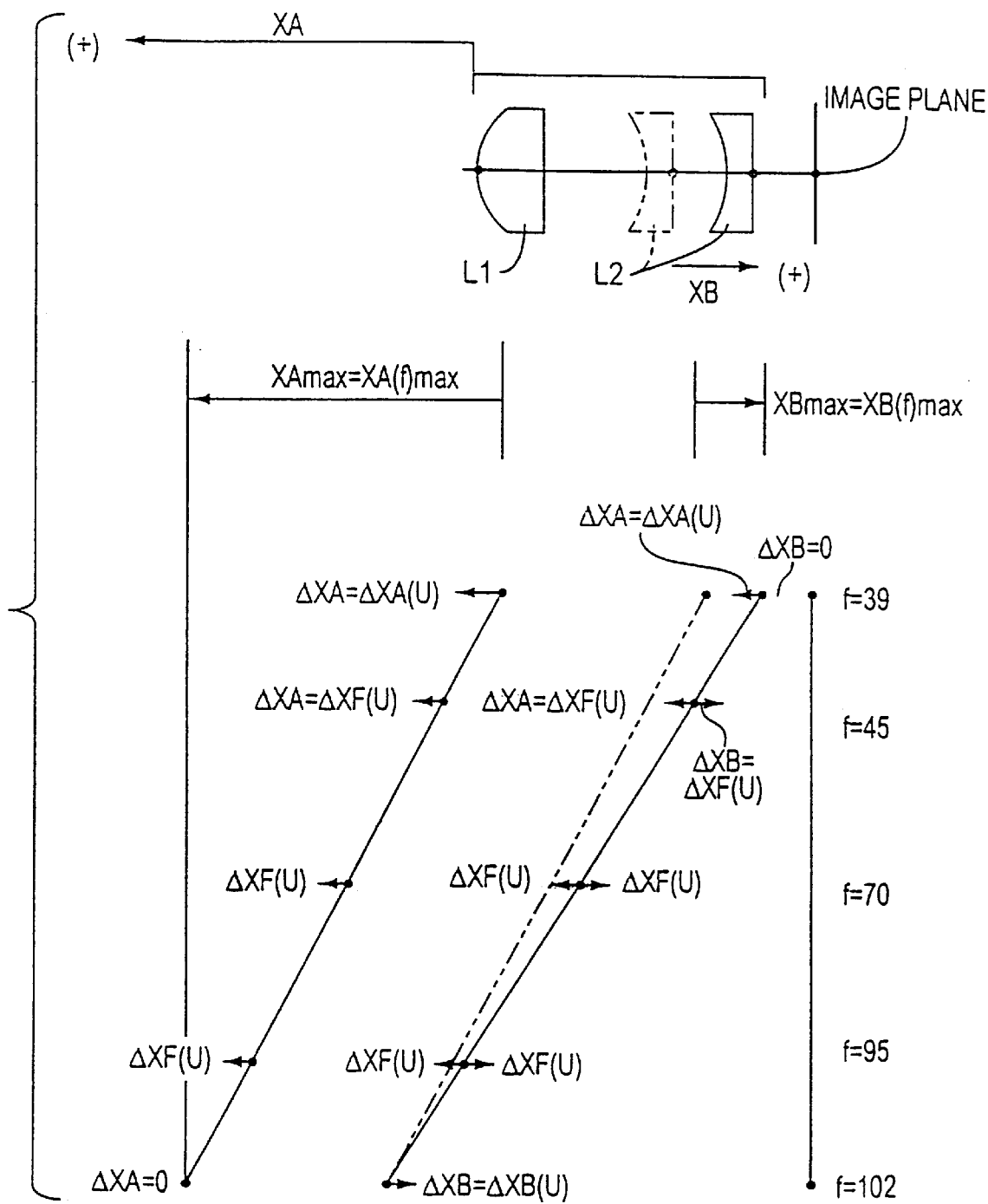
FIG. 6 is a graphic representation of another example of lens movement control according to the method of focusing of the present embodiment.

FIG. 6 shows a fourth example of a front lens group L1 and a rear lens group L2.

In the present example, around the short focal length end, set by the zoom operating device 431, the following relationships are defined:

$$XA = XA(f) + \Delta XA(u)$$

$$XB = XB(f) + 0$$

(i.e., regarding subject distance, the rear lens group L2 should not move relative to the front lens group L1)

Around the long focal length end, set by the zoom operating device 431, the following relationships are defined:

$$XA = XA(f) + 0$$

(i.e., regarding subject distance, the front lens group L1 should not move)

$$XB = XB(f) + \Delta XB(u)$$

And at other focal lengths, the following relationships are defined:

$$XA = XA(f) + \Delta XF(u)$$

$$XB = XB(f) + \Delta XF(u)$$

In the present example, if the shortest subject distance u=700 mm, the position of the lenses, other than at around the short or long focal length ends, are approximately determined as follows:

when f=39 mm, then ΔXA(u)=1.72;

when f=45 mm, then ΔXF(u)=1.17;

when f=70 mm, then ΔXF(u)=1.20;

when f=95 mm, then ΔXF(u)=1.24; and, when f=102 mm, then ΔXB(u)=1.35.

Therefore, at focal lengths other than around the short or long focal length ends, it is possible to control the position of the lenses only by the subject distance information, regardless of the focal length information.

In the present example, the following relationships are defined:

$$XA\max = XA(f)\max$$

$$XB\max = XB(f)\max$$

Therefore, the movement of both lens groups is minimized, as well as the relative movement of the rear lens group.

[EXAMPLE 5]

Figure 7:
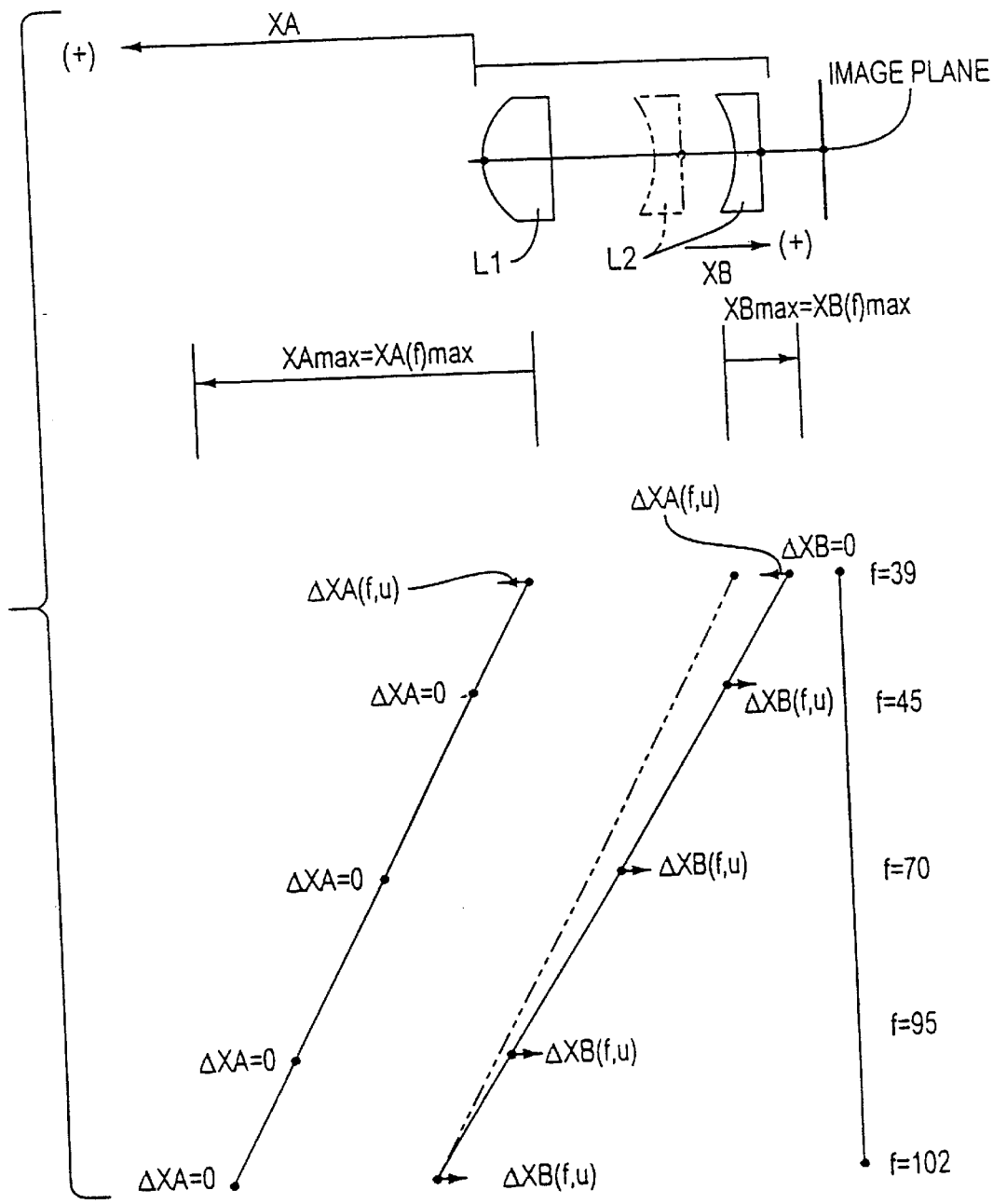
FIG. 7 is a graphic representation of another example of lens movement control according to the method of focusing of the present embodiment.

FIG. 7 shows a fifth example of a front lens group L1 and a rear lens group L2.

In the present example, around the short focal length end, set by the zoom operating device 431, the following relationships are defined:

$$XA = XA(f) + \Delta XA(u)$$

$$XB = XB(f) + 0$$

(i.e., regarding subject distance, the rear lens group L2 should not move against the front lens group L1)

At other focal lengths, the following relationships are defined:

$$XA = XA(f) + 0$$

(i.e., regarding subject distance, the front lens group L1 should not move)

$$XB = XB(f) + \Delta XB(f, u)$$

In the present example, if the shortest subject distance u=700 mm, the position of the lenses around the long focal length end is approximately determined as follows:

when f=39 mm, then ΔXA(u)=1.72;

when f=45 mm, then ΔXF(u)=1.90;

when f=70 mm, then ΔXF(u)=1.42;

when f=95 mm, then ΔXF(u)=1.35; and, when f=102 mm, then ΔXB(u)=1.35.

Therefore, at the short focal length end, it is possible to control the position of the lenses only by the subject distance information, and at other focal lengths it is possible to control the position of the lenses by the focal length information and the subject distance information.

In the present example, the following relationships are defined:

$$XA\max = XA(f)\max$$

$$XB\max = XB(f)\max$$

Therefore, the movement of both lens groups is minimized, as well as the relative movement of the rear lens group. The position of the lenses, however, may differ according to the focal length.

The mechanical structure of the zoom lens shown in FIG. 1 illustrates a simple example thereof. Various mechanical structures may actually be made, and thus the present invention shall not refer to the mechanical structure itself.

As above described, according to the method of focusing the zoom lens camera in the present invention, when the focus operating device is operated, focusing is performed in such a manner that, the whole unit driving motor which drives the front and the rear lens group as a whole, and the rear lens group driving motor which varies the distance between the front lens group and the rear lens group, move together, and thereby flexible control of the lens position will be facilitated.

To realize the zoom lens and the method of lens driving shown in FIGS. 2 through 7, several embodiments of the present invention will now be described with reference to FIGS. 8 to 23.

Figure 26:
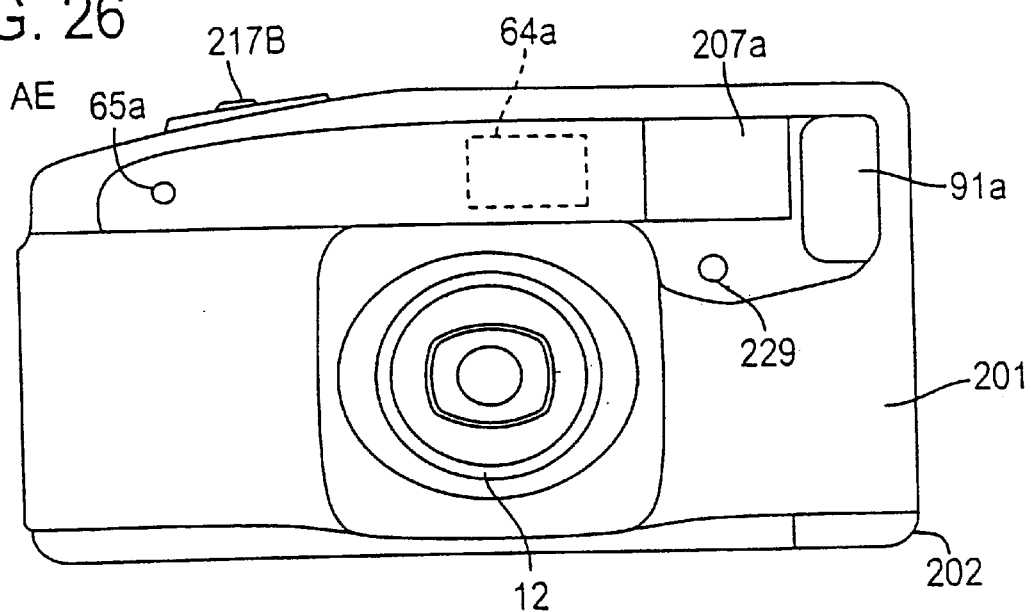
FIG. 26 is a front elevational view of an example of an embodiment of a zoom lens camera according to the present invention.

The following embodiments of the present invention are applied to a lens shutter type of zoom lens camera, as shown in FIG. 26. The concept of the present zoom lens camera will now be described with reference to FIG. 20.

Figure 20:
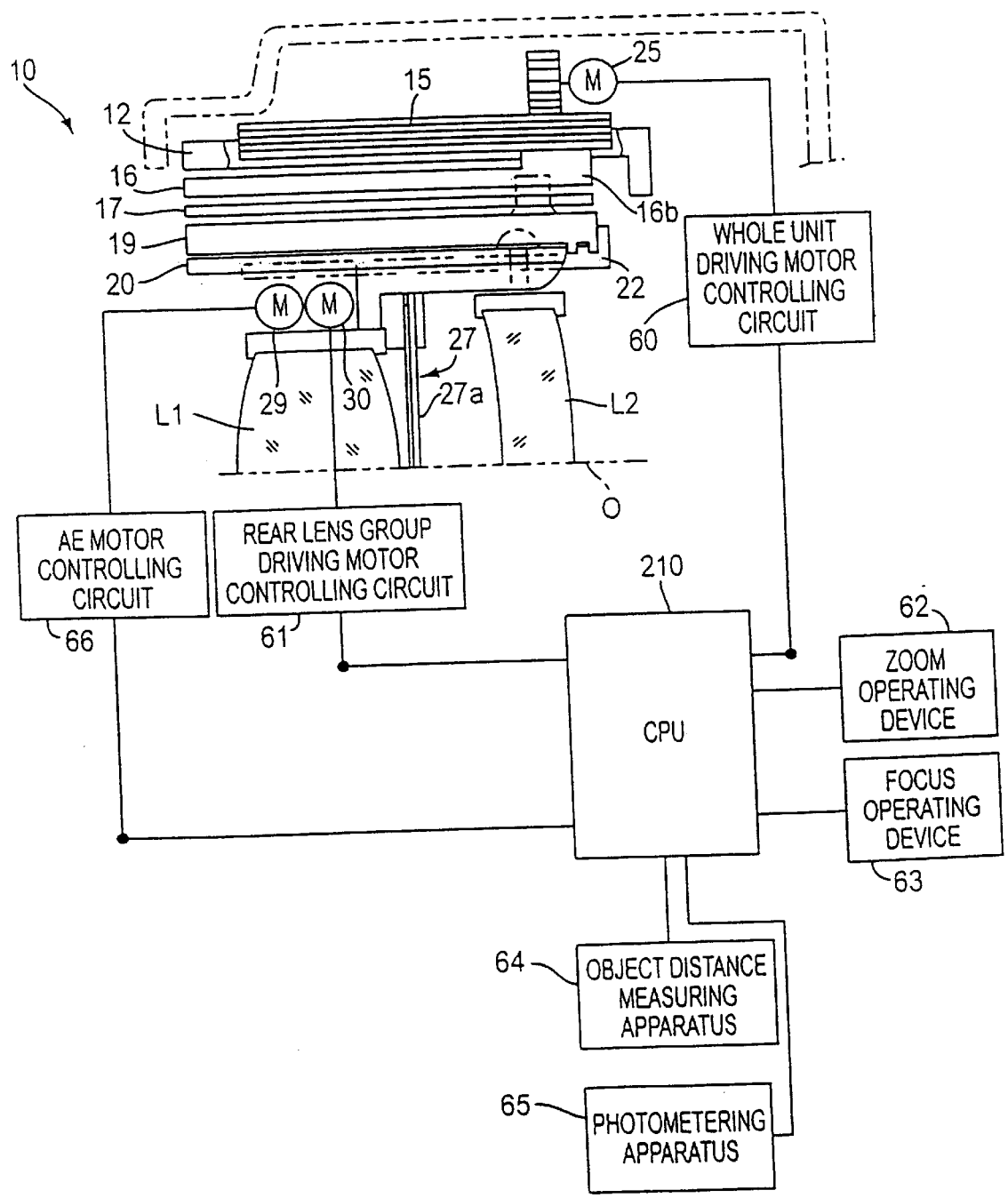
FIG. 20 is a block diagram of a controlling system to control an operation of the zoom lens barrel.

FIG. 20 shows a zoom lens barrel 10, provided in the present zoom lens camera, of a three-stage delivery type having three moving barrels, namely a first moving barrel 20, a second moving barrel 19 and a third moving barrel 16. Two lens groups are provided, namely a front lens group L1 having positive power and a rear lens group L2 having negative power.

Figure 28:
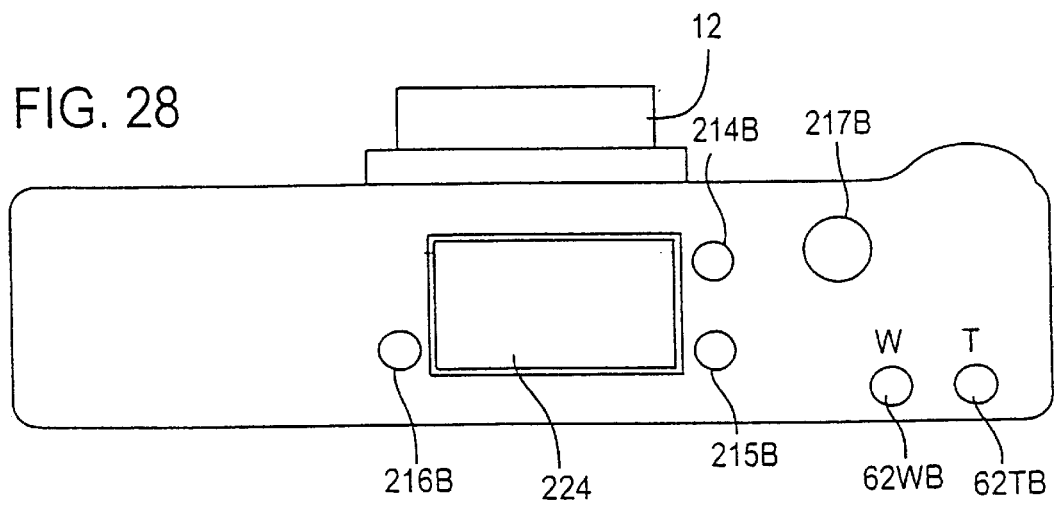
FIG. 28 is a plan view of the zoom lens camera shown in FIG. 26.

In the main body of the camera, a whole unit driving motor controlling circuit 60, a rear lens group driving motor controlling circuit 61, a zoom operating device 62, a focus operating device 63, a object distance measuring apparatus 64, a photometering system 65, an AE (i.e., automatic exposure) motor controlling circuit 66, and a CPU (i.e., central processing unit) 210, are provided. The CPU 210 controls the above devices, circuits or apparati. Although the specific object distance measuring apparatus 64 which is used to provide information regarding the object-to-camera distance does not form part of the present invention, one such suitable system is disclosed in commonly assigned U.S. patent application Ser. No. 08/605,759, filed on Feb. 22, 1996, the entire disclosure of which is expressly incorporated by reference herein. Although the systems disclosed in such application are of the so-called "passive" type, other known autofocus systems (e.g., active rangefinding systems such as those based on infrared light and triangulation) may be used. Similarly, a photometering system as disclosed in the noted U.S. patent application Ser. No. 08/605,759 could be implemented as photometering system 65. When the zoom operating device 62, for example in the form of a zoom lever provided on the camera body (i.e., a "wide" zoom button 62WB and a "tele" zoom button 62TB, as shown in FIG. 28), is operated, the CPU 210 outputs commands to the whole unit driving motor controlling circuit 60 to move the front lens group L1 and the rear lens group L2, rearwardly or forwardly without consideration of the focal length and a focal point thereof.

In the following explanation, forward and rearward movements of the lenses L1 and L2 by the whole unit driving motor control circuit 60 (the motor 25) are referred to as the movement toward "tele" and the movement toward "wide", respectively, since forward and rearward movements of the lenses L1 and L2 occur when the zoom operating device 62 is operated to "tele" and "wide" positions.

The image magnification of the visual field of the finder 427 (FIG. 1), varies sequentially to the variation of the focal length through the operation of the zoom operating device 62. Therefore, the photographer may perceive the variation of the set focal length through the operation of the zoom operating device 62, by observing the variation of image magnification of the visual field of the finder. In addition, the focal length, as set by the operation of the zoom operating device 62, may be indicated by a value displayed on an LCD (i.e., liquid crystal display) panel 224, as shown in FIG. 28.

When the focus operating device 63 is operated, the CPU 210 drives the whole unit driving motor 25, driven via the whole unit driving motor controlling device 60, and additionally drives a rear lens group driving motor 30, driven via the rear lens group driving motor controlling circuit 61, so that the front and rear lens groups L1 and L2 are moved to a position corresponding to a set focal length and a detected object distance, and whereby the zoom lens is focused on the subject.

Specifically, the focus operating device 63 is provided with a release button 217B. A photometering switch SWS and a release switch SWB are synchronized with the release button 217B. When the release button 217B is half-depressed (half step), through the CPU 210, the photometering switch SWS is turned ON, and the respective object distance measuring and photometering commands are input to the object distance measuring apparatus 64 and the photometering apparatus 65.

When the release button 217B is fully depressed (full step), the CPU 210 causes the release switch SWR to be turned ON, and according to the result of the object distance measuring device and a set focal length, the whole unit driving motor 25 and the rear lens group driving motor 30 are driven. Thus, the focusing process, in which the front lens group L1 and the rear lens group L2 move to the focusing position, is executed. Further, an AE motor 29 of an AF/AE (i.e., autofocus/autoexposure) shutter unit 21 (FIG. 21) is driven via the AE motor controlling circuit 66, and a shutter 27 is actuated. During the shutter action, upon the input of the photometering information output from the photometering apparatus 65, the CPU 210 drives the AE motor 29 and opens shutter blades 27a of the shutter 27 for a specified period of time. In the zoom lens camera of the present embodiment, immediately after the shutter blades 27a are closed, by driving the rear lens group driving motor 30, the rear lens group L2 moves forwardly to the initial position thereof. The focus operating device 63, though not shown, includes switching mechanism to execute the focusing process by the CPU 210.

When the zoom operating device 62 is operated, the CPU 210 drives the whole unit driving motor 25, and the front lens group L1 and the rear lens group L2 move together as a whole in the optical axis direction. Simultaneous with such a movement, the rear lens group driving motor 30 may also be driven via the rear lens group driving motor controlling circuit 61. However, this operation is not performed under the conventional concept of zooming in which the focal length is varied sequentially without moving the position of the focal point.

Motors 29 and 30 are identical, and comprise DC motors having a minimum torque of 1.5 gram*cm at a rated voltage (i.e., 1.5V); motor 25 comprises a DC motor which has a minimum torque of 12.0 gram*cm at a rated voltage (i.e., 2.4V). One example of motors 29 and 30 are motors manufactured by Sanyo Seimitsu Co., Ltd. of Japan, under motor code No. M-01166600; and an example of motor 25 is a motor which is also manufactured by Sanyo Seimitsu Co., Ltd. of Japan, under motor code No. M-01154200.

An example of the embodiment of the zoom lens barrel according to the above concept will now be described with reference to FIGS. 18 and 19.

The overall structure of the zoom lens barrel 10 in the present invention will firstly be described.

The zoom lens barrel 10 is provided with the first moving barrel 20, the second moving barrel 19, the third moving barrel 16, and a fixed lens barrel block 12. The third moving barrel 16 is engaged with a cylindrical part of the fixed lens barrel block 12, and moves in the optical axis direction upon being rotated. The third moving barrel 16 is provided on an inner periphery thereof with a linear guide barrel 17, which is restricted in rotation. The linear guide barrel 17 and the third moving barrel 16 move together as a whole in the optical axis direction, with the third moving barrel 16 rotating relative to the linear guide barrel 17. The first moving barrel 20 moves in the optical axis direction with rotation thereof being restricted. The second moving barrel 19 moves in the optical axis direction, while rotating relative to the linear guide barrel 17 and the first moving barrel 20. The whole unit driving motor 25 is secured to the fixed lens barrel block 12. A shutter mounting stage 40, on which the AE motor 29 and the rear lens group driving motor 30 are mounted, is secured to the first moving barrel 20. The front lens group L1 and the rear lens group L2 are respectively supported by a lens supporting barrel 34 and a lens supporting barrel 50.

On the inner periphery of the fixed lens barrel block 12, a female helicoid 12a, and a plurality of linear guide grooves 12b formed parallel to an optical axis O, are provided. An aperture plate 14 having an aperture 14a which defines a portion of the film to be exposed, is provided, as shown in FIG. 18.

Figure 14:
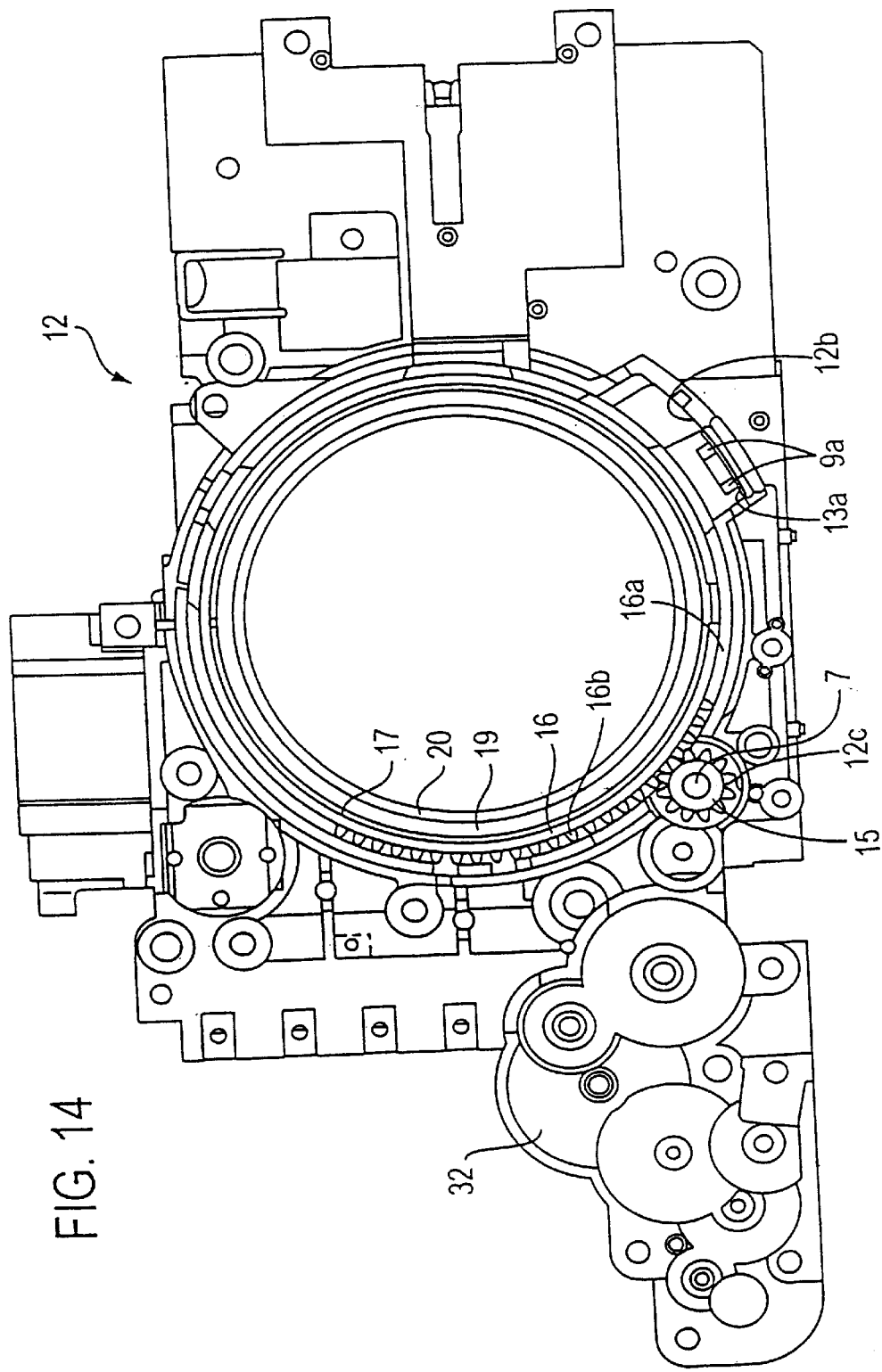
FIG. 14 is a front elevational view of a fixed lens barrel block of the zoom lens barrel.

In the fixed lens barrel block 12, a gear housing 12c, expanding in the radial direction, and extending in the optical axis direction, is provided as shown in FIG. 14. In the gear housing 12c, a driving pinion 15, extending in the optical axis direction, is rotatively held. The ends of a shaft 7 of the driving pinion 15 are rotatively supported, by a supporting hollow 4 provided in the fixed lens barrel block 12, and by a supporting hollow 31a provided on a gear supporting plate 31, respectively. The teeth of the driving pinion 15 project into the inner periphery of the fixed lens barrel block 12.

At the bottom part of one of the linear guide grooves 12b, namely 12b', the code plate 13a having a predetermined pattern is fixed, as shown in FIG. 14. The linear guide groove 12b' is provided so that it may be positioned at an approximate diagonal position of the photographing plane in regard to the fixed lens barrel block 12. The code plate 13a is provided along substantially the whole of the length of the fixed lens barrel block 12 (i.e., in the optical axis direction). The code plate 13a is part of a flexible printed circuit board 13 positioned outside the fixed lens barrel block 12. On the flexible printed circuit board 13, a photointerrupter 1 is secured, which in combination with a rotating plate 2, comprises an encoder for detecting a rotation of the whole unit driving motor 25. The rotating plate 2 is fixed on a shaft of the whole unit driving motor 25 as shown in FIG. 19.

Figure 13:
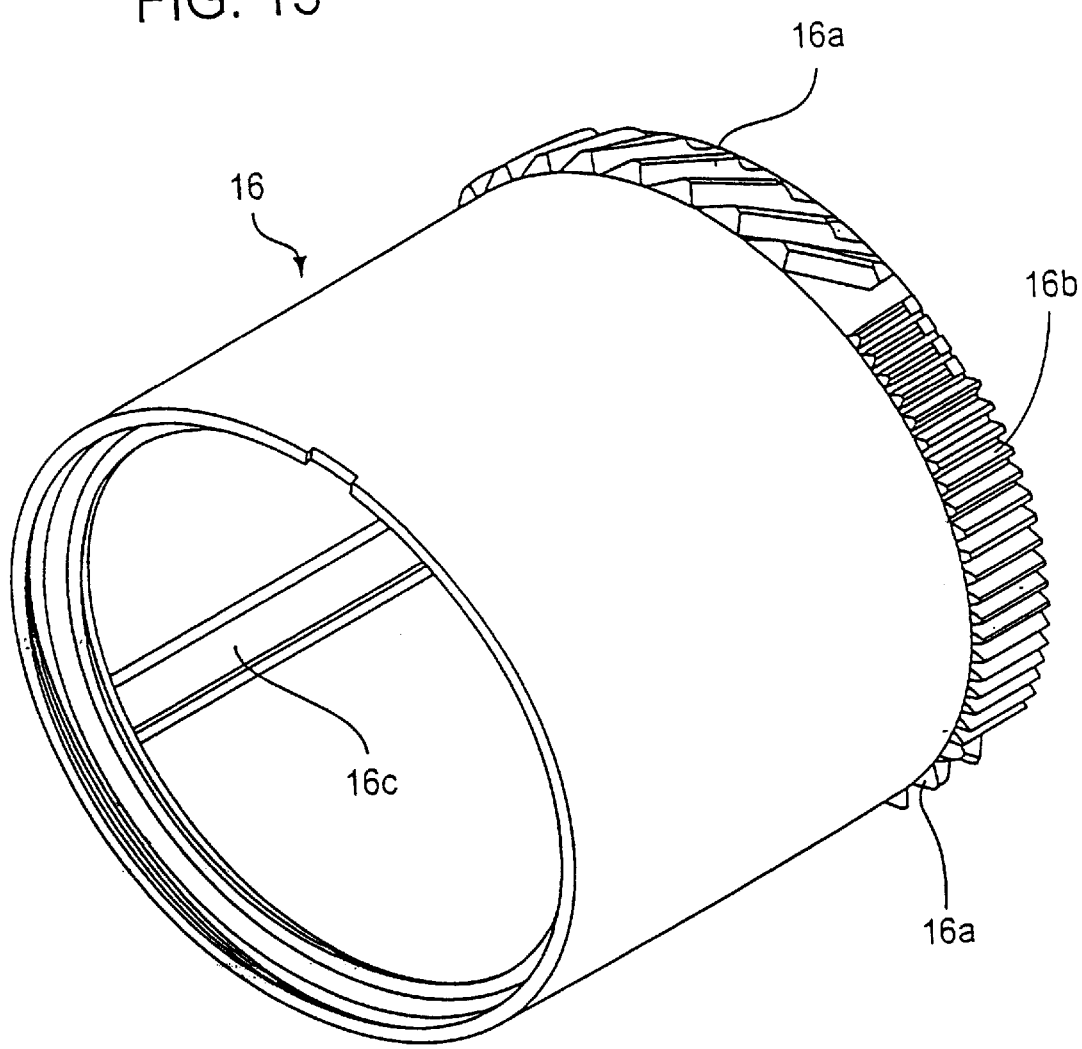
FIG. 13 is a schematic perspective view of an outline of a third moving barrel of the zoom lens barrel.

On an inner periphery of the third moving barrel 16, a plurality of linear guide grooves 16c, formed parallel to the optical axis, are provided. At an outer periphery of the rear end of the third moving barrel 16, a male helicoid 16a, which engages with the female helicoid 12a of the fixed lens barrel block 12, and an outer peripheral gear 16b, which engages with the driving pinion 15, are provided as shown in FIG. 13. The driving pinion 15 has an axial length sufficient to be capable of engaging with the outer peripheral gear 16b throughout the entire range of movement of the third moving barrel 16 in the optical axis direction.

The linear guide barrel 17 is provided, on a rear part of an outer periphery thereof, with a rear end flange 17d. The rear end flange 17d has a plurality of engaging projections 17c projecting away from the optical axis in the radial direction. An anti-dropping flange 17e is provided just in front of the rear end flange 17d. The anti-dropping flange 17e has a radius smaller than the rear end flange 17d. In the circumferential direction of the anti-dropping flange 17e, a plurality of notches 17f are formed. On an inner periphery of the rear end of the third moving barrel 16, a plurality of engaging projections 16d, projecting towards the optical axis in a radial direction are provided, as shown in FIG. 18. By inserting the engaging projections 16d into the notches 17f, the engaging projections 16d are positioned between the flanges 17d and 17e, and by the relative rotation of the linear guide barrel 17, the engaging projections 16d are engaged with the linear guide barrel 17. On the rear end surface of the linear guide barrel 17, an aperture plate 23 having an aperture 23a approximately the same shape as the aperture 14a, is fixed.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis O. One of the engaging projections 17c, namely 17c' (a linear guide key), is fixed to a contact terminal, i.e., a brush 9, which is in slidable contact with the code plate 13a, fixed to the bottom of the linear guide groove 12b', to generate signals corresponding to focal length information during zooming. The engaging projection 17c' is positioned approximately diagonal to the photographing plane.

The contacting terminal 9 is provided with a pair of brushes (electric armatures) 9a, which are approximately perpendicular to a fixing part 9b and in slidable contact with the code plate 13a, and a pair of positioning holes 9d. The pair of brushes 9a are electrically continuous with each other via the fixing part 9b.

Figure 30:
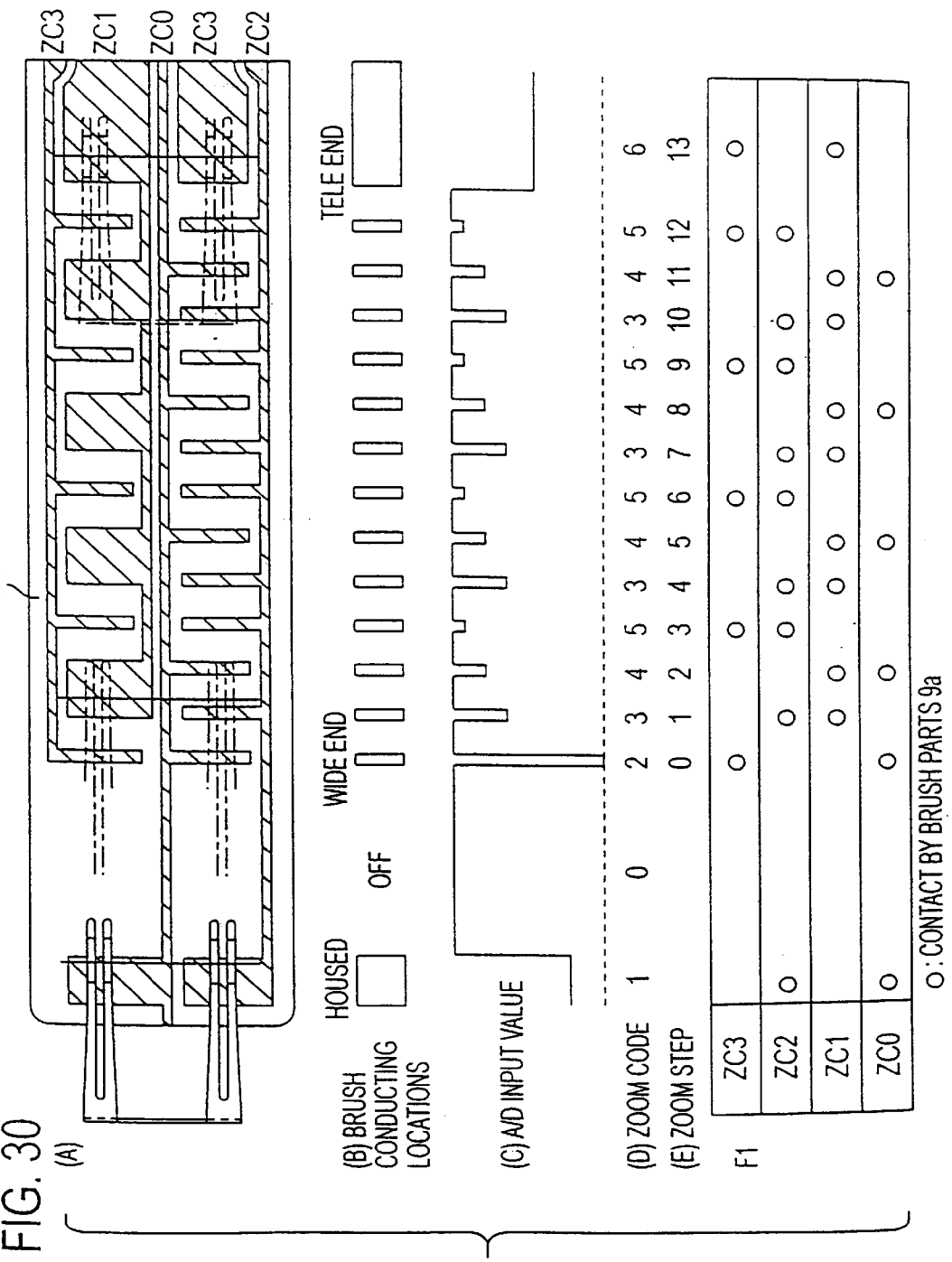
FIG. 30 is a schematic view of a structure of a zoom code plate and brushes, and a structure of detection of a position of a zoom code in contact with the brushes to detect a position of the lenses of the zoom lens camera.

As illustrated in FIG. 30, on the code plate 13a, four types of electrode patterns ZC0, ZC1, ZC2 and ZC3 are provided aligned in a direction perpendicular to the longitudinal direction of the code plate 13a. The electrode patterns ZC0, ZC1, ZC2 and ZC3 form a predetermined pattern in combination, so that a predetermined signal (i.e., voltage) may be output, when the pair of brushes 9a slide along the longitudinal direction of the code plate 13a, conducting through the electrode patterns ZC0, ZC1, ZC2 and ZC3 designated in advance corresponding to the slide position.

On the inner periphery of the linear guide barrel 17 a plurality of linear guide grooves 17a are formed parallel to the optical axis O. A plurality of lead grooves 17b are formed on the linear guide barrel 17 to extend through, and pass through, the peripheral wall of the linear guide barrel 17. The lead grooves 17b are formed oblique (inclined) to the optical axis.

The second moving barrel 19 engages with the inner periphery of the linear guide barrel 17. On the inner periphery of the second moving barrel 19, a plurality of lead grooves 19c are provided in a direction inclined oppositely to the lead grooves 17b. On the outer periphery of the rear end of the second moving barrel 19 a plurality of follower projections 19a, having a trapezoidal cross-sectional shape projecting away from the optical axis in a radial direction, are provided. Follower pins 18 are positioned in the follower projections 19a. Each follower pin 18 consists of a ring member 18a, and a center fixing screw 18b which supports the ring member 18a in the follower projection 19a. The follower projections 19a are in slidable engagement with the lead grooves 17b of the linear guide barrel 17, and the follower pins 18 are in slidable engagement with the linear guide grooves 16c of the third moving barrel 16. With such an arrangement, when the third moving barrel 16 rotates, the second moving barrel 19 moves linearly in the optical axis direction, while rotating.

Figure 8:
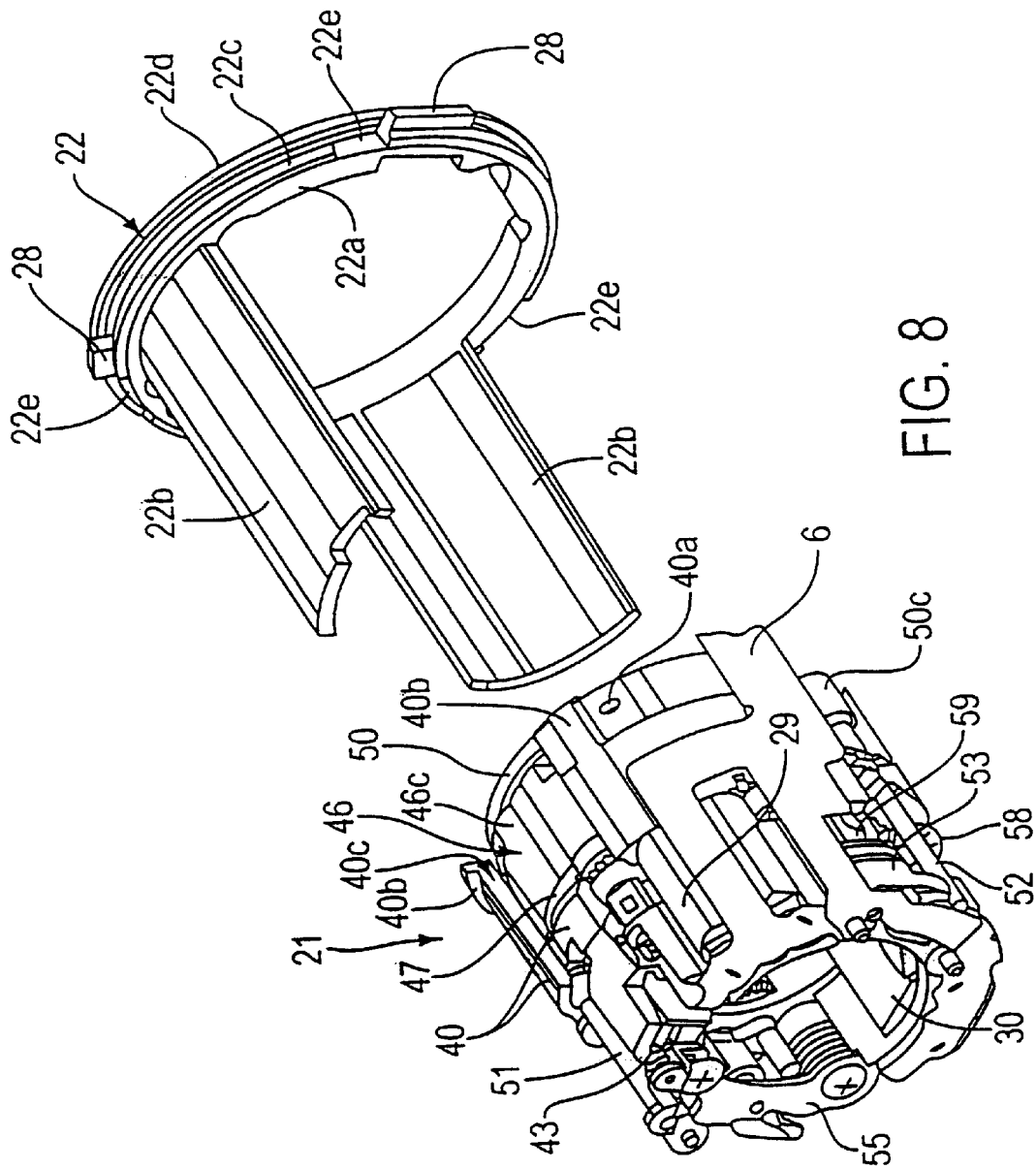
FIG. 8 is an enlarged schematic perspective view which shows part of a zoom lens barrel according to the present embodiment.
Figure 9:
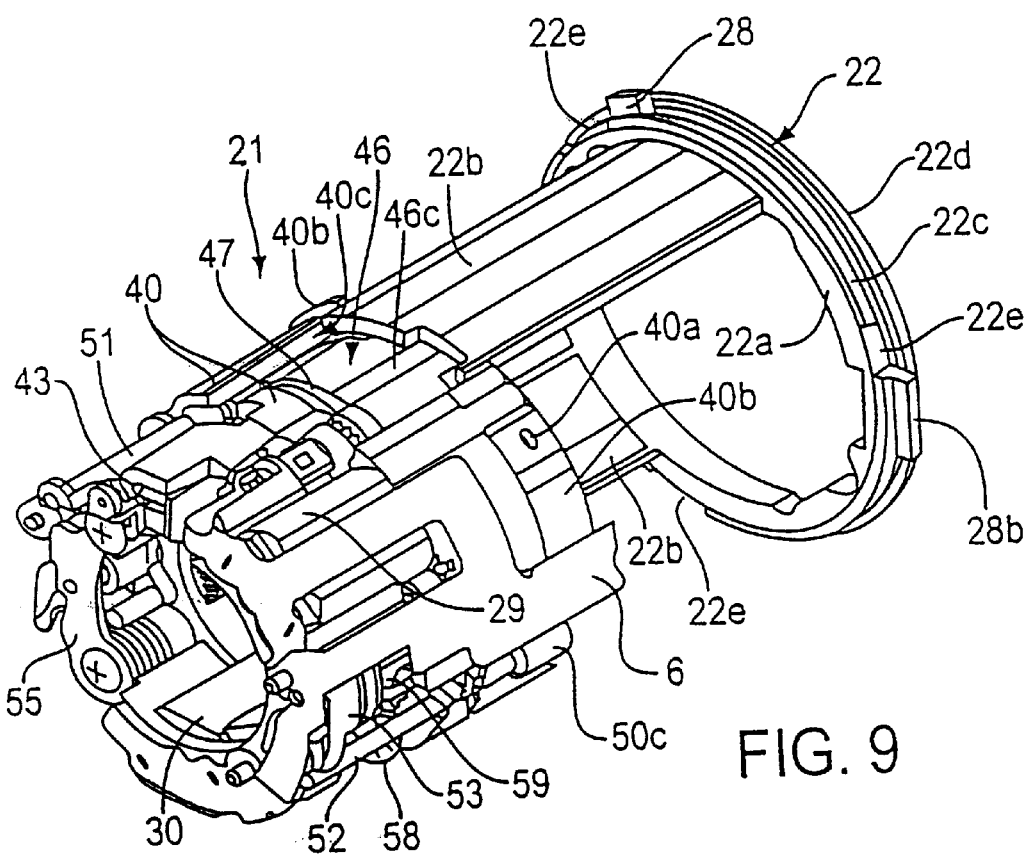
FIG. 9 is a schematic perspective view of the zoom lens barrel shown in FIG. 8, in a different condition.

On the inner periphery of the second moving barrel 19, the first moving barrel 20 is engaged. In the first moving barrel 20, a plurality of follower pins 24, provided on an outer periphery of the rear thereof, are engaged with the corresponding inner lead grooves 19c, and at the same time the first moving barrel 20 is guided linearly by a linear guide member 22. As shown in FIGS. 8 and 9, the linear guide member 22 is provided with an annular member 22a, a pair of guide legs 22b, which project from the annular member 22a in the optical axis direction, and a plurality of engaging projections 28 which project from the annular member 22a away from the optical axis in a radial direction. The engaging projections 28 slidably engage with the linear guide grooves 17a. The guide legs 22b are inserted between the inner peripheral face of the first moving barrel 20 and the AF/AE shutter unit 21.

The annular member 22a of the linear guide member 22 is connected to the rear of the second moving barrel 19, such that the linear guide member 22 and the second moving barrel 29 are capable of moving along the optical axis direction as a whole. In addition, the linear guide member 22 and the second moving barrel 19 are capable of relative rotation around the optical axis. On the outer periphery of the rear of the linear guide member 22 a rear end flange 22d is provided having a plurality of engaging projections 28b which project away from the optical axis in the radial direction. In front of the rear end flange 22d there is provided an anti-dropping flange 22c, having a radius smaller than the rear end flange 22d. Along the circumferential direction of the anti-dropping flange 22c, a plurality of notches 22e are formed, as shown in FIG. 8. On the inner periphery of the rear of the second moving barrel 19, a plurality of engaging projections 19b, projecting towards the optical axis in a radial direction, are provided as shown in FIG. 18. By inserting the engaging projections 19b into the notches 22e, the engaging projections 19b are positioned between the flanges 22c and 22d, and by relative rotation of the linear guide member 22, the engaging projections 19b are engaged with the linear guide member 22. With the above structure, when the second moving barrel 19 rotates clockwise or counterclockwise, the first moving barrel 20 moves linearly, forwardly and rearwardly in the optical axis direction, but is restricted from rotating.

Figure 10:
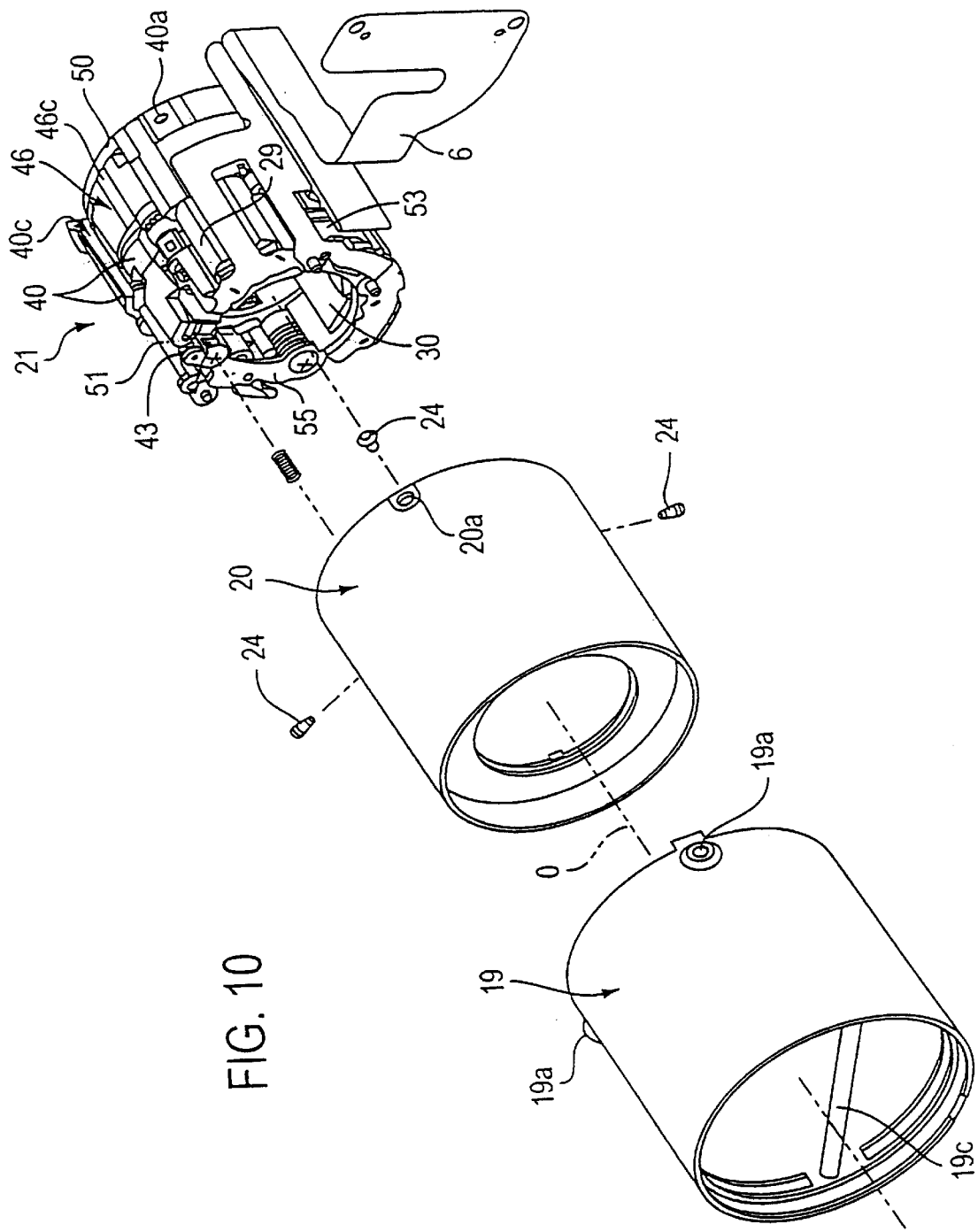
FIG. 10 is an enlarged exploded perspective view of a part of the zoom lens barrel of the present embodiment.
Figure 11:
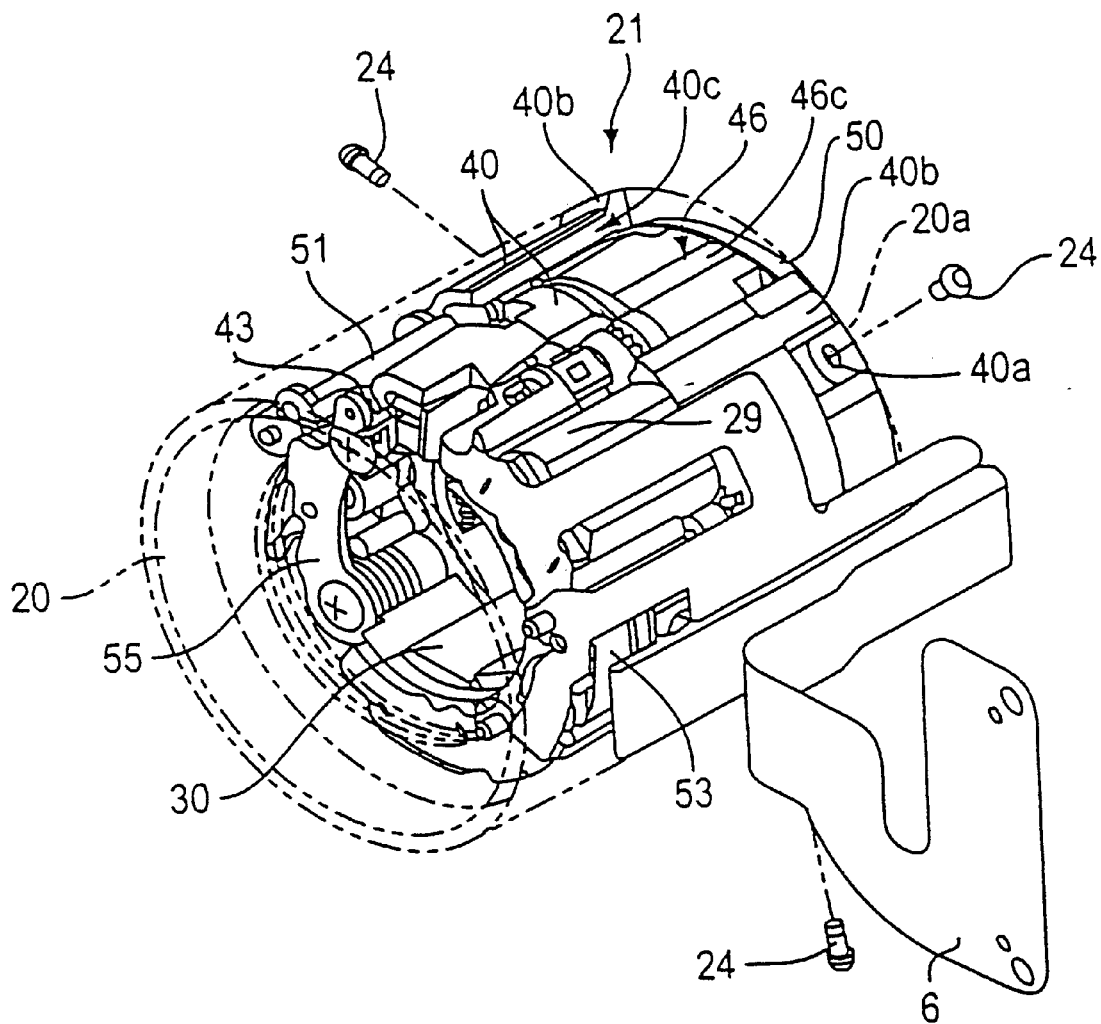
FIG. 11 is a schematic perspective view illustrating a state where an AF/AE shutter unit of the zoom lens barrel is mounted to a first moving barrel.
Figure 12:
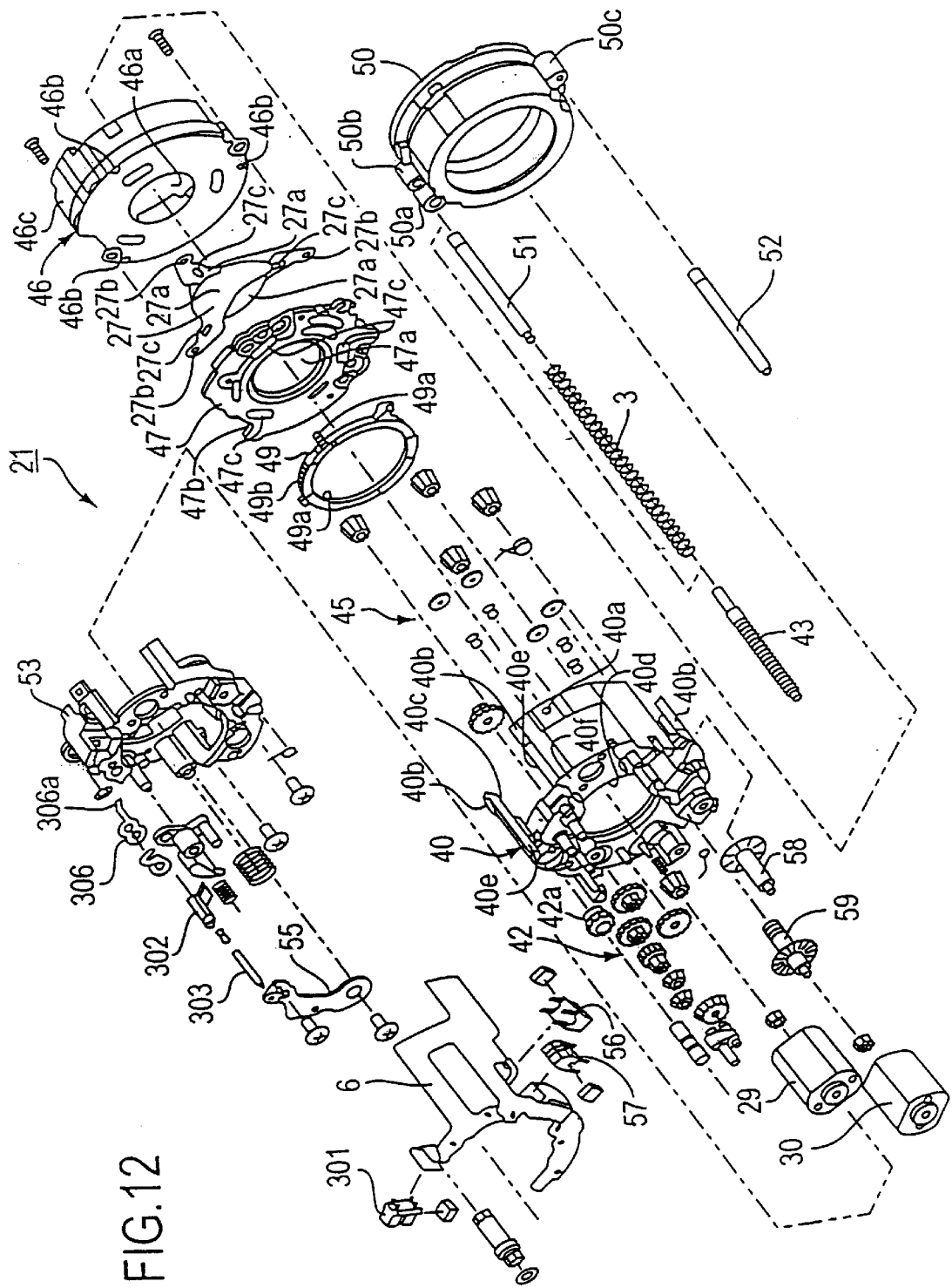
FIG. 12 is an exploded perspective view illustrating main parts of the AF/AE shutter unit of the zoom lens.

At the front of the first moving barrel 20, a barrier apparatus 35 having barrier blades 48a and 48b is mounted, and on an inner peripheral face of the first moving barrel 20 the AF/AE shutter unit 21 having the shutter 27, consisting of three shutter blades 27a, is engaged and fixed (FIG. 12). The AF/AE shutter unit 21 is provided with a plurality of fixing hollows 40a formed at even angular intervals on the outer periphery of the shutter mounting stage 40 as shown in FIG. 10. The plurality of follower pins 24 serve to fix the AF/AE shutter unit 21. The follower pins 24 are inserted and fixed in hollows 20a, formed on the first moving barrel 20, and in the fixing hollows 40a. with this arrangement the shutter unit 21 is secured to the first moving barrel 20 as shown in FIG. 11. For example, the follower pins 24 may be fixed by an adhesive or by screws for example. For reference, numeral 41 (FIG. 19) is a decorative plate secured to the front of the first moving barrel 20.

Figure 19:
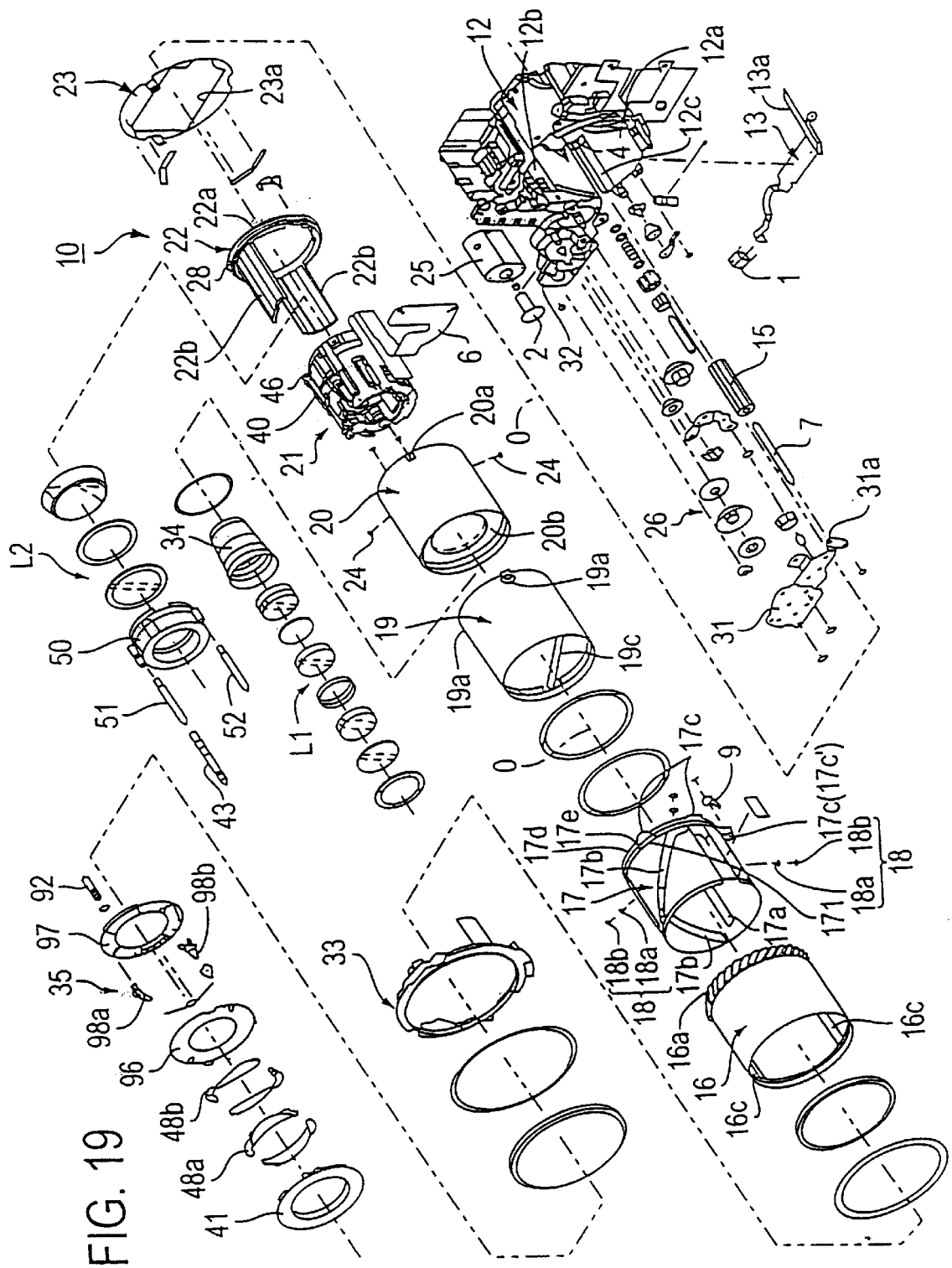
FIG. 19 is an exploded perspective view of the overall structure of the zoom lens barrel.

As illustrated in FIGS. 12 and 19, the AF/AE shutter unit 21 is provided with the shutter mounting stage 40, a shutter blade supporting ring 46 fixed on the rear of the shutter mounting stage 40, and the lens supporting barrel 50 (i.e., for the rear lens group L2) supported in a state of being capable of movement relative to the shutter mounting stage 40. On the shutter mounting stage 40, the front lens group L1, the AE motor 29, and the rear lens group driving motor 30, are supported. The shutter mounting stage 40 is provided, with an annular member 40f having a photographing aperture 40d. The shutter mounting stage 40 is also provided with three legs 40b which project rearwards from the annular member 40f. Three slits are defined between the three legs 40b, and two of the slits comprise linear guides 40c, which slidably engage with the respective pair of guide legs 22b of the linear guide member 22, so as to guide the movement of the linear guide member 22.

The shutter mounting stage 40 supports an AE gear train 45, which transmits rotation of the AE motor 29 to the shutter 27, a lens driving gear train 42, which transmits rotation of the rear lens group driving motor 30 to a screw shaft 43, photointerrupters 56 and 57, connected to the flexible printed circuit board 6, and rotating plates 58 and 59, having a plurality of radially formed slits provided in the circumferential direction. An encoder for detecting a rotation of the rear lens group driving motor 30 consists of the photointerrupter 57 and the rotating plate 59, and an encoder for detecting a rotation of the AE motor 29 consists of the photointerrupter 56 and the rotating plate 58.

The shutter 27, a supporting member 47 which pivotally supports the three shutter blades 27a of the shutter 27, and a circular driving member 49, which provides rotative power to the shutter blades 27a, are positioned between the shutter mounting stage 40 and a shutter blade supporting ring 46, secured to the shutter mounting stage 40. The circular driving member 49 is provided with three operating projections 49a spaced at even angular intervals, which respectively engage with each of the three shutter blades 27a. As shown in FIG. 12, the shutter blade supporting ring 46 is provided, at a front end thereof, with a photographing aperture 46a and with three supporting hollows 46b positioned at even angular intervals around the photographing aperture 46a. On an outer periphery of the shutter blade supporting ring 46 there is provided a deflection restricting member 46c, which is exposed from the linear guides 40c and which slidable supports the inner peripheral faces of the pair of guide legs 22b.

The supporting member 47 positioned in front of the shutter blade supporting ring 46 is provided with a photographing aperture 47a, aligned with the photographing aperture 46a, and with three shafts 47b (only one of which is illustrated in FIG. 12) at respective positions opposite the three supporting hollows 46b. Each of the three shutter blades 27a are respectively provided with a shaft hole 27b into which one end of each respective shaft 47b is inserted, with a blocking part (not shown) which prevents unwanted light from entering the photographing apertures 46a and 47a at the other end, and with a slot 27c, through which the operating projection 49a is inserted, between the one end and the other end thereof. The supporting member 47 is fixed to the shutter blade supporting ring 46 in such a manner that each shaft 47b, which supports a corresponding shutter blade 27a, is engaged with a corresponding supporting hollow 46b of the shutter blade supporting ring 46.

On the outer periphery of the circular driving member 49, gears 49b are provided to receive the rotation from the gear train 45. The supporting member 47 is provided, at the position close to the three shafts 47b, with three arc grooves 47c, which are arched in the circumferential direction. The three operating projections 49a of the circular driving ring 49 engage with the slots 27c of the respective shutter blades 27a through the three arc grooves 47c. The shutter blade supporting ring 46 is inserted from the rear of the shutter mounting stage 40, to support the circular driving ring 49, the supporting member 47 and the shutter 27, and is fixed on the shutter mounting stage 40 by screws.

At the rear of the shutter blade supporting ring 46, the lens supporting barrel 50 is positioned such that the lens supporting barrel 50 is capable of relative movement with respect to the shutter mounting stage 40 via slide shafts 50 and 51. The shutter mounting stage 40 and the lens supporting barrel 50 are urged by a coil spring 3 fitted to the slide shaft 51, to move in opposite directions away from each other. Therefore, play between the supporting barrel 50 and the slide shaft 51 is reduced. In addition, a driving gear 42a provided in the gear train 42 is restricted to move in the axial direction, and on the inner periphery thereof, an internal thread (not shown) is formed. The screw shaft 43, one end of which is fixed to the lens supporting barrel 50, engages the internal thread, and a feed screw structure is provided consisting of the driving gear 42a and the screw shaft 43. In such a manner, when the driving gear 42a rotates clockwise or counterclockwise due to driving by the rear lens group driving motor 30, the screw shaft 43 respectively moves forwardly or rearwardly with respect to the driving gear 42a and the lens supporting barrel 50. In other words, the rear lens group L2 supported by the lens supporting barrel 50, moves relative to the front lens group L1.

At the front of the shutter mounting stage 40, pressers 53 and 55, which press against respective motors 29 and 30, are screwed to the shutter mounting stage 40. The motors 29, 30 and the photointerrupters 56, 57 are connected to the flexible printed circuit board 6. One end of the flexible printed circuit board 6 is fixed to the shutter mounting stage 40. When the first, second and third moving barrels 20, 19 and 16, and the AF/AE shutter unit 21 and the like are assembled, the aperture plate 23 is fixed to the rear of the linear guide barrel 17. At the front of the fixed lens barrel block 12, an anti-dropping member 33, having a circular shape, is engaged.

At the front of the first moving barrel 20, which is positioned at the front most part of the zoom lens barrel 10, the barrier apparatus 35, having pairs of barrier blades 48a and 48b, serving respectively as follower barrier blades and main barrier blades, are provided. Towards the rear of the decorative plate 41, an annular plate 96 is fixed, and between the decorative plate 41 and the annular plate 96, the barrier blades 48a and 48b are connectively engaged. In addition, at the front of the first moving barrel 20, between a front surface 20b and the annular plate 96, a barrier driving ring 96, having a pair of barrier driving levers 98a and 98b, is rotatively provided. The barrier driving ring 97, is rotated clockwise or counterclockwise, by a barrier interlocking gear 92 which drives rotatively upon receiving a rotation of the rear lens group driving motor 30, and via the barrier driving levers 98a and 98b opens or closes the main barrier blades 48b together with the follower barrier blades 48a.

While in the above description of the present invention, the zoom lens consisted of two groups, namely the front lens group L1 and the rear lens group L2, it should be understood that the present invention is not limited to the embodiment disclosed above. In addition, in the above embodiment, the front lens group L1, and the rear lens group L2, supported by the lens supporting barrel 50, are provided as components of the AF/AE shutter unit 21, and the rear lens group driving motor 30 is mounted to the shutter unit 21. With such a structure, although the supporting structure and the driving structure of the rear lens group L2 are simplified, the present zoom lens may also be realized in such a manner by making the rear lens group L2 a member apart from the AF/AE shutter unit 21. In this alternative, the AF/AE shutter unit 21 is provided with the shutter mounting stage 40, the circular driving member 49, the supporting member 47, the shutter blades 27, the shutter blade supporting ring 46 and the like, and that the rear lens group L2 is supported by a supporting member other than the AF/AE shutter unit 21.

In the zoom lens camera of the present invention, the operation by rotation of the whole unit driving motor 25 and the rear lens group driving motor 30 will now be described.

Figure 16:
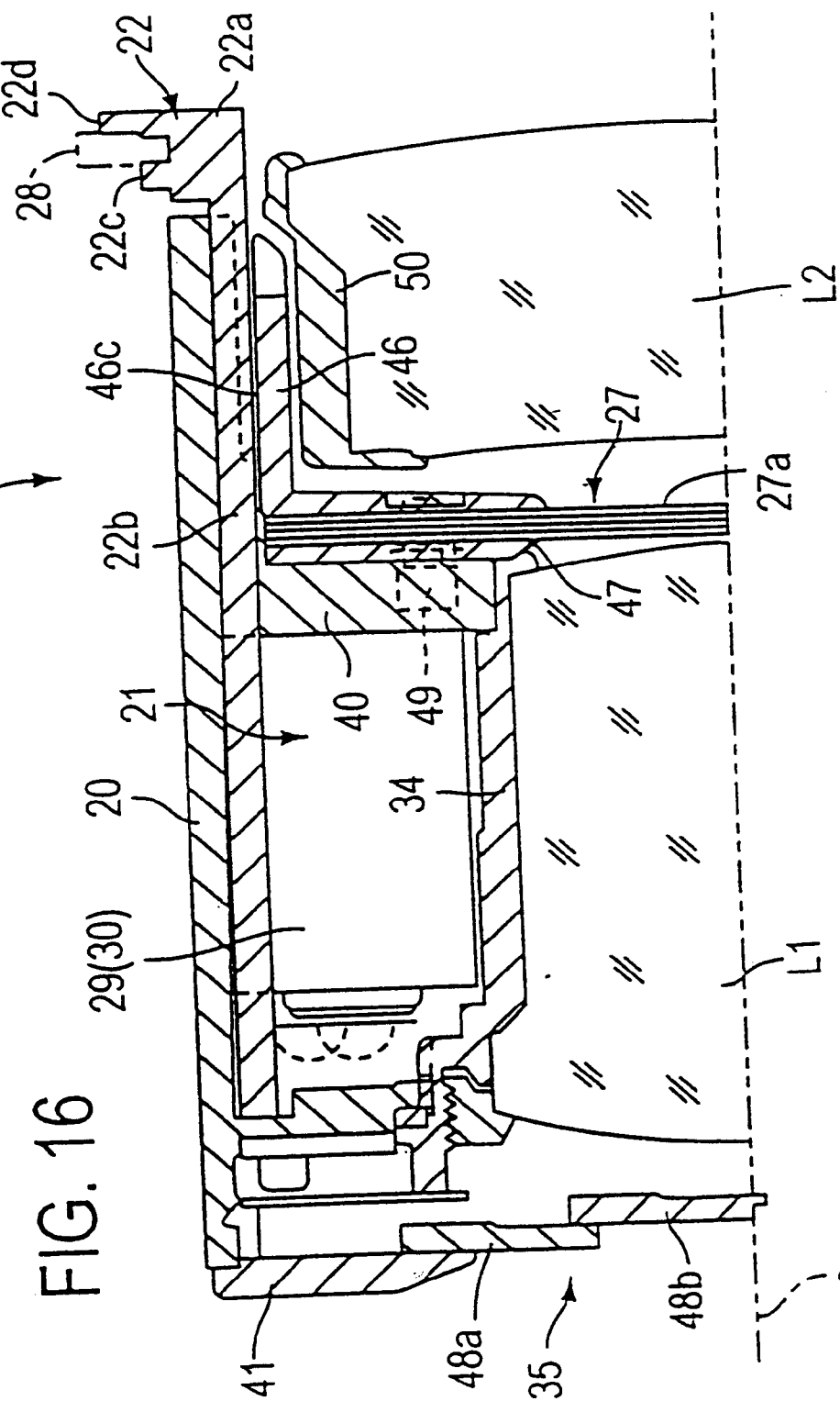
FIG. 16 is a sectional view of an upper part of the zoom lens barrel, when in a housed state, illustrating essential parts.
Figure 17:
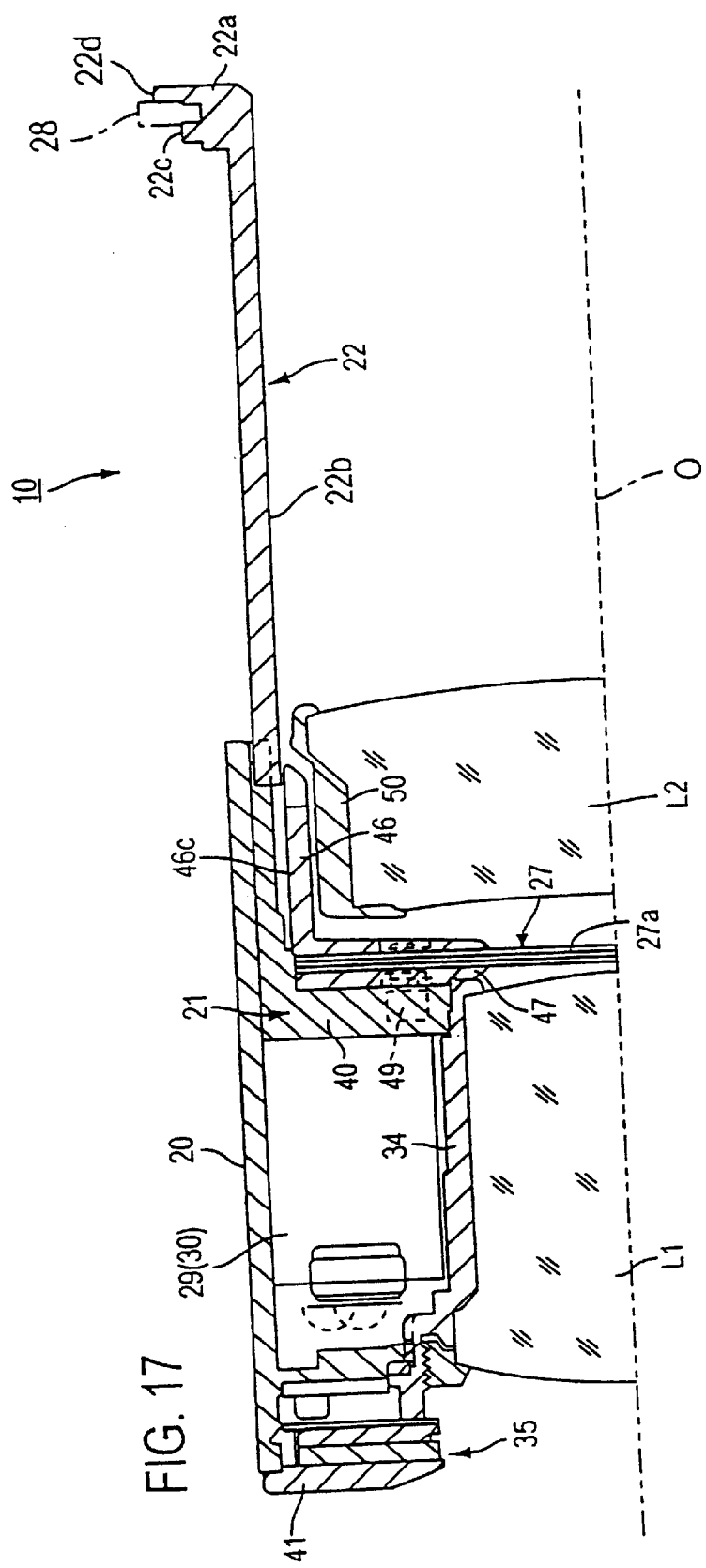
FIG. 17 is a sectional view of an upper part of the zoom lens barrel, illustrating essential parts in a maximum extended state.

As shown in FIG. 16, when the zoom lens barrel 10 is at the most retracted (withdrawn) position, i.e., the lens-housed condition, when the power switch is turned ON, the whole unit driving motor 25 rotates by a small amount in the clockwise direction. This rotation is transmitted, via a gear train 26 which is supported by a supporting member 32, to the driving pinion 15. The third moving barrel 16 is rotated in the optical axis direction (i.e., is extended), the second moving barrel 19 and the first moving barrel 20 are extended by a small amount in the optical axis direction, along with the third moving barrel 16, which places the camera in a state capable of photographing, with the zoom lens positioned at the widest position,, i.e., the wide end. At this time, due to the fact that the amount of movement of the linear guide barrel 17, with respect to the fixed lens barrel block 12, is detected through the relative sliding movement between the code plate 13a and the contacting terminal 9, the focal length of the zoom lens, i.e., the front and rear lens group L1 and L2, is also detected.

In the photographable state as above described, when the zoom "tele" switch is turned ON, the whole unit driving motor 25 drives clockwise, and rotates the third moving barrel 16 in the direction in which it is extended via the driving pinion 15 and the outer peripheral gear 16b. Therefore, the third moving barrel 16 is extended from the fixed lens barrel block 12, according to the relationship between the female helicoid 12a and the male helicoid 16a, and at the same time, the linear guide barrel 17, which moves without relative rotation to the fixed lens barrel block 12, because of the engaging projections 17c and the linear guide grooves 12b, moves forwardly in the optical axis direction together with the third moving barrel 16. At this time, the simultaneous engagement of the follower pins 18 with the lead groove 17b and the linear guide groove 16c causes the second moving barrel 19 to move forward relative to the third moving barrel 16 in the optical axis direction, while rotating relative to and in the same direction as the third moving barrel 16. The first moving barrel 20, which is guided linearly by the linear guide member 22 and the follower pins 24 which are guided by the lead grooves 19c, moves forwardly in the optical axis direction together with the AF/AE shutter unit 21, from the second moving barrel 19, without relative rotation to the fixed lens barrel block 12. During such movements, because the position of the linear guide barrel 17 as it moves with respect to the fixed lens barrel block 12 is detected through the relative sliding between the code plate 13a and the contacting terminal 9, the focal length can be set by the zoom operation device 62.

When the zoom "wide" switch is turned ON, the whole unit driving motor 25 drives counterclockwise, and the third moving barrel 16 is rotated in the direction in which it is retracted such that the third moving barrel 16 is retracted into the fixed lens barrel block 12 together with the linear guide barrel 17. At the same time, the second moving barrel 19 is retracted into the third moving barrel 16, while rotating in the same direction as that of the third moving barrel 16, and the first moving barrel 20 is retracted into the rotating second moving barrel 19 together with the AF/AE shutter unit 21. During the above retraction driving, as in the case of extending driving as above described, the rear lens group driving motor 30 is not driven.

Figure 15:
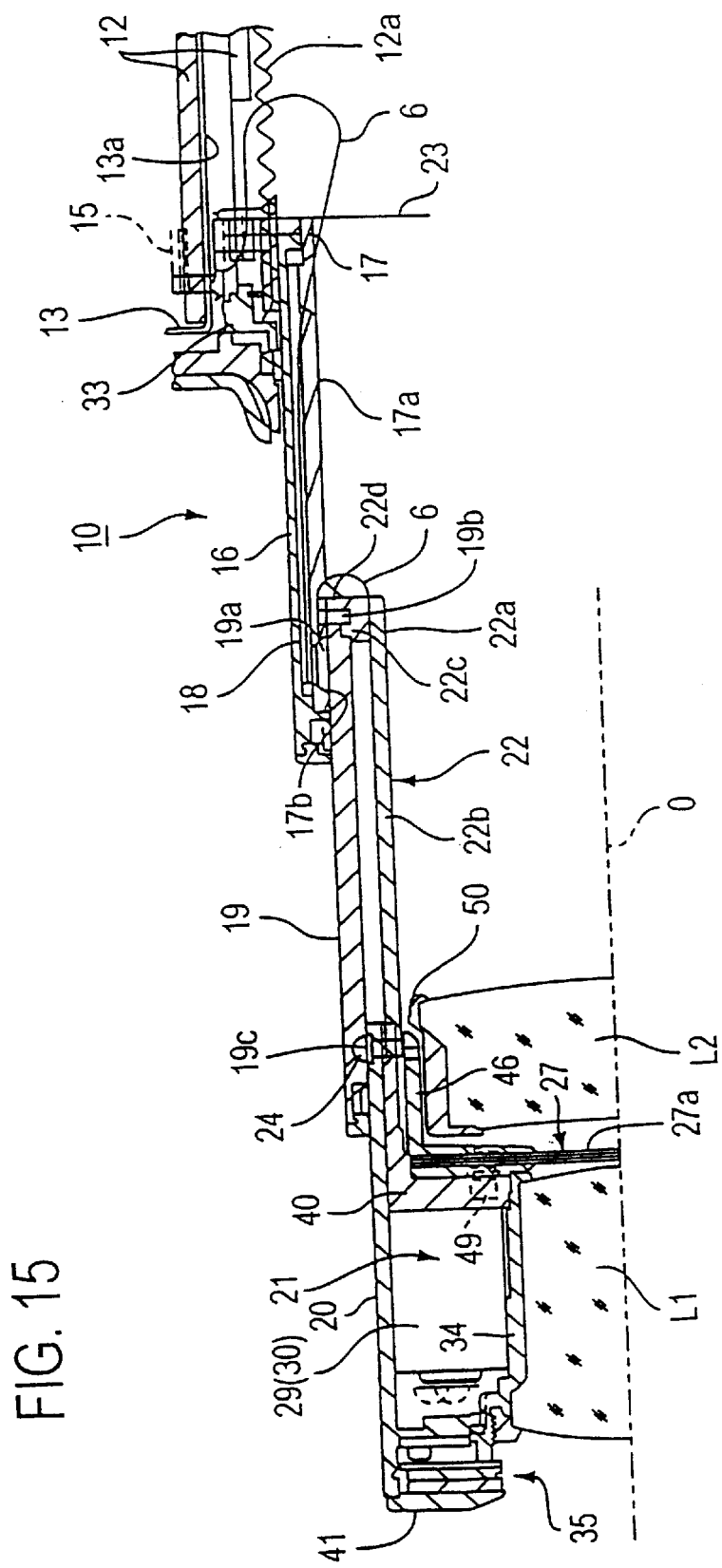
FIG. 15 is a sectional view of an upper part of the zoom lens barrel of the present invention in a most extended state.

While the zoom lens 10 is driven during the zooming operation, since the rear lens group driving motor 30 is not driven, the front lens group L1 and the rear lens group L2 move as a whole, maintaining a constant distance between each other, as shown in FIG. 15. The focal length inputted via the zoom code plate 13a is indicated on the LCD panel 224.

At any focal length set by the zoom operating device 62, when the release button 217B is depressed by a half-step, the CPU 210 obtains focusing information from the object distance measuring apparatus 64 and photometering information from the photometering apparatus 65. In such a state, when the release button 217B is fully depressed, the CPU 210 moves the whole unit driving motor 25 and the rear lens group driving motor 30 by an amount corresponding to the focal length information set in advance by the operation, and by the subject distance information from the object distance measuring apparatus 64. This has the effect of moving the whole unit driving motor 25 and the rear lens group driving motor 30 to the specified focal length, bringing the subject into focus. Further, via the AE motor controlling circuit 66, the AE motor 29 drives the circular driving member 49 according to subject luminance information obtained from the photometering apparatus 65, and drives the shutter 27 in order to satisfy the required exposure. After the shutter release operation, the whole unit driving motor 25 and the rear lens group driving motor 30 are both driven immediately, and the front lens group L1 and the rear lens group L2 are moved to the position prior to shutter release.

Figure 18:
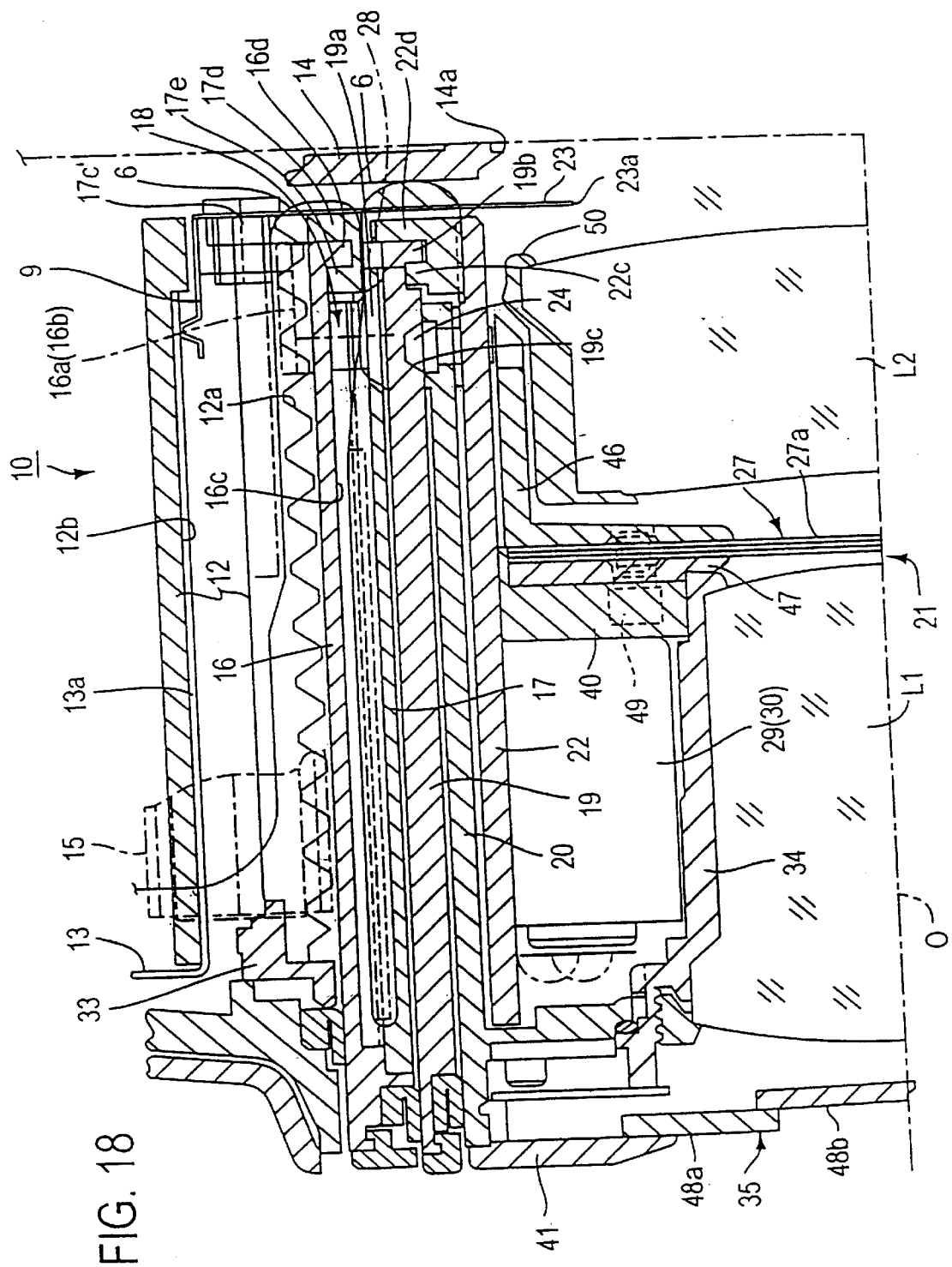
FIG. 18 is a sectional view of an upper part of the zoom lens barrel in a housed state.

When a power switch 212 is turned OFF and the electric power is disconnected, the zoom lens 10 is retracted to the lens housed position as shown in FIG. 18 by the whole unit driving motor 25. Before the withdrawal movement, the whole unit driving motor 25 is driven, and the rear lens group L2 moves to the home position.

In regard to the movement control of the front lens group L1 and the rear lens group L2 which is performed when the release button 217B is fully depressed, the rear lens group driving motor 30 moves the rear lens group L2 rearwardly away from the front lens group L1, by an amount corresponding to the subject distance information obtained from the object distance measuring apparatus 64 and the focal length information set by the zoom operating device 31. At the same time, the whole unit driving motor 25 moves the front lens group L1 by an amount corresponding to the subject distance information obtained from the object distance measuring apparatus 64 and the focal length information set by the zoom operating device 31. Due to the movement of the front lens group L1 and the rear lens group L2, the focal length is set and subject focusing is performed. After completion of the shutter release, the rear lens group driving motor 30 and the whole unit driving motor 25 are driven immediately, so that both lens groups L1 and L2 are returned to the position they were at prior to the shutter release.

When the zoom operating device 62 is operated to the "wide" position, the whole unit driving motor 25 drives counterclockwise, and the third moving barrel 16 is rotated in the retraction direction, and is retracted into a cylinder 11 of the fixed lens barrel block 12, together with the linear guide barrel 17. At the same time, the second moving barrel 19 is retracted into the third moving barrel 16, with a rotation similar to that of the third moving barrel 16, and the first moving barrel 20 is retracted into the rotating second moving barrel 19 together with the AF/AE shutter unit 21. During the above retraction driving, and as in the case of extension driving as above mentioned, the rear lens group driving motor 30 is not driven. When the power switch is OFF, the zoom lens 10 is retracted to the housed position as shown in FIG. 18, by driving the whole unit driving motor 25 accordingly.

A detailed description in regard to lens drive control, which is one of the characteristics of the zoom lens barrel of the zoom lens camera of the present embodiment of the present invention, will now be described with reference to FIGS. 24 and 25.

Figure 24:
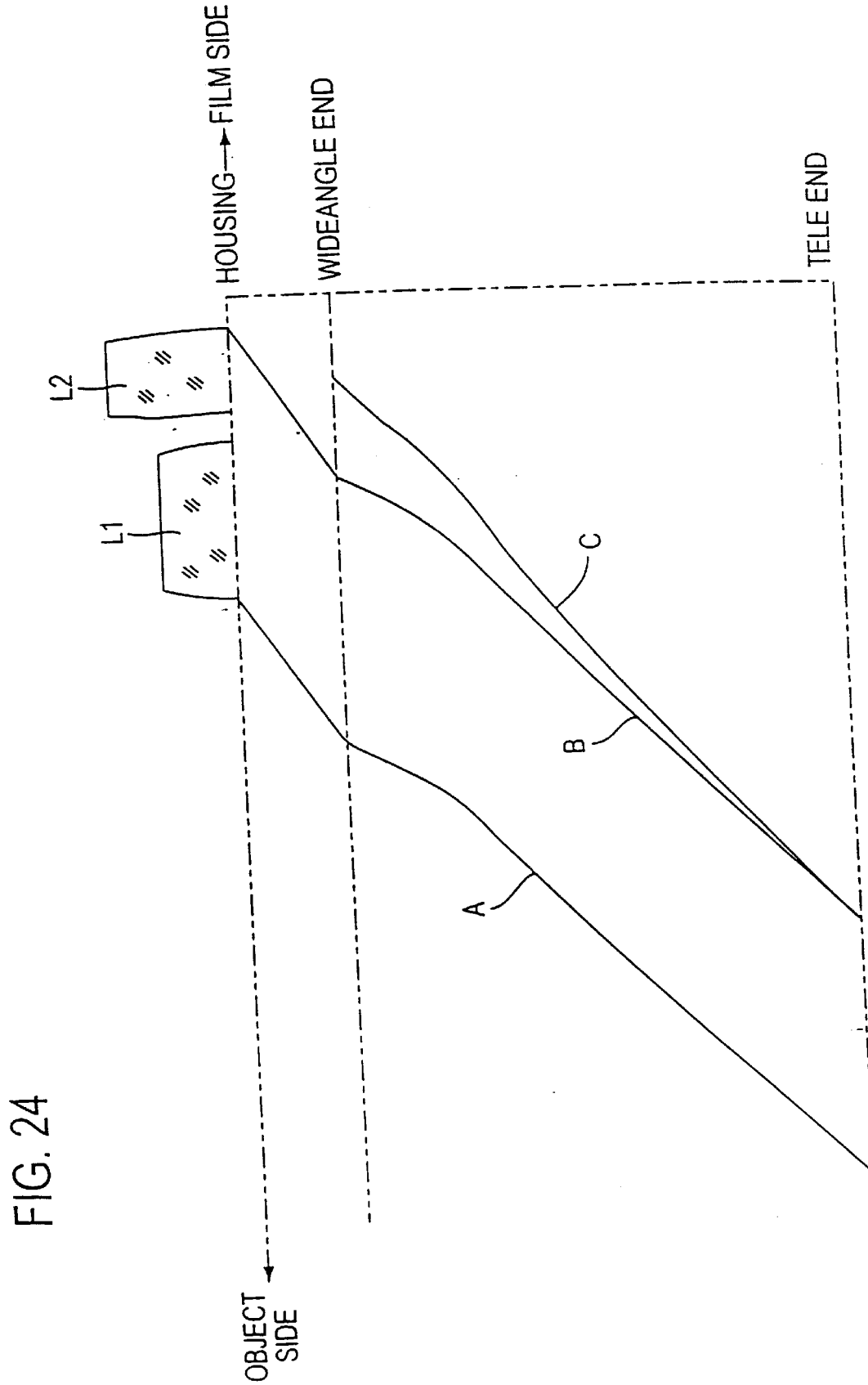
FIG. 24 is a schematic view illustrating loci of movements of the front lens group and the rear lens group.
Figure 25:
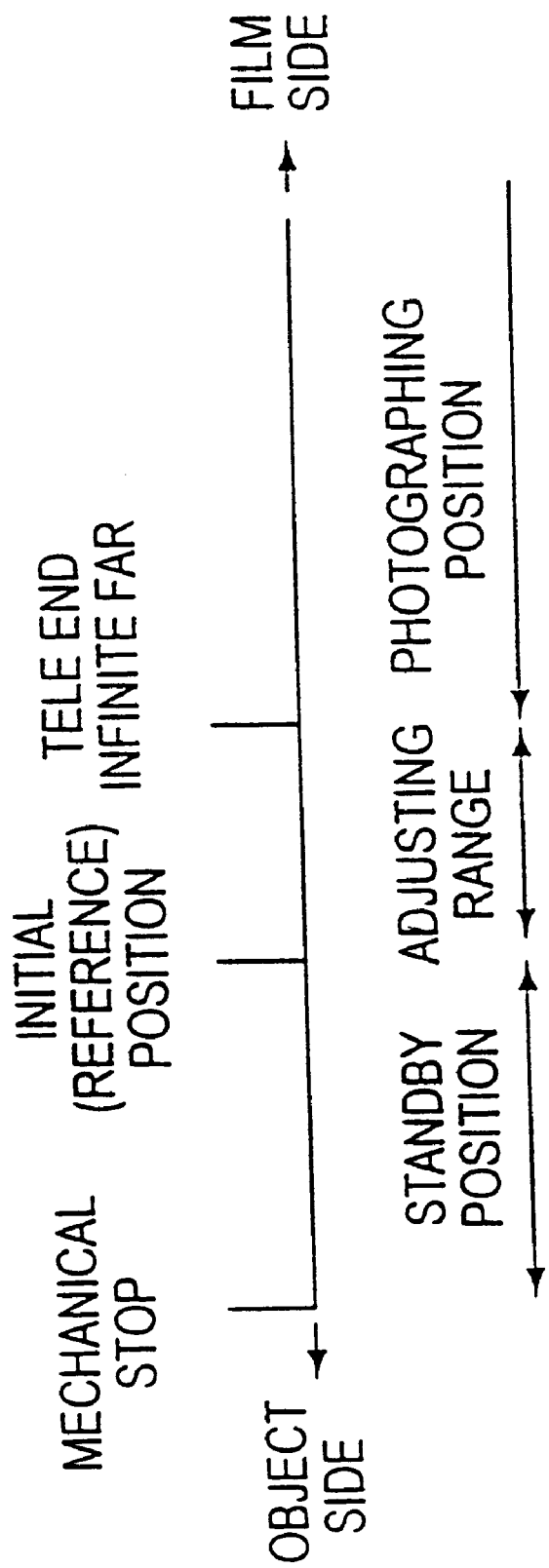
FIG. 25 is a schematic view illustrating movements of the rear lens group with respect to the front lens group.

FIG. 24 illustrates the loci of the movements of the front lens group L1 and the rear lens group L2, and FIG. 25 illustrates the range of movement of the rear lens group L2 compared to the front lens group L1.

In FIG. 24, line A represents the locus of movement of the front lens group L1, line B represents the locus of movement of the rear lens group L2 before the release button is fully depressed, and line C represents the locus of movement of the rear lens group L2 when the release button is fully depressed. As can be understood from FIG. 24, during focusing, the distance between the front lens group L1 and the rear lens group L2 is wider at the "wide" end (i.e. "W" end) position, and is shorter at the "tele" end (i.e., "T" end) position.

As shown in FIG. 25, before and during an operation of the zoom operating device 62, the rear lens group L2 is positioned at the standby position, and the constant distance to the front lens group L1 is maintained. When the release button is fully depressed, the rear lens group L2 moves rearwardly, namely to the right in FIG. 25, and moves to the photographing position and focusing is performed. When the rear lens group L2 moves rearwardly, the initial position (i.e., the reference position) of the rear lens group L2 (i.e., the rear lens supporting barrel 50) is detected via a photo sensor (not shown), and from the initial moment of position detecting, a pulse counting operation is commenced. When the pulse counting reaches a value corresponding to an amount of movement corresponding to the subject distance information obtained from the object distance measuring apparatus 64 and the focal length information set by the zoom operating device 62, the rear lens group driving motor 30 is stopped.

In FIG. 25, the range indicated as "Adjusting Range", represents a range corresponding to the minimum value of the pulse counting from the initial position, when the zoom lens barrel 10 is positioned at the "tele" end and the focused subject is at infinity. Therefore, the rear lens group L2 is moved rearwardly with respect to the front lens group L1, by an amount, such as the adjusting quantity, from the initial position.

Figure 21:
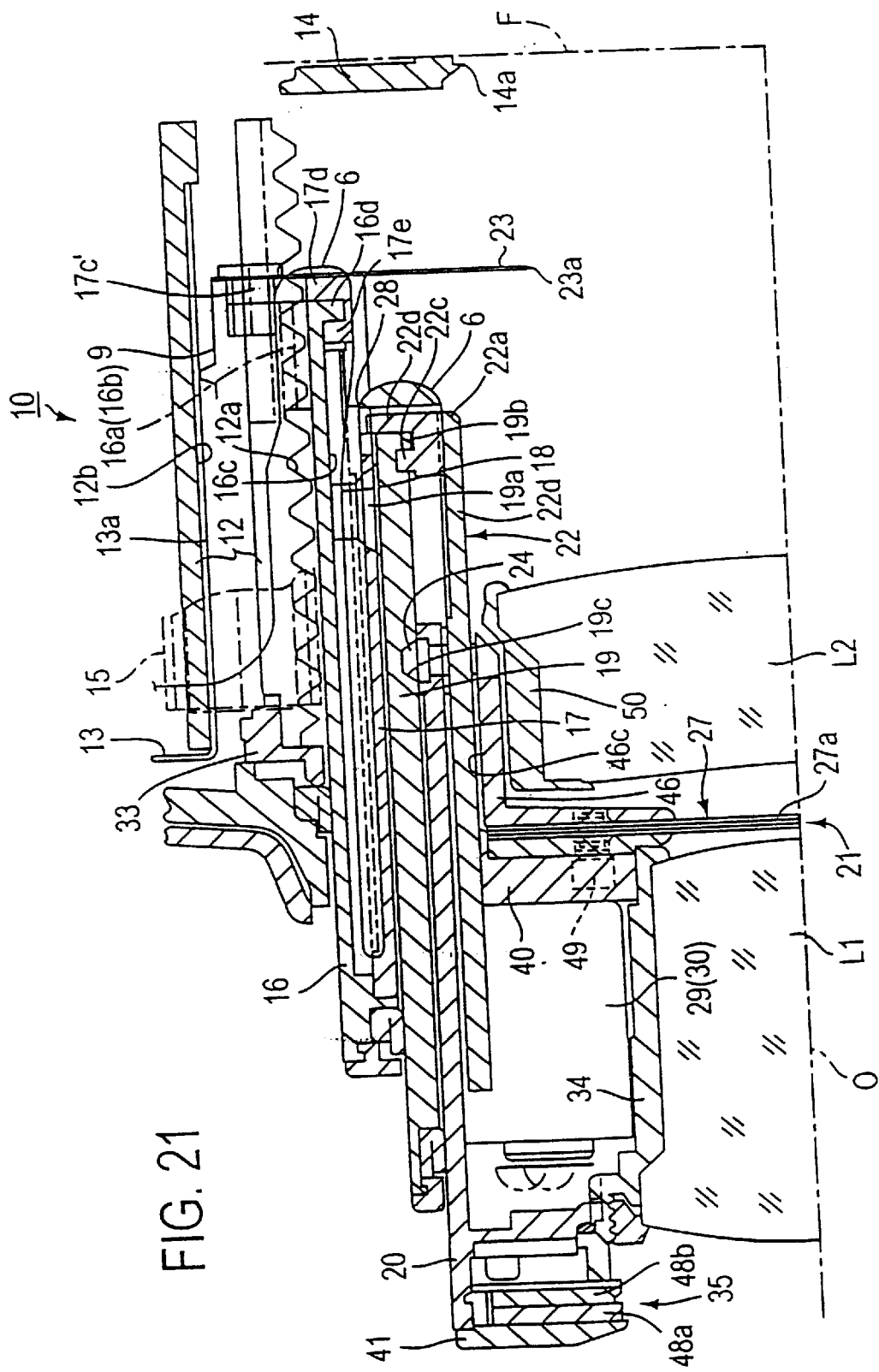
FIG. 21 is a sectional view illustrating a state when the zoom lens barrel is positioned close to a "wide" end, and further a state before a release button is released.
Figure 22:
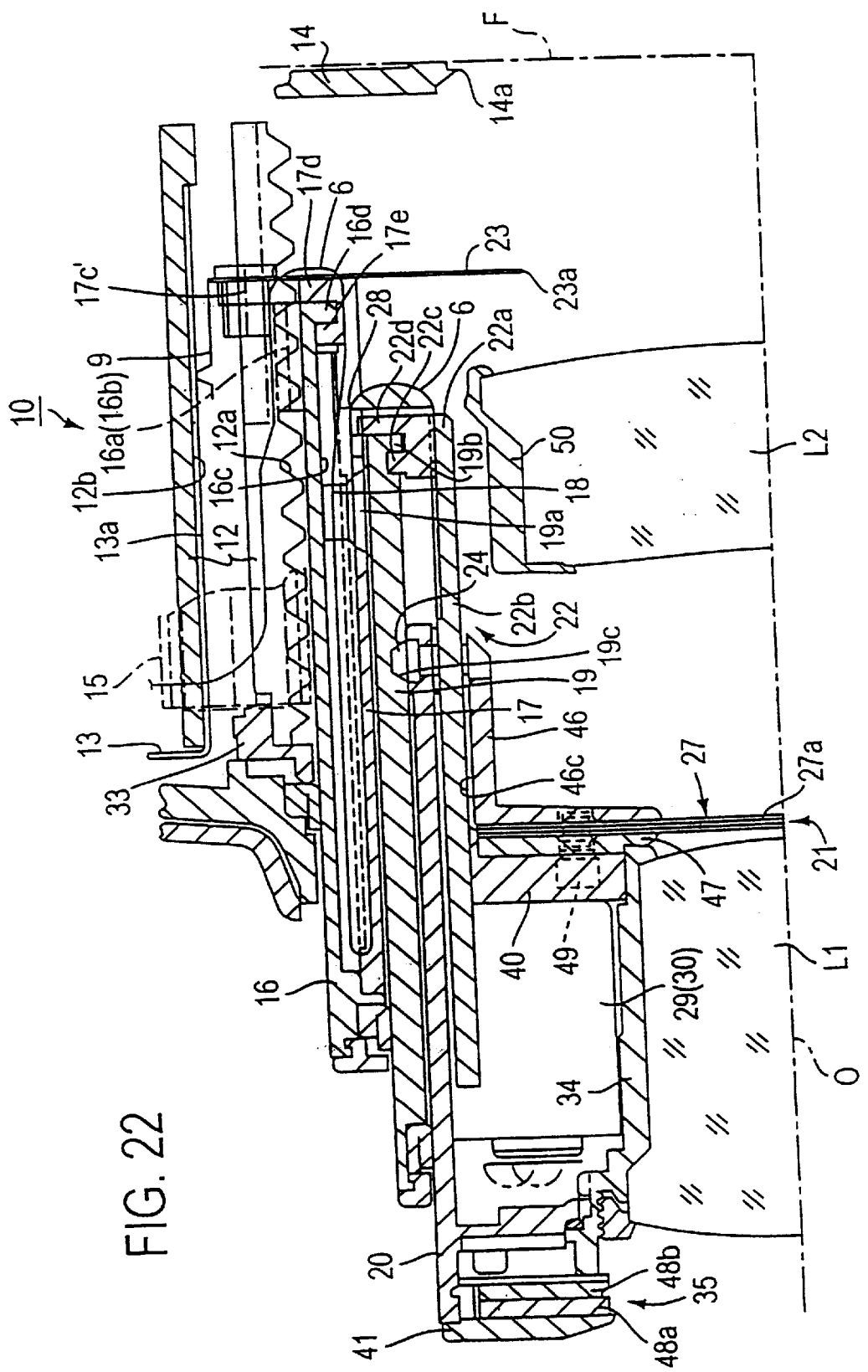
FIG. 22 is a sectional view illustrating a state when the zoom lens barrel is positioned close to a "wide" end, and further a state immediately after the release button is released.

FIG. 21 illustrates the state when the zoom lens barrel 10 is in the "wide" end position, before the release button has been fully depressed. FIG. 22 illustrates the state when the zoom lens barrel 10 is in the "wide" end position, immediately after the release button has been fully depressed. As above described, from the state as shown in FIG. 22, after the shutter release is complete, the rear lens group driving motor 30 is driven immediately, and the rear lens group L2 moves towards the front lens group L1, returning the zoom lens barrel 10 to the state as shown in FIG. 21.

Figure 23:
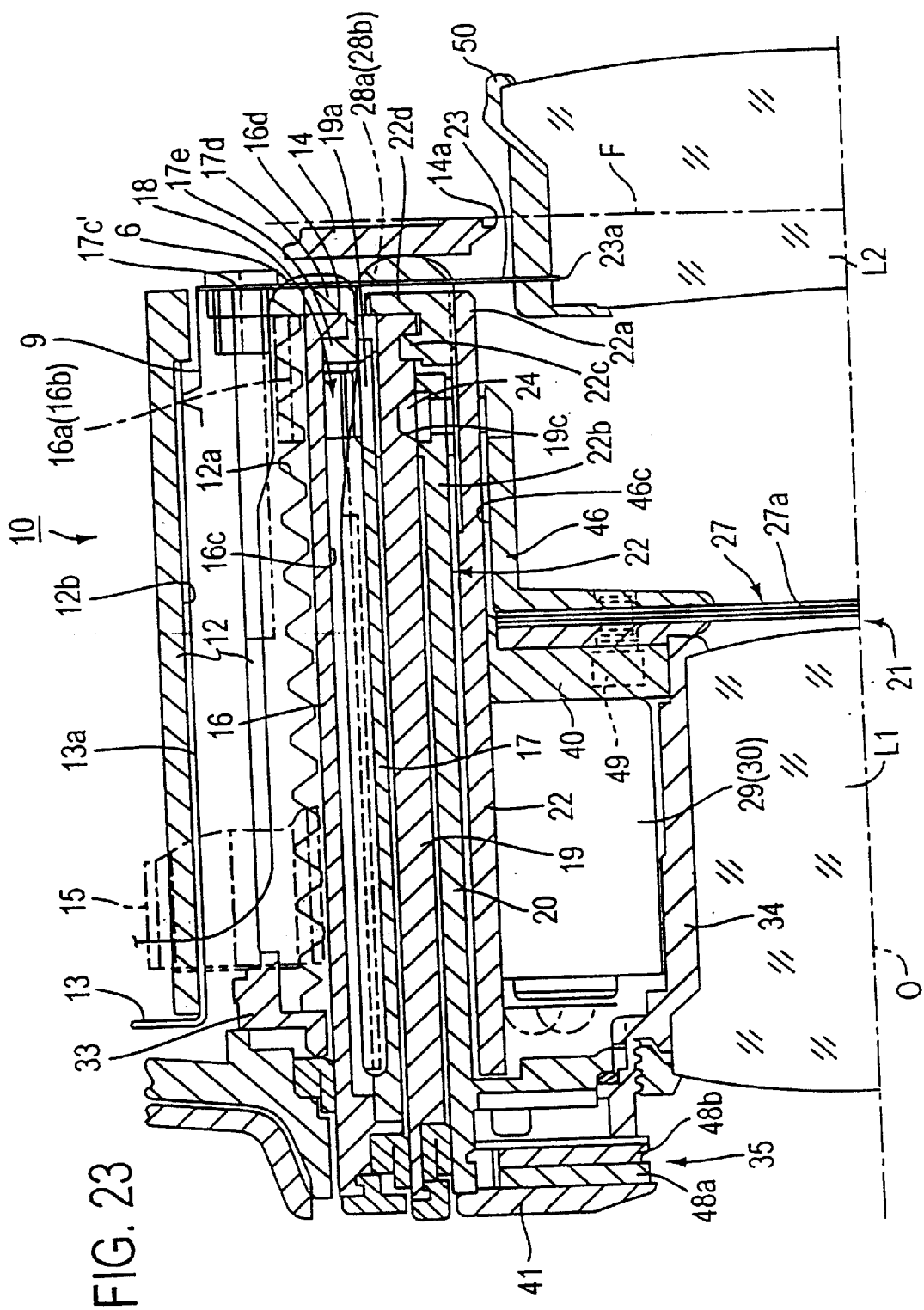
FIG. 23 is a sectional view illustrating a state when an external force in the direction of the camera body is made to the front of the first moving barrel, and a whole lens barrel unit is retracted into the camera body, and the a rear lens group collides with a film F.

If the rear lens group driving motor 30 is not immediately driven after completion of the shutter release from the state as shown in FIG. 22, the rear lens group L2 remains in the photographing position, if a serious external force or impact is made towards the front of the first moving barrel 20, in a direction towards the main body of the camera (i.e., namely to the right in FIG. 22), all the moving barrels, namely, the first moving barrel 20, the second moving barrel 19 and the third moving barrel 16, will be forced into the main body of the camera, and in such a case, the rear lens group L2 may collide with a film F. Therefore, not only may the film F or the rear lens group L2 be damaged, but other devices within the camera may be damaged. Such a state is illustrated in FIG. 23.

However, because the lens drive control of the zoom lens barrel provided in the camera of the present embodiment immediately drives the rear lens group driving motor 30 after completion of the shutter release from the state as shown in FIG. 22, the rear lens group L2 is moved towards the front lens group L1 and is returned to the position as shown in FIG. 21. Thus, the above problem illustrated in FIG. 23 is unlikely to occur.

The above embodiment of the present invention refers to a three-stage delivery zoom lens barrel; however, it should be understood that the present invention is not limited to such a lens barrel, and can be equally applied to a one-stage, two-stage or more than three-stage delivery zoom lens barrel.

As described above, in accordance with the lens driving method of the zoom lens and the zoom lens barrel in the present invention, during the zoom operation, the front lens group and the rear lens group move as a whole without varying the distance between the two lens groups, and during the release operation, the rear lens group moves rearwardly with respect to the front lens group, and after completion of release, the rear lens group moves towards the front lens group, so that both lens groups are returned to the initial position that they were at during the zoom operation. Therefore, in a state that the lens barrel is extended from the main body of the camera, if a serious external force or impact is made to the front of the lens barrel in a direction towards the main body of the camera, and the lens barrel is forced to be retracted accordingly, it is unlikely that the rear lens group might collide with the film, and therefore the film, the rear lens group or the lens driving apparatus will not be damaged.

Figure 27:
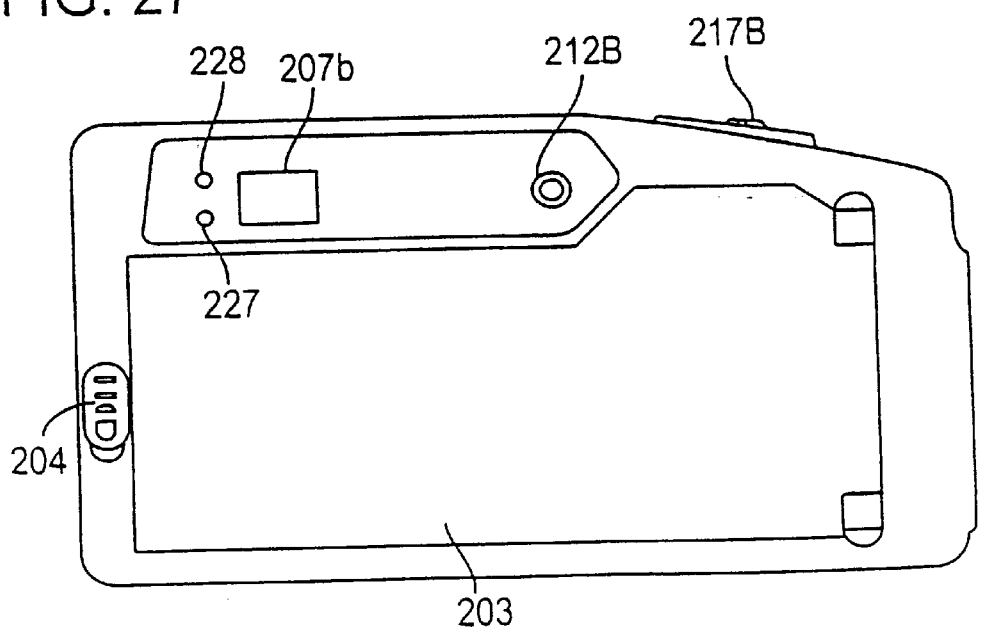
FIG. 27 is a rear elevational view of the zoom lens camera shown in FIG. 26.

FIGS. 26 through 28 illustrate a front elevational view, a rear elevational view and a plan view of the lens shutter type camera of the present invention, respectively, provided with the zoom lens barrel shown in FIGS. 1 through 25.

At approximately a center of the front of a camera body 201, the zoom lens barrel 12 is mounted. On the front surface of the camera body 201, a light receiving element 65a for photometering, an AF sensor window 64a, a finder window 207a of a finder optical system, a stroboscopic lamp 209, and a self-timer indicating lamp 229, are all provided. At the bottom of the camera body 201, a battery cover 202 is provided.

On the rear surface of the camera body 201, a rear cover 203, opening and closing for the purpose of loading or removing a film cartridge, a rear cover opening lever 204, used to unlock the locking device to open the rear cover 203, a green lamp 228, which indicates the result of focusing, a red lamp 227, which indicates the state of strobe charging, an eyepiece 207b, and a power (ON/OFF) button 212B, are provided.

On the top surface of the camera body 201, as viewed from the left of the drawing, a rewind button 216B, the LCD panel 224, a mode button 214B, a driving button 215B, the release button 217B, the "wide" button 62WB, and the "tele" button 62TB, are provided.

Figure 29:
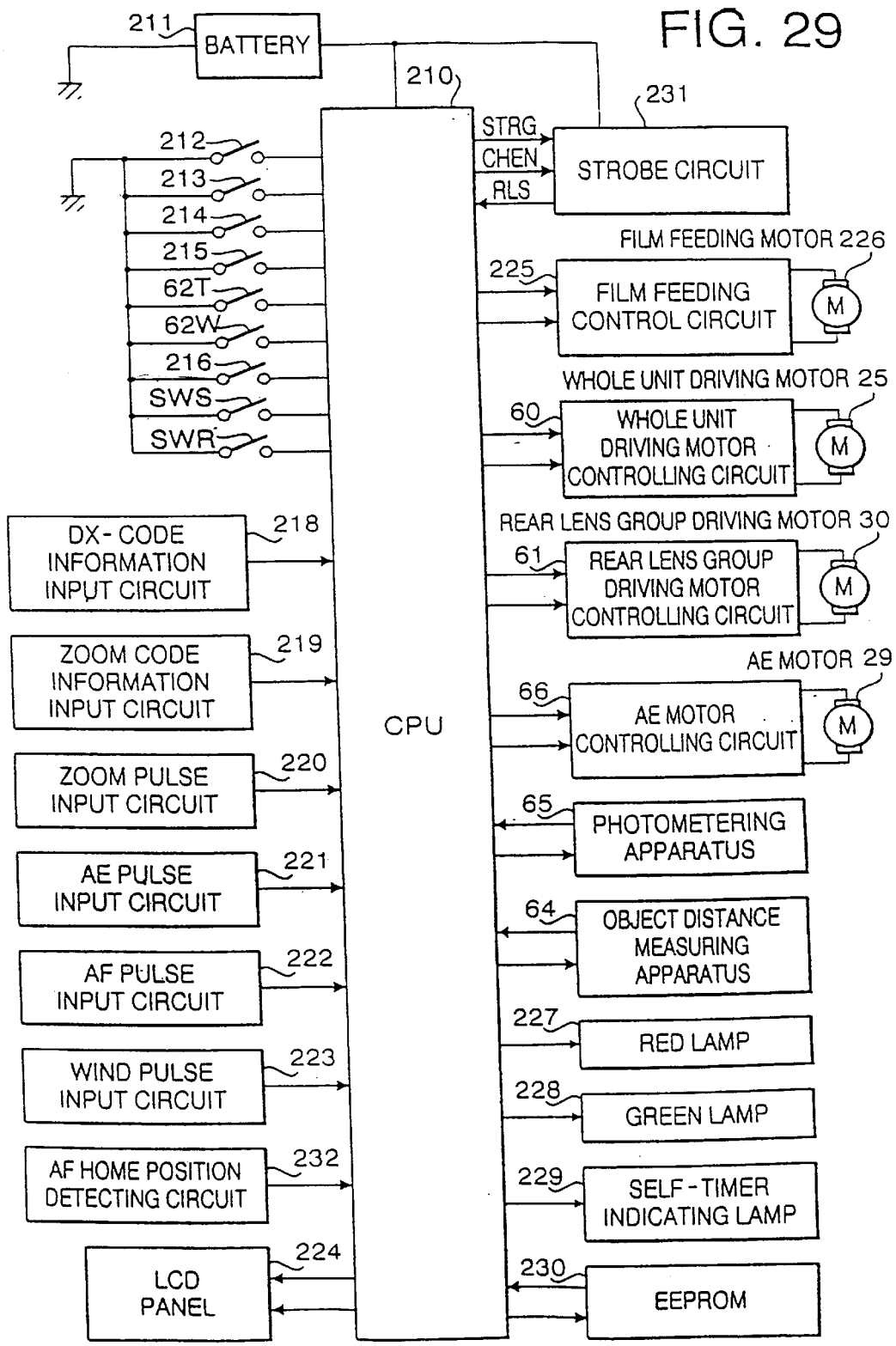
FIG. 29 is a block diagram of the main parts of a control system of the zoom lens camera of the present embodiment.

FIG. 29 illustrates a structure of the main internal components of the zoom lens camera of the present invention. The camera is provided with the CPU 210, that controls the overall functions of the camera.

The CPU 210 drives and controls the whole unit driving motor 25, via the whole unit driving motor controlling circuit 60, the rear lens group driving motor 30, via the rear lens group driving motor controlling circuit 61, and the AE motor 29, via the AE motor controlling circuit 66. The CPU 210 also controls, via a film feeding control circuit 225, a film transport motor 226 which performs loading, winding and rewinding of film. The CPU 210 further controls flashing of a strobe (i.e, an electronic flash) via a strobe device 231.

The CPU 210 is capable of operation when a battery 211 is loaded, and executes functions according to the I/O state (i.e., ON/OFF) of each switch input thereto, namely the state of the power switch 212, a rear cover switch 213, a mode switch 214, a driving switch 215, a "tele" switch 62T, a "wide" switch 62W, a rewind switch 216, the photometering switch SWS, and the release switch SWR.

The power switch 212 is connected to the power button 212B, and when the power switch 212 is turned "ON" when the electric power is "OFF" (i.e., the electric power of the battery 211 is cut), the power switch 212 turns the electric power "ON" (i.e., the electric power of the battery 211 is supplied), and when the power switch 212 is turned "OFF" when the electric power is "ON", the power switch 212 turns the electric power "OFF".

The rear cover switch 213 is associated with the opening or closing of the rear cover 203 by a connection to the rear cover 203. According to changes in the state of the rear cover 203, the rear cover switch 213 executes a film loading operation by driving the film transport motor 226, or resets a film counter.

The mode switch 214 is used to change photographing modes, and is connected to the mode button 214B. As the mode switch 214 changes to an "ON" state, photographing modes are changed, such as an auto strobe flashing mode, a forced strobe flashing mode, a strobe flashing forbidding mode, a long exposure mode, or a bulb mode etc.

The driving switch 215 changes between various driving modes, and is connected to the driving button 215B. As the driving switch 215 changes to an "ON" state, driving modes are changed, such as a frame photographing mode, a self-timer mode, a continuous photographing mode, or a multiple exposure mode etc.

The "tele" switch 62T is connected to the "tele" button 62TB. When the "tele" switch 62T is "ON", the whole unit driving motor 25 is driven toward the "tele" end.

The "wide" switch 62W is connected to the "wide" button 62WB. When the "wide" switch 62W is "ON", the whole unit driving motor 25 is driven toward the "wide" end.

The photometering switch SWS and the release switch SWR are connected to the release button 217B. When the release button 217B is half depressed, the photometering switch SWS is turned "ON", and when the release button 217B is fully depressed, the release switch SWR is turned "ON". During the time that the release button 217B is between the half-depressed and fully-depressed conditions, the photometering switch SWS is maintained in the "ON" state. When the photometering switch SWS is "ON", photometering and object distance measuring operations are executed. When the release switch SWR is turned "ON", the whole unit driving motor 25 and the rear lens group driving motor 30 are driven so that the front lens group L1 and the rear lens group L2 may be moved to a position at which the subject is brought into focus according to the result of the object distance measurement. The AE motor 29 is also driven and exposure processing is executed according to the determined photometering value. After exposure is complete, the whole unit driving motor 25 and the rear lens group driving motor 30 are driven, and the front lens group L1 and the rear lens group L2 are returned to their respective initial positions. In addition, the film transport motor 226 is driven and the film is wound by one frame.

An output from a DX-code information input circuit 218 is input to the CPU 210, which provides information regarding the ISO speed of film. Also input to the CPU 210 is zoom code information input from a zoom code circuit 219, which provides information regarding the present lens position from the code plate 13a, a zoom pulse input circuit 220, an AE pulse input circuit 221, an AF reference pulse input circuit 222, and a wind pulse input circuit 223, which provides information regarding driving of the film and the amount of driving thereof. Additionally, an AF home position detecting circuit 232, is input to the CPU 210.

A number of indicators, for example, the LCD panel 224, which indicates a current focal length, a number of frames photographed, an exposure mode or the like, the red lamp 227, which indicates the state of strobe charging, the green lamp 228, which indicates the result of focusing from the object distance measuring apparatus 64, and the self-timer indicating lamp 229, which indicates the operation of the self-timer, are connected to the CPU 210.

In an EEPROM 230, data inherent to the camera at the time of assembling, such as data regarding an AE adjustment thereof, or data set by a photographer, such as the exposure mode or the number of frames photographed, are stored.

Figures 31, 32:
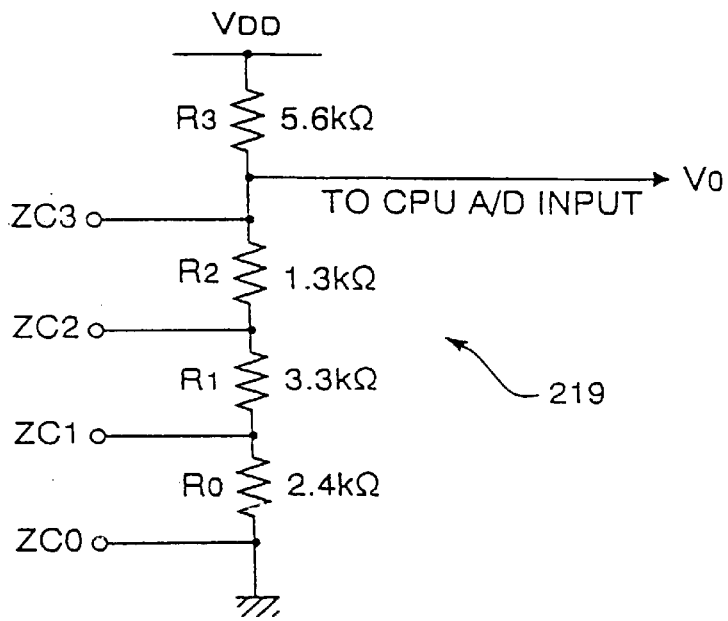
FIG. 31 is a schematic view illustrating an example of an electronic circuit to detect the zoom code, in contact with the brushes, as a voltage.
FIG. 32 is a table illustrating conversions of a voltage, obtained through contact with the brushes, into a code.

As shown in FIG. 31, the zoom code information input circuit (electrical circuit) 219 is provided with four resistors (R0, R1, R2, R3) connected in series. The resistor R0 is grounded while a reference voltage $V_{DD}$ is applied to the resistor R3. Between the resistor R0 and ground the electrode pattern ZC0 is connected, and between resistors R0 and R1 the electrode pattern ZC1 is connected, between resistors R1 and R2 the electrode pattern ZC2 is connected, and between resistors R2 and R3 the electrode pattern ZC3 is connected. In addition, an A/D conversion input port of the CPU 210 is connected between the resistors R2 and R3.

As shown in FIG. 30 (A), the code plate 13a is provided with four independent electrode patterns (zoom codes) ZC0, ZC1, ZC2 and ZC3 formed on an insulating substrate 13b. The electrode patterns, namely conducting plates, ZC0, ZC1, ZC2 and ZC3 are connected respectively between the resistors R0, R1, R2 and R3. The contacting terminal 9 is provided with a pair of brushes 9a conducting with each other via a conductive part 9b. The brushes 9a are formed to move in slidable contact along the code plate 13a, so that any two patterns among the electrode patterns ZC0, ZC1, ZC2 and ZC3 may conduct with each other. Therefore, if any two patterns among the electrode patterns ZC0, ZC1, ZC2 and ZC3 conduct with each other, according to the combination of conduction, the output voltage of the zoom code information input circuit 219 will vary, as shown in FIG. 30 (C) and FIG. 30 (E). The CPU 210 performs an A/D conversion, whereby the output voltage is converted into a digital value. The CPU 210 further converts the converted digital value into a corresponding zoom code. The CPU 210 then detects the position of the zoom lens according to the zoom code.

In the present embodiment of the present invention, as shown in FIG. 30 (D), the voltages corresponding to the contacting positions of the brushes 9a are converted into seven zoom codes, namely 0, 1, 2, 3, 4, 5 and 6. Each of the seven codes represents a position of the lens, i.e., the zoom code 1 represents the housed position, the zoom code 2 the "wide" position, the zoom code 6 the "tele" position, the zoom codes 3 through 5 represent the intermediate positions between the "wide" position and the "tele" position, and the zoom code 0 represents the position between the housed position and the "wide" position. At the intermediate positions, the zoom codes 3, 4 and 5 are repeated four times in that order, and the zoom range is divided and coded into fourteen zoom step codes. In the present embodiment of the present invention, the zoom step 0 is assigned to the "wide" end position, and the zoom step 13 at the "tele" end position, and the zoom steps 1 through 12 are assigned to positions between the "wide" end and the "tele" end positions.

FIG. 31 shows the zoom code information input circuit 219 with exemplary values for resistors R0, R1, R2 and R3. FIG. 32 is a table showing an example of the relationship among the short-circuiting of resistors R1, R2, R3; the zoom code; the output $V_O$ of the zoom code information input circuit 219; and the threshold voltage.

The zoom pulse input circuit 220 is provided with an encoder consisting of the photointerrupter 1 and the rotating plate 2. The input of the photointerrupter 1, varied according to the passage of the slit of the rotating plate 2 which rotates in accompaniment to the rotation of the driving shaft of the whole unit driving motor 25, is output as a zoom pulse.

The AE pulse input circuit 221 is provided with an encoder consisting of the photointerrupter 57 and the rotating plate 59. The input of the photointerrupter 57, which varies according to the passage of the slit of the rotating plate 59 which rotates in accompaniment to the rotation of the driving shaft of the AE motor 29, is output as an AE pulse. The rotating plate 59 is arranged such that is rotates by less than one full turn (i.e., less that 360°).

The AF reference pulse input circuit 222 is provided with an encoder consisting of the photointerrupter 56 and the rotating plate 59. The input of the photointerrupter 56, which varies according to passage of the slit of the rotating plate 59 which rotates in accompaniment to the rotation of the driving shaft of the rear lens group driving motor 30, is output as an AF pulse.

Figure 37:
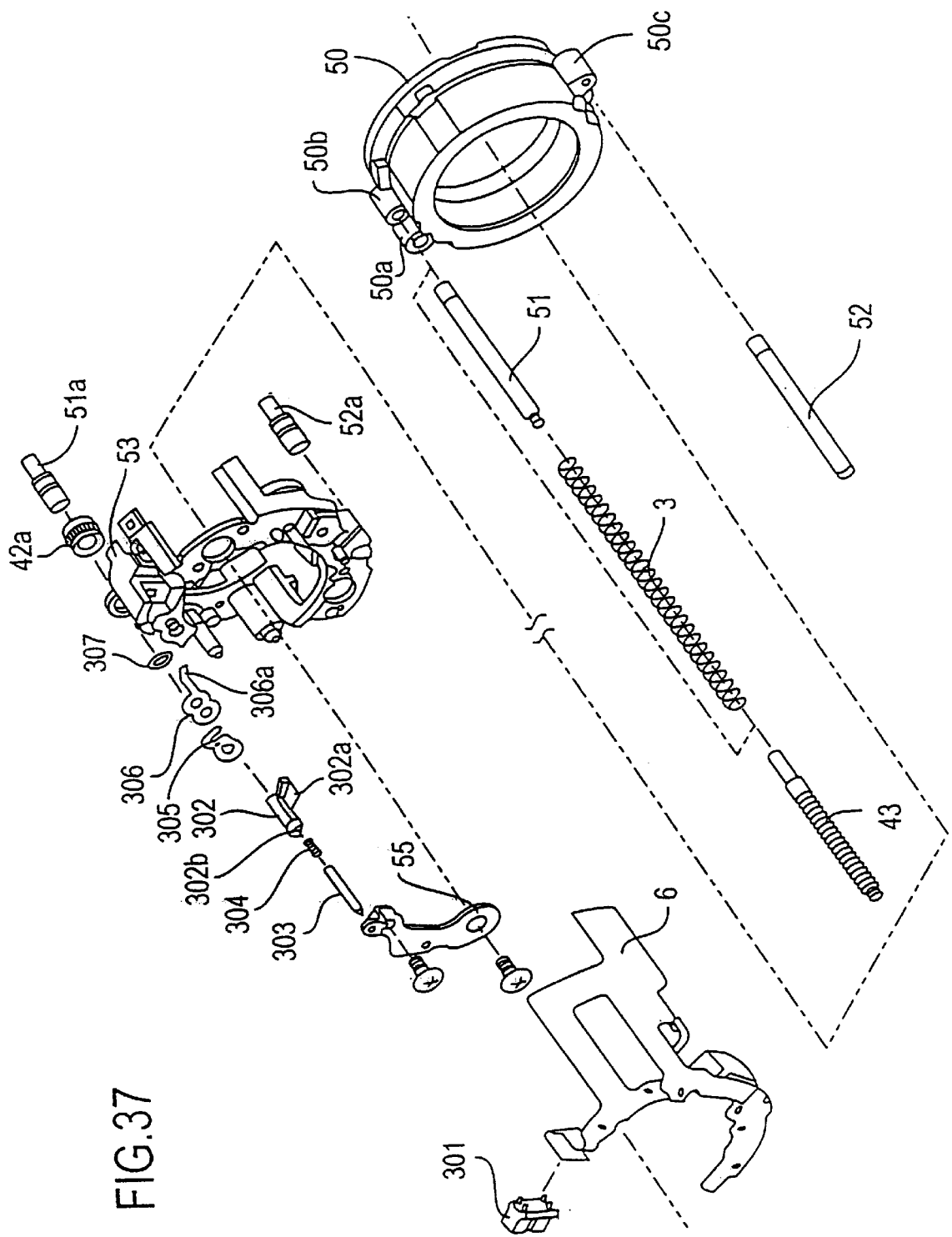
FIG. 37 is an exploded perspective view of a peripheral structure of the rear lens group of the zoom lens barrel.
Figure 38:
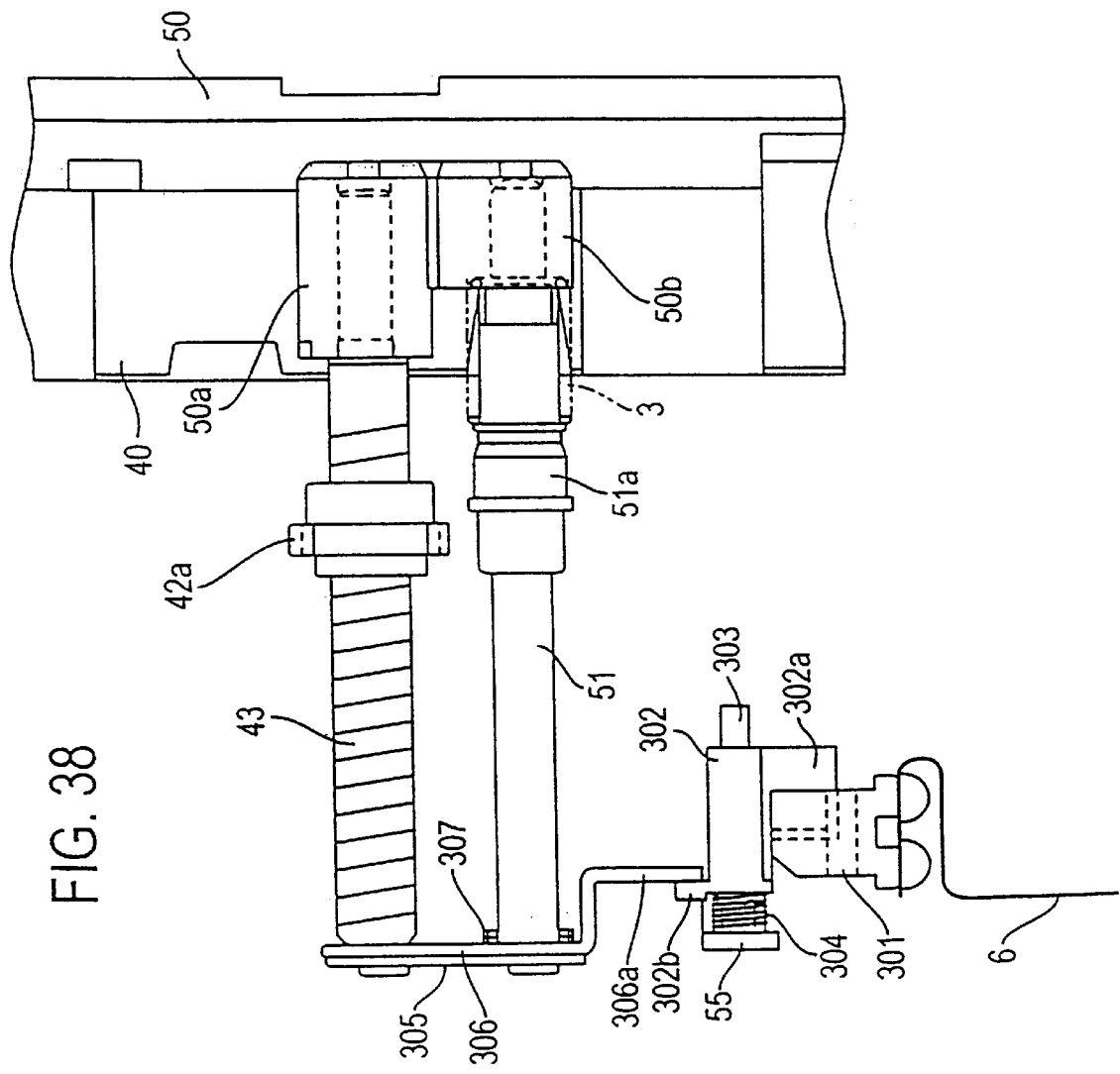
FIG. 38 is a plan view of the main parts of an example of an initial position detecting device of the rear lens group of the present embodiment.
Figure 39:
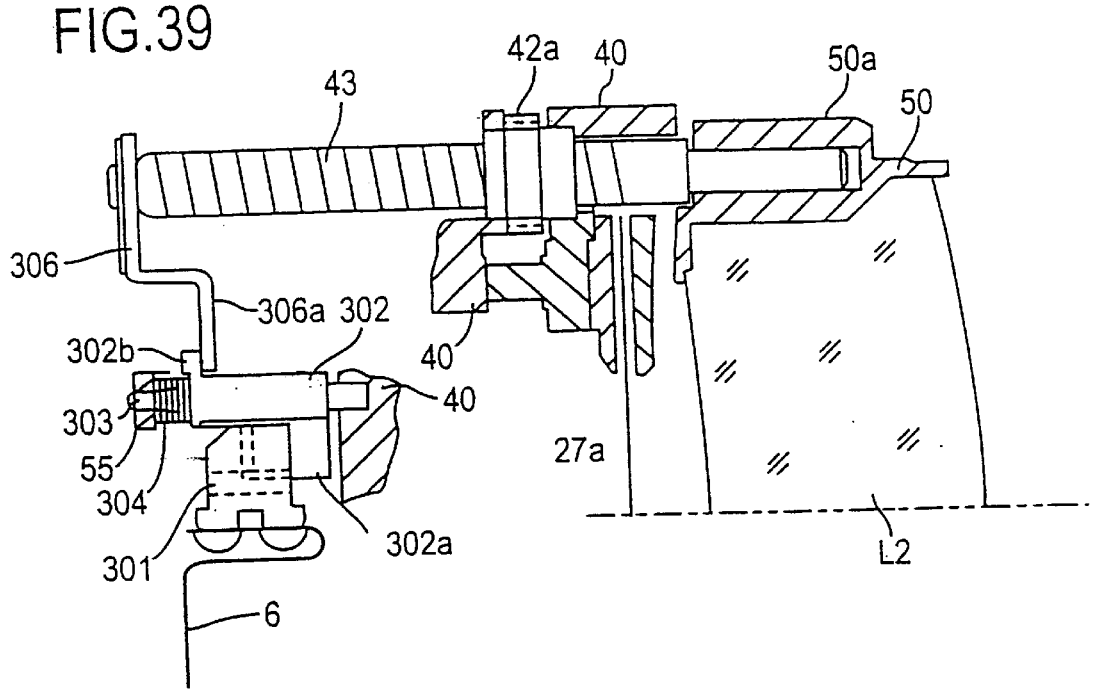
FIG. 39 is a sectional view of the initial position detecting device of the rear lens group, at a state when the rear lens group is at the initial position.
Figure 40:
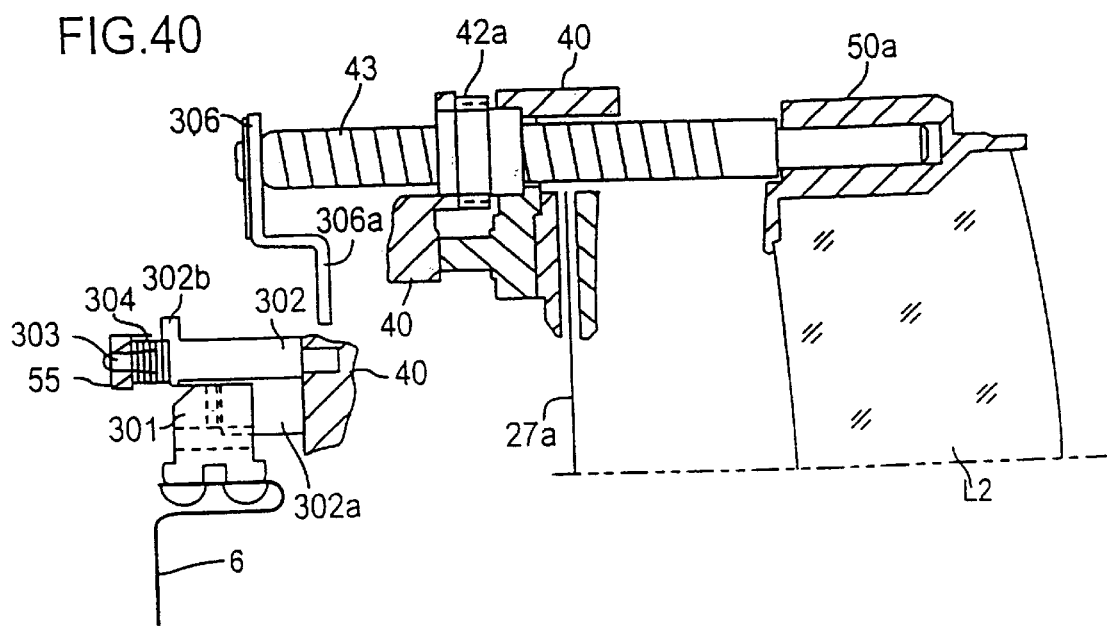
FIG. 40 is a sectional view of the initial position detecting device of the rear lens group, at a state when the rear lens group is not at the initial position.

The AF home position detecting circuit 233 detects whether the rear lens group L2 is positioned at the reference position, namely the position closest to the front lens group L1 (i.e., the AF home position). In the present embodiment of the present invention, the position of the rear lens group L2 is controlled by the AF pulse number, with respect to the AF home position. The AF home position detecting circuit 233 is provided with a photointerrupter 301, and the position at which a chopper 302 (i.e., a chopper plate 302a), which moves integrally with the rear lens group L2, blocks the light path of the photointerrupter 301, is set as the AF home position, and according to the variation of output of the photointerrupter 301, the rear lens group L2 is detected to be at the AF home position (see, for example, FIG. 37).

Figure 33:
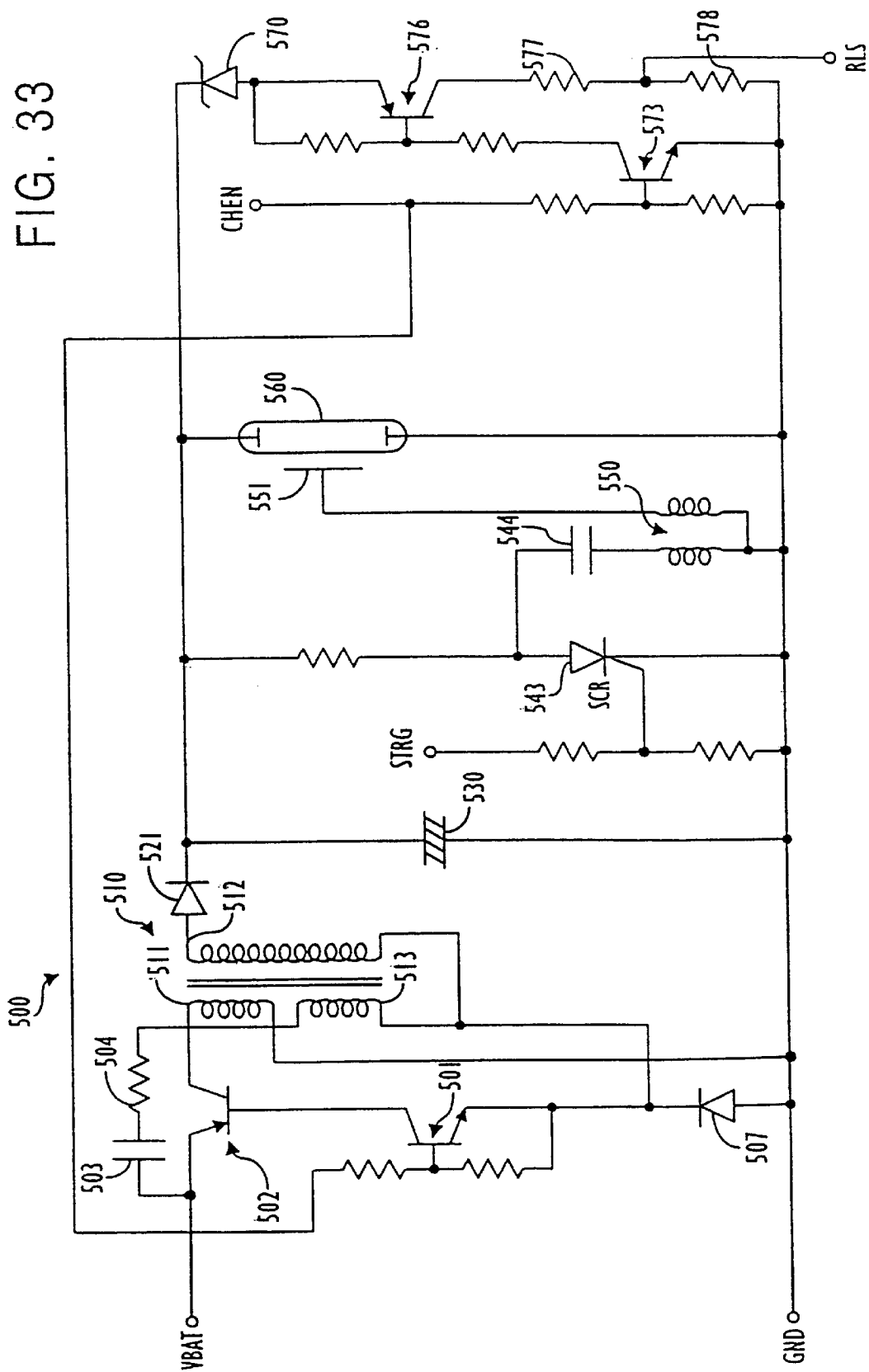
FIG. 33 is a schematic view illustrating an example of an electronic circuit of a strobe.

FIG. 33 illustrates an electrical circuit of the strobe device 231.

A strobe circuit 500 is provided with a ground terminal GND, a voltage input terminal VBAT and three strobe controlling terminals STRG, CHEN and RLS. The battery voltage of the camera is supplied to the terminals VBAT and GND. The controlling terminals STRG, CHEN and RLS are respectively connected to the CPU 210. The terminal STRG is a strobe flashing signal (strobe trigger) input terminal, and in an normal state the terminal STRG is set to the L level (i.e., logic low), and on occasion of strobe flashing, a signal at the H level (i.e., logic high) is input. To the terminal CHEN the charging signal is input. At the L state, charging is not performed, while at the H state, charging is performed. The terminal RLS is a charging voltage output terminal and outputs the voltage corresponding to the charging voltage to the A/D converter of the CPU 210.

The battery charging and the monitoring of the charging voltage will now be described.

As above described, the charging is performed by setting the level of the terminal CHEN to the H level (i.e., the charging signal "ON"). When the terminal CHEN is at the H level, the level of the base of a transistor 501 becomes H and transistor 501 turns ON. When the transistor 501 is ON, a voltage transforming circuit (i.e., a DC-DC converter), consisting of a transistor 502, a primary winding 511 and a secondary winding 512 of a transformer 510, and a diode 521, is activated, and charging of a capacitor 530 is performed.

In addition, since the signal at the H level is supplied to the terminal CHEN, transistors 573 and 576 also turn ON, and a Zener diode 570 becomes connected to each terminal of the capacitor 530 via a transistor 576 and resistors 577 and 578.

In the present embodiment, the capacitor 530 is charged to 300 volts. The breakdown voltage of the Zener diode 570 is 230 volts. As the capacitor 530 charges and the voltage applied to the Zener diode 530 increases beyond the breakdown voltage of the Zener diode 530, current flows through the Zener diode 570 (Zener current).

As the Zener current flows, a voltage corresponding to the charged voltage of the capacitor 530 is applied to the terminal RLS, as divided by a voltage divider set up by resistors 577 and 578.

As above described, during charging when the terminal CHEN is at the H level, the resistors 577 and 578 are connected in series to each terminal of the capacitor 530. Until the charged voltage of the capacitor 530 exceeds the breakdown voltage, current does not flow. As the charging of the capacitor 530 continues, and the voltage applied to the Zener diode 570 increases beyond the breakdown voltage, a difference between the charged voltage of the capacitor 530 and the breakdown voltage of the Zener diode 570 is divided by resistors 577 and 578. The divided voltage value, which corresponds to the voltage across the resistor 778, is applied to the terminal RLS.

As shown in FIG. 29, the voltage applied to the terminal RLS is input to the CPU 210. Specifically, the voltage applied to the terminal RLS is applied to the A/D converter built into the CPU 210.

The strobe flashing operation will now be described.

When the charging voltage of the capacitor 530 is more than or equal to the voltage level necessary for flashing, strobe flashing is performed by inputting the strobe trigger to the terminal STRG.

When the strobe trigger is input to the terminal STRG, in other words, when the signal at the H level is input to the terminal STRG, an SCR (i.e., a thyristor) is turned ON such that the SCR is in a conductive state. At that time, in accordance with the sudden discharge of a capacitor 544 connected to the primary winding of a transformer 550, the secondary winding of the transformer 550 will have a high voltage. The high voltage in the secondary winding of the transformer 550 is applied to a trigger terminal 551 of a xenon tube 560, and flashing of the xenon tube 560 is performed.

FIGS. 37 through 40 illustrate the structure to detect the AF home position, which is the initial position of the rear lens group L2. The AF home position is a position where the rear lens group L2 is close to the front lens group L1. By making this position the reference position for focusing, the rear lens group L2 moves along the optical axis away from the front lens group L1. When the power is "ON", the shutter release has completed, the lens is housed, and at zoom step positions other than the zoom steps 0 through 4, the rear lens group L2 is controlled to maintain the AF home position with respect to the front lens group L1. At zoom steps 0 through 4, the rear lens group L2 is moved to the rearward position from the AF home position by an amount corresponding to the specified pulse value AP1.

The rear lens supporting barrel 50 is supported, via the pair of slide shafts 51 and 52, so as to be capable of moving towards the shutter mounting stage 40 along the optical axis. One end of the slide shafts 51 and 52 are fixed on shaft supporting bosses 50b and 50c projecting from the outer periphery of the lens supporting barrel 50. The slide shaft 51 is inserted to be slidably supported by a slide bearing 51a fixed to the shutter mounting stage 40.

One end of the screw shaft 43 is fixed to a shaft supporting boss 50a projecting from the outer peripheral face of the lens supporting barrel 50, close to the shaft supporting boss 50b. The screw shaft 43 is engaged with the driving gear 42a, which is supported by the shutter mounting stage 40 and the shutter 27, such as to be rotatable, but not movable in the axial direction. When the driving gear 42a is driven by the rear lens group driving motor 30, the screw shaft 43 moves forwardly and rearwardly with respect to the driving gear 42a, and the lens supporting barrel 50, namely the rear lens group L2 supported by the lens supporting barrel 50, is moved relative to the front lens group L1. In order to prevent backlash between the screw shaft 43 and the driving gear 42a, the rear lens group urging coil spring 3 is tilted to the slide shaft 51 and is engaged with the slide bearing 51a and the shaft supporting boss 50b. The rear lens group urging coil spring 3 forces the lens supporting barrel 50 in the direction away from the shutter mounting stage 40, in other words, towards the rear of the shutter mounting stage 40. Thus backlash is prevented.

At the front of the shutter mounting stage 40, namely the presser 55, the photointerrupter 301 and the chopper 302 which comprise the AF home position detecting circuit 232, are mounted. The photointerrupter 301 is mounted to the flexible printed circuit board 6, and is fixed on the shutter mounting stage 40. The chopper 302 is slidably supported by a chopper guide shaft 303 and has its front end supported by the presser 55. The chopper 302 is urged towards the shutter mounting stage 40, in other words, rearwards in the optical axis direction, by a chopper urging spring 304 mounted between the chopper 302 and the presser 55. The chopper 302 is provided with the chopper plate 302a, which is inserted in the slit of the photointerrupter 301, and when the chopper 302 is at the rearward position owing to the force of the chopper urging spring 304, the optical path of the photointerrupter 301 is open. When the chopper 302 moves to the specified position against the force of the chopper urging spring 304, the optical path of the photointerrupter 301 is blocked.

At the ends of the screw shaft 43 and at one end of the slide shaft 51, a stopper plate 306 is fixed via a lock washer 305. A chopper presser 306a is integrally provided on the stopper plate 306, which contacts the chopper 302 and moves the chopper 302 forwardly against the force of the chopper presser urging 304 when the lens supporting barrel 50 moves forwardly. The chopper presser 306a is also contacted with a projection 302b of the chopper 302 when the lens supporting barrel 50 (i.e., the rear lens group L2) reaches a predetermined position closer to the shutter mounting stage 40. Due to the further forward movement of the lens supporting barrel 50, the chopper presser 306a moves the chopper 302 against the force of the chopper urging spring 304. When the lens supporting barrel 50 moves to the AF home position close to the shutter mounting stage 40, the chopper plate 302a of the chopper 302 blocks the optical path of the photointerrupter 301. By checking the output of the photointerrupter 301, the CPU 210 detects whether the rear lens group L2, namely the lens supporting barrel 50, is at the AF home position or not.

The function of the present zoom lens camera, the following discussion will be made with reference to flow charts shown in FIGS. 41 through 73. The processes are executed by the CPU 210 based on the program stored in the internal ROM of the CPU 210.

[THE MAIN PROCESS]

Figure 41:
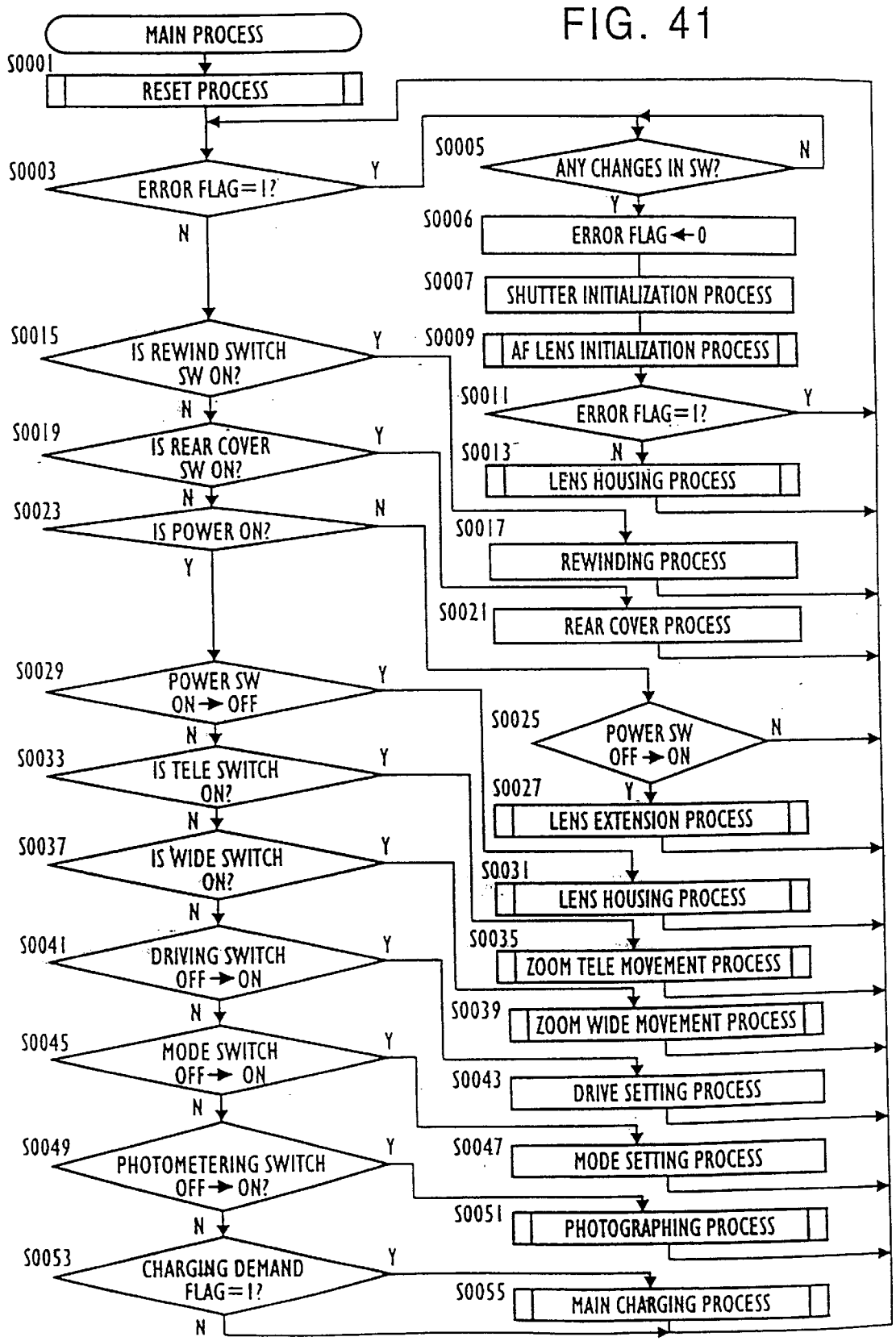
FIG. 41 is a flow chart of a main process of the zoom lens camera.

FIG. 41 is a flow chart showing the main process of the camera in the present invention. When the battery is loaded into the camera, the CPU 210 commences the main process, and then enters a standby state and waits for an operation to be performed by the photographer.

In the main process, the reset process (FIG. 42), indicated at step S0001, is executed. In the reset process, hardware initialization, such as each port of the CPU 210, RAM initialization, test function process, reading of adjustment data, shutter initialization, AF lens initialization, and lens housing processing, are executed.

After completion of the reset process, at step S0003 through step S0053, checks are executed to check whether an error flag is set, the rewind switch 216 is ON, the state of the rear cover switch 213 changes, the power is ON, the state of the power switch 212 changes from ON to OFF, the "tele" switch 62T is ON, the "wide" switch 62W is ON, the driving switch 215 is changed from OFF to ON, the mode switch 214 is changed from OFF to ON, the photometering switch SWS is changed from OFF to ON, and whether the charging demand flag is set. The processes associated with each of the checks are executed according to the result of the checks.

At step S0003, if the error flag is set (i.e., error flag is set to 1), it indicates that an error has occurred during at least one of the above processes in the reset process. To clear the error flag, error initialization processes from steps S0005 through S0013 are repeated until the error flag has cleared. At step S0005 the CPU 210 waits for a change in state of any of the switches, and after a change, at steps S0006 through S0009, the error flag is reset, a shutter initialization process (FIG. 51) and an AF lens initialization process (FIG. 43) are executed. Then at step S0011 it is checked as to whether the error flag has been set during the above processes (S0006–S0009), and if the error flag is set, control returns to step S0003 and the processes from step S0005 are repeated. If the error flag is not set at step S0011, the error state has been resolved, and control returns to step S0003 after a lens housing process (FIG. 44) has been executed at step S0013.

When the error flag is cleared, and when the power is OFF, at step S0015, step S0019, step S0023, step S0025 and step S0029, the above-mentioned checks are repeated, namely it is checked whether the rewind switch 216 is ON, the state of the rear cover switch 213 has changed, the power is ON, and whether the power switch 212 is changed from ON to OFF. When the rewind switch 216 is turned ON, or when the state of the rear cover switch 213 is changed, or when the power switch 212 is changed from ON to OFF, the following processes are executed.

At step S0015, if the rewind switch 216 is ON, the rewind motor is driven and the film rewind is executed at step S0017.

At step S0019, if the state of the rear cover switch 213 changes, namely the rear cover is closed or opened, the rear cover processes, such as resetting of the film counter or the film loading process, are executed at step S0021.

At steps S0023 and S0025, if the power switch 212 is changed from OFF to ON, the power is turned ON, and the lens extension process is executed at step S0027. Each time the power switch is turned ON, the CPU 210 turns the power ON if the power is OFF, and turns the power OFF if the power is ON.

When the power is ON, control proceeds from step S0023 to step S0029, and the processes from steps S0029 to S0053 are executed. In the processes from steps S0029 to S0053, checks are performed to determine whether the power switch 212 is changed from ON to OFF, the "tele" switch 62T is ON, the "wide" switch 62W is ON, the driving switch 215 is changed from OFF to ON, the mode switch 214 is varied from OFF to ON, the photometering switch SWS is varied from OFF to ON, and whether the charging demand flag is set.

At step S0029, if the power switch 212 is varied from ON to OFF, the power is turned OFF, and the lens housing process (FIG. 44) is executed at step S0031. In the lens housing process the lens barrel is withdrawn to the housed position.

At step S0033, if the "tele" switch 62T is turned ON, a zoom "tele" movement process (FIG. 47) is executed at step S0035. In the zoom "tele" movement process the whole unit driving motor 25 is driven in the lens extension direction.

At step S0037, if the "wide" switch 62W is turned ON, a zoom "wide" movement process (FIG. 48) is executed at step S0039. In the zoom "wide" movement process the whole unit driving motor 25 is driven in the lens retraction direction.

At step S0041, if the driving switch 215 is varied from OFF to ON, a drive setting process is executed at step S0043. Though not shown in detail, the drive setting process is a process to select the driving mode from amongst the frame photographing mode, the continuous photographing mode, the multiple exposure mode, the self-timer mode, or the like.

At step S0045, if the mode switch 214 is varied from OFF to ON, a mode setting process is executed at step S0047. Though not shown in detail, the mode setting process is a process to select the exposure mode from amongst the strobe autoflashing mode, the forced strobe flashing mode, the strobe flashing prevention mode, the red-eye reduction mode, the long exposure mode, the bulb mode, or the like.

At step S0049, if the photometering switch SWS is varied from OFF to ON, a photographing process (FIG. 49) is executed at step S0051.

At step S0053, if the charging demand flag is set, a main charging process (FIG. 50) is executed at step S0055, and the charging process of the strobe device 231 is executed.

When the power is ON, the above processes from steps S0003 through S0055 are repeated according to the operation of the photographer, and when no operation is being undertaken, the standby state is maintained, i.e., a state ready for photographing.

[THE RESET PROCESS]

Figure 42:
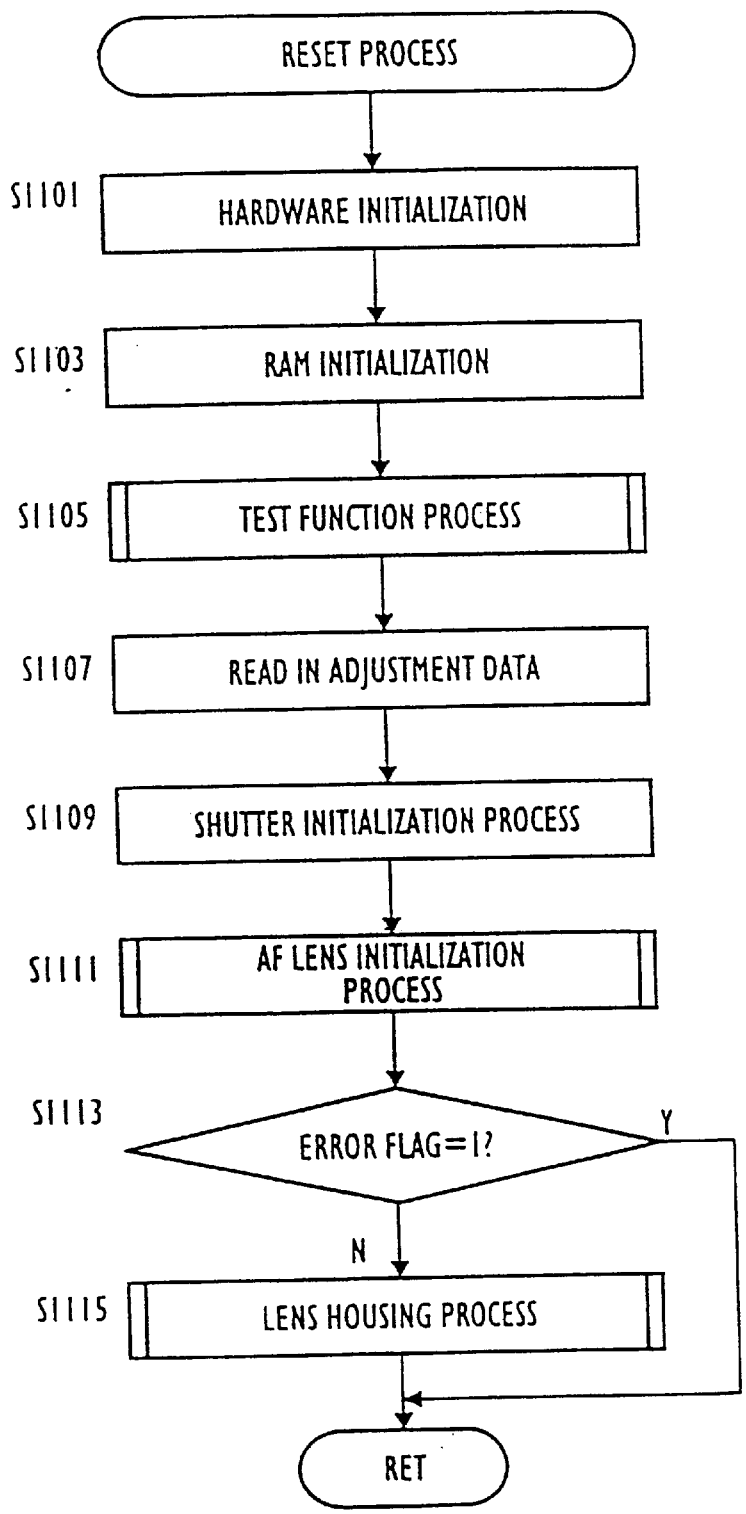
FIG. 42 is a flow chart of a reset process of the zoom lens camera.

FIG. 42 is a flow chart showing the reset process which is performed at step S0001 of the main process. In the reset process the following processes are executed, namely, hardware initialization of each port of the CPU 210, RAM initialization, calling of the test function, reading of adjusting data, initialization of the shutter, initialization of the AF lens, and the lens housing processing.

At step S1101, the initialization of hardware, i.e., initializing the levels of each port of the CPU 210 is executed, and at S1103 the initialization of RAM, i.e., to clear the RAM in the CPU 210 is executed.

At step S1105 the test function process (FIG. 68) is executed, namely each function of the camera is tested by an external measuring apparatus, such as a computer, during or after assembly. In the test function process of the present embodiment of the present invention, although commands regarding the function to be tested are output from the external measuring apparatus, the actual process is executed by the CPU 210.

At step S1107, adjusting data is read from the EEPROM 230. The adjusting data includes exposure adjusting value data, focus adjusting value data, and diaphragm adjusting data. The exposure adjusting value data adjusts for an error between a design diaphragm value and the actual diaphragm value, or adjusts for differences due to different lenses having different transmittances. The diaphragm adjusting data detects whether the difference between the designed degree of opening of the shutter blade and the actual degree of opening thereof, has been adjusted with respect to the number of AE pulses detected by the AE encoder upon driving of the AE motor 29. If the adjustment has been performed, the diaphragm adjusted value is stored in the EEPROM 230, as part of the adjusting data.

At step S1109, the shutter initialization process is executed to completely close the shutter blades 27a. In the present embodiment of the present invention, since the opening of the shutter blades 27a is operated by the AE motor 29, there is a possibility that the battery may be removed while the shutter is open, and additionally a possibility exists that the battery is loaded while the shutter is open. Therefore, the AE motor 29 is driven in a direction to close the shutter blades 27a (shutter closing direction), and sets the closed condition wherein the shutter blades 27a are in contact with an initial position stopper (not shown).

At step S1111, the AF lens initialization process (FIG. 43) is executed, namely, the rear lens group L2 is moved to the initial position at which it is extended furthest. In the present embodiment, the rear lens group driving motor 30 is driven to move the rear lens group L2 forwardly to the furthest extended position, i.e., close to the front lens group L1, as an initial position.

At step S1113, it is checked whether the error flag has been set, and if the error flag has been set, control returns without executing any further process. If the error flag has not been set, control returns after executing a lens housing process (FIG. 44), at step S1115.

In the lens housing process, the barrier blades 48a and 48b are closed by moving the lens barrel rearwardly to the housed position within the camera body 201, by driving the whole unit driving motor 25. Since the error flag will be cleared during normal usage, the lens housing process will be executed. If the error flag is set to 1, the housing (withdrawing) of the lens is stopped since it can not be guaranteed that the rear lens group L2 is at the initial position (i.e., the AF home position) during the AF initialization process. If the lens housing process is executed in such a state, a possibility exists that the rear lens group L2 may collide with the aperture plate 14, so the lens housing process is canceled.

[THE AF LENS INITIALIZATION PROCESS]

Figure 43:
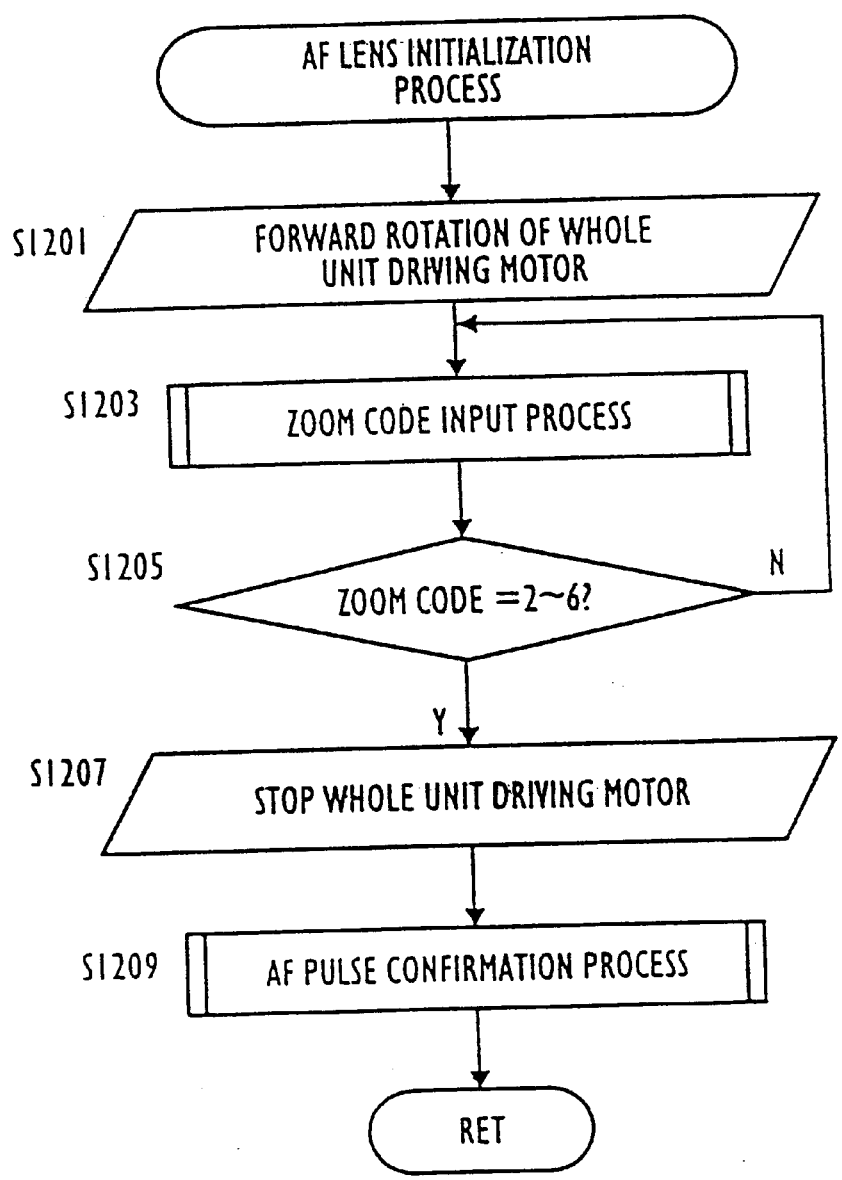
FIG. 43 is a flow chart of an AF lens initialization process of the zoom lens camera.

FIG. 43 is flow chart showing the AF lens initialization process. In the AF lens initialization process, if the lenses are housed, the whole unit driving motor 25 is driven clockwise, the rear lens group driving motor 30 is connected to an unillustrated barrier driving gear device, and the front lens group L1 and the rear lens group L2 are moved as a whole to the "wide" position by the whole unit driving motor 25. The rear lens group L2 is moved to the AF home position, namely the position at which it will be closest to the front lens group L1, by driving the rear lens group driving motor 30.

If the lenses are at any position other than the housed position, the whole unit driving motor 25 is driven clockwise, and if one of the zoom codes is detected, the rear lens group driving motor 30 is driven and the rear lens group L2 is moved to the AF home position, namely the position closest to the front lens group L1.

Since the rear lens group driving motor 30 is connected to the barrier driving gear device at the housed position, and is connected to the rear lens driving gear device at positions other than the housed position, the whole unit driving motor 25 must be driven to move the front lens group L1 and the rear lens group L2 to a position other than the housed position (i.e., to the "wide" position or further) when the rear lens group L2 is to be driven.

At step S1201, the whole unit driving motor 25 is driven clockwise, namely in the direction for extending the lenses. If the lenses are housed, the barrier driving device is detached from the barrier driving gear and engaged with the lens driving gear, so that the rear lens group L2 is in a state capable of be driven.

At step S1203, the CPU 210 performs an A/D conversion of the voltage input from the zoom code input circuit 219 and converts the obtained digital value into a zoom code. At step S1205, the CPU 210 checks the converted zoom code, and if the code is in the range 2 through 6 at step S1205, the whole unit driving motor 25 is stopped immediately at step S1207. In the present embodiment, zoom code 1 indicates the housed position, zoom code 2 indicates the "wide" end position, zoom code 6 indicates the "tele" end position, zoom codes 3, 4 and 5 indicate intermediate zoom positions, and zoom code 0 indicates the "OFF" state. In the processes of steps S1201 through S1207 the lens barrels 16, 19 and 20 are extended until a zoom code in the range 2 to 6 is detected.

At step S1209, when the whole unit driving motor 25 is stopped, an AF pulse confirmation process (FIG. 53) is executed and the rear lens group L2 is moved to the AF home position. The AF pulse confirmation process is characterized in that the rear lens group driving motor 30 is driven to rotate in forward and reverse directions to remove so-called "biting" of the mechanical components, such as the cam follower pin into the cam groove. After the rear lens group L2 is moved to the AF home position, control is returned.

[THE LENS HOUSING PROCESS]

Figure 44:
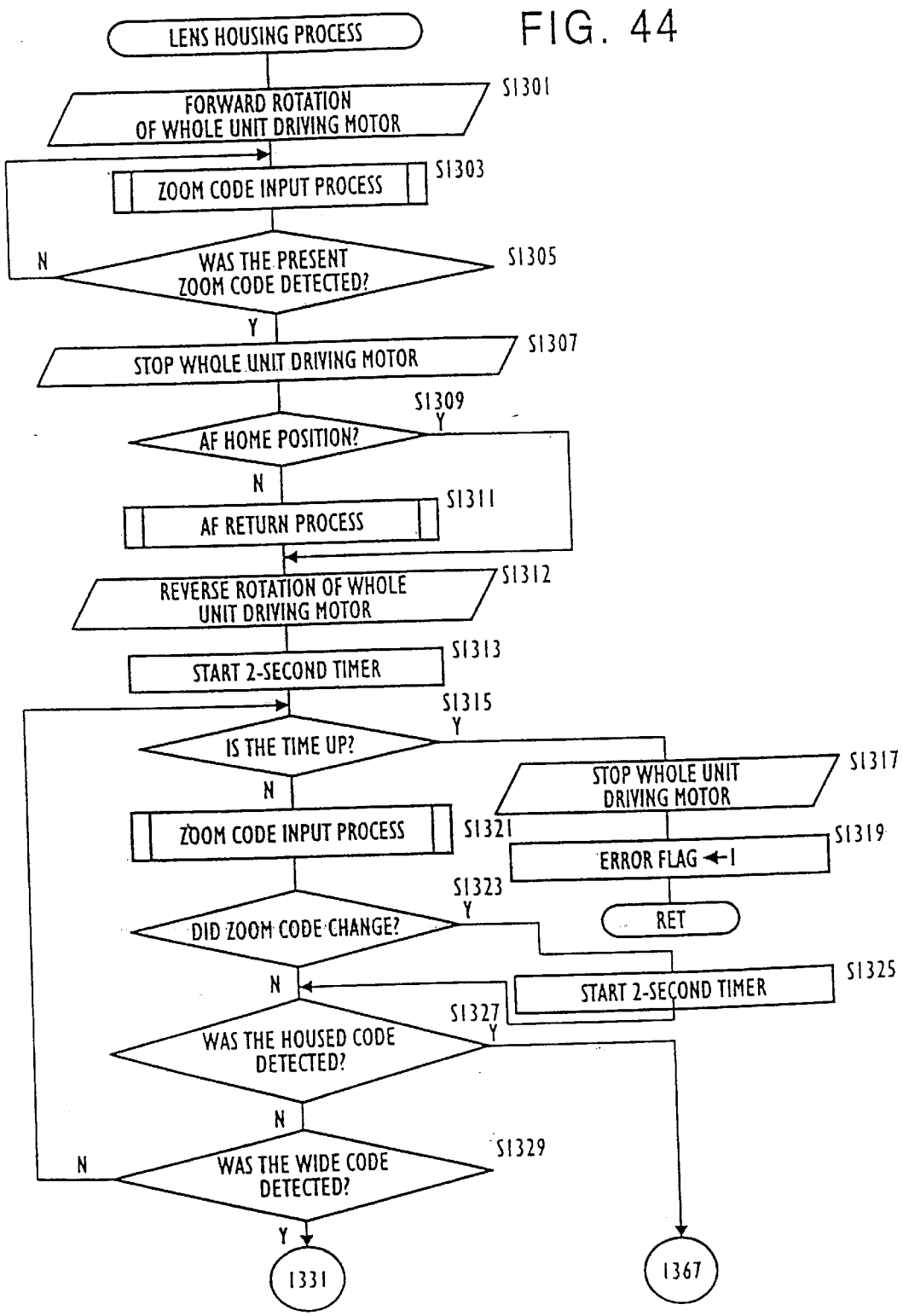
FIGS. 44 and 45 show a flow chart of a lens housing process of the zoom lens camera.
Figure 45:
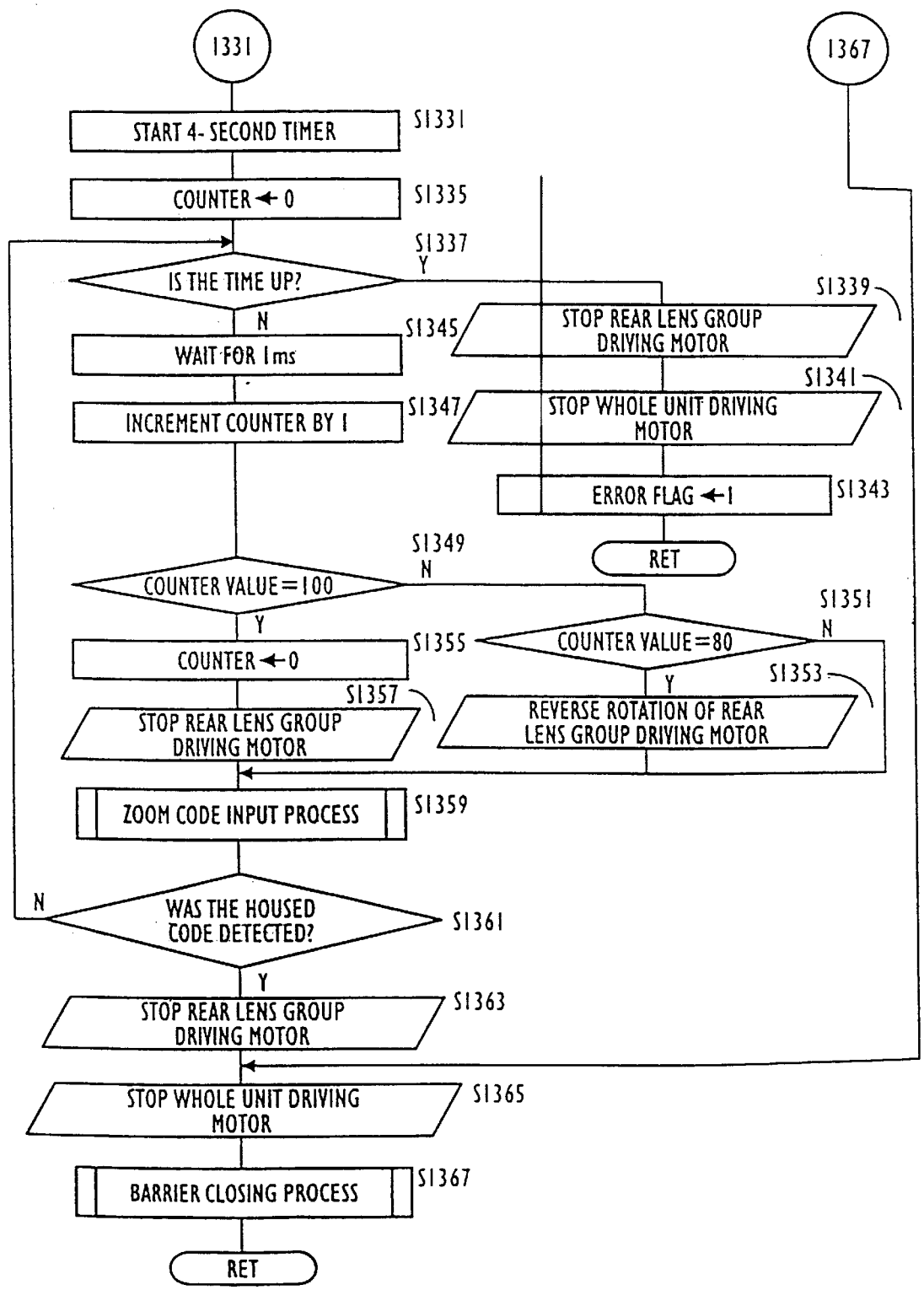

FIGS. 44 and 45 show a flow chart of the lens housing process. In the lens housing process the front lens group L1 and the rear lens group L2 are returned to the housed position. That is, the process is one in which the rear lens group L2 is returned to the AF home position by the rear lens group driving motor 30, and the lenses, i.e., the front lens group L1 and the rear lens group L2, are driven to the housed position by the whole unit driving motor 25, and then the lens barrier is closed.

At step S1301, when the lens housing process is called, the whole unit driving motor 25 is driven in the clockwise direction, namely in the "tele" zoom direction. At step S1303 the zoom code input process (FIG. 52) is executed until the present zoom code, namely the zoom code corresponding to the lens position at the time at which the lens housing process is called, is detected. If the zoom code is detected at step S1305, then at step S1307 driving of the whole unit driving motor 25 is stopped. Subsequently, at step S1309, it is judged whether the rear lens group L2 is at the AF home position. If the rear lens group L2 is not at the AF home position at step S1309, the AF return process (FIG. 54) is executed and the rear lens group L2 is moved to the AF home position.

If the lens housing process is performed when the rear lens group L2 is not at the AF home position, namely the rear lens group L2 is projecting towards the film, the rear lens group L2 may collide with the aperture plate 14 of the camera body before the lenses reach the housed position. For the purpose of avoiding such an occurrence, the rear lens group L2 is returned to the AF home position before the lenses are housed, namely before the counterclockwise driving of the whole unit driving motor 25.

When the lens housing process is called, if the lenses are positioned at the "wide" end position, there exists a possibility that the rear lens group driving motor 30 may not be connected to the movement device of the rear lens group L2, but instead connected to the barrier opening device. If the rear lens group driving motor 30 is connected to the barrier opening device, and if at the same time the rear lens group L2 is extended from the AF home position, the rear lens group L2 will not move to the AF home position even when the rear lens group driving motor 30 is driven.

Figure 34:
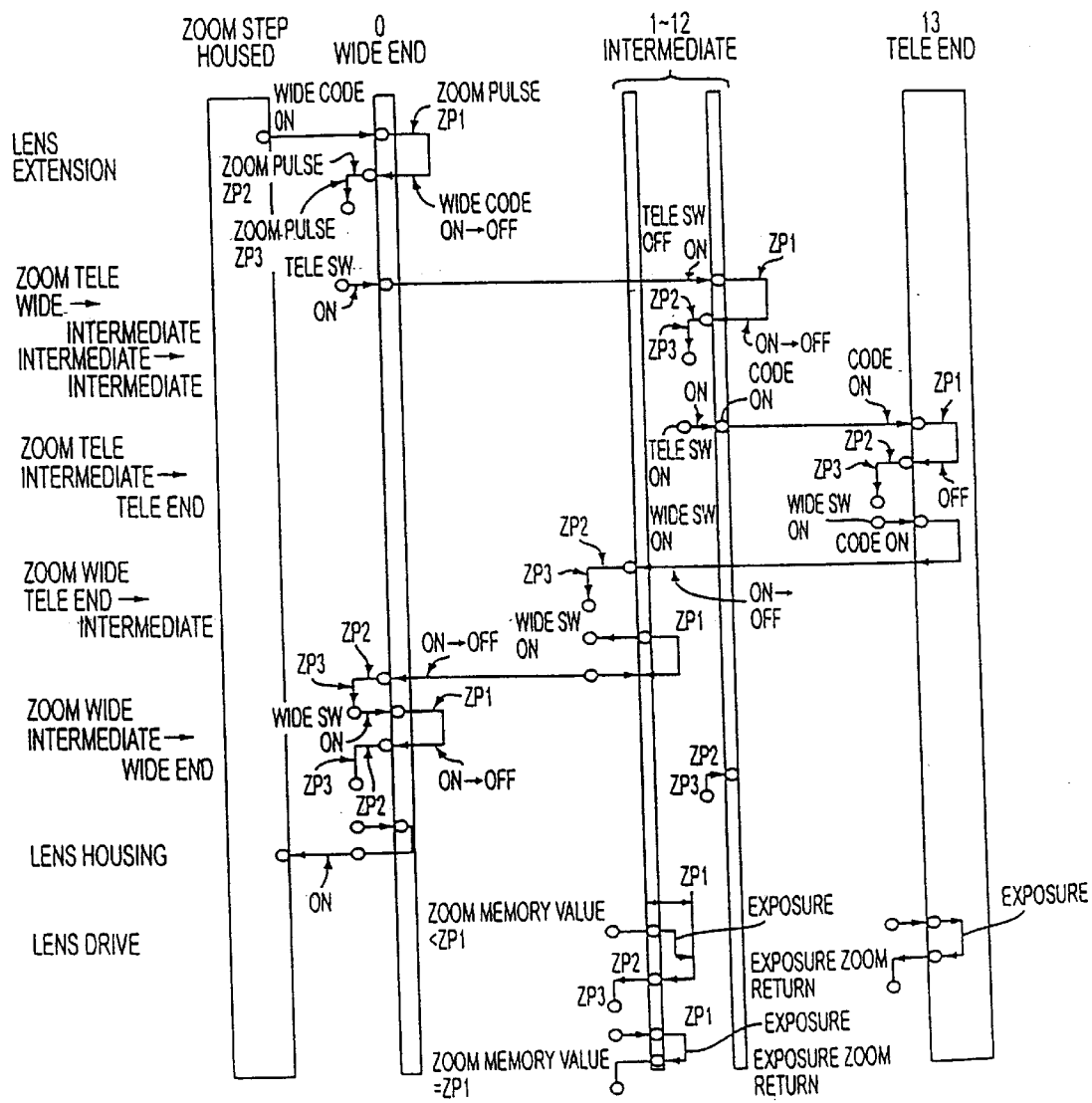
FIG. 34 is a schematic view illustrating movement of the front lens group and the rear lens group of the zoom lens camera.

In the processes of steps S1301 through S1307, the lenses are driven once beyond the "wide" end position, to the "tele" side, as shown in FIG. 34, so that the rear lens group driving motor 30 will be connected to the driving device of the rear lens group L2 after S1307. By driving the rear lens group driving motor 30 in the AF return process at step S1311, after it has been judged at step S1309 that the rear lens group L2 is not positioned at the AF home position, the rear lens group L2 can be surely be moved.

At step S1309, if the rear lens group L2 is judged to be positioned at the AF home position, the CPU 210 skips the AF return process (step S1311), and proceeds to the movement process for housing the lenses at step S1312.

At step S1312, the movement of the lenses to the "wide" end is started by driving the whole unit driving motor 25 counterclockwise, and at step S1313 a two-second timer is started. Subsequently, at steps S1315 through S1329, before the end of the two-second timer, the zoom code, which varies according to the movement of the lenses, is input to detect the lenses reaching the "wide" end position.

At step S1315, the CPU judges whether the timer has expired. The phrase "time expires" refers to the case in which the variation of the zoom code is not detected within two seconds and where the movement of the lenses is stopped. If the time has not expired, at step S1321, the zoom code input process is called and the zoom code is input.

Whether the zoom code has changed is judged at step S1323, and if the zoom code has changed, the two-second timer is reset. If it is judged that the zoom code has not changed at step S1323, it is then judged at step S1327 whether the lenses have reached the housed position. If the lenses have not reached the housed position, it is judged whether the lenses have reached the "wide" end position at step S1329. If neither the housed code nor the "wide" code is detected, the CPU 210 repeats the processes from step S1315.

If the time expires while repeating the above processes, at step S1317 the CPU 210 stops the whole unit driving motor 25, and sets the error flag to 1 to indicate the occurrence of an error (step S1319), and the lens housing process is ended. Control returns to the position at which the present process was called.

If at step S1329, the "wide" code was detected during the above process, then a four-second timer is set at step S1331, and the counter is reset to 0 (step S1335), and the processes from steps S1337 to S1361 are repeated until the four-second timer expires. Here, a process is executed in which the rear lens group driving motor 30 is driven intermittently while the whole unit driving motor 25 is driven continuously, namely the lenses are moved beyond the "wide" end position towards the housed position.

In the camera 1 of the present embodiment, as already described, the movement of the rear lens group L2 and the opening and closing of the barrier are executed by the rear lens group driving motor 30. When the lenses are positioned on the "tele" side of the "wide" end position, the rear lens group driving motor 30 is connected to the driving device of the rear lens group L2 and is not connected to the barrier opening device. However, when the lenses are positioned toward the housed position from the "wide" end position, or when the lenses are being housed, the barrier/lens switching gear device must be switched so that the rear lens group driving motor 30 is connected to the barrier opening device.

Although the switching of the gears is designed to be executed through a cam device according to the movement of the lenses, in order to ensure that the barrier/lens switching gear device will surely be engaged with the teeth of the barrier driving gear at this time, the rear lens group driving motor 30 is driven while the lenses are being moved from the "wide" end position to the housed position. To ensure the engagement of the barrier/lens switch gear, after step S1311 where the counterclockwise driving of the whole unit driving motor 25 is commenced, the rear lens group driving motor 30 is designed to be driven intermittently.

At step S1337, it is judged whether the time of the four-second timer expires. Normally, the time of the four-second timer will not be up as long as an error has not occurred, and an N (NO) judgement is made at step S1337. At step S1345, after waiting 1 ms, the counter is incremented at step S1347, and it is judged whether the value of the counter has reached 100 at step S1349. If the value of the counter is less than 100, an N judgement is made at step S1349, and then at step S1351, it is judged whether the value of the counter has reached 80 at step S1351.

If the value of the counter is less than 80 at step S1351, the zoom code input process is called and the zoom code is input at step S1359. If the housed code is not detected at step S1361, control returns to step S1337 and the processes are repeated. At step S1351, when the value of the counter reaches 80, the counterclockwise driving of the rear lens group driving motor 30 is executed at step S1353. If the value of the counter reaches 100, the counter is reset to 0, and the rear lens group driving motor 30 is stopped, at steps S1355 and S1357.

Since the waiting time of 1 ms is set at step S1345, the above processes are repeated at a 100 ms cycle. Therefore, when the value of the counter is between 0 and less than 80, namely, until 80 ms passes after the detection of the "wide" end code, only the whole unit driving motor 25 is driven. When the value of the counter is 80 or more and less than 100, namely, 80 ms or more and less than 100 ms have passed since the detection of the "wide" end code, both the whole unit driving motor 25 and the rear lens group driving motor 30 are driven. When the value of the counter reaches 100, namely, 100 ms have passed, the driving of the rear lens group driving motor 30 is stopped and only the whole unit driving motor 25 is driven continuously. Since the above processes are repeated, during the driving of the whole unit driving motor 25, the rear lens group driving motor 30 is driven for 20 ms in each 100 ms period.

If the housed code is not detected before the time of the four-second timer expires, the time is judged to expire at step S1337. The housed code will not be detected within four seconds if the movement of the lens is obstructed for some reason, and in such a case, at steps S1339 and S1341, the rear lens group driving motor 30 and the whole unit driving motor 25 are stopped, and the process is ended upon setting the error flag to 1 to indicate the occurrence of an error.

During the above process, when the housed code is detected, the CPU 210 stops the rear lens group driving motor 30 at step S1363, and further stops the whole unit driving motor 25 at step S1365, and after closing the barrier by calling the barrier closing process, the lens housing process is completed. The barrier closing process is the process to close the lens barrier by the rear lens group driving motor 30.

[THE LENS EXTENSION PROCESS]

Figure 46:
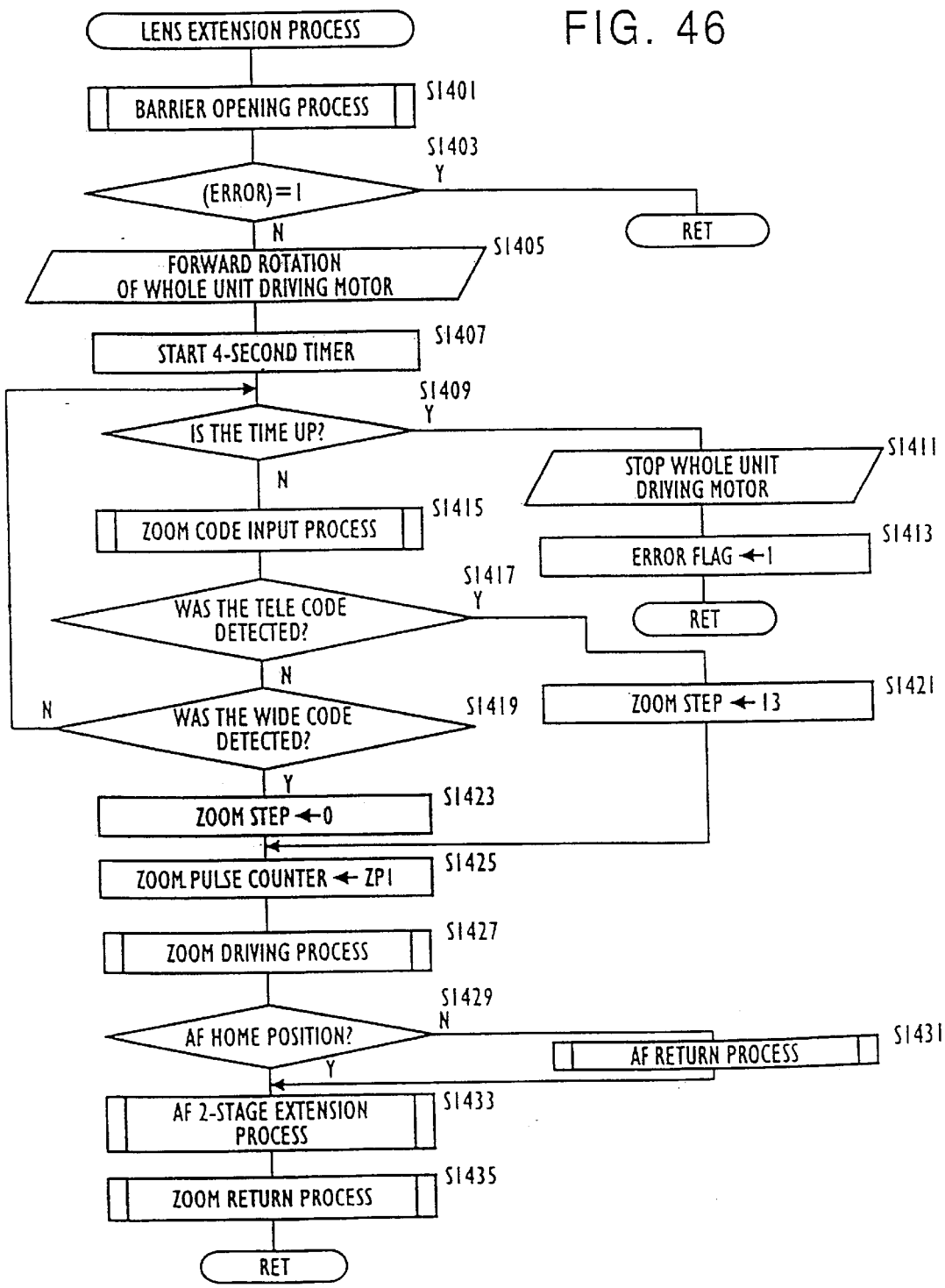
FIG. 46 is a flow chart of a lens extension process of the zoom lens camera.

FIG. 46 shows a flow chart of the lens extension process. In the lens extension process, when the state of the camera changes from being in the standby state to the power "ON" state (i.e., the operational state), the lens barrier is opened and the lenses (i.e., the front lens group L1 and the rear lens group L2) are extended from the housed position to the "wide" end position.

When the lens extension process is called, at step S1401, the barrier opening process is called and the barrier is opened by driving the rear lens group driving motor 30. In the barrier opening process, if a pulse is not output from the AF reference pulse input circuit 222, namely, if the rear lens group driving motor 30 is not driven, the error flag is set to 1.

At step S1403, it is judged whether the error flag has been set to 1 in the barrier opening process. The error flag will be set to 1 if the barrier opening process does not end normally, and in this case, the lens extension processes after step S1405 are not executed and control returns. The error flag will be set to 0 if the barrier opening process is ended normally, and in this case, at step S1405 the whole unit driving motor 25 is driven clockwise and the movement of the rear lens group L2 and the front lens group L1 in the "tele" direction is started.

With the commencement of driving of the whole unit driving motor 25, the CPU 210 starts the four-second timer at step S1407, and monitors whether the "wide" end code (i.e., whether the lenses reach the "wide" end position) is detected before the time of the timer expires.

At step S1409, the CPU 210 judges whether timer has expired. Normally, since the lenses reach the "wide" end position within four seconds from starting of the lens extension, the judgement at step S1409 is "N". At step S1415 the zoom code input process is called, and at step S1417 it is judged whether the input code, namely, the zoom code corresponding to the lens position, is the "tele" end code, and if the input code is not the "tele" end code, at step S1419 it is judged whether the input code is the "wide" end code.

Under normal conditions, the lens moves from the housed position to the "tele" end position within four seconds. Accordingly, before the time of the four-second timer expires, if neither the "tele" end code nor the "wide" end code is detected, it represents, for example, that the movement of the lens is obstructed. Therefore, if at step S1409 the time is judged to expire during the lens movement, at step S1411 the driving of the whole unit driving motor 25 is stopped, and at step S1413 the error flag is set to indicate that an error has occurred, and the lens extension process is ended.

In the normal lens extension process, when the lenses are extended, the "wide" end code is firstly detected. At step S1419, if the "wide" end code is detected, then at step S1423 the zoom step, which is an indicator of the lens position, is set to 0, corresponding to the "wide" position. From step S1425, the processes for stopping the lenses are executed.

If the lens extension process is continued without detecting the "wide" end code, the lenses will eventually reach the end of the range of capable movement, and will become immovable. In the camera 1 of the present embodiment, during the lens extension process, the lenses will continue to move even without the "wide" end being detected, and when the "tele" end code is detected at step S1417, the movement of the lenses, namely, the processes after step S1425, will be stopped. When the lenses reach the "tele" end position, the zoom step is set to 13, corresponding to the "tele" end position, at step S1421. Therefore, during the lens extension process, the zoom step will be set to the correct value corresponding to the lens position even when the lenses have moved to the "tele" end.

As described above, when the lenses have been extended and the zoom step has been set to correspond to the lens position, from steps S1425 to S1435 the processes to stop the lenses are executed. In the camera of the present embodiment, in order to obtain the position of the lens, the zoom step is set upon detecting the zoom code. When the lenses are stopped, for the purpose of detecting the zoom code, the brush 9a is designed so as to stop at a position that is shifted towards the "wide" end position by a predetermined amount, namely, "the standby position". When the lenses are moved for the purpose of zooming or focusing, the lenses are moved once towards the "tele" side, regardless of whether the direction of movement is towards the "wide" end or the "tele" end, in order for the brush 9a to contact the zoom code. The zoom code is then input to the CPU 210, which then controls the amount of movement of the zoom lens based on the position at which the zoom code is input, i.e., by making the position at which the zoom code is input a reference position.

Figure 57:
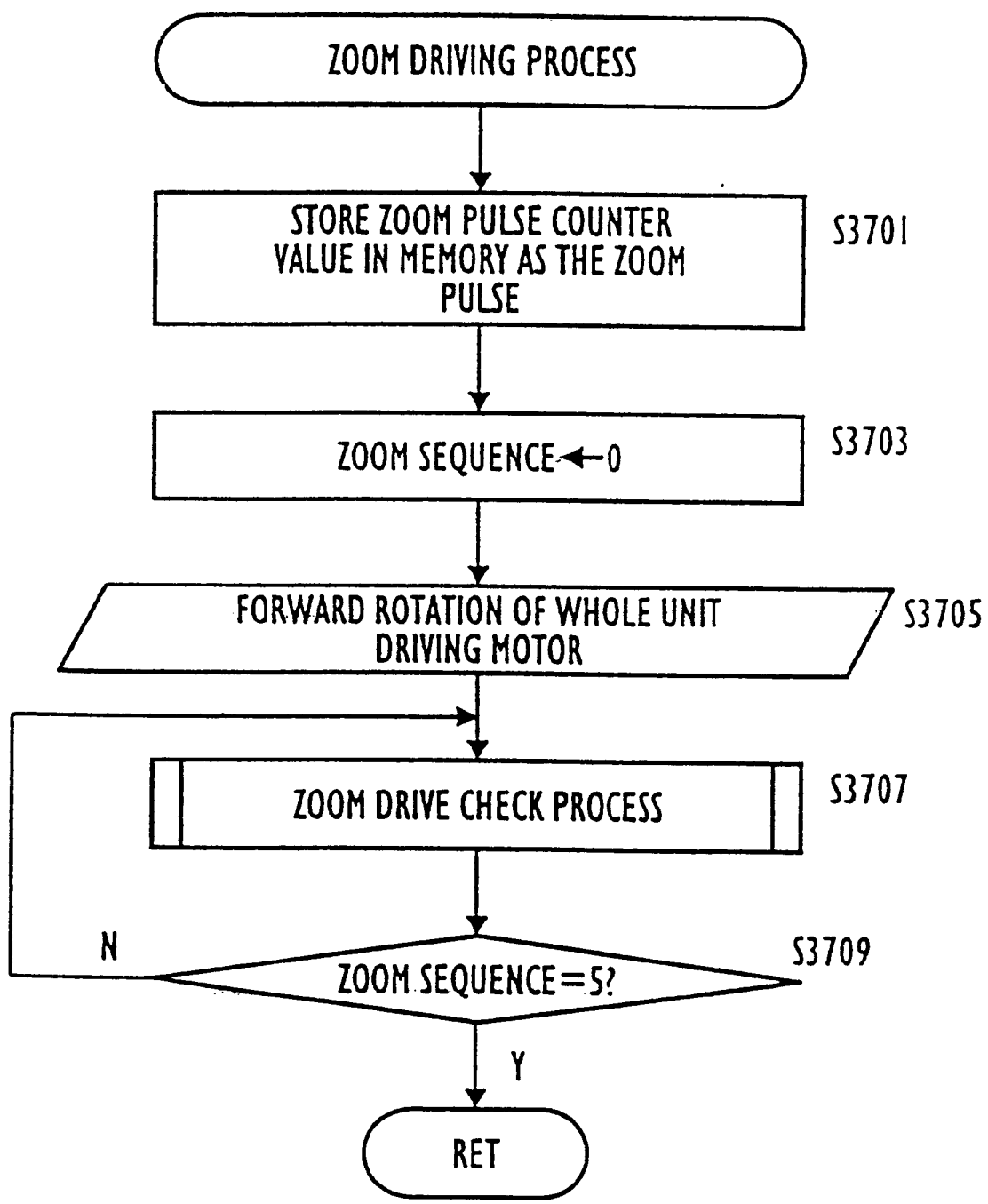
FIG. 57 is a flow chart of a zoom driving process of the zoom lens camera.

At step S1425, a first zoom pulse ZP1 having a predetermined value, is set in the zoom pulse counter and the zoom driving process is called, as shown in FIG. 57. In the zoom driving process, the whole unit driving motor 25 is driven clockwise, namely, in the direction in which the lenses are moved toward the "tele" side, until the number of pulses output to the CPU 210 by the zoom pulse input circuit 220 (output in synchronization with the rotation of the whole unit driving motor 25), becomes equal to the value of the counter value set in the zoom pulse counter. Thus, the lenses will be stopped upon being moved further towards the "tele" position by a predetermined amount from the position at which the zoom code detecting terminal detects the zoom code.

The value by which the brush for zoom code detection will be moved past the zoom code and positioned at a non-continuous part on the "tele" side when the lenses are moved by the zoom driving process, is used as the first zoom pulse ZP1, which is set at the zoom pulse counter at step S1425. The value of the first zoom pulse ZP1 also satisfies the following conditions. In the camera of the present embodiment, the magnification of the finder optical system varies according to the movement of the lenses. Accordingly, the first zoom pulse ZP1 is set so that the magnification of the finder will not be affected even if the lenses are moved by an amount corresponding to this value of the pulse. In the present embodiment, though the lenses move when the shutter button is pressed, the number of zoom pulses, corresponding to the amount of movement of the lenses at that time, is set to a value which will not exceed that of the first zoom pulse ZP1.

After the lenses are moved by an amount corresponding to the zoom pulse ZP1, at step S1429 it is judged whether the rear lens group L2 is positioned at the AF home position, and if the rear lens group L2 is not positioned at the AF home position, namely, if the rear lens group L2 is extended from the AF home position at step S1429, the AF return process is called at step S1431 and the rear lens group L2 is moved to the AF home position. With the rear lens group L2 being positioned at the AF home position, the AF two-stage extension process at step S1433, and the zoom return process at step S1435, are executed and control returns to the calling routine.

The AF two-stage extension process is the process in which the rear lens group L2 is extended by a certain amount from the AF home position In the camera of the present invention, when photography is performed (i.e., when the shutter button is fully depressed), after the front lens group L1 and the rear lens group L2 have been moved simultaneously for zooming, in addition to the movement of the front lens group L1 and the rear lens group L2 by the whole unit driving motor 25, the movement of only the rear lens group L2 by the rear lens group driving motor 30 is also performed for the purpose of focusing and adjustment of the focal length.

During photographing, since the amount of movement of the rear lens group L2 is relatively large when the lenses are at the "wide" end side, the release time lag, which is the time difference between the point at which the shutter button is pressed and the point at which exposure is actually performed, becomes rather long. In order to shorten the release time lag, in the camera of the present invention, when the lenses are positioned at the "wide" side (the movement of the rear lens group L2 is relatively large), the rear lens group L2 is extended by a predetermined amount in advance. The AF two-stage extension process of step S1433 is performed for this purpose, and is the process by which the rear lens group L2 is extended by a predetermined amount, only when the lenses are positioned on the "wide," side. In the present embodiment, the judgement as to whether the lenses are on "wide" side, is made according to whether the zoom step is less than or equal to 4, which will be described later (see below). In step S1435, the zoom return process moves the lenses toward the "wide" direction by a predetermined amount corresponding to zoom pulse ZP2 (described hereinafter).

[The Zoom "tele" Movement Process]

Figure 47:
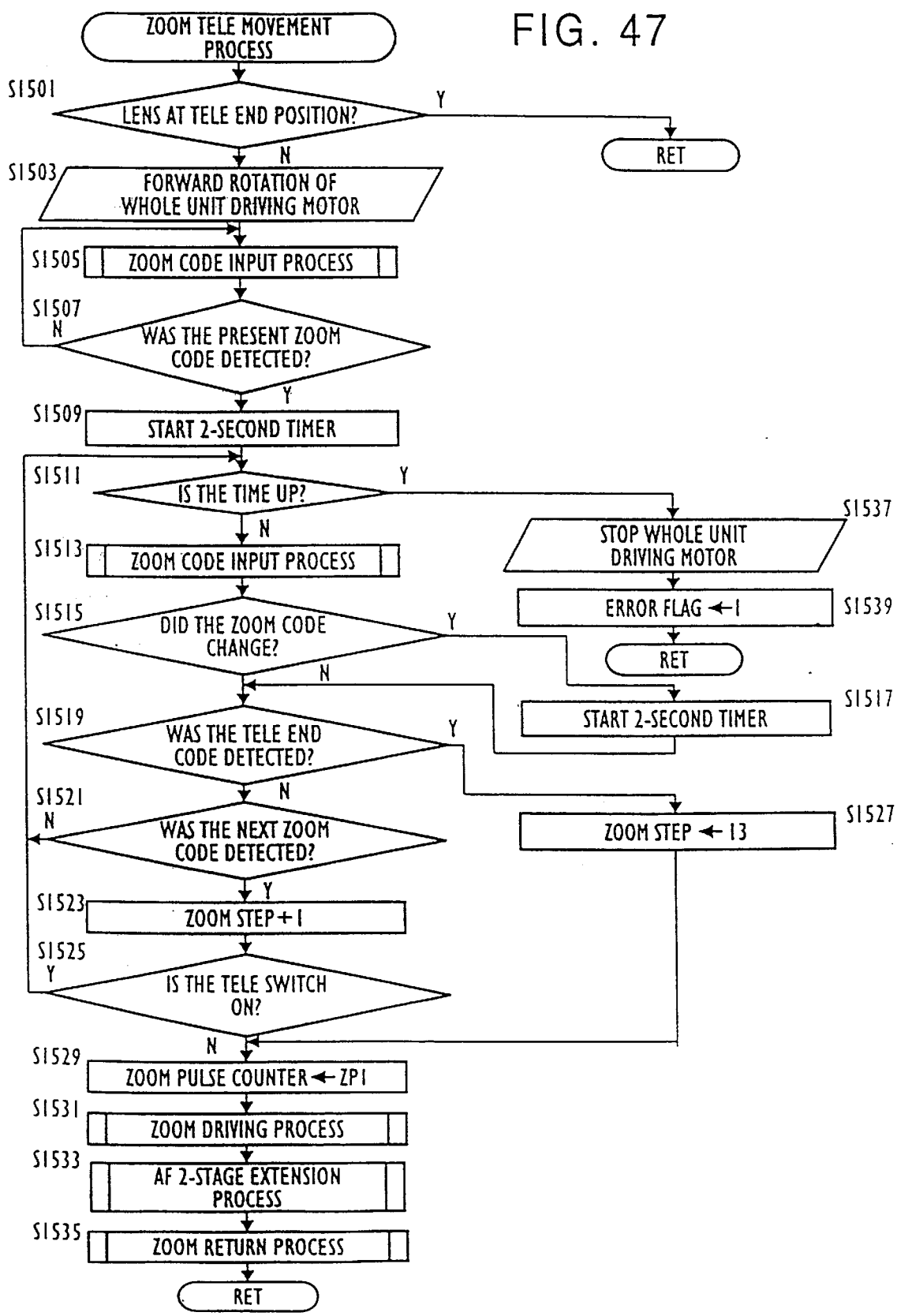
FIG. 47 is a flow chart of a zoom "tele" movement process of the zoom lens camera.

FIG. 47 shows a flow chart of the zoom "tele" movement process. This process will be described with reference to FIG. 34, which shows the relationship between the zoom code plate 13b and the positions of the front lens group L1 and the rear lens group during the zoom "tele" movement process. The zoom "tele" movement process is a process to drive the whole unit moving motor 25 in a direction in which the lens barrels 16, 19 and 20 extend (i.e., in the direction in which the focal length is made long), namely the front lens group L1 and the rear lens group L2 are advanced as a whole without changing the relative distance therebetween.

In the zoom "tele" movement process, the zoom code corresponding to the present position of the lens is detected by driving the whole unit driving motor 25 clockwise. The point at which the zoom code turns "ON" is used as a reference point when the whole unit driving motor 25 is to be stopped. After the whole unit moving motor 25 is driven clockwise to advance the lenses by the predetermined first zoom pulse value ZP1 with respect to this reference point, the whole unit driving motor 25 is driven counterclockwise. After the whole unit driving motor 25 has been driven to rotate counterclockwise by the second zoom pulse value ZP2 with respect to the point at which the zoom code turns "ON/OFF" again, the whole unit driving motor 25 is driven clockwise by a backlash eliminating zoom pulse value ZP3, and the whole unit driving motor 25 is stopped. By this zoom "tele" movement process, the zoom lens is stopped between zoom codes with backlash in the forwarding (advancing) direction being removed to some extent.

Furthermore, in the present embodiment, when the whole unit driving motor 25 stops, if the zoom step is not more than 4, the rear lens group L2 is retracted by an amount corresponding to the predetermined AF pulse value AP1. In the present embodiment, the present lens position is controlled by dividing the focal length range, from the "wide" end to the "tele" end, into fourteen parts, and assigning the zoom step 0 to the "wide" end, the zoom step 13 to the "tele" end, and zoom steps 1 through 12 to the focal lengths in between.

In the zoom "tele" movement process, at step S1501 it is checked whether the lenses are at the "tele" end position, and if the lenses are at the "tele" end position, control returns since there is no need for tele-zooming.

If the lenses are not at the "tele" end position at step S1501, at step S1503 the whole unit driving motor 25 is driven clockwise, namely, in the tele-zoom direction, and the zoom code input process is executed at step S1505. The process waits until the present zoom code corresponding to the zoom step is detected at step S1507. When the present zoom code corresponding to the zoom step is detected, at step S1509 a two-second timer is started to detect a state in which the whole unit driving motor 25 is incapable of driving for a predetermined period of time (i.e., two seconds).

When the two-second timer is started, at step S1511 it is checked whether the time has expired. In the case of normal operations the time will not be up, and therefore at step S1513 the zoom code input process is executed. Then at step S1515 it is checked whether the zoom code has changed, and if the zoom code has not changed, a "tele" end code detecting check is directly executed at step S1519. If the zoom code has changed, the "tele" end code detecting check is executed at step S1519 only after restarting the two-second timer at step S1517.

If the zoom code does not change even after the whole unit driving motor 25 has driven for the predetermined period of time, it is assumed that an abnormal condition, such as the lens barrel has contacted some object, has occurred. Therefore at steps S1511, S1537 and S1539, after starting the two-second timer, if the two seconds have elapsed and the time of the two-second timer expires without any variation of the zoom code, the whole unit driving motor 25 is stopped, the error flag is set, and control is returned.

If the "tele" end code is not detected at step S1519, it is judged whether the next zoom code is detected at step S1521, and if the next code is not detected, the processes of steps S1511 through S1519 are repeated. Upon detection of the next zoom code, the zoom step is incremented by 1 at step S5123, and if the "tele" switch 62T is ON at step S1525, control is returned to step S1511 and the above processes are repeated, while if the "tele" switch is OFF, a jump to step S1525 is performed. That is, once this process is entered, tele-zooming is performed by one zoom step even when the zoom switch 62T is turned OFF before tele-zooming is performed by one zoom step.

A jump to step S1529 is performed when the lenses reach the "tele" end or when the "tele" switch 62T is turned OFF (steps S125, S1529 or S1519, S1527, S1529) If the jump is performed upon reaching the "tele" end, the zoom step is set to 13 at step S1527.

At step S1529, the predetermined first zoom pulse value ZP1 is set in the zoom pulse counter. Then after the zoom driving process at step S1531, the AF two-stage delivery process (step S1533) and the zoom return process (step S1535) are executed, and control is returned.

In the zoom driving process, the whole unit driving motor 25 is driven clockwise (i.e., in the direction in which the lenses are extended) by an amount corresponding to the value of the zoom pulse counter, namely, that of the first zoom pulse value ZP1.

In the AF two-stage extension process, when the whole unit driving motor 25 is stopped, if the zoom step is not more than 4, the rear lens group L2 is retracted by an amount corresponding to the predetermined AF pulse value (i.e., AP1). Then the whole unit driving motor 25 is driven counterclockwise, by an amount corresponding to the second zoom pulse value ZP2, with respect to the point at which the zoom code turns ON/OFF. Then the whole unit driving motor 25 is driven clockwise by an amount corresponding to the backlash eliminating third zoom pulse value ZP3, and the whole unit driving motor 25 is stopped. By this zoom "tele" movement process, the zoom lens is stopped between zoom codes with the backlash in the advancing direction being somewhat eliminated.

In the zoom return process, the whole unit driving motor 25 is driven counterclockwise, and is further driven counterclockwise by an amount corresponding to the second zoom pulse value ZP2 with respect to the point at which the zoom code turns ON/OFF. After that, the motor is driven clockwise by an amount corresponding to the backlash eliminating third zoom pulse value ZP3, and then the whole unit driving motor 25, is stopped to stop the front lens group L1 and the rear lens group L2 at the standby position between the zoom codes.

[The Zoom "wide" Movement Process]

Figure 48:
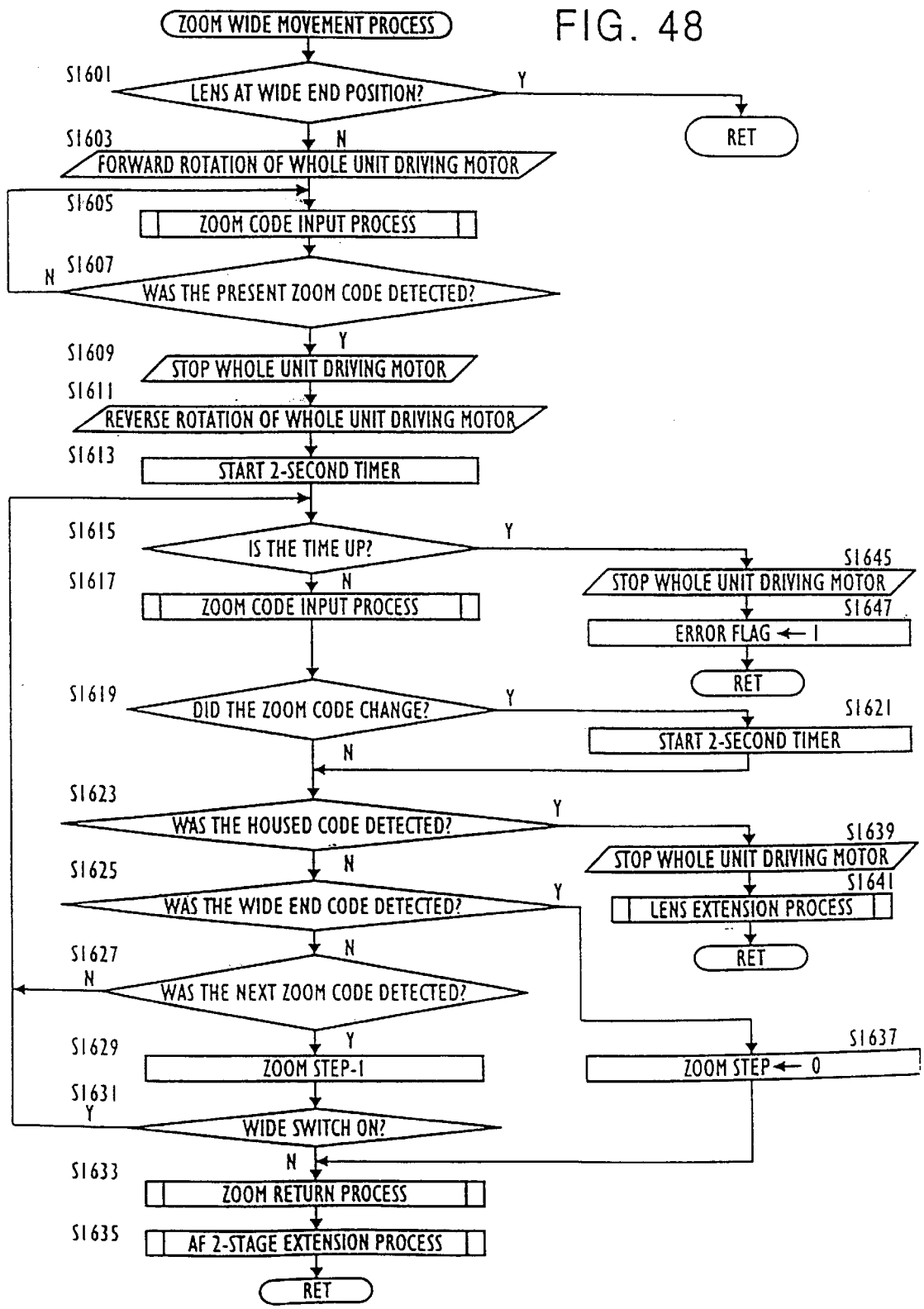
FIG. 48 is a flow chart of a zoom "wide" movement process of the zoom lens camera.

FIG. 48 shows a flow chart for the zoom "wide" movement process. This process shall be firstly described with reference to FIG. 34, which shows the relationship between the zoom code plate 13b and the positions of the front lens group L1 and the rear lens group L2 during the zoom "wide" movement process. In the zoom "wide" movement process the whole unit driving motor 25 is driven in the direction in which the lens barrels 16, 19 and 20 are retracted (i.e., the direction in which the focal length is made shorter), namely, the front lens group L1 and the rear lens group L2 are retracted as a whole without changing the distance therebetween.

In the zoom "wide" movement process, the whole unit driving motor 25 is driven clockwise and after being driven clockwise further by an amount corresponding to the first zoom pulse value ZP1. From the point at which the zoom code corresponding to the present lens position is detected, the whole unit driving motor 25 is driven counterclockwise. When the whole unit driving motor 25 is stopped in the intermediate zoom region, the motor 25 is further driven counterclockwise by an amount corresponding to the second zoom pulse value ZP2 from the point at which the zoom code turns "ON/OFF". Then the motor 25 is driven counterclockwise by an amount corresponding to the backlash eliminating zoom pulse value ZP3, and then the whole unit driving motor 25, is stopped. By this zoom "wide" movement process, the zoom lens is stopped between zoom codes with the backlash in the forwarding (advancing) direction being somewhat eliminated.

In the present embodiment, when the whole unit driving motor stops, if the zoom step is not more than 4, the rear lens group L2 is retracted by an amount corresponding to the predetermined AF pulse value AP1. The motor 25 is then driven counterclockwise by an amount corresponding to the second zoom pulse value ZP2 with respect to the point at which the zoom code turns "ON/OFF", and then the motor 25 is driven clockwise by an amount corresponding to the zoom pulse value ZP3 for backlash elimination, and then the whole unit driving motor 25 is stopped. By this zoom "wide" movement process, the zoom lens is stopped between zoom codes with the backlash in the advancing direction being eliminated to some extent.

When the zoom "wide" movement process is entered, at step S1601 it is checked whether the lens is at the "wide" (i.e., "wide" end) position, and if the lens is at the "wide" position, control returns since there is no need for zooming.

If at step S1601, the lens is not at the "wide" position, the whole unit driving motor 25 is driven in a clockwise direction, i.e., tele-zooming direction, at step S1603 since there is a possibility that the lenses may have been moved past the next zoom code due to the backlash when the lenses were retracted. At step S1605 the zoom code input process is executed and the process waits until the present zoom code corresponding to the zoom step is detected at step S1607. When the present zoom code corresponding to the zoom step is detected, the whole unit driving motor is stopped (step S1609), driven counterclockwise (step S1611), and the two-second timer is started at step S1613.

When the two-second timer is started, it is checked whether the time expires at step S1615. In the case of normal operations the time will not be up, and therefore at step S1617 the zoom code input process is executed. It is then checked whether the zoom code has changed at step S1619, and if the zoom code has changed, the two-second timer is restarted (step S1621) and it is checked whether the housed code has been detected at step S1623. If the zoom code has not changed at step S1619 control proceeds to step S1623. If the housed code is not detected at step S1623, it is checked whether the "wide" end code is detected at step S1625, and if the "wide" end code is also not detected, it is checked whether the next zoom code has been detected at step S1627. If the next zoom code has not been detected, control returns to step S1615, and the process from steps S1615 to S1627 are repeated until the next zoom code is detected.

When the next zoom code is detected at step S1627, the zoom step is decremented by 1 at step S1629, and if the "wide" switch 62W is ON at step S1631, control returns to step S1615 and the above processes of steps S1615 through S1631 are repeated. If the "wide" end code is detected at step S1625, or if the "wide" switch is OFF, control jumps to step S1633 and the zoom return process is called (steps S1625, S1633, S1635, S1637 or S1631, S1635, S1637). At step S1637, when the jump is performed upon detection of the "wide" end code, the zoom step is set to 0.

In the zoom return process at step S1633, the front lens group L1 and the rear lens group L2 are returned to the standby position at which they were positioned before the lens driving process during the photographing process.

In the AF two-stage delivery extension at step S1635, the rear lens group L2 is retracted to the AF home position, or to the position retracted from the AF home position by an amount corresponding to the value AP1 in accordance with the present zoom step.

Although the above description is directed to a normal operation, in cases where the lens barrel is forcibly pushed etc., it is checked at step S1623 that the housed code has been detected. If so, the whole unit driving motor 25 is stopped at step S1639, and the lens extension process is executed at step S1641 before the control is returned. In addition, if two-second timer expires, for example when the lens barrel is pressed and is incapable of movement, the whole unit driving motor 25 is stopped at step S1645, and control returns after setting the error flag to 1.

In the present zoom "wide" process, since the "wide" switch check is executed after detecting the present zoom code and the next zoom code, wide zooming is performed by one zoom step once this process is entered, even when the zoom "wide" switch 62W is OFF before zooming is performed by one step.

[The Photographing Process]

Figure 49:
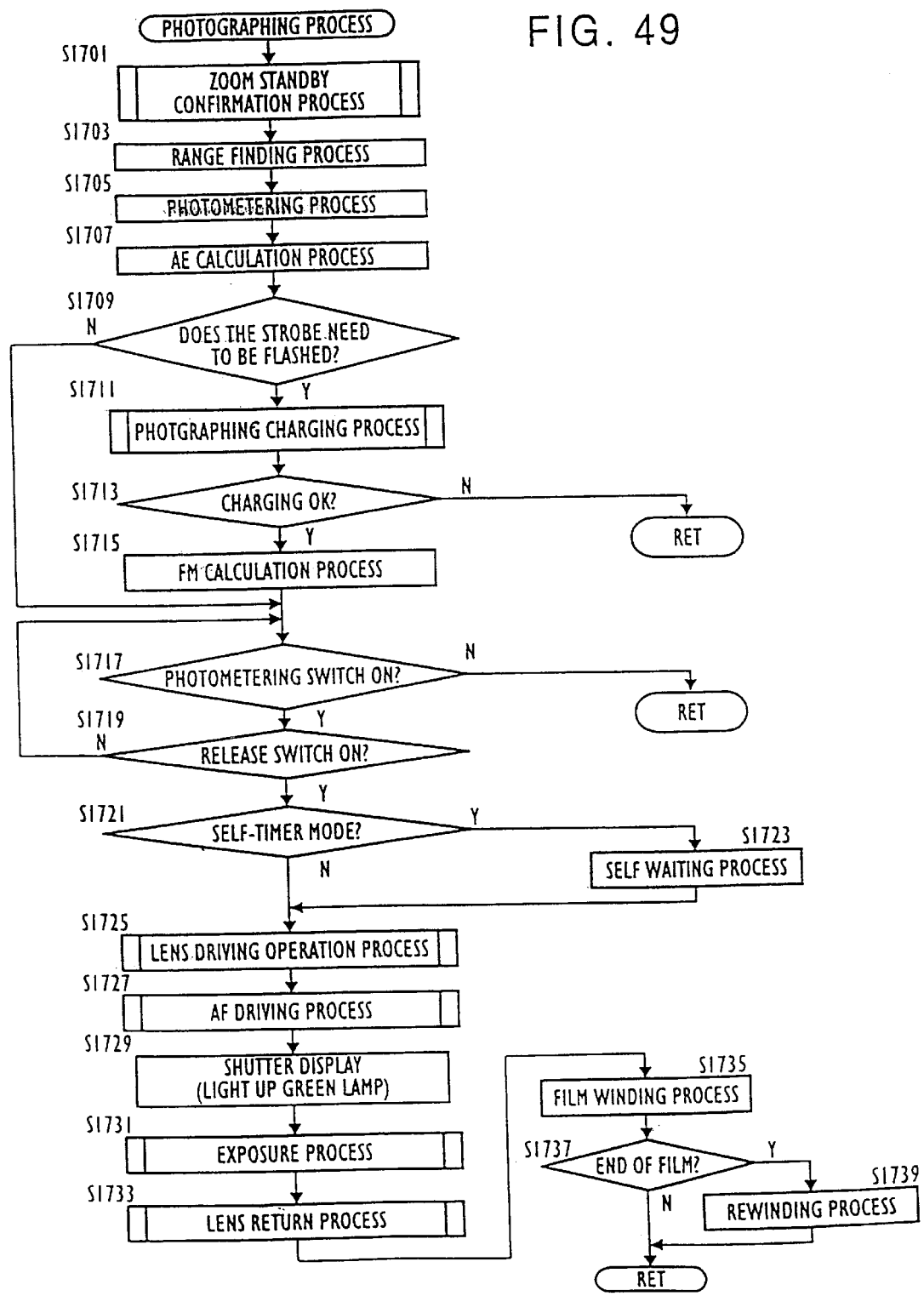
FIG. 49 is a flow chart of a photographing process of the zoom lens camera.

FIG. 49 shows a flow chart for the photographing process. The photographing process, of the present embodiment, is called when the photometering switch SWS is turned ON, and is characterized in that it is checked if the front lens group L1 is at the standby position. The front lens group L1 and the rear lens group L2 are moved to positions at which the subject will be in focus, in accordance with the preset focal length after the release switch SWR is turned ON.

In the photographing process, at step S1701, the zoom standby confirmation process is executed, and the front lens group L1 is moved to the standby position corresponding to the present focal length.

Then at steps S1703, S1705 and S1707, the object distance measuring process is executed and the focal length is obtained, the photometering process is executed and the luminance of the subject is obtained. The AE calculation process is also executed to determine the shutter speed, the aperture value, and whether strobe flashing is necessary. Strobe flashing will be necessary when the luminance of the subject is at the strobe flashing level in the auto strobe flashing mode, or when the forced strobe flashing mode is set, etc. If it is judged that strobe flashing is necessary at step S1709, the photographing charging process is executed at step S1711. During the photographing charging process, if the photometering switch SWS is turned OFF or if the time of the charging timer expires (step S1713), control returns, while if sufficient charging has been completed, after executing the flashmatic (FM) operation at step S1715, control proceeds to step S1717. If strobe flashing is not necessary at step S1709, control proceeds to step S1717, skipping steps S1711 through S1715.

At step S1717, it is checked whether the photometering switch SWS is turned ON, and if the photometering switch SWS is turned OFF, control returns. If the photometering switch SWS is ON at step S1717, the process waits for the release switch SWR to be turned ON (step S1719) while the photometering switch SWS remains ON.

When the release switch SWR is ON (step S1719) and if the self-timer mode is not set at step S1721, the lens drive calculation process is executed at step S1725. If the self-timer mode is set, the lens drive calculation process is executed after a self-waiting process at step S1723, in which the process waits for a predetermined duration of time.

In the lens drive calculation process, the amount of movement, i.e., the zoom pulse value, of the front lens group L1 with respect to the ON/OFF switching point of the zoom code and the amount of movement, i.e., the AF pulse value, of the rear lens group L2 with respect to the switching point of the AF home signal (AF home position) are calculated according to the result of focusing and the present focal length.

Then at steps S1725 and S1727, according to the amount of movement of the front lens group L1 and the rear lens group L2 obtained through the lens drive calculation process, the lens driving process is executed. In the lens driving process, the rear lens group L2 is driven together with the front lens group L1, and control is performed to bring the subject into focus.

When the movement of the lens is completed, at step S1729 the green lamp 228 is lit (i.e., current is passed through the green lamp) to notify the photographer that the shutter will be released, and the exposure process is executed at step S1731. The green lamp 228 only stays lit for a small duration of time and then is turned OFF.

After the exposure process has completed, at step S1733, the lens return process is executed, in which the front lens group L1 and the rear lens group L2 are returned to the positions they were at prior to movement at step S1727.

Then at steps S1735, S1737 and S1739, the film winding process is executed, and if the film is not at the end, control is returned, while if the end of the film has been reached, the rewinding process is executed and control returns.

[The Main Charging Process]

Figure 50:
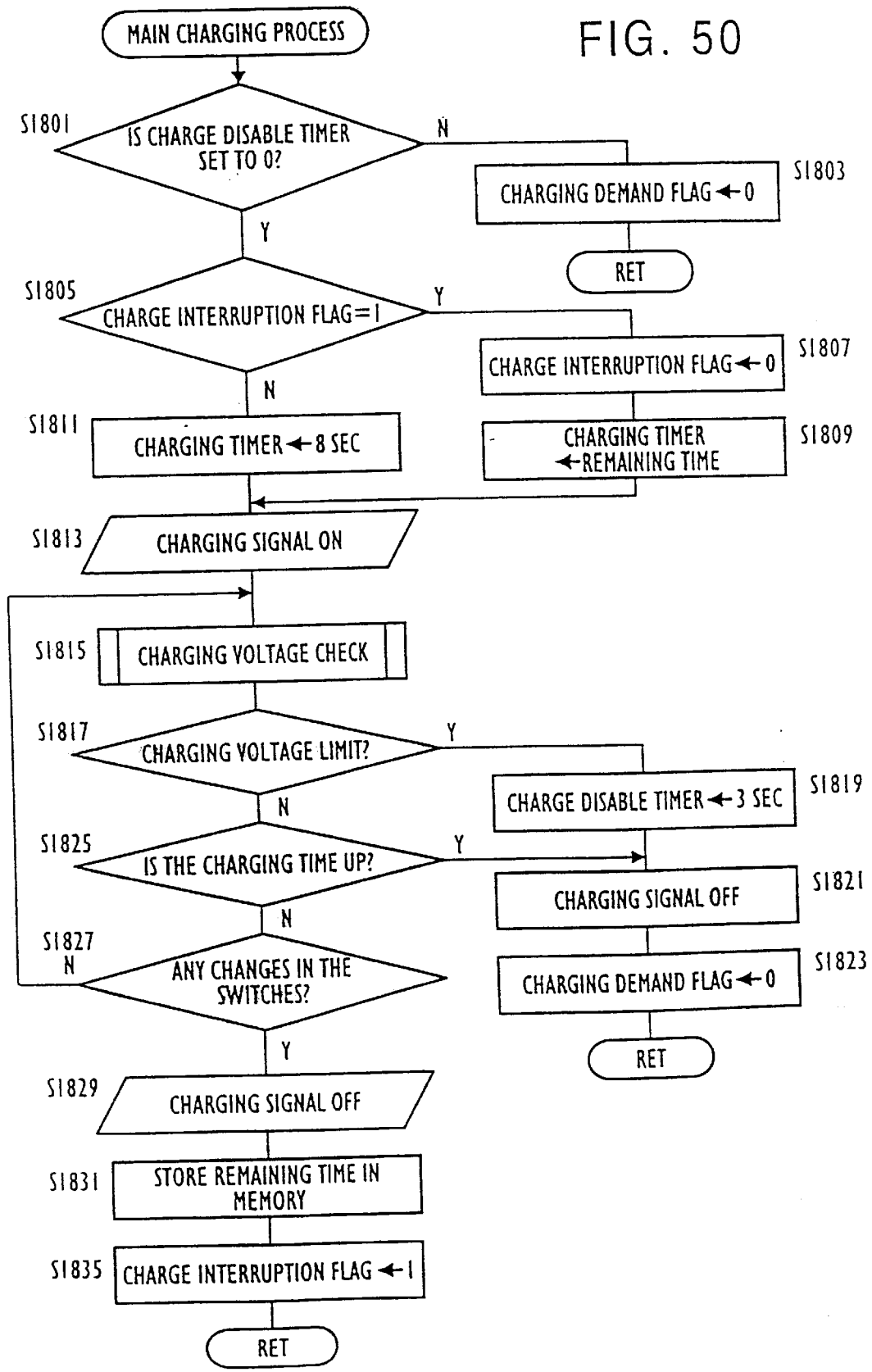
FIG. 50 is a flow chart of a main charging process of the zoom lens camera.

FIG. 50 shows a flow chart for the main charging process. The main charging process is the charging process that is called in the main process (FIG. 41) when the charging demand flag equals 1.

At step S1801, the CPU 210 judges whether the value of the charge disable timer is set to 0. The charge disable timer is a timer in which the time to disabled charging is set. A charge disable time of three seconds is set when the flash capacitor 530 of the strobe device 231 is fully charged. If the time has not expired at the charge disable timer at step S1801, at step S1803 the charging demand flag is set to 0, and the process is ended. In such a manner, while the charge disable timer is counting the three seconds during which charging is to be disabled, the CPU 210 prohibits charging unconditionally without checking the charging voltage. The charging can be interrupted (disabled) by setting the level of the terminal CHEN of the strobe device 231 to L.

If the time at the charge disable timer expires, at step S1805 the CPU 210 judges whether the charge interruption flag is set to 1. As will be described later, the charge interruption flag is set to 1 when the charging process is canceled before the completion thereof. In the present main charging process and in the photographing charging process, which will be described later, the charging process is deemed to have been completed normally when the charging voltage reaches a predetermined value, or when the charging time reaches a predetermined time (for example, in the present camera, eight seconds). During charging, if the charging is interrupted due to the operation of another switch, etc., the time spent on charging prior to interruption is deducted from the predetermined time, namely from eight seconds, and the remaining time is stored in the memory. When charging is resumed, it is judged whether the charging voltage will reach the predetermined value within the remaining time.

Therefore, if the charge interruption flag is set to 1, the charge interruption flag is cleared (i.e., set to 0), and a resumed charging process is performed by setting the charging timer to the remaining time which has been stored in the memory. If the charge interruption flag is not 1, namely if the charging process has not been interrupted at step S1805, charging is performed upon setting the charging timer to the predetermined charging, i.e., eight seconds.

In order to start charging, the CPU 210 turns ON the charging signal at step S1813. In other words, charging is started by setting the level of terminal CHEN of the strobe device 231 to be high (H). While the level at the terminal CHEN on the strobe device 231 is H, an A/D conversion is performed on the output of terminal RLS of the strobe device 231, and the converted output is input to the CPU 210. At step S1815, the CPU 210 checks the charging voltage based on the A/D converted voltage value. If the charging voltage has reached the upper limit at step S1817, then at step S1819, the CPU 210 disables charging for three seconds, by setting three seconds as the charge disable time in the charge disable timer, and then at step S1821, the CPU 210 stops the charging by making the voltage at the terminal CHEN of the strobe device 231 as low (L). Then the charging demand flag is set to 0 at step S1823 and the main charging process is completed.

If at step S1817, the CPU judges that the charging voltage has not reached the upper limit, at step S1825 it is judged whether charging timer has expired. If the charging timer expires, at step S1821 the charging is stopped by making the level at the terminal CHEN of the strobe device 231 as L, and at step S1823 the charging demand flag is set to 0 to indicate the completion of the charging process. For reference, if the main charging process is completed after the time of the charging timer expires, the charge disable time of three seconds is not set.

If the time of the charging timer has not expired at step S1825, then at step S1827, the CPU judges whether the state of any of the switches has changed. If any change of state amongst the switches is detected, the charging process is interrupted, and the process corresponding to the operated switch is performed in accordance with a predetermined priority. Therefore, upon detecting a change in the state of the switches, the CPU 210 sets the charging signal to OFF at step S1829 (i.e., sets the level at the terminal CHEN of the strobe device 231 to be low). At step S1831 the remaining time indicated by the charging timer is stored in the memory, and at step S1835 the charge interruption flag is set 1 to indicate the interruption of charging, and the main charging process is completed. The remaining time stored in the memory at step S1831, and the charge interruption flag set at step S1835, are referred to at the time of execution of the next main charging process or the next photographing charging process.

[The Shutter Initialization Process]

Figure 51:
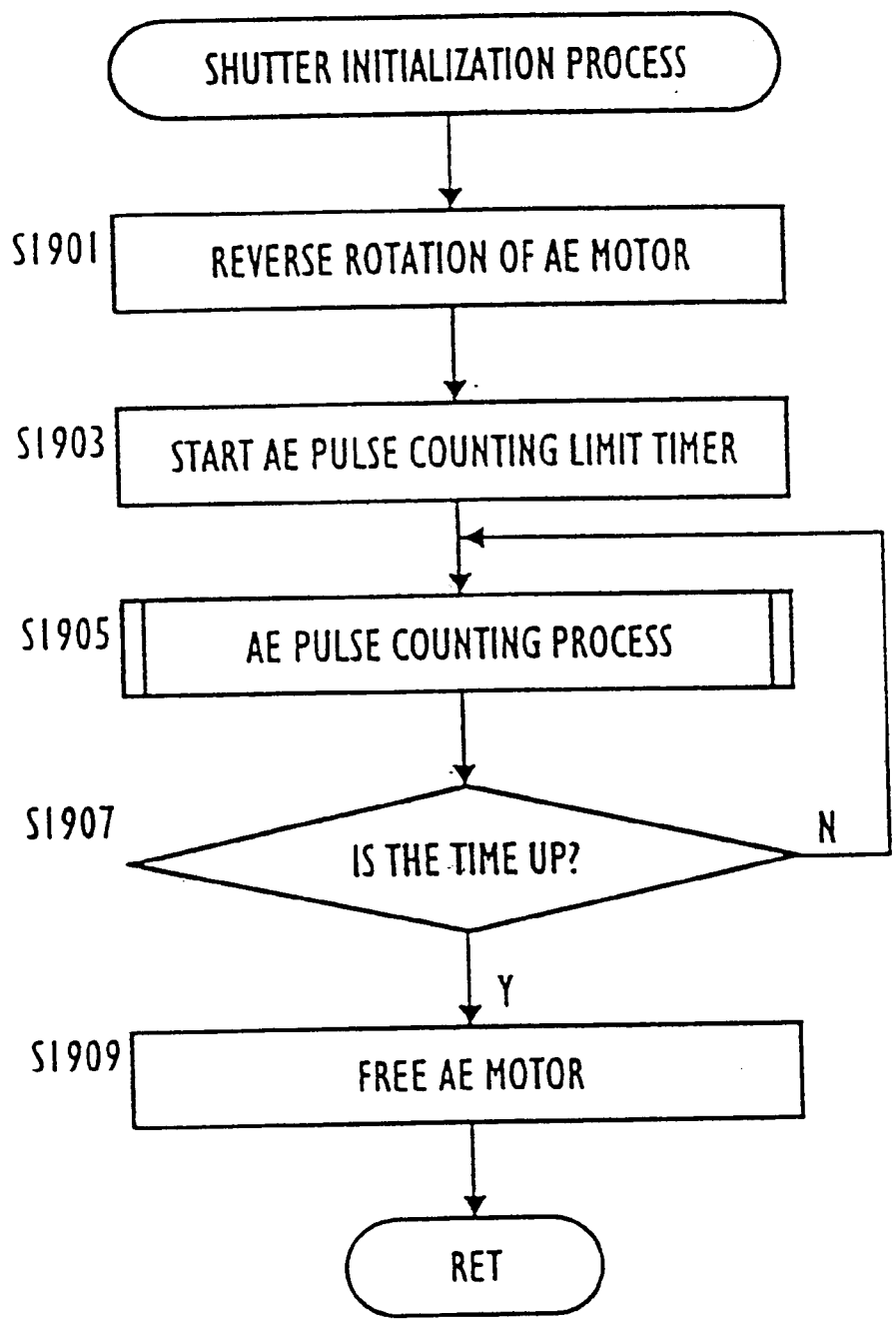
FIG. 51 is a flow chart of a shutter initialization process of the zoom lens camera.

FIG. 51 shows a flow chart for the shutter initialization process. In the shutter initialization process of the present embodiment, the AE motor 29, which drives the shutter 27, is driven in the shutter closing direction to fully close the shutter blades until the shutter blades come into contact with the stoppers.

At step S1901, the AE motor 29 is firstly driven counterclockwise to drive the shutter blades 27a in the closing direction. Then at step S1903 the AE pulse counting limit timer is started, and the AE pulse count process is called to wait for the time to expire at the AE pulse counting limit timer, while detecting the AE pulse (steps S1905, S1907). The AE pulse counting process is performed by the CPU 210 in combination with the AE pulse inputting circuit 221.

At steps S1907 and S1909, the shutter blades 27a are completely shut and the AE motor 29 becomes incapable of driving, since the time will have expired as determined by the AE pulse counting limit timer, the AE motor 29 is released, and control is returned.

By the above process, the shutter 27 is set to the initial position at which the shutter blades 27a are completely shut.

[The Zoom Code Input Process]

Figure 52:
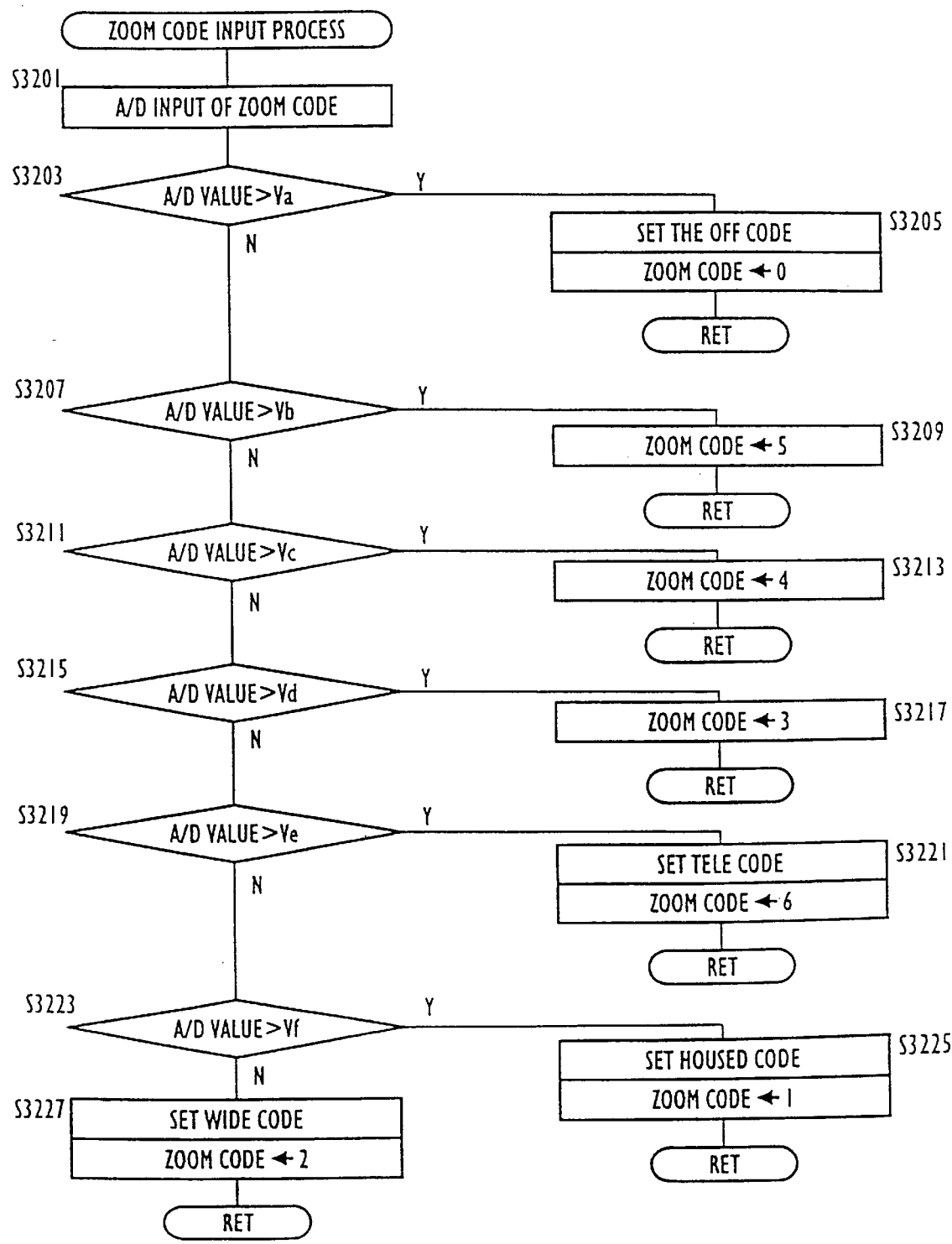
FIG. 52 is a flow chart of a zoom code input process of the zoom lens camera.

FIG. 52 shows a flow chart of the zoom code input process. In the zoom code input process, the zoom code is set based on the A/D converted value of the voltage input into the A/D conversion terminal of the CPU 210 from the zoom code information input circuit 219.

At step S3201, a voltage is input from the zoom code information input circuit 219 into the A/D terminal of the CPU 210. The CPU 210 compares the A/D converted value of the input voltage with the threshold voltages Va through Vf, and sets the zoom code corresponding to the input voltage. The setting of the zoom code is executed as follows.

At step S3203, the CPU 210 compares the A/D converted value with the threshold voltage Va. If the A/D converted value of the input voltage is greater than the threshold voltage Va at step S3203, the zoom code is set to 0 at step S3205, and control is returned.

If the A/D converted value of the input voltage is less than or equal to Va at step S3203, and greater than Vb at step S3207, the zoom code is set to 5 at step S3209.

If the A/D converted value of the input voltage is less than or equal to Vb at step S3207, and greater than Vc at step S3211, the zoom code is set to 4 at step S3213.

If the A/D converted value of the input voltage is less than or equal to Vc at step S3211, and greater than Vd at step S3215, the zoom code is set to 3 at step S3217.

If the A/D converted value of the input voltage is less than or equal to Vd at step S3215, and greater than Ve at step S3219, the zoom code is set to 6 at step S3221.

If the A/D converted value of the input voltage is less than or equal to Ve at step S3219, and greater than Vf at step S3223, the zoom code is set to 1 at step S3225.

If the A/D converted value of the input voltage is less than or equal to Vf at step S3223, the zoom code is set to 2 at step S3227.

Here, the codes identified by Vd, Ve and Vf, for which the interval between the threshold voltages is relatively large, are respectively assigned to the lens housed position (the zoom code=1), the "wide" end position (the zoom code=2) and the "tele" end position (the zoom code=6), which become reference points for the lens position. In such a manner, the correct zoom code will be set at least for the reference points even if the voltage input into the CPU 210 varies somewhat due to voltage fluctuations.

[The AF Pulse Confirmation Process]

Figure 53:
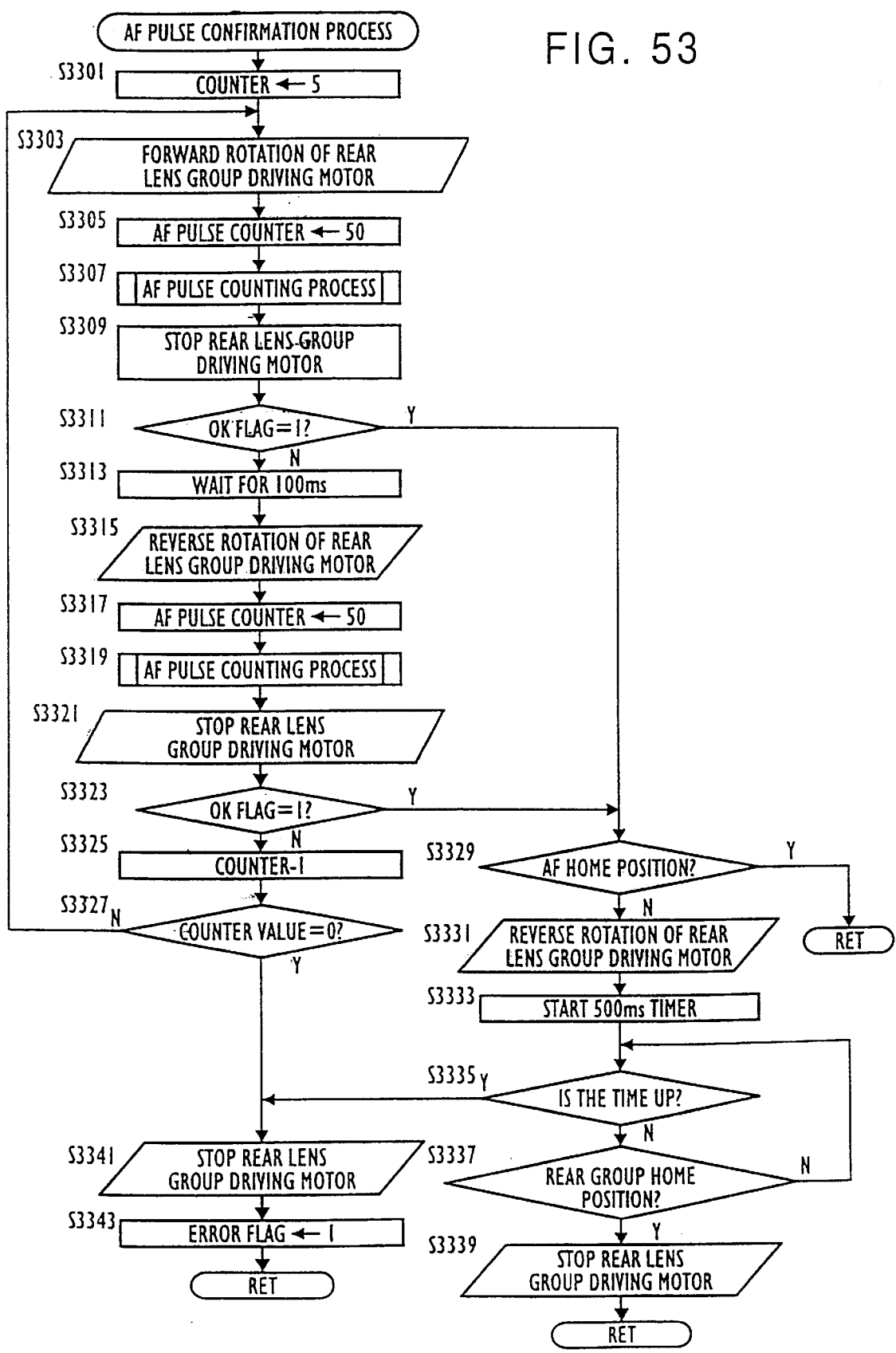
FIG. 53 is a flow chart of an AF pulse confirmation process of the zoom lens camera.

FIG. 53 shows a flow chart for the AF pulse confirmation process. In the AF pulse confirmation process the rear lens group driving motor 30 is driven alternately. in the clockwise and counterclockwise directions. For example, during driving of the rear lens group driving motor 30, if the rear lens group driving motor 30 is unable to rotate for some reason, by alternately driving the rear lens group driving motor 30 clockwise and counterclockwise, the cause of the obstruction of rotation of the rear lens group driving motor 30 may be removed, thus allowing the rear lens group L2 to move. In the present embodiment, the rear lens group driving motor 30 alternately rotates clockwise and counterclockwise, and after confirming that the rear lens group driving motor 30 has rotated more than a predetermined amount, the rear lens group L2 is moved to the AF home position. If this confirmation has not been made within five operations of alternate clockwise and counterclockwise driving, or even if such a confirmation is made, if the rear lens group L2 does not move to the AF home position within the predetermined time, the rear lens group driving motor 30 is stopped, and the error flag is set to 1.

At step S3301, the value of the counter which defines the maximum number of times that the rear lens group driving motor 30 is driven alternately in the clockwise and counterclockwise directions is set to 5.

Then at steps S3303, S3305 and S3307, the rear lens group driving motor 30 is firstly driven clockwise, namely in the direction in which the rear lens group is retracted, the AF pulse counting process is performed upon setting the value of the AF pulse counter to 50, and the process waits until 50 AF pulses are output. When the value of the AF pulse counter becomes 50, at step S3309 the rear lens group driving motor 30 is stopped.

At step S3311 it is checked whether the OK flag is set, and if the OK flag is set, in other words if 50 AP pulses have been output, it is checked whether the rear lens group L2 is at the AF home position. If the rear lens group L2 is at the AF home position, control returns, while if the rear lens group L2 is not at the AF home position, at step S3331 and step S3335 the rear lens group driving motor 30 is driven counterclockwise, namely in the direction in which the rear lens group L2 is moved towards the AP home position, and a 500 ms timer is started. Since the rear lens group L2 will normally reach the AF home position before the time of the 500 ms timer expires, the rear lens group driving motor 30 is stopped and control is returned when the rear lens group L2 reaches the AF home position (steps S3335, S3337, S3339). If the rear lens group L2 does not reach the AF home position before the time of the 500 ms timer expires at S3335, at steps S3335, S3341 and S3343, the rear lens group driving motor 30 is stopped, and control is returned upon setting the error flag to 1.

Although the above is directed to a normal case, if the rear lens group L2 does not move easily the following processes are executed.

In the AF pulse counting process at step S3307, if the AF pulse is not output for a predetermined amount of time even though the rear lens group driving motor 30 is being driven, this probably will indicate that a condition is occurring in which the rear lens group driving motor 30 cannot move due to biting, etc., therefore, the OK flag is cleared. In this case, control proceeds to the rolling process, from steps S3311 to S3313. When control is at step S3313, after waiting for 100 ms, the rear lens group driving motor 30 is driven counterclockwise at step S3315. Then at steps S3317, S3319 and S3321, the value of the AF pulse counter is set to 50, the AF pulse counting process is executed, and then the rear lens group driving motor 30 is stopped. In the AF pulse counting process, when 50 AF pulses are detected, the OK flag is set, and if 50 AF pulses are not detected within a predetermined time, the OK flag is cleared. Thus, if the rear lens group L2 moves during such a counterclockwise rotation of the rear lens group driving motor 30, control proceeds to the process at step S3329, while if the rear lens group L2 does not move, control proceeds to the process at step S3325.

At step S3325, the counter is decremented by one, and if the value of the counter is not 0, control returns to step S3303, and the processes from step S3303 are repeated. If the value of the counter becomes 0, namely if the rear lens group L2 is not moved even upon repeating the clockwise and counterclockwise driving of the rear lens group driving motor 30 five times, since this will indicate that some form of trouble may be occurring with the lens driving system. At steps S3341 and S3343, the rear lens group driving motor 30 is stopped, and the error flag is set to 1, and control is returned.

[The AF Return Process]

Figure 54:
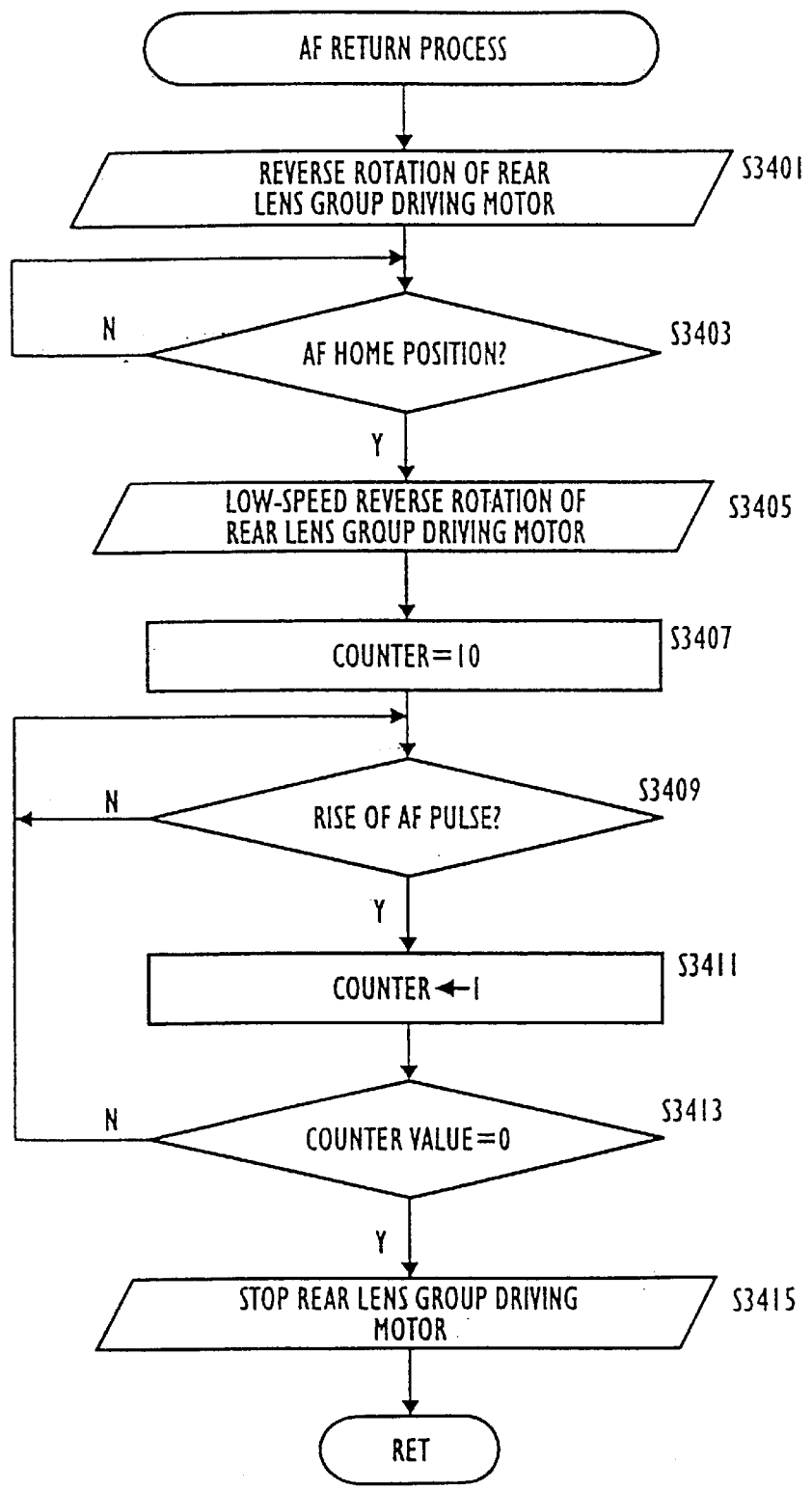
FIG. 54 is a flow chart of an AF return process of the zoom lens camera.

FIG. 54 shows a flow chart for the AF return process. In the AF return process the rear lens group L2 is returned to the AF home position.

At steps S3401 and S3403, the rear lens group driving motor 30 is driven counterclockwise, namely in the direction in which the rear lens group is advanced, to advance the rear lens group L2 towards the AF home position and the process waits until the rear lens group L2 reaches the AF home position.

At steps S3405, S3407, S3409, S3411 and S3413, when the arrival of the rear lens group L2 at the AF home position is detected, via the photointerrupter 301, the driving of the rear lens group driving motor 30 is switched to low-speed counterclockwise driving, and a value of 10 is set in the counter. The rise of the AF pulse is then counted and the counter is decremented by one on each count and the process waits until the value at the counter becomes 0.

At steps S3413 and S3415, when the value at the counter becomes 0, the rear lens group driving motor 30 is stopped, and control is returned. In such a manner, the rear lens group L2 is stopped at the AF home position.

In the present embodiment, after the rear lens group L2 reaches the AF home position, the driving of the rear lens group driving motor 30 is continued for another ten pulses. This is done since the driving pulse count for the rear lens group L2 is based on the switching of the AF home signal and so that the rear lens group L2 will definitely be at the AF home position in the standby condition.

[The Barrier Closing Process]

Figure 55:
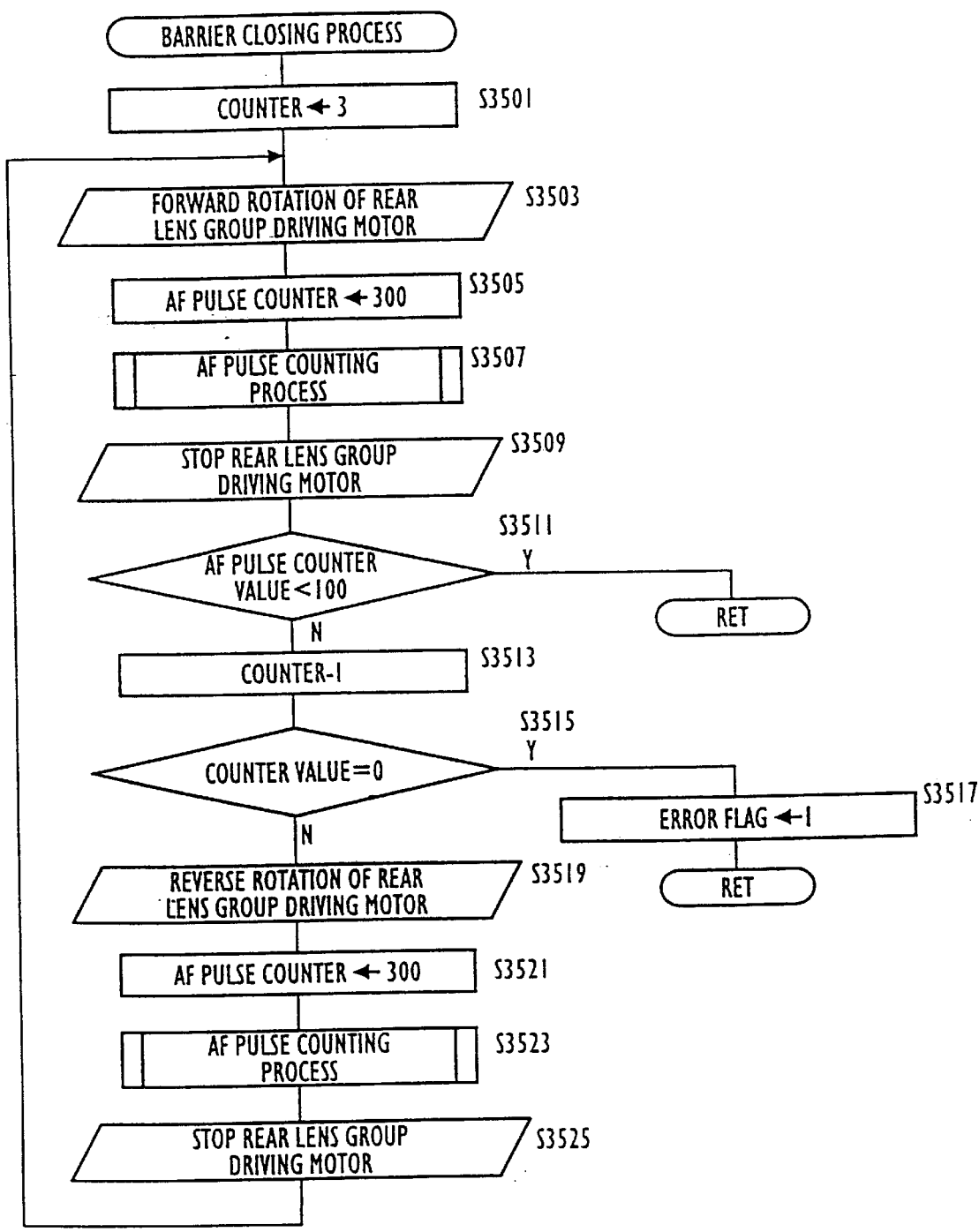
FIG. 55 is a flow chart of a barrier closing process of the zoom lens camera.

FIG. 55 shows a flow chart for the barrier closing process. In the barrier closing process the barrier is closed upon housing of the lenses.

Firstly, a value 3, which is the number of times the opening/closing process (described later) is to be repeated when a fault occurs, is set in the counter. In the present embodiment, the judgement whether the barrier closing process is completed normally, is made according to whether the rear lens group driving motor 30 has driven clockwise by a predetermined amount, namely, whether a predetermined number of AF pulses have been counted upon driving the rear lens group driving motor 30.

During clockwise driving of the rear lens group driving motor 30, if the predetermined number of AF pulses is not input from the AF reference pulse inputting circuit 222, it can be suspected that the barrier could not be closed due to some reason, or that the barrier closing process was executed with the barrier closed already.

Therefore, in the present embodiment, when the predetermined number of AF pulses is not counted upon clockwise driving of the rear lens group driving motor 30, the rear lens group driving motor 30 is once driven counterclockwise by a predetermined amount, namely by an amount sufficient for opening the closed barrier, and then the rear lens group driving motor 30 is driven clockwise again. The number of times set at step S3501 is the value for restricting the number of times of execution of the process in which the rear lens group driving motor 30 is once driven counterclockwise and then driven clockwise again (described above).

At step S3503, the rear lens group driving motor is driven clockwise, namely, driven in the direction by which the barrier will close, and at step S3505 a value of 300 is set in the AF pulse counter, and at step S3507 the AF pulse counting process is called. In the AF pulse counting process the AF pulse counter, set at step S3505, is decremented based on the pulse signals output to the CPU 210 from the AF reference pulse input circuit 222 in synchronization with the rotation of the rear lens group driving motor 30.

The AF pulse counting process is ended when the pulse is not output within a predetermined time, or when the count value at the decremented AF pulse counter becomes 0.

After completion of the AF pulse counting process, at step S3509 the rear lens group driving motor 30 is stopped, and at step S3511, it is judged whether the AF pulse count remaining after being decremented in the AF pulse counting process is less than 100.

At step S3511, if the value of the AF pulse counter is less than 100, namely, if the value was decremented by 200 or more in the AF pulse counting process, it is judged that the barrier was closed normally, and the barrier closing process is ended. If the value of the AF pulse counter is 100 or more at step S3511, it is considered that the rear lens group driving motor 30 cannot rotate due to some reason, and the elimination of the obstruction is attempted by once rotating the rear lens group driving motor 30 once counterclockwise, and then again clockwise. In such a manner, the obstacle can be removed.

The control proceeds to step S3519, as long as the counter value does not become zero upon decrementing of the counter at step S3513. At step S3519, the rear lens group driving motor 30 is driven counterclockwise, and a value of 300 is set in the AF pulse counter, and the AF pulse counting process is called. After completion of the AF pulse counting process at step S3523, the rear lens group driving motor 30 is stopped at step S3525, and the control returns to step S3503. Then at steps S3503, S3505, S3507 and S3509, the clockwise driving of the rear lens group driving motor 30, the setting of the AF pulse counter, the execution of the AF pulse counting process, and stopping of the rear lens group driving motor 30 are made. It is then judged at step S3511, whether the barrier has closed, based on the value of the AF pulse counter. In the present embodiment, since a value of 3 is set at the counter at step S3501, if the barrier is not closed, the above retry process is repeated twice.

During the above process, if the barrier closes, at step S3511 the value of the AF pulse counter will be less than 100, and the barrier closing process is completed. In addition, after repeating the process, if the value of the AF pulse counter does not become less than 100, after the last of the repetitions, the barrier is judged not to be closed, and the barrier closing process is ended upon setting the error flag to 1 to indicate an occurrence of a fault.

[The Barrier Opening Process]

Figure 56:
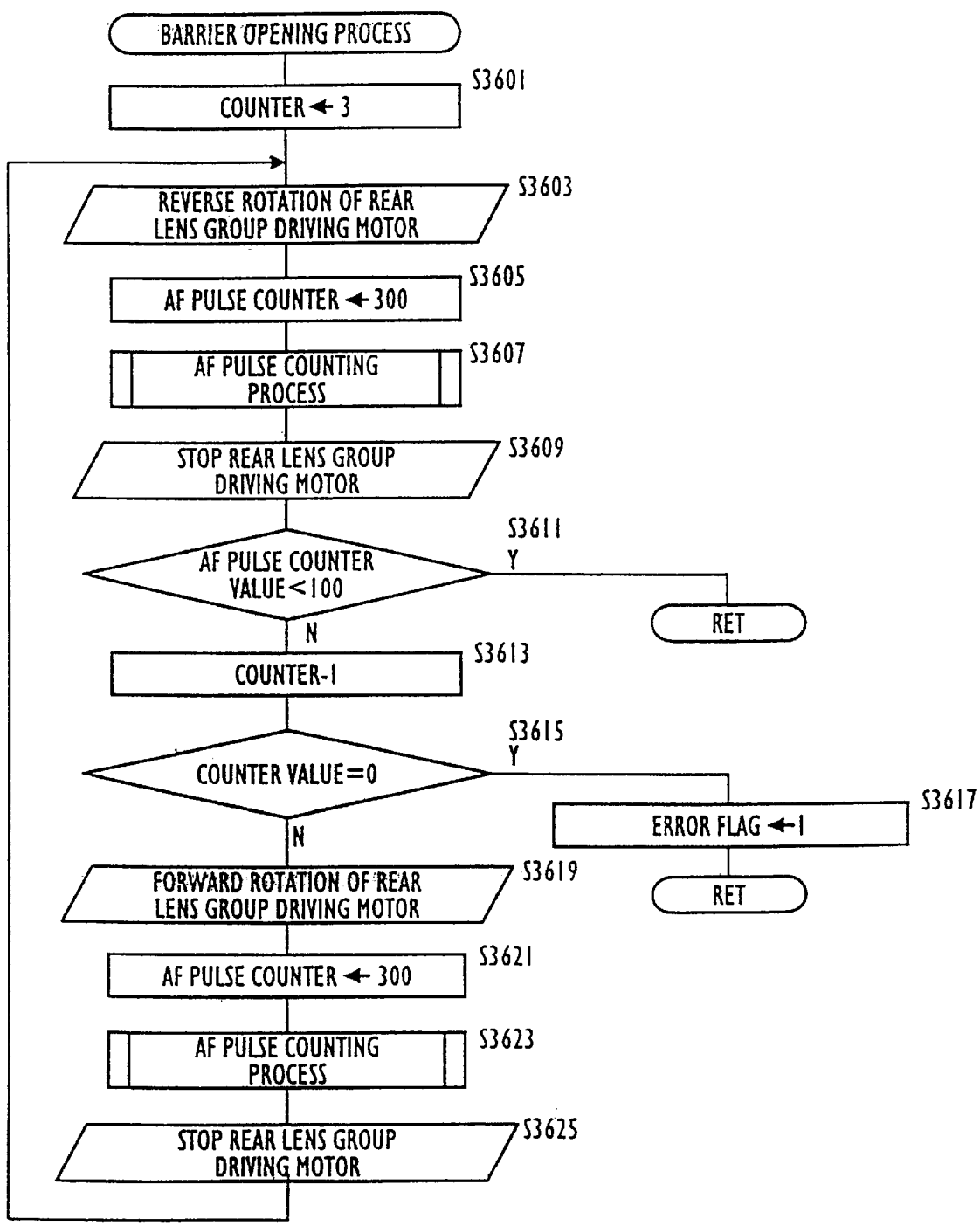
FIG. 56 is a flow chart of a barrier opening process of the zoom lens camera.

FIG. 56 shows a flow chart for the barrier opening process. In the barrier opening process the barrier is opened when the lenses are extended from the housed position.

First, a value of 3, which is the number of times of repetition of the process, is set at the counter at step S3601. Normally, the barrier opening process is called with the barrier being closed. However, the barrier opening process will be executed with the barrier open when, for example, the battery of the camera is changed with the lens being extended, i.e., the barrier is open. The barrier opening process may also be called when the lenses are housed without the barrier being closed because of some obstruction. If the rear lens group driving motor 30 is driven to open the barrier when the barrier is already open, the rear lens group driving motor 30 will not rotate because the barrier is open, and the AF reference pulse input circuit 222 will therefore not generate any pulses.

Therefore, in the present process, the rear lens group driving motor 30 is driven in order to open the barrier, and if the opening of the barrier is not confirmed, in other words, if the AF reference pulse input circuit 222 does not output pulses to the CPU 210, the rear lens group driving motor 30 is driven in the direction to close the barrier, and is again driven in the direction to open the barrier. The number of times set at the counter at step S3601 is the value for restricting the number of times of execution of the above-described process in which the barrier is opened after closing, which is executed when it cannot be confirmed that the barrier was opened upon driving the rear lens group driving motor 30 for the first time.

At step S3603, the rear lens group driving motor is driven counterclockwise, namely, in the direction in which the barrier opens. At step S3605 a value of 300 is set in the AF pulse counter, and at step S3607 the AF pulse counting process is called. In the AF pulse counting process the AF pulse counter is decremented based on the pulse signals output to the CPU 210 from the AF reference pulse input circuit 222 in synchronization with the rotation of the rear lens group driving motor 30.

The AF pulse counting process is ended when the pulses are not output to the CPU 210 from the AF reference pulse input circuit 222 within a predetermined time, or when the count value of the decremented AF pulse counter becomes 0.

After completion of the AF pulse counting process, at step S3609 the rear lens group driving motor 30 is stopped. At step S3611, it is judged whether the AF pulse count remaining after being decremented in the AF pulse counting process is less than 100.

At step S3611, if the value of the AF pulse counter is less than 100, namely, if the value was decremented by 200 or more in the AF pulse counting process, it is judged that the barrier was opened normally, and the barrier opening process is ended. If the value of the AF pulse counter is 100 or more at step S3611, it is considered that the rear lens group driving motor 30 cannot rotate due to some reason and the elimination of the obstruction is attempted by once rotating the rear lens group driving motor 30 clockwise, namely, in the direction in which the barrier closes, and then again counterclockwise. In such a manner, the obstacle can be removed.

At step S3613, the counter is decremented, and as long as the counter does not become 0 at step S3615, control proceeds to step S3619. At step S3619, the rear lens group driving motor 30 is driven clockwise, a value of 300 is set in the AF pulse counter, and the AF pulse counting process is called. After completion of the AF pulse counting process at step S3623, the rear lens group driving motor 30 is stopped at step S3625, and control is returned to step S3603. Then the counterclockwise driving of the rear lens group driving motor 30, the setting of the AF pulse counter, the execution of the AF pulse counting process, and the stopping of the rear lens group driving motor 30 are made, and it is judged whether the barrier is closed, according to the value of the AF pulse counter.

In the present embodiment, since the value of 3 is set in the counter at step S3601, if the barrier is not opened at step S3611, the processes from steps S3613 to S3609 via S3625 are repeated twice. If the barrier opens in this process, the AF pulse counter will be less than 100 at step S3611, and the barrier opening process is ended. If the value of the AF pulse counter does not become less than 100 after the last of the repetitions, it is judged that the barrier did not open and the barrier opening process is ended upon setting the error flag to 1 to indicate the occurrence of a fault.

[The Zoom Driving Process]

FIG. 57 shows a flow chart for the zoom driving process. The zoom driving process is a process to drive and control the whole unit driving motor 25 clockwise (i.e., in the direction in which the lenses are extended) by the amount corresponding to the value of the zoom pulse counter, in order to cause the front lens group L1 and the rear lens group L2 to become focused at the subject distance, as shown in FIG. 34.

In the zoom driving process, at step S3701 the value of the zoom pulse counter is stored in memory as a number of zoom pulses. Then at steps S3703, S3705, S3707 and S3709, the zoom sequence is then set to 0 and the whole unit driving motor 25 is driven clockwise, namely, in the advancing direction, the zoom drive check process is executed, and the process waits until the zoom sequence becomes 5, after which control is returned.

The zoom sequence is an identifier for identifying the operation sequence condition of the whole unit driving motor controlling circuit 60. A zoom sequence of 0 indicates that the switching of the zoom code has been detected, which serves as the reference point for the counting of the zoom pulses. A zoom sequence of 1 or 2 indicates the condition where the zoom pulses are being counted, a zoom sequence of 3 indicates the activation of the reverse rotation brake, a zoom sequence of 4 indicates the short-circuit braking condition, and a zoom sequence of 5 indicates the open terminal condition (inactive condition) and thus the ending of the series of the zoom drive sequences.

[The AF Two-stage Extension Process]

Figure 58:
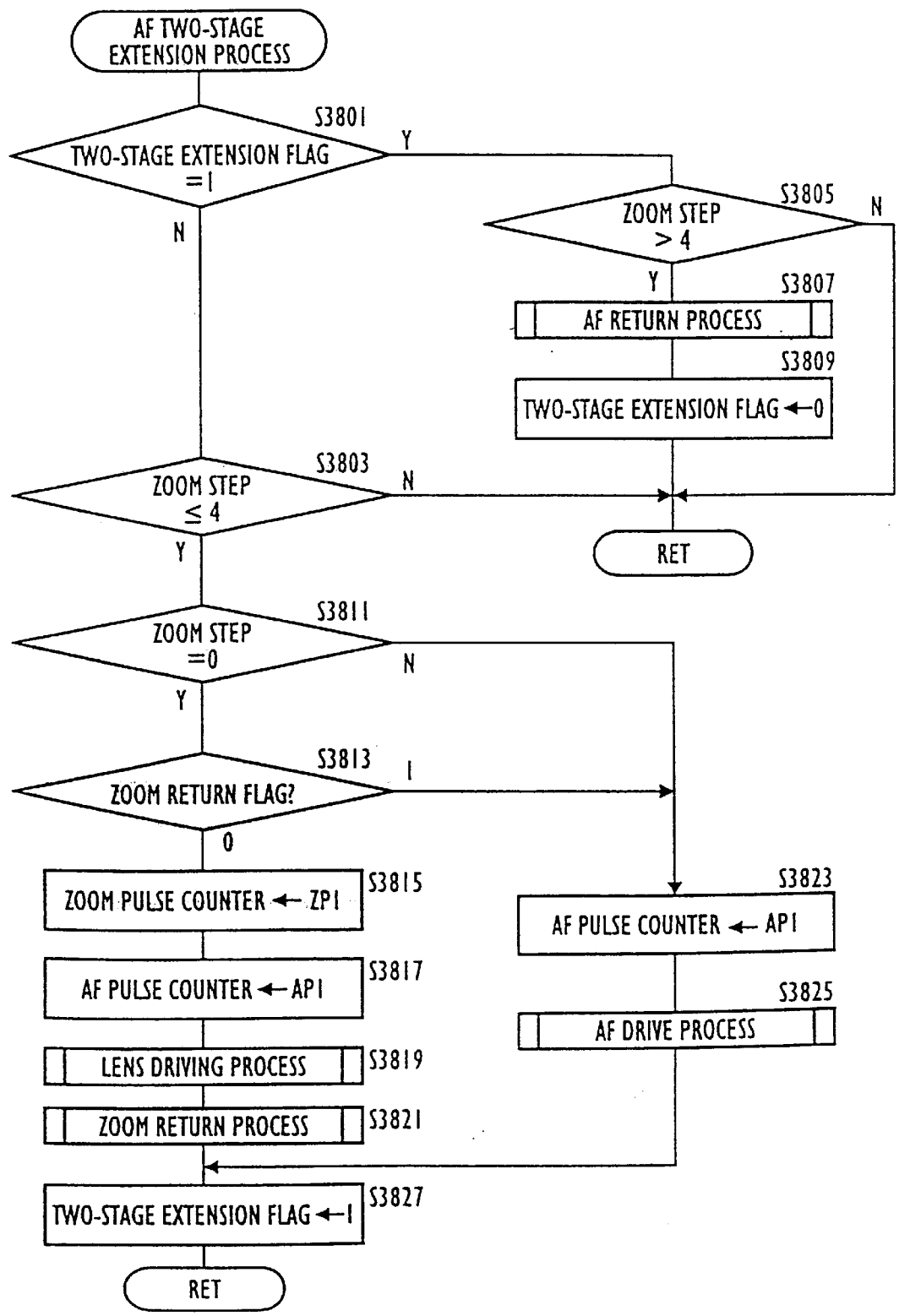
FIG. 58 is a flow chart of an AF two-stage extension process of the zoom lens camera.

FIG. 58 shows a flow chart for the AF two-stage extension process. The AF two-stage extension process is executed when the focal length of the lenses has been changed and is the process by which the rear lens group L2 is extended by a predetermined amount (API) from the AF home position when the lenses are positioned at the "wide" side.

When the AF two-stage extension process is called, at step S3801, the CPU 210 judges whether the rear lens group L2 is presently in the condition where it has been extended by a predetermined amount by the AF two-stage extension process. In the latest execution of the AF two-stage extension process, if the lenses were positioned at the "wide" end side (i.e., the zoom step was less than 4), the rear lens group L2 would have been extended by a predetermined amount and the two-stage extension flag would have been set to 1. If the zoom step was 4 or more when the previous AF two-stage extension process was executed, the rear lens group would not have been extended (would be positioned at the AF home position) and the two-stage extension flag would have been set to 0.

When the AF two-stage extension process is called with the two-stage extension flag being set to 1 at step S3801, then at step S3805, the CPU judges whether the zoom step corresponding to the present lens position is greater than 4. If the zoom step is greater than 4, namely the rear and the front lens groups L1 and L2 are at the "tele" side, at steps S3807 and S3809, the AF return process is called to return the already extended rear lens group L2 to the AF home position, and control is returned upon clearing the two-stage extension flag, i.e., setting the flag to 0. If the present zoom step is 4 or less, although the rear lens group L2 needs to be extended, since the rear lens group L2 has already been extended when the previous AF two-stage extension process was executed, control is returned without executing any process.

If the two-stage extension flag is not 1 at step S3801, namely, if the flag is set to 0, this would mean that the rear lens group L2 was positioned at the AF home position at the end of the previous AF two-stage extension process. In this case, at step S3803 the CPU 210 judges whether the zoom step is 4 or less, and if the zoom step is greater than 4 at step S3803, since it is not necessary to extend the rear lens group L2, in other words, it is sufficient for the rear lens group L2 to remain at the AF home position, the extension of the rear lens group L2 is not executed, and control is returned. If the zoom step is 4 or less, namely if the lenses are positioned at the "wide" side, the process of extending the rear lens group L2 is executed. However, process method will differ according to whether the lenses are at the "wide" end.

At step S3811, it is judged whether the value of the zoom step is 0, in other words, whether the lenses are positioned at the "wide" end position. If the lenses are positioned at the "wide" end position, the rear lens group driving motor 30 may be connected with the barrier opening device and is not connected to the rear lens group moving device. In other words, if the rear lens group driving motor 30 is driven in the state where the lenses are positioned at the "wide" end position, the rear lens group L2 may not be driven and the opening/closing of the barrier may be executed instead.

On the other hand, when the lenses are at the "tele" position, rather than at the "wide" position, the rear lens group driving motor 30 will always be connected to the rear lens group moving device. Therefore, when the lenses are not positioned at the "wide" end, namely the zoom step is not 0 at step S3811, the rear lens group L2 can be made to extend from the AF home position by an amount corresponding to the AF pulse number AP1 by setting the predetermined value AP1 at the AF pulse counter (step S3823) and calling the AF drive process at step S3825. After extending the rear lens group L2, the CPU 210 sets the two-stage extension flag to 1, and control is returned.

When the value of the zoom step is 0, namely when the lenses are positioned at the "wide" end at step S3811, as already described, a possibility exists that the rear lens group driving motor 30 may be connected to the barrier opening device. However, as long as the AF two-stage extension process is called during the lens return process, the rear lens group driving motor 30 is guaranteed to be connected with the rear lens group moving device. Therefore at step S3813, the process is branched according to the zoom return flag, which indicates whether the AF two-stage extension process being executed was called in the lens return process. If the present AF two-stage extension process was called in the lens return process, the zoom return flag would be set to 1. In such a case, at step S3823 and step S3825, only the driving of the rear lens group L2 is executed.

On the other hand, if the present AF two-stage extension process was called from a process other than the lens return process, the zoom return flag would be set to 0, and the CPU 210 will therefore execute the processes from step S3815.

At steps S3815 and S3817, the CPU 210 sets the predetermined values ZP1 and AP1 respectively in the zoom pulse counter and the AF pulse counter, and at step S3819 the lens driving process is called, and the front and rear lens groups L1 and L2 are firstly moved by an amount corresponding to the zoom pulse ZP1, by driving the whole unit driving motor 30, and simultaneously the rear lens L2 is moved by an amount corresponding to the AF pulse AP1, by driving the rear lens group driving motor 30. After that, in the zoom return process at step S3821, the front and the rear lens groups L1 and L2 are returned by an amount corresponding to the value ZP1, by driving the whole unit driving motor 25. That is, the lenses are once moved to the "tele" position by the predetermined amount so that the rear lens group driving motor 30 is surely engaged with the driving device of the rear lens group L2, and the rear lens group L2 is extended by driving the rear lens group driving motor 30. After, by returning the front and rear lenses toward the "wide" position by the predetermined amount, eventually the rear lens group L2 is only moved toward the "wide" position.

As described above, at the point at which the AF two-stage extension process is ended, if the lenses are at the "wide" position (i.e., the zoom step is not more than 4), the rear lens group L2 would be extended by a predetermined amount and the two-stage extension flag would be set to 1. If the lenses are at the "tele" position (i.e., the zoom step is greater than 4), the rear lens group L2 would be positioned at the AF home position, and the two-stage extension flag would be set 0.

[The Zoom Return Process]

Figure 59:
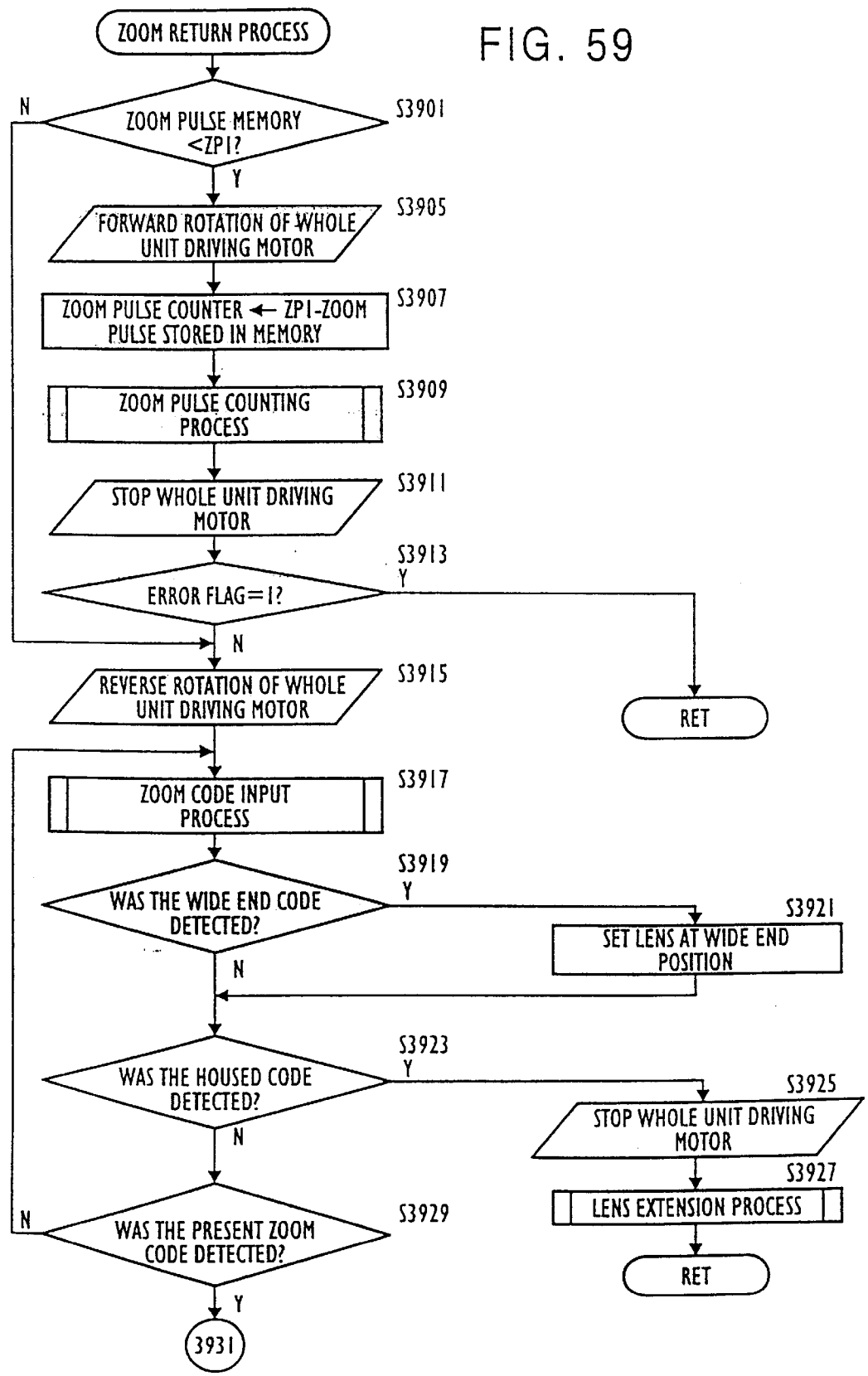
FIG. 59 is a flow chart of a zoom return process of the zoom lens camera.

FIG. 59 shows a flow chart for the zoom return process. The zoom return process is the process in which the front lens group L1 and the rear lens group L2 are returned to the standby position at which they were positioned prior to being moved in the lens driving process during the photographing process. In other words, in this process the whole unit driving motor 25 is driven counterclockwise by an amount corresponding to the second zoom pulse ZP2 from the switching point at the housed side of the present zoom code, in order to return the front lens group L1 and the rear lens group L2 to the standby position, and is then stopped upon being rotated clockwise by an amount corresponding to the third zoom pulse ZP3, to eliminate backlash to some degree, as shown in FIG. 34, i.e., the lens driving.

In the zoom return process at steps S3901, S3905, S3907, S3909 and S3911, it is checked whether the pulse number stored in the zoom pulse memory is less than the first zoom pulse value ZP1, and if it is less, the whole unit driving motor 25 is driven clockwise, namely driven for movement in the tele direction. Then the value of the pulse, obtained by deducting the drive pulse value stored in the zoom pulse memory from the first zoom pulse value ZP1, is set in the zoom pulse counter, and the zoom pulse counting process is executed to wait until the value of the zoom pulse counter becomes 0. When the value becomes 0, namely when the whole unit driving motor has been driven by an amount corresponding to the value of the first zoom pulse ZP1 from the switching point of the present zoom code, the whole unit driving motor 25 is stopped. In such a process, when the lenses are stopped around the "tele" position switching point of the present zoom code, the zoom code may become unstable during the initial stages of passing current to the whole unit driving motor 25, and the standby position may shift. For the purpose of avoiding such an occurrence, the whole unit driving motor is driven clockwise by an amount corresponding to the value of the first zoom pulse ZP1 so that the zoom code will definitely turn OFF. Then at step S3913, if the error flag is set to 1, control is returned, and if the error flag is not set to 1 control proceeds to step S3915.

If the drive pulse number stored in the zoom pulse memory equals the first zoom pulse number ZP1 (indicating that the lenses have already been moved to the position at which the present zoom code turns OFF), the process of driving the whole unit driving motor 25 is skipped.

At step S3915, the whole unit driving motor 25 is driven counterclockwise, namely, driven for movement in the "wide" direction. Then at steps S3917, S3919, S3923 and S3929, the zoom code input process is called to detect the zoom code, and it is checked whether the "wide" code is detected, whether the housing code is detected, and whether the present zoom code is detected. If the "wide" code was detected, the lens "wide" position is set, while if the housed condition is detected, the whole unit driving motor 25 is stopped and control is returned after executing the lens extension process (steps S3919, S3921 and S3923, or at steps S3923, S3925 and S3927).

If the present zoom code is detected at step S3929, then at step S3931 the zoom code input process is executed. The process then waits until the OFF code is detected, namely, until the present zoom code turns OFF (step S3933). When the OFF code is detected, the second zoom pulse value ZP2 is set at the zoom pulse counter and the zoom pulse counting process is called to perform a waiting operation until the value at the zoom pulse counter becomes 0 (steps S3935, S3937).

At step S3939, upon returning from the zoom pulse counting process, the whole unit driving motor 25 is stopped. At steps S3941, S3943, S3945 and S3947, if the error flag was set to 1, namely, if the return was performed without the value at the zoom pulse counter becoming 0, control is returned without executing any process. While if the error flag was not set, the whole unit driving motor 25 is driven in a clockwise direction, the backlash elimination pulse number ZP3 is set at the zoom pulse counter, and the zoom pulse counting process is called to wait for the value at the zoom pulse counter to become 0. Then at step S3949, upon returning from the zoom pulse counting process, the whole unit driving motor 25 is stopped and control is returned.

Thus by the zoom return process, the front lens group L1 is moved rearwardly to the standby position, which is retracted by the value of the second zoom pulse ZP2 from the rear end edge of the present zoom code. At the standby position, backlash during a rotation of the whole unit driving motor 25 in the "tele" direction is substantially removed.

[The Zoom Standby Confirmation Process]

Figure 60:
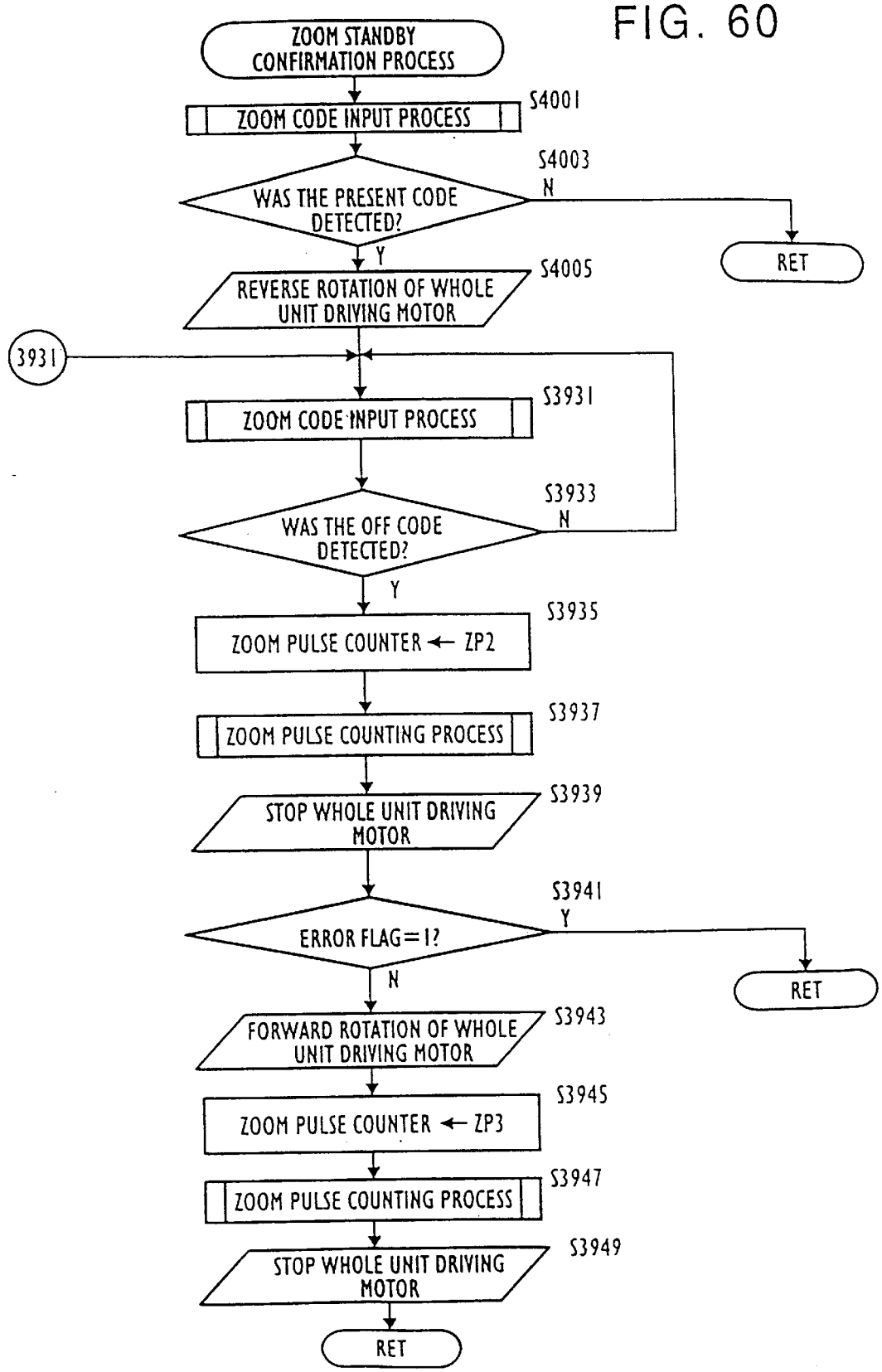
FIG. 60 is a flow chart of a zoom return process and a zoom standby confirmation process of the zoom lens camera.

FIG. 60 shows a flow chart for the zoom standby confirmation process. The zoom standby confirmation process is the process called during the photographing process, in which, when the photometering switch SWS is ON, it is confirmed whether the lenses are positioned at the correct standby position, and if the lenses are not at the correct standby position, the lenses are moved to the correct standby position. The processes after step S3931 of the zoom standby confirmation process, are the same as those of the zoom return process.

In the zoom standby confirmation process, at steps S4001 and S4003, the zoom code input process is called and the zoom code is input, and if the present zoom code is not detected, control is returned since it is assumed that the lenses are at the correct standby position. If the present zoom code is detected at step S4003 (i.e., the lenses have moved from the standby position), at step S4005, the whole unit driving motor 25 is driven counterclockwise, namely driven in the direction for movement to the "wide" side, and control proceeds to step S3931, and the zoom code input process is executed.

The detection of the OFF code is then waited for and when the OFF code is detected, the second zoom pulse number ZP2 is set in the zoom pulse counter, and the zoom pulse counting process is called to wait for the value at the zoom pulse counter to become 0 (steps S3933, S3935 and S3937).

At step S3939, upon returning from the zoom pulse counting process, the whole unit driving motor 25 is stopped. At steps S3941, S3943, S3945 and S3947, if the error flag was set to 1, namely if control was returned without the value at the zoom pulse counter becoming 0, the control is returned without executing any process. While if the error flag was not set, the whole unit driving motor 25 is driven in a clockwise direction, the backlash elimination pulse number ZP3 is set at the zoom pulse counter, and the zoom pulse counting process is called to wait for the value at the zoom pulse counter to become 0. Then at step S3949, upon returning from the zoom pulse counting process, the whole unit driving motor 25 is stopped and control is returned.

As above described, in the zoom standby confirmation process, the front lens group L1 and the rear lens group L2 are moved to the standby position, which is retracted by a predetermined distance from the switching position at the "wide" side of the present zoom code, when the present zoom code corresponding to the zoom step is detected.

[The Photographing Charging Process]

Figure 61:
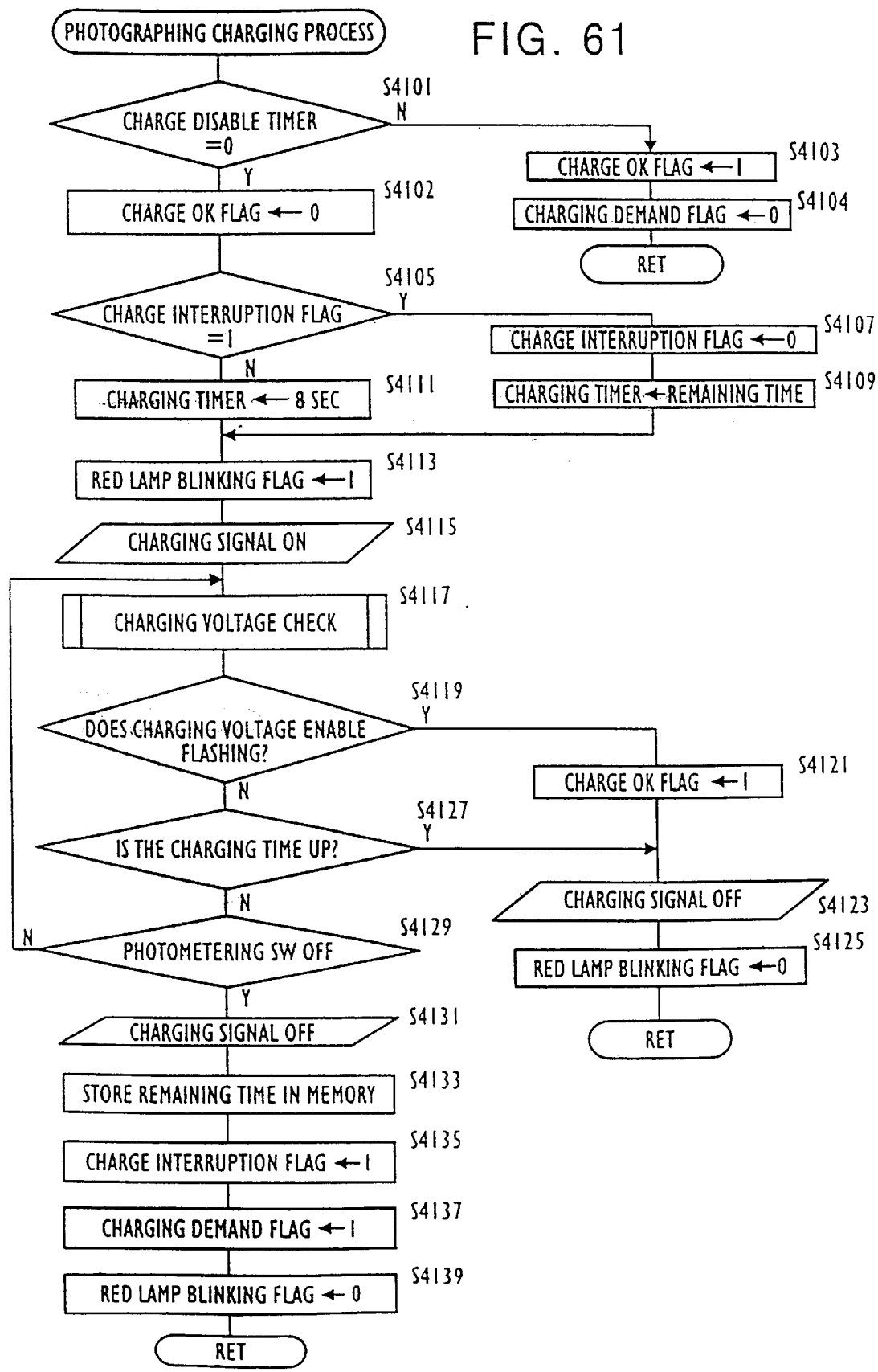
FIG. 61 is a flow chart of a photographing charging process of the zoom lens camera.

FIG. 61 shows a flow chart for the photographing charging process. The photographing charging process is the process executed when the photometering switch SWS is ON, and is the charging process called when it is judged in the photographing process that strobe flashing is necessary.

When the photographing charging process is called, at step S4101 the CPU 210 judges whether the charge disable timer is set to 0. The charge disable timer sets the period during which charging is disabled and a charge time of three seconds is set at this timer when the flash capacitor 530 of the strobe device 231 becomes fully charged in the main charging process shown in FIG. 41. In such a manner, if the time of the charge disable timer has not expired (i.e., the timer value is not 0), although the charging of the flash capacitor 530 will be disabled, strobe flashing will be enabled since the capacitor 530 is almost fully charged. Therefore if the time has not expired at the charge disable timer at step S4101, then at step S4103 the charge-OK flag is set to 1 to indicate that the strobe can be flashed, and at step S4104 the charging demand flag is set to 0, and control is returned upon ending the photographing charging process.

The time will not be up at the charge disable timer at step S4101, if the strobe device 231 is not fully charged or if three or more seconds have passed since the strobe device 231 was fully charged. In such cases, since charging is not disabled, and the CPU 210 sets the charge-OK flag to 0 at step S4102, and the processes for charging after step S4105 are executed.

At step S4105, the CPU 210 judges whether the charge interruption flag is set to 1. When a switch operation is performed while the main charging process is being executed, the charging process is interrupted and the process corresponding to the operated switch is executed, and in this process the charge interruption flag is set to 1.

If the charge interruption flag is set to 0, that is if the main charging process was not interrupted at step S4105, a predetermined limit time (8 seconds) is set at the charging timer in order to restrict the charging time. If the charge interruption flag is set to 1 at step S4105, since the charging will be resumed, the charge interruption flag is cleared (set to 0) and the amount of the charge limiting time remaining at the point at which charging was interrupted is set at the charging timer (steps S4107 and S4109). In such a manner, even if charging is interrupted, a part of the predetermined charging limit time (8 seconds) will already have been spent in charging in the charging process prior to the interruption.

Since the charging time for the charging process after interruption is set to the part of the predetermined charging limit time (8 seconds) remaining after the above mentioned spent time, charging will have been performed for the predetermined charging time when the charging is ended with the time becoming up at the timer.

After the charging timer is set at step S4111 or S4109, the CPU 210 sets the red lamp blinking flag to 1, and the red lamp 227 is blinked. Although the charging of the strobe flash capacitor 530 is executed in the main charging process, without being recognized thereof by the photographer, since the charging in the photographing charging process is executed while the photographer is pressing the shutter button 217 halfway down, it is preferred to notify the photographer that charging is in progress. For this purpose, in the photographing charging process, the red lamp 227 is blinked so that the photographer may recognize that charging is in progress.

When the charging timer is set, at step S4115 the charging signal is set to ON, namely the level at the terminal CHEN of the strobe device 231 is set to be H, and charging is started. The output of the terminal RLS of the strobe device 231, which corresponds to the charging voltage, is input to the CPU 210 upon undergoing the A/D conversion. At step S4117 the CPU 210 checks the A/D converted charging voltage. If the charging voltage has reached the level enabling strobe flashing at step S4119, then at step S4121 the CPU 210 sets the charge-OK flag to 1 to indicate that strobe flashing is enabled, and at step S4123 the charging is stopped by setting the level at the terminal CHEN of the strobe circuit 500 to low (L), and at step S4125 the red lamp blinking flag is set to 0, and the blinking of the red lamp is stopped. In such a manner, the photographer may recognize that the charging process is complete, namely that the condition is no longer that in which the strobe cannot be flashed, in other words, photographing is now possible.

At step S4119, if the CPU 210 judges that the charging voltage has not reached the value enabling strobe flashing, then at step S4127 it is judged whether the time at the charging timer has expired. If the time at the charging timer expires, then at step S4123 the level at the terminal CHEN of the strobe circuit 500 is set to low (L) to stop charging, and at step S4125 the red lamp blinking flag is set to 0 to end the blinking of the red lamp. If the time expires at step S4127, the charge-OK flag will not be set to 1, since the charging voltage will not have reached the level at which flashing is enabled.

If the time of the charging timer has not expired at step S4127, then at step S4129 the CPU 210 judges whether the photometering switch SWS is OFF. If the photometering switch SWS is ON, the processes from steps S4117 through S4127 are repeated. In such a manner, as long as the shutter button 217 is at least pressed halfway, charging is executed until the charging voltage reaches the level enabling flashing or until the charging time (eight seconds) has elapsed.

At step S4129, if the photometering switch SWS is judged to be OFF, namely if the half-pressed condition of the shutter button is canceled during charging, then at step S4131 the CPU 210 makes the charging signal OFF, namely the CPU 210 turns OFF the charging signal, i.e., sets the level at the terminal CHEN of the strobe circuit 500 to low, and at step S4133 the remaining time, indicated by the charging timer, is stored in the memory, and at step S4135 the charge interruption flag is set to 1 to indicate that the charging has been interrupted. Then in order to resume the execution of the remaining charging process canceled in the main charging process, at step S4137 the charging demand flag is set to 1, and then at step S4139 the red lamp blinking flag is set to 0 to stop the blinking of the red lamp 227, and the photographing charging process is ended. As above described, the remaining time stored in the memory at step S4133, and the charge interruption flag and the charging demand flag, are referenced during the execution of the main charging process.

[The Focusing Process]

Figure 62:
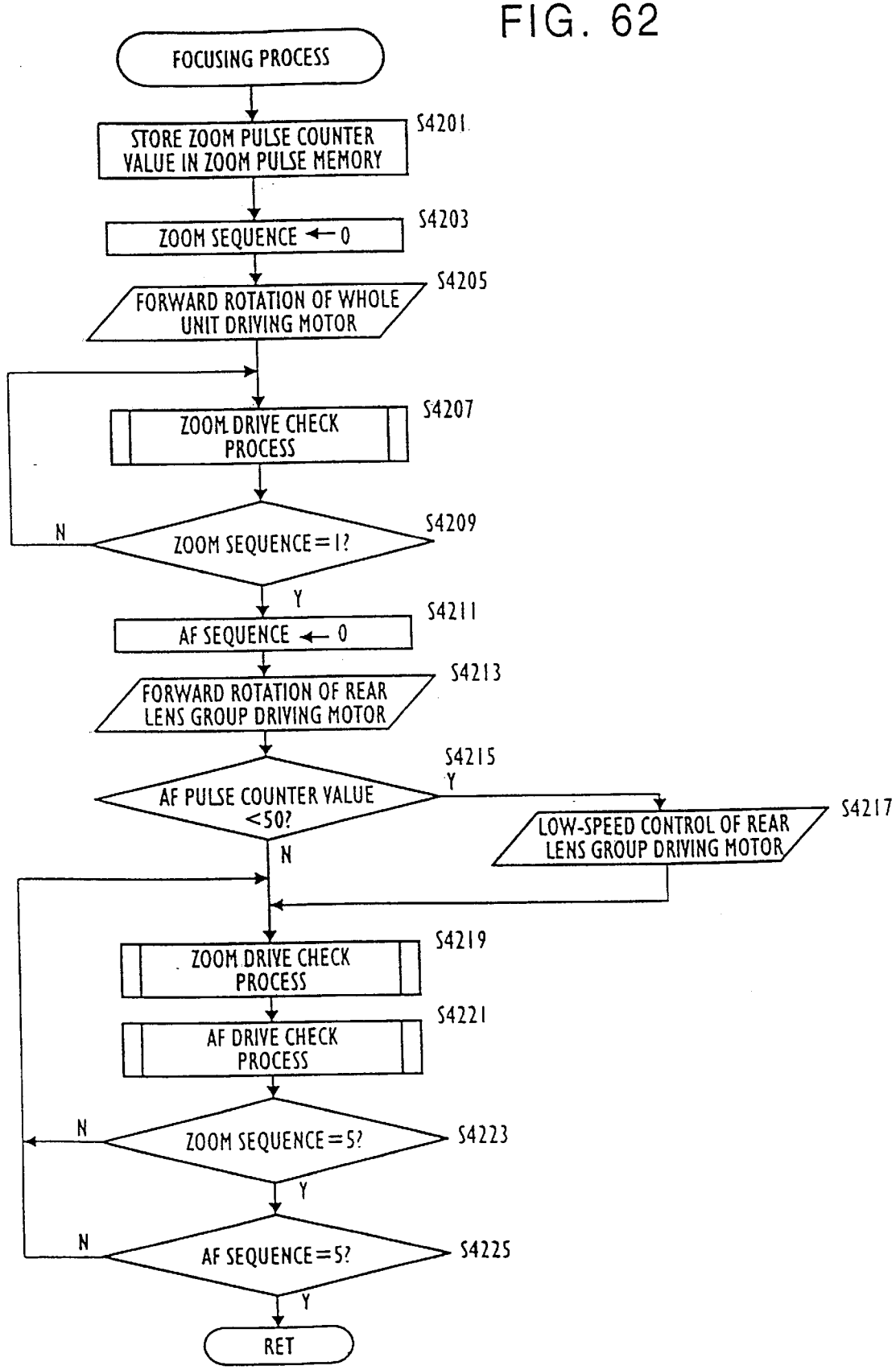
FIG. 62 is a flow chart of a focusing process of the zoom lens camera.

FIG. 62 shows a flow chart for the focusing process. In the focusing process, the whole unit driving motor 25 is driven clockwise (i.e., in the direction in which the lenses are extended), and the rear lens group driving motor 30 is driven clockwise (i.e., in the retracting direction in which the rear lens group L2 is retracted) based on the whole unit driving motor drive pulse number and the rear lens group driving motor drive pulse number calculated in the lens drive calculation process, to move the front lens group L1 and the rear lens group L2 to the focused position, (see lens drive of FIG. 34). The present focusing process is characterized in that both the whole unit driving motor 25 and the rear lens group driving motor 30 are driven at the same time, i.e., driven in parallel.

In the focusing process, the zoom pulse counter value, namely, the number of pulses, calculated in the lens drive calculation process, by which the whole unit driving motor 25 is driven from the switching point at the housed side of the present zoom code, is written into of the zoom pulse memory at step S4201. The zoom sequence is then set to 0, and the whole unit driving motor 25 is driven clockwise, and the driving check process is executed to wait for the zoom sequence to become 1, namely for the present zoom code to be detected (i.e., turned from OFF to ON), and when the zoom sequence becomes 1, the AF sequence is set to 0 (steps S4203, S4205, S4207, S4209 and S4211).

The rear lens group driving motor 30 is then driven clockwise, and it is checked whether the value at the AF pulse counter is less than 50. If the value is less than 50, the control of the rear lens group driving motor 30 is changed to low-speed control (i.e., pulse width modulation (PWM controlling), while if the value is not less than 50, control proceeds to the zoom drive check process (steps S4213, S4215, S4217 and S4219, or at steps S4213, S4215 and S4219).

The process then waits for both the zoom sequence and the AF sequence to become 5, and when both become 5, namely when both the whole unit driving motor 25 and the rear lens group driving motor 30 stop, control is returned (steps S4219, S4221, S4223 and S4225).

In the focusing process, since both the whole unit driving motor 25 and the rear lens group driving motor 30 are driven at the same time, the time required for focusing by moving the front lens group L1 and the rear lens group L2 to the focused position is shortened.

[The Exposure Process]

Figure 63:
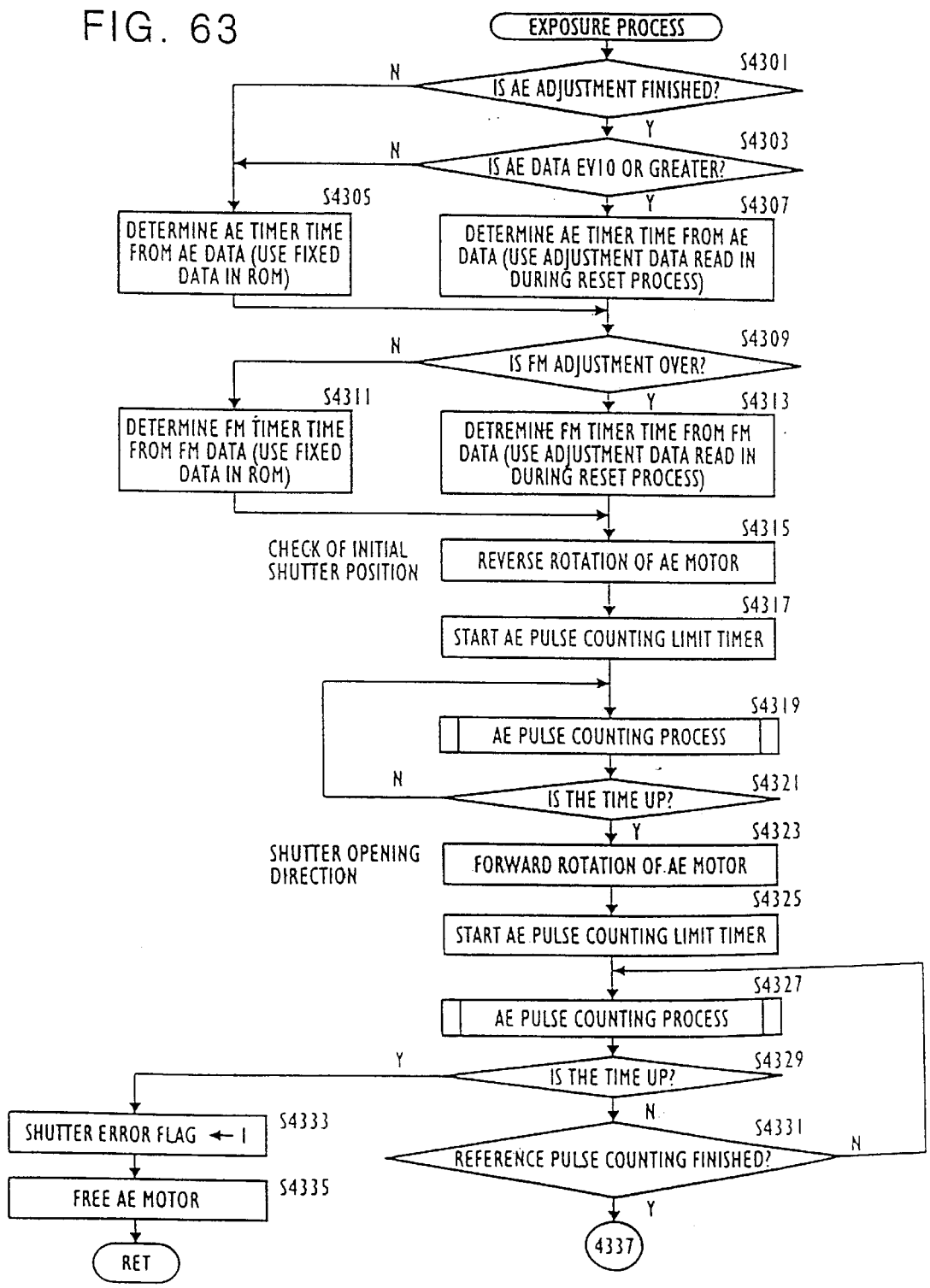
FIGS. 63, 64 and 65 show a flow chart of an exposure process of the zoom lens camera.
Figure 64:
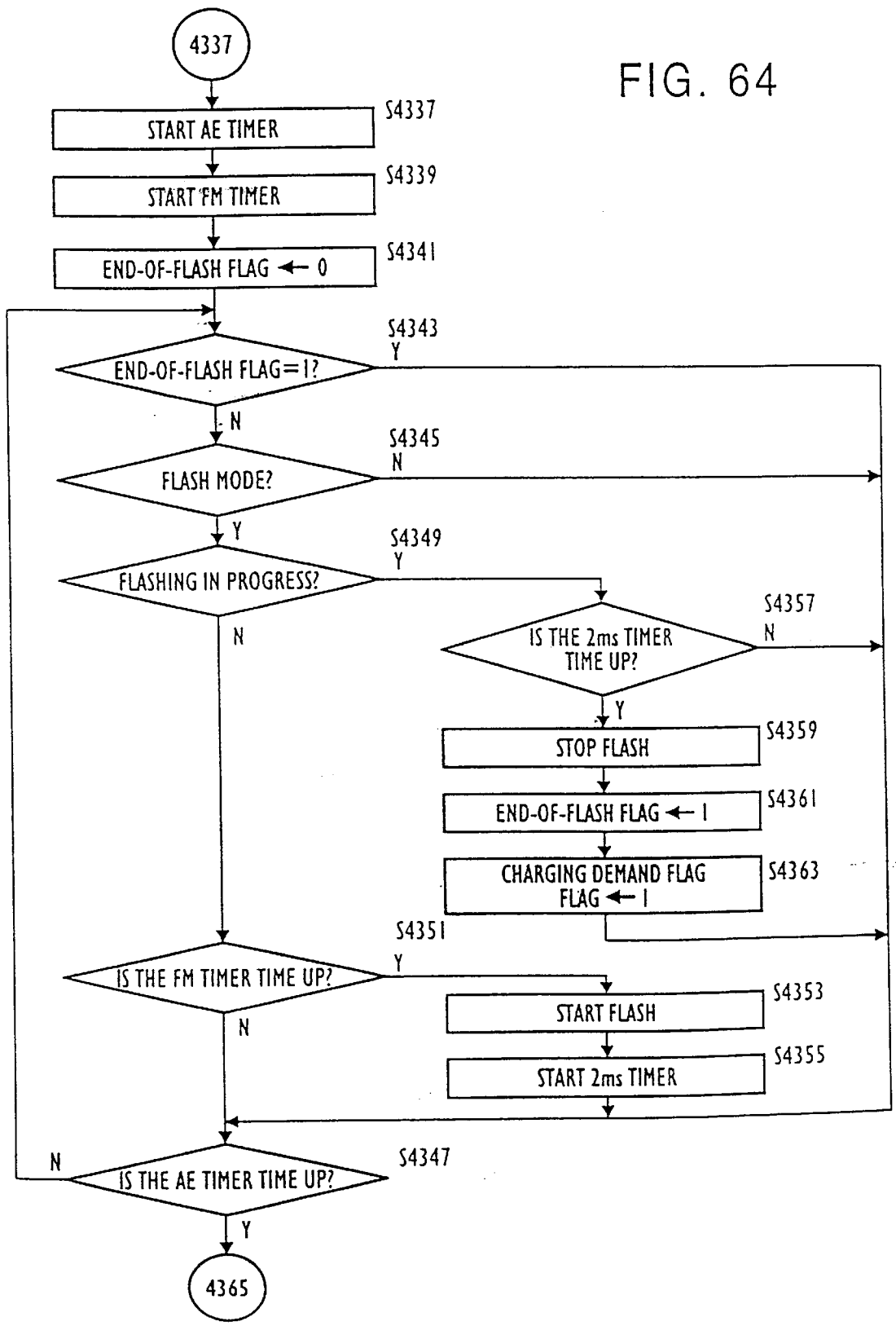
Figure 65:
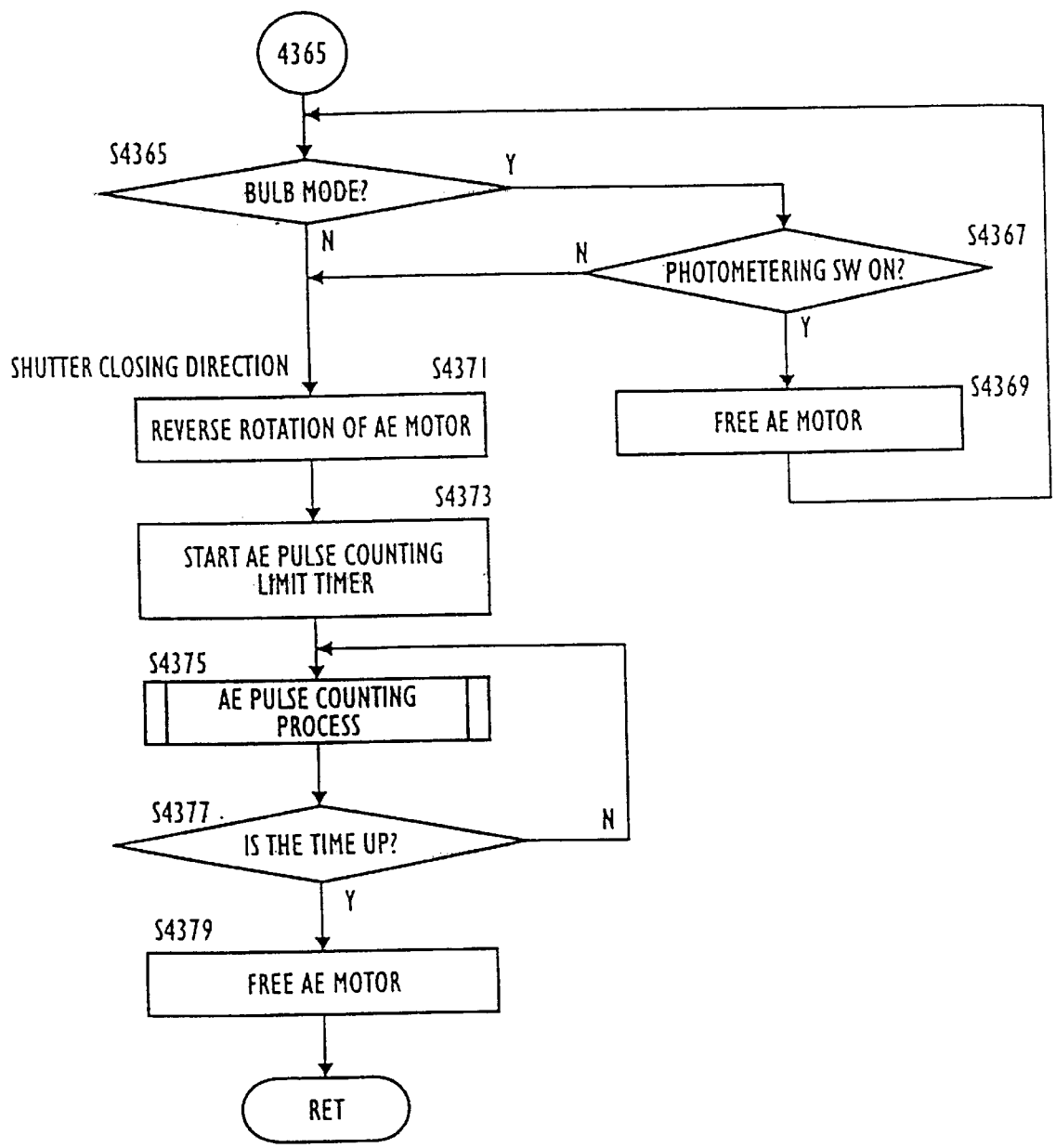

FIGS. 63 through 65 show a flow chart for the exposure process. The exposure process is executed when the release switch SWR is turned ON. In the exposure process, the compensation process in regard to the shutter, and the shutter initial position confirmation process, etc., are executed, and the shutter is thereafter released to perform exposure.

Whether the AE adjustment has finished is checked at step S4301, and if the AE adjustment has not finished, or if the AE data is less than 10 Ev even if the AE adjustment has finished, the AE timer time is selected from among the fixed data stored in the ROM based on the AE data obtained during the AE calculation process (steps S4301 and S4305, or at S4301, steps S4303 and S4305). If the AE adjustment has finished and the AE data is 10 Ev or more, at steps S4301, S4303 and S4307, based on the AE data obtained during the AR calculation process, the AR timer time is determined from among the adjustment data read during the reset process. The fixed data in the ROM is used when the AE data is less than 10 Ev since the shutter release time will be long when the AE data is less than 10 Ev and the influence of errors will therefore be small, and since the process can be executed in a shorter time by using the data in the ROM.

Then at steps S4309 and S4311, or at steps S4309 and S4313, whether the FM adjustment has completed or not is checked. If the FM adjustment has not completed, the FM timer time is selected from among the fixed data in the ROM based on the FM data, while if the FM adjustment has completed, the data that was read in the adjustment data reading process during the reset process is used.

When the setting of the timers is completed, at steps S4315, S4317, S4319 and S4321, the shutter initial position confirmation process is executed. In the process, namely at steps S4315, S4317, S4319 and S4321, the AE motor 29 is driven counterclockwise to drive the shutter blades 27a in the shutting direction, the AE pulse counting limit timer is started, and the AE pulse counting process is executed to wait until the timer time expires. When the shutter blades 27a are completely shut, and become immovable, the time expires since the AE motor 29 becomes incapable of rotating.

When the time expires, at steps S4323 and S4325, the AE motor 29 is driven clockwise and the shutter is driven in the opening direction, and the AE pulse counting limit timer time is started. Then at steps S4327, S4329 and S4331, the AE pulse counting process is executed and the process waits until the reference pulse number is counted up in the AE pulse counting process, while checking whether the AE pulse counting limit timer time has expired.

At steps S4329, S4333 and S4335, if the AE pulse counting limit timer has expired, it represents that the rotation of the AE motor 29 is impeded due to some reason, the shutter error flag is set, the AE motor 29 is freed, namely the passage of current is stopped, and control is returned.

At the moment when the counting of the reference pulse is ended, since the shutter blades 27a start to be opened. the AE timer and the FM timer are started, and the end-of-flash flag is cleared (steps S4335, 4337, S4339 and S4341).

Although it is checked whether the end-of-flash flag is set, and whether the flash mode is set, in the case where the strobe is not to be flashed, since the end-of-flash flag will remain cleared and the flash mode will not be set, the process waits for the time to expire at the AE timer (steps S4343, S4345 and S4347).

When the time of the AE timer expires and if the bulb mode is not set, the AE motor 29 is driven counterclockwise (i.e., in the direction in which the shutter is closed) to start the shutter blade shutting operation and the AE pulse counting limit timer time is started (steps S4371 and S4373). Then while executing the AE pulse counting process, the process waits for the time to expire at the AE pulse counter, namely, that the shutter blades 27a are shut and the AE motor 29 is stopped. When the time expires, the AE motor is freed and control is returned (steps S4375, S4377 and S4379). In the case of the bulb mode, the AE motor 29 is freed while the photometering switch SWS is ON, in order to prevent the AE motor 29 from overloading, and the process waits for the photometering switch SWS to be turned OFF (steps S4365, S4367 and S4369).

If the strobe flashing mode is set, since this means that a flashing mode is set, control proceeds to step S4349, and it is checked whether flashing is in progress, and since flashing will not be in progress initially, the process waits for the time to expire at the FM timer (steps S4349, S4351, S4347, S4313 and S4345). Since the FM timer time is normally shorter than the AE timer time, the time will normally be up at the FM timer first. When FM timer expires, flashing is started and the 2 ms timer is started (steps S4351, S43S3 and S4355). The 2 ms timer is a timer for waiting for the complete ending of the flashing of the strobe, and this waiting time is not limited to 2 ms and may differ according to the characteristics of the strobe.

When flashing is started, since flashing will be in progress, the process waits until the 2 ms timer expires (steps S4349, S4357, S4347, S4343 and S4345). When the time of the 2 ms timer expires, the flashing is stopped, the end-of-flash flag is set, and the charging demand flag is set (steps S4357, S4359, S4361 and S4363). Then at steps S4343 and S4347, since the end-of-flash flag has already been set the process waits until the AE timer expires.

[The Lens Return Process]

Figure 66:
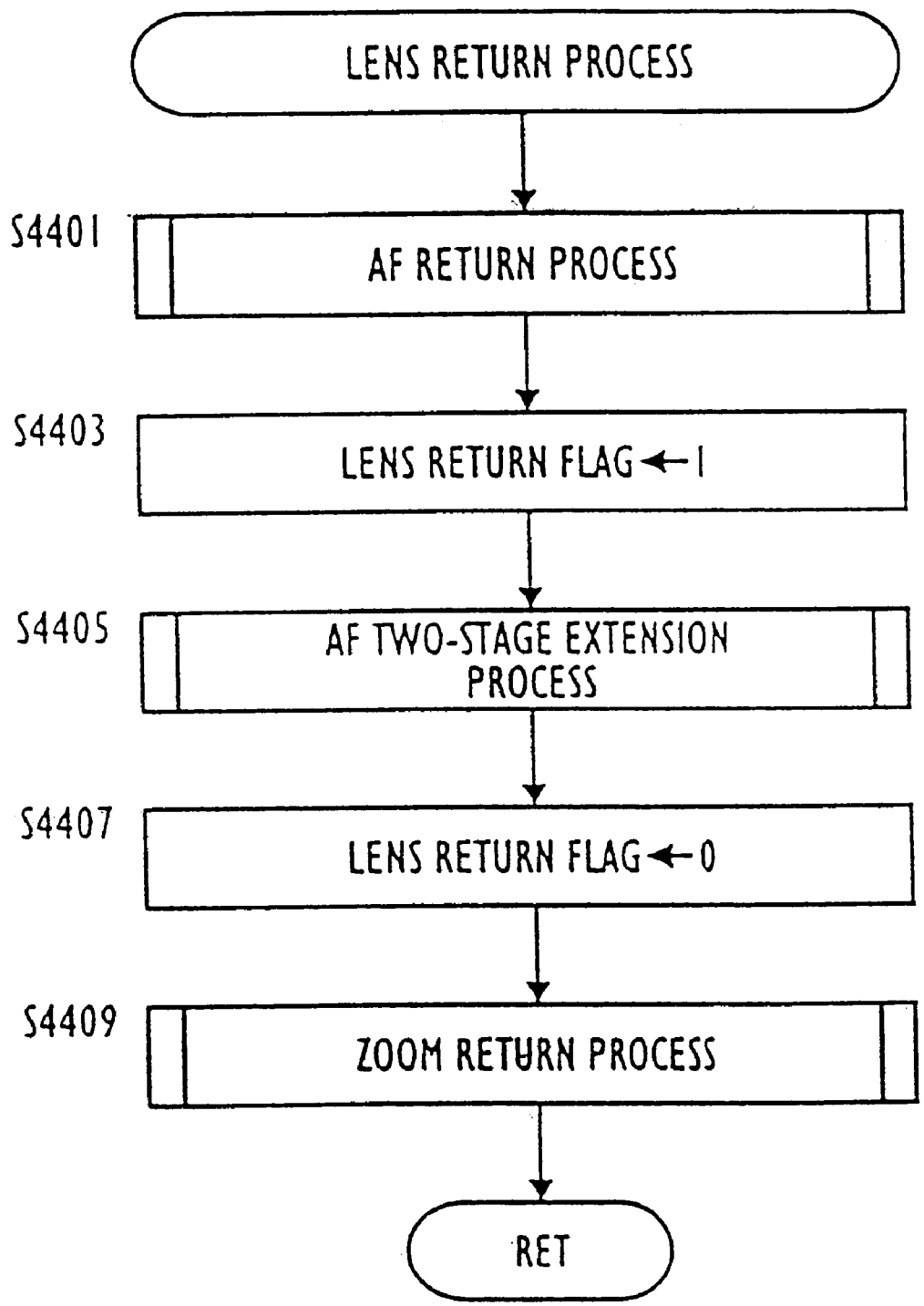
FIG. 66 is a flow chart of a lens return process of the zoom lens camera.

FIG. 66 shows a flow chart for the lens return process. The lens return process is a process in which the front lens group L1 and the rear lens group L2, which been moved to the focused positions during the photographing process, are returned to the positions prior to the photographing process. The front lens group L1 is returned to the standby position, retracted in the direction of the housing position by an amount corresponding to the second zoom pulse ZP2 from the "wide" side switching point of the zoom code corresponding to the zoom step which identifies the present focal length. The rear lens group L2 is returned to the AF home position if the zoom step is 5 or greater, or moved to a position extended (i.e., retracted) from the AF home position by an amount corresponding to the value of the AF pulse AP1, when the zoom step is between 0 and 4.

In the lens return process, the AF return process is called, the rear lens group L2 is returned to the AF home position, and the lens return flag is set. Then the AF two-stage extension process is called, and if the zoom code is 5 or greater, the rear lens group L2 is left as it is. If the zoom code is 4 or less, the rear lens group L2 is extended (i.e., retracted) by an amount corresponding to the value of the AP pulse AP1, and then the zoom return flag is cleared, i.e., set to 0. Then the zoom return process is called, and the front lens group L1 is moved to the standby position of the present zoom code, and control is returned (steps S4401, S4403, S4405, S4407 and S4409).

[The Lens Drive Calculation Process]

Figure 67:
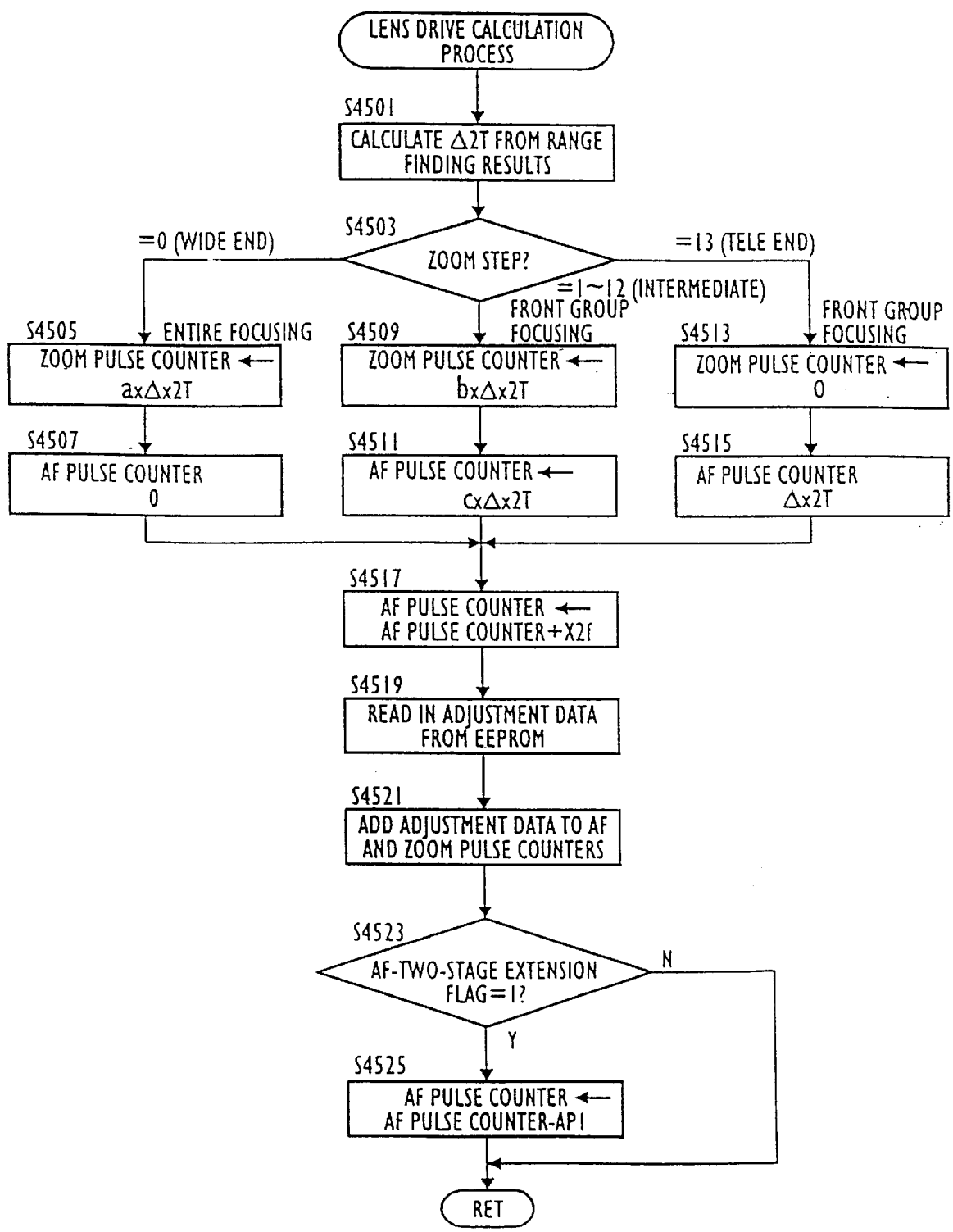
FIG. 67 is a flow chart of a lens driving operation process of the zoom lens camera.

FIG. 67 shows a flow chart for the lens drive calculation process. The lens drive calculation process is the process in which the pulse numbers, by which the whole unit driving motor 25 and the rear lens group driving motor 30 are to be driven, are determined based on the subject distance (or the photographing distance) obtained in the focusing processing and the present zoom step, as the zoom pulse number from the "wide" side switching point (i.e., the ON/OFF point) corresponding to the present zoom step and the AF pulse value. In the focusing process in the present embodiment, the direction in which the whole unit driving motor 25 is driven is the direction in which the front lens group L1 is advanced (extended), and the direction in which the rear lens group driving motor 30 is driven is the direction in which the rear lens group L2 is retracted from the AF home position, namely, moved away from the front lens group L1.

In the present embodiment, three modes of focusing are performed. At the "wide" end, whole focusing (first mode) is performed in which the front lens group L1 and the rear lens group L2 are moved as a whole by the whole unit driving motor 25. At the "tele" end, rear lens group focusing (third mode) is performed in which only the rear lens group L2 is moved by the rear lens group driving motor 30, and between the "wide" end and the "tele" end, the front lens group focusing (second mode) is performed in which the front lens group L1 and the rear lens group L2 are moved by the whole unit driving motor 25, and the rear lens group L2 is moved by the rear lens group driving motor 30, so that the absolute position of the rear lens group L2 with respect to the camera will not be changed.

In the lens drive calculation process, at step S4501, the reference amount of lens movement (i.e., the pulse number) $\Delta 2T$ is calculated based on the present zoom step and the subject distance obtained through the focusing processing. Then at steps S4503, S4505, S4507, S4509, S4511, S4513 and S4515, it is judged whether the present zoom step is 0 (i.e., the "wide" end), between 1 and 12 (i.e., intermediate position between the "wide" end and the "tele" end), or 13 (i.e., the "tele" end), and the pulse calculation process corresponding to the zoom step is executed in accordance wit the present zoom step. At steps S4505 and S4507, if the present zoom step is at the "wide" end, the whole focusing will be performed, and the value $(a*\Delta*2T)$ is set in the zoom pulse counter, and the value 0 is set in the AF pulse counter. If the present zoom step corresponds to an intermediate position, the front lens group focusing will be performed, and at steps S4509 and S4511, the value $(b*\Delta*2T)$ is set in the zoom pulse counter, and the value $(c*\Delta*2T)$ is set in the AF pulse counter. If the present zoom step corresponds to the "tele" end, the rear lens group focusing will be performed, and at steps S4513 and S4515, the value 0 is set in the zoom pulse counter, and the value $(\Delta*2T)$ is set in the AF pulse counter. The symbols a, b, c and $\Delta X$ are predetermined compensation factors.

When the setting of the pulse counter is complete, at step S4S17, the correction value X2f, according to the focal length, is added to the value of the AF pulse counter. Then at steps S4519 and S4521, the adjustment data is read from the EEPROM 230, and are further added to the values at the AF pulse counter and the zoom pulse counter. At steps S4523 and S4525 it is checked whether the AF two-stage extension flag is set, and if it is set, since the rear lens group L2 has already been extended (retracted) by the value of the AF pulse AP1 from the AF home position, the value AP1 is deducted from the AF pulse counter.

In the above processing, the setting of the drive pulse number of the whole unit driving motor 25 and the drive pulse number of the rear lens group driving motor 30, for moving the front lens group L1 and the rear lens group L2 to lens positions at which the lenses will be in focus with the subject at the present focal length, are completed.

[The Test Function Process]

Figure 68:
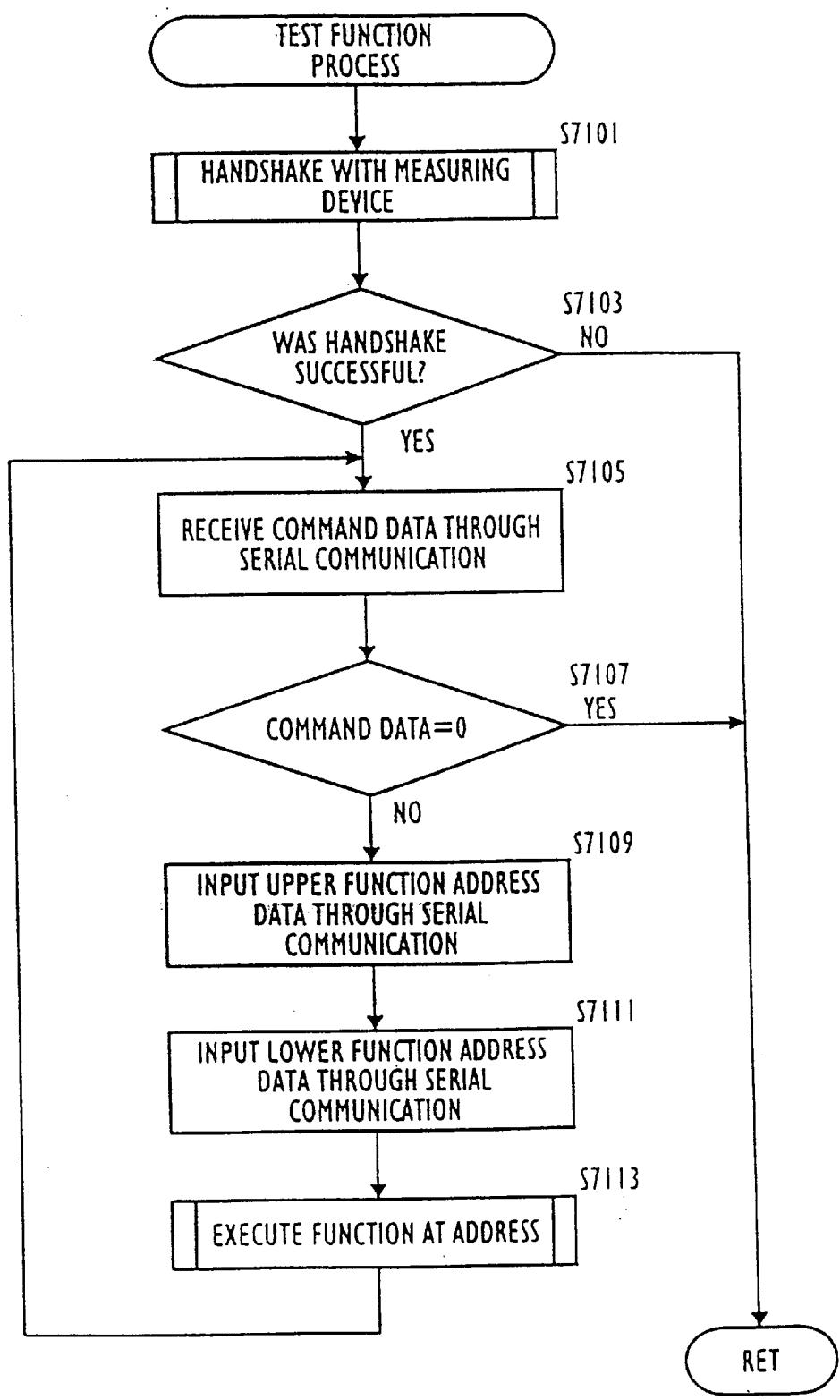
FIG. 68 is a flow chart of a test function process of the zoom lens camera.

FIG. 68 shows a flow chart for the test function process. The test function process is the process for testing the functions of the camera, and is called to execute the various functions of the camera with the camera being connected to a measuring device.

In the prior art, tests to be performed upon connecting a measuring device to a camera are commenced when commands are input into the camera from the measuring device, which are determined in advance and predetermined processes are executed at the camera side according to the various commands input from the measuring device. However, when tests are performed by such a method, only a limited number of predetermined operations can be executed and other operations cannot be executed. Test operations can only be performed for test items that are considered at the time of writing the test program, and normally test items cannot be added later. With the camera of the present embodiment, programs for controlling the camera can be designed one function at a time and input from the measuring device to be executed by the camera.

The test function process is called during the execution of the reset process. Therefore, the test function process is executed by connecting the measuring device (not shown) to the camera, as the battery is loaded into the camera.

When the test function process is called, at step S7101 a handshake between the CPU 210 of the camera and the measuring device, connected to the camera, is executed, and the communication condition is set. If an error occurs during the handshake, or if the measuring apparatus is not connected to the camera, it is deemed that the handshake was unsuccessful at step S7103, and the test function process is canceled, and control is returned. If the handshake is successful and communication is enabled at step S7103, the input of commands from the measuring device to the CPU 210 is enabled (step S7105).

If the command data has a value 0, which indicates the end of the test function process at step S7107, control is returned upon ending the test function process. If the value of the command data is not 0, the upper address and the lower address of the function to be called are received through serial communication from the measuring device (steps S7109, S7111) and the function stored in the address range is executed at step S7113. The processes related to the test items necessary, are executed by repeating the above until the command data with a value of 0 is received.

As described above, detailed tests can be performed with the camera of the present embodiment, since the camera controlling programs can be designed and executed in function units by data input from the measuring device.

[The AF Pulse Counting Process]

Figure 69:
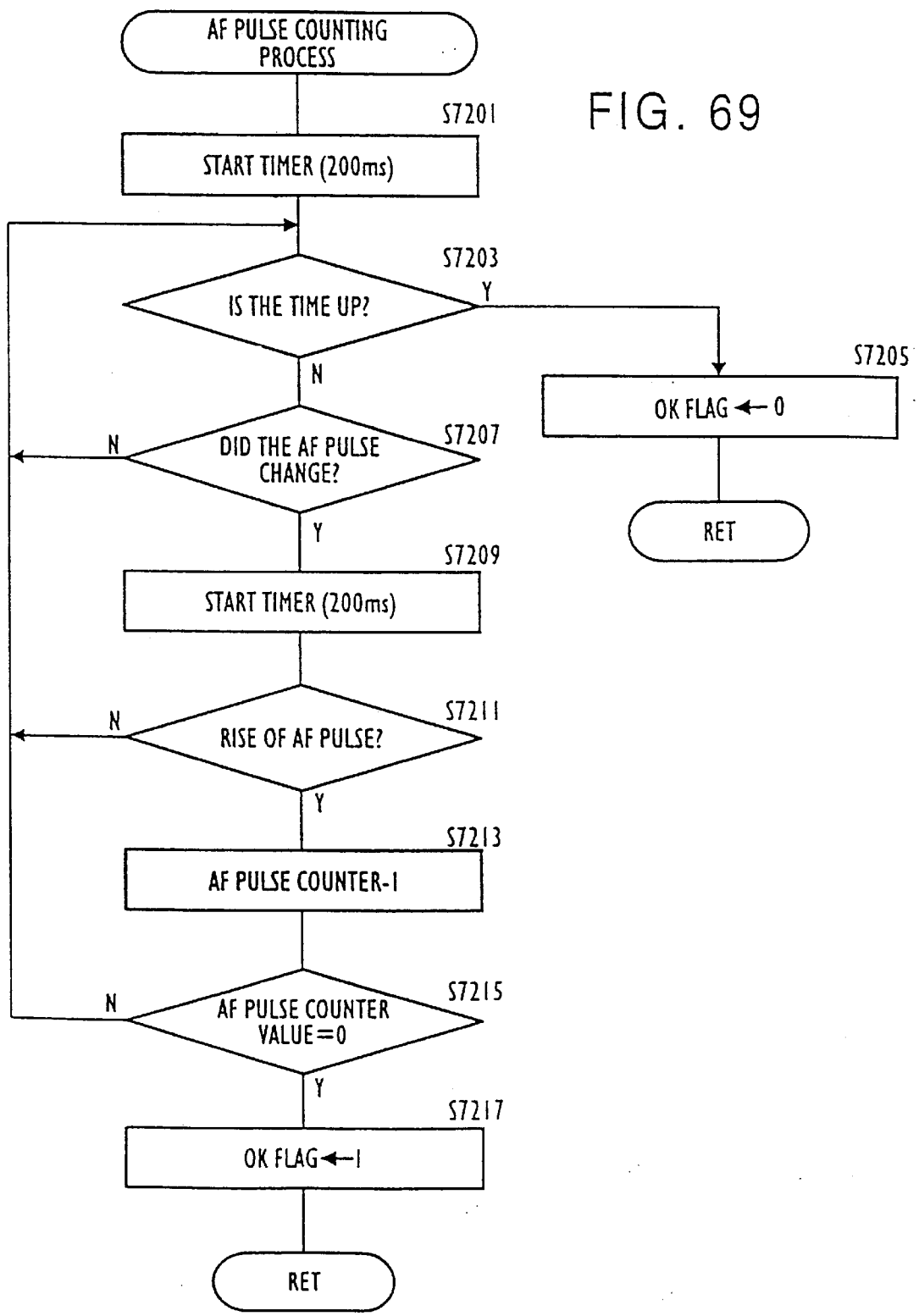
FIG. 69 is a flow chart of an AF pulse counting process of the zoom lens camera.

FIG. 69 shows a flow chart for the AF pulse counting process. The AF pulse counting process is the process in which the AF pulse counter is decremented by one each time a change in the AF pulse is detected within a predetermined time period, and the OK flag is set to 1 when the value at the AF pulse counter becomes 0. The OK flag is set to 0 if the value at the pulse counter does not become 0 within the predetermined period.

At step S7201, the CPU 210 first sets a timer to 200 ms, which is representative of a period during which the changes in the AF pulses are to be monitored. In the following processes, if there is no change in the AF pulse within 200 ms period, the CPU 210 sets the OK flag to 0, as above described.

At step S7203, the CPU 210 judges whether the 200 ms timer has expired. If the time has not expired, then at step S7207, whether there was a change in the AF pulse is judged based on the output signal from the AF reference pulse input circuit 222 to the CPU 210. The judgement as to whether there is a change in the AF pulse is made by detecting the change of the pulse from both the H (high) level to the L (low) level and vice versa.

If there is no change in the AF pulse at step S7207, the CPU 210 returns the process to step S7203. Therefore, if no changes in the AF pulse are detected within the 200 ms time period, it is judged that the time expires at step S7203, and the process is ended upon setting the OK flag to 0 at step S7205. In other words, the OK flag is set to 0 if the same number of pulses as the value set at the AF pulse counter before the AF pulse counting process was called is not detected during the execution of the AP pulse counting process.

When the CPU 210 detects a change in the AF pulse at step S7207, then at step S7209 the timer is reset, and the period of 200 ms is set again and restarted. If the detected change in the AF pulse is a rise of the AF pulse at step S7211, then at step S7213 the AF pulse counter is decremented by one. Here, the value to be counted, that is, the value corresponding to the amount by which the rear lens group L2 is to be driven by the rear lens group driving motor, is set at the AF pulse counter before the AF pulse counting process is executed. If the value at the decremented AF pulse counter is 0 at step S7215, the CPU 210 sets the OK flag to 1 and ends the process. That is, the OK flag is set to 1 if the same number of pulses as the value set at the AF pulse counter before the AF pulse counting process was called has been counted.

As described above, in the AF pulse counting process, the OK flag is set to 1 if the same number of pulses as the predetermined value set at the AF pulse counter are output from the AF reference pulse input circuit 222 to the CPU 210. The OK flag is set to 0 if the output of pulses is stopped before the AF reference pulse input circuit 222 outputs a number of pulses equal to the predetermined value set at the AF pulse counter to the CPU 210.

[The Zoom Drive Check Process]

Figure 70:
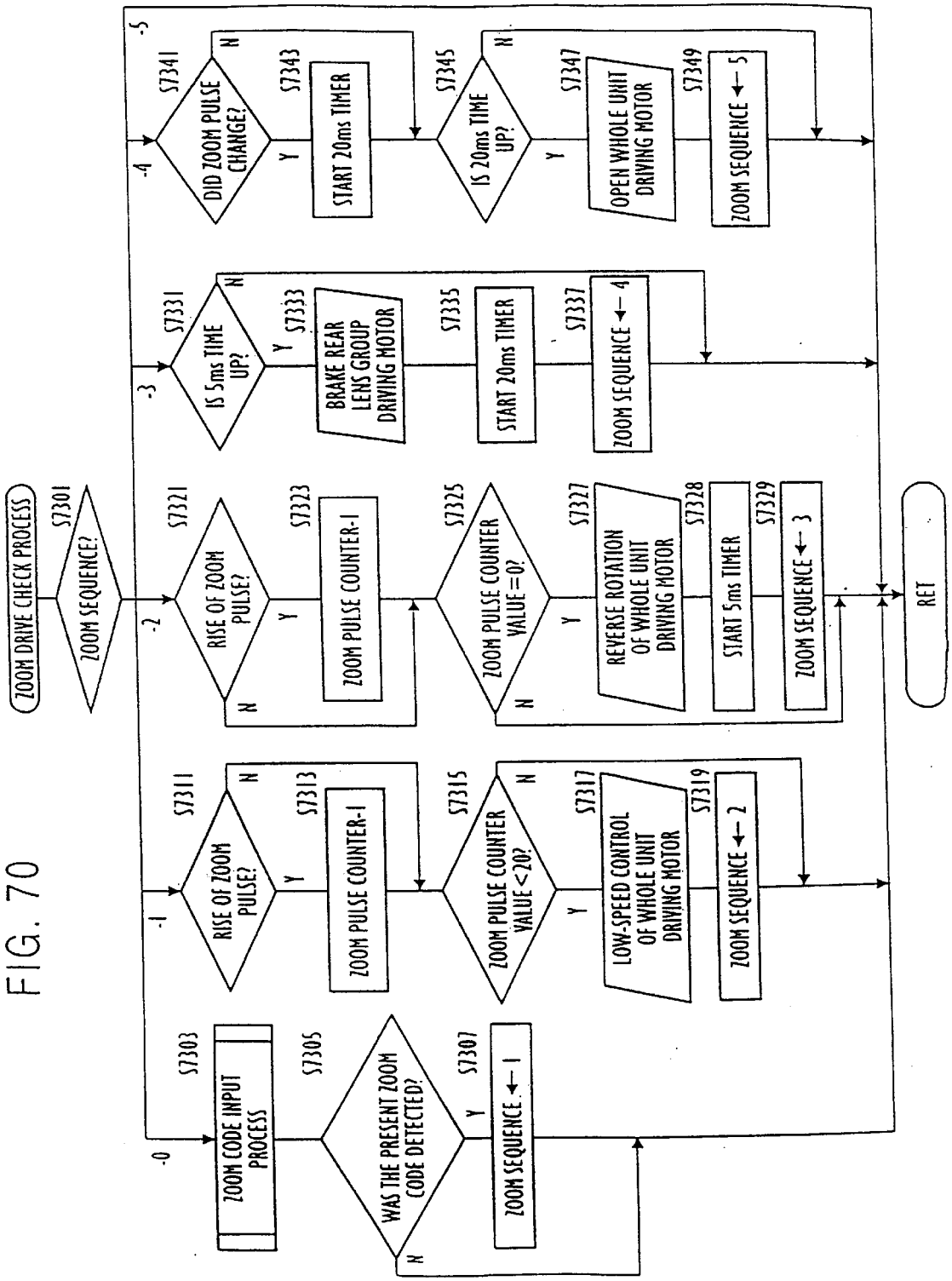
FIG. 70 is a flow chart of a zoom driving check process of the zoom lens camera.

FIG. 70 shows a flow chart for the zoom drive check process. In addition, the relationship between the driving state of the whole unit driving motor 25 and the zoom sequence is shown in the form of a timing chart in FIG. 35. The zoom drive check process is a process in which it is judged at which stage the driving of the lenses by the whole unit driving motor 25 for focusing on the subject distance is at, and in which stage the driving control of the whole unit driving motor 25 is carried out.

When the zoom drive check process is executed, according to the value of the zoom sequence (0 through 5), which is the index that indicates the state of driving of the whole unit driving motor 25, namely, the state of operation of the whole unit driving motor controlling circuit 60, the process branches at step S7301. When the zoom drive check process is called, the condition will be one in which the whole unit driving motor 25 is driven clockwise, and the zoom sequence is set to 0.

At step S7303, if the value of the zoom sequence is 0, the CPU 210 calls the zoom code input process, and the value of the zoom code is input. When the lenses are stopped, the terminal for zoom code detection is positioned to the "wide" side of the zoom code. When the whole unit driving motor 25 is driven clockwise, the zoom code detection terminal first contacts the zoom code corresponding to the preset lens position. If the zoom code input in the zoom code input process equals to the value stored in the memory as the present zoom code at step S7305, then at step S7307 the zoom sequence is set to 1. If the zoom code input by the zoom code input process differs from the value stored in memory as the present zoom code at step S7305, the zoom sequence remains at 0, and the zoom drive check process is ended.

When the value of the zoom sequence is 1, namely, after the present zoom code is detected, at step S7311 the CPU 210 monitors the rise of the zoom pulse output by the zoom pulse input circuit 220. At steps S7311 and S7313, the zoom pulse is then only decremented if the rise of the zoom pulse is detected. When the zoom pulse counter becomes less than 20 at step S7315, then at step S7317 the CPU 210 switches the whole unit driving motor 25 to the low-speed control, and at step S7319, the value of the zoom sequence is set at 2. If the value at the zoom pulse counter is equal to or greater than 20 at step S7315, the zoom sequence remains at 1, and the zoom drive check process is ended.

Therefore, when the whole unit driving motor 25 is started to drive, the zoom pulse counter is decremented on the basis of the present zoom code, and according to the pulses output by the zoom pulse input circuit 220 to the CPU 210. The whole unit driving motor 25 is driven by the normal DC drive until the count at the zoom pulse counter becomes 20. The zoom sequence will be 1 while the whole unit driving motor 25 is being driven at normal speed. If the driving in the DC drive condition is continued, the lenses may be moved by more than the amount corresponding to the desired number of pulses due to inertia, etc., when the whole unit driving motor 25 stops. Therefore, when the zoom pulse counter becomes less than 20, the whole unit driving motor 25 is put under low speed control. The low-speed control is executed by PWM control. When the driving of the whole unit driving motor 25 is switched to low-speed control, the zoom sequence is set to 2.

When the zoom sequence is 2, namely during the low-speed control of the whole unit driving motor 25, if the zoom drive check process is called, the processes from step S7321 are executed. In such processes, at step S7321 the CPU monitors a rise of the zoom pulse, and decrements the zoom pulse when a rise is detected at step S7323. If a rise of the zoom pulse is not detected at step S7321, the process at step S7323 is skipped.

Until the zoom pulse count, which is decremented by one at a time while the lenses are being driven with the whole unit driving motor 25 being under low-speed control, become 0, the processes at steps S7321 and S7323 are executed each time the zoom drive check process is called. The zoom sequence will remain at 2 during this period. When the zoom pulse becomes 0 at step S7325, the whole unit driving motor 25 is driven counterclockwise at step S7327, to perform the braking process (i.e., reverse brake). After starting the counterclockwise driving of the whole unit driving motor 25, at step S7328, the time of 5 ms, which is the reverse driving period, is set at the timer, and the zoom sequence is set to 3 at step S7329. In such a manner, when the zoom sequence is 3, the whole unit driving motor 25 is driven counterclockwise for braking.

When the zoom sequence is 3, if the zoom drive check process is called, at step S7331 the CPU 210 judges whether the period of 5 ms, which is the period of the counterclockwise driving of the whole unit driving motor 25, has elapsed or not. If 5 ms has not elapsed, control is returned with the zoom sequence remaining at 3. After 5 ms have elapsed, at steps S7333, S7335 and S7337, braking is performed by short-circuiting the terminals of the whole unit driving motor 25, and the 20 ms timer is started, and the zoom sequence is set to 4, and control is returned.

If the zoom driving check processing is called when the zoom sequence is 4, at step S7341 the CPU 210 monitors whether the zoom pulse changes. That is, whether the whole unit driving motor 25 is rotating under the condition where the brakes are acting is judged according to whether the zoom pulse changes within 20 ms.

If the CPU 210 judges, that there is no change in the zoom pulse at step S7341, and that the 20 ms timer expires at step S7345, then at steps S7347 and S7349, the control of the whole unit driving motor 25 is stopped, and the terminals of the motor are brought in to the open condition (i.e., undriven condition), and the zoom sequence is set to 5. If it is detected at step S7341 that the zoom pulse has changed, the 20 ms timer is restarted at step S7343, and it is monitored whether the next change in the zoom pulse is detected within the 20 ms after the previous change in the zoom pulse. A return is performed with the brake acting on the whole unit driving motor 25 and with the zoom sequence remaining at 4 until it is judged at step S7345 that the 20 ms timer has expired.

If the zoom drive check process is called when the zoom sequence is 5, as shown in the flow chart, control is returned without executing any processes in the zoom drive check process.

As above described, in the zoom drive check process, the lenses are moved to the position of the present zoom code, which is the reference position (zoom sequence=0). The lenses are then moved at the normal speed while the counter at the zoom pulse counter is 20 or more (zoom sequence=1), and then moved at a low speed when the count at the zoom pulse counter becomes less than 20 (zoom sequence=2). When the count at the zoom pulse counter becomes 0, the whole unit driving motor 25 is driven counterclockwise for 5 ms (zoom sequence=3), and thereafter, braking is performed by short-circuiting the terminals of the whole unit driving motor 25 (zoom sequence=4). When the whole unit driving motor 25 comes to a complete stop, control of the whole unit driving motor 25 is ended (zoom sequence=5), and thereafter, the undriven condition is maintained, until a new value is set at the zoom pulse counter and the zoom sequence is set to 0.

[The AF Drive Process]

Figure 71:
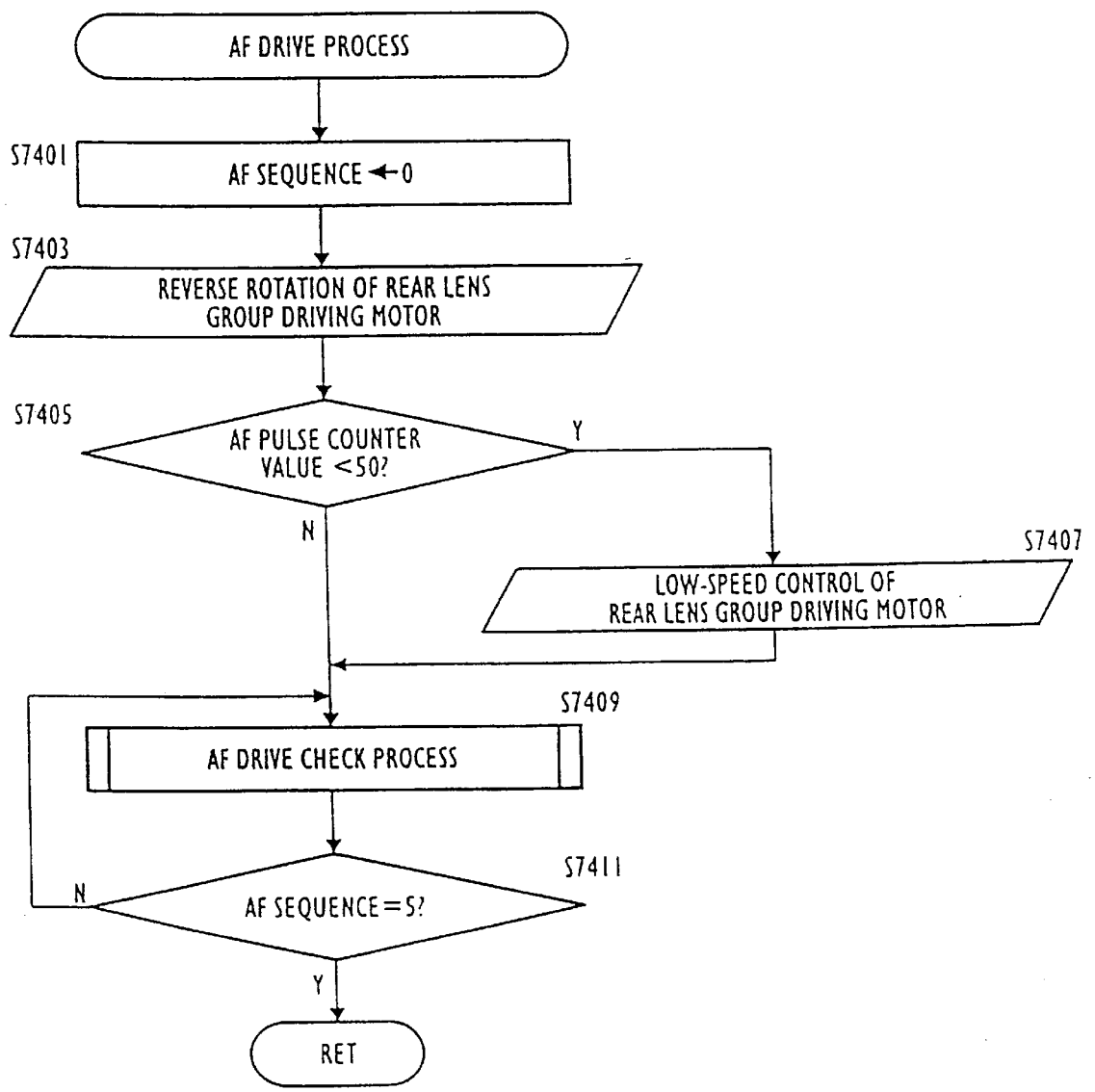
FIG. 71 is a flow chart of an AF driving process of the zoom lens camera.

FIG. 71 shows a flow chart for the AF drive process. The AF drive process is a process in which the rear lens group motor 30 is driven and controlled so as to move the rear lens group rearwardly, i.e., towards the film plane, in the lens retracting direction. By this process, the rear lens group L2 is moved rearwardly in order to set the focus on the subject distance.

At step S7401 the AF sequence is first set to 0. At steps S7403 and S7405 the rear lens group driving motor 30 is driven clockwise, namely, driven in the retracting direction, and it is checked whether the count at the AF pulse counter is less than 50. If the count is less than 50, the control of the rear lens group driving motor 30 is switched to low-speed control (i.e., the PWM control), while if the count is 50 or greater, the AF drive check process is called without switching the control (steps S7405, S7407 and S7409, or at steps S7405 and S7409). Then at steps S7409 and S7411, it is then waited for the AF sequence to become 5 while performing the AF drive check process and a return is performed when the sequence becomes 5.

Figure 35:
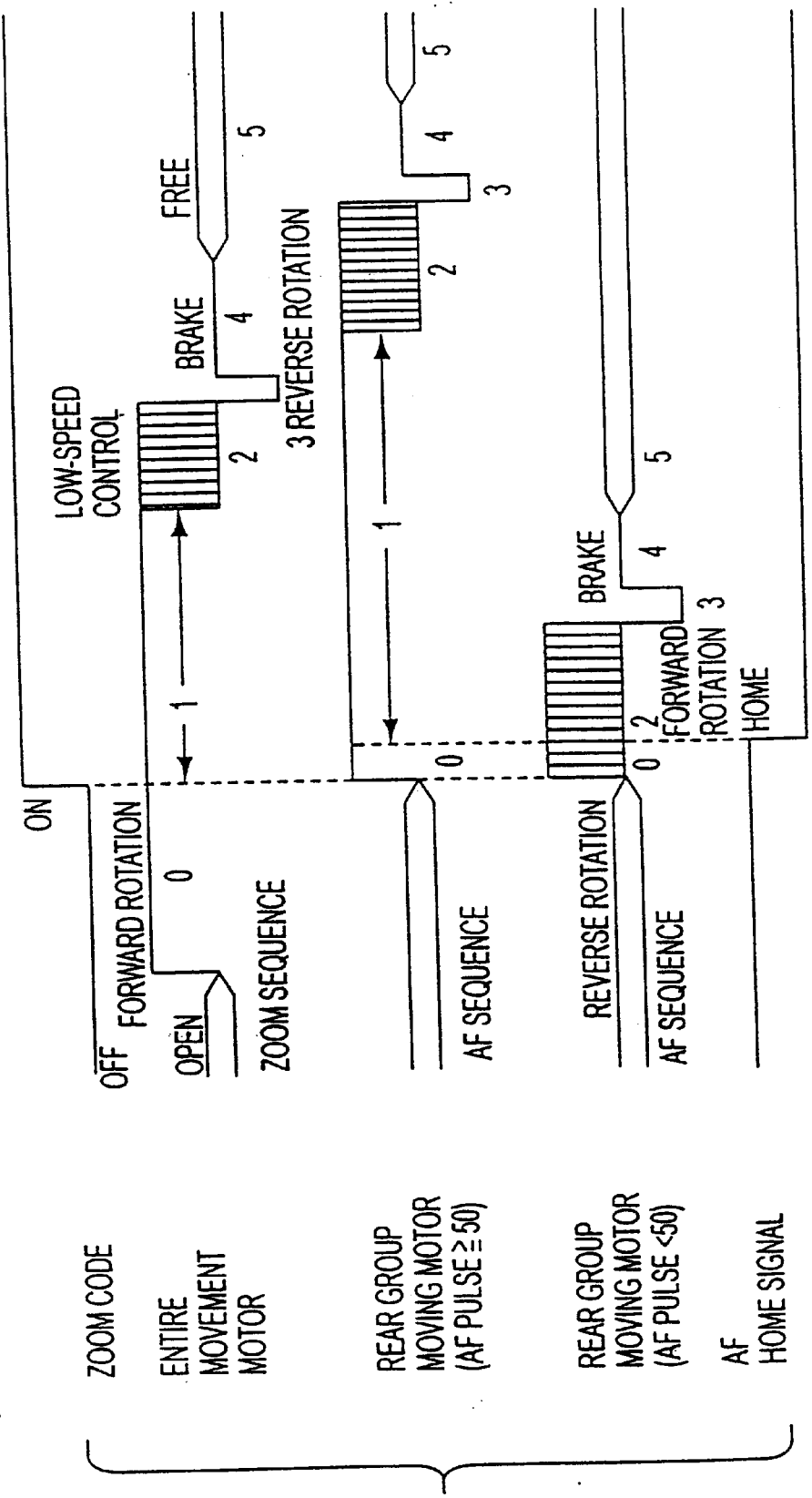
FIG. 35 is a schematic view illustrating movement sequences of a whole unit driving motor and a rear lens group driving motor during exposure (i.e., during focusing) of the zoom lens camera.
Figure 36:
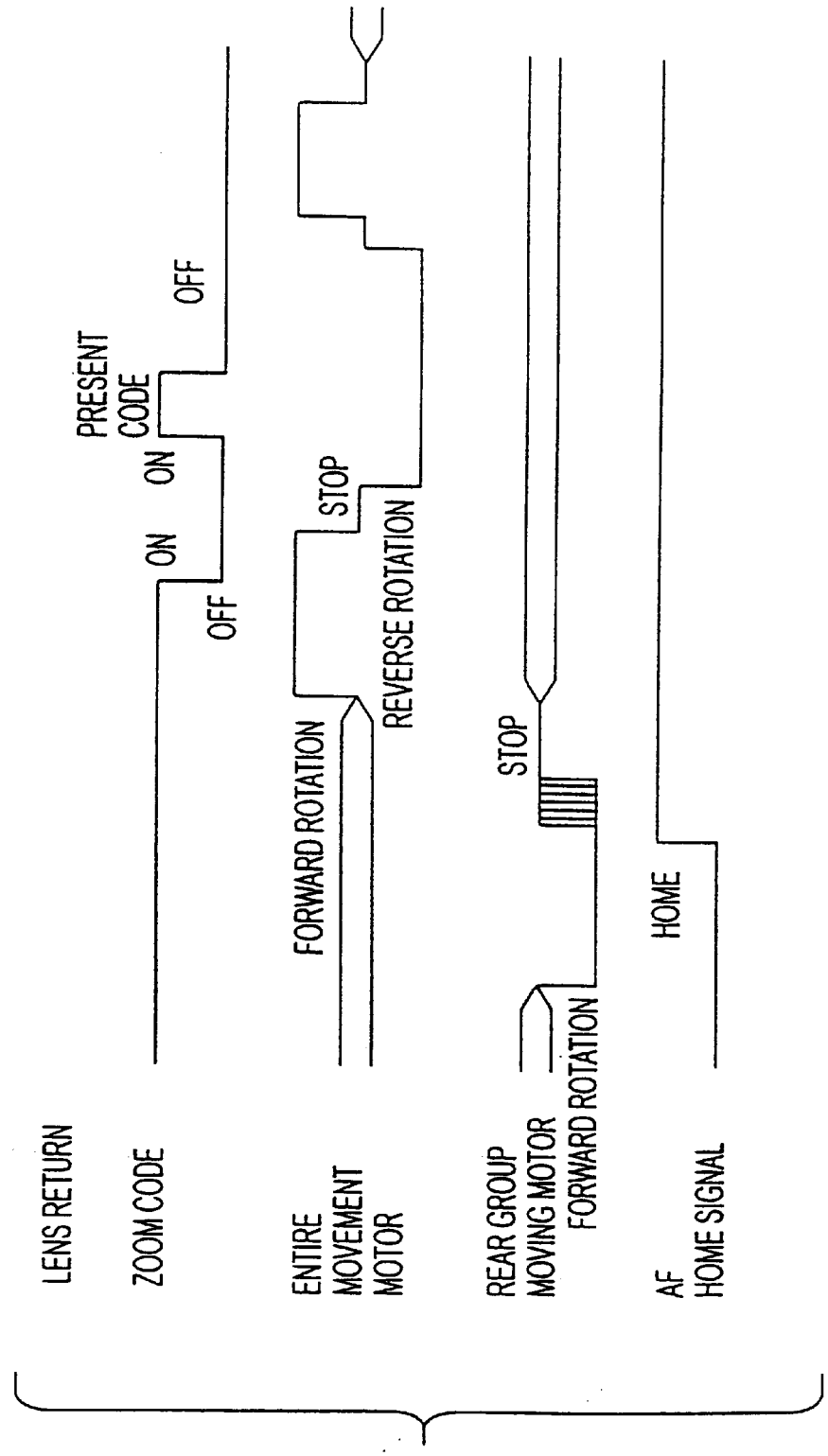
FIG. 36 is a schematic view illustrating movement sequences of the whole unit driving motor and the rear lens group driving motor during lens return of the zoom lens camera.

The AF sequence is an identifier which identifies the state of the operation sequence of the rear lens group driving motor controlling circuit 61, and as shown in FIG. 35 and FIG. 36, an AF sequence of 0 indicates the condition where the switching of the AF home signal, basis for the counting of AF pulses, has been detected. An AF sequence of 1 and 2 indicate the condition in which the AF pulses are being counted with 1 indicating the DC drive condition and 2 indicating the low-speed control condition. An AF sequence of 3 indicates the reverse braking condition, 4 indicates the short-circuit braking condition, and 5 indicates the open terminal condition (inactivated condition) and thus the ending of the series of sequences.

If the rear lens group driving motor 30 is driven by the DC drive when the AF pulse number by which the rear group moving motor 30 is to be driven is small, the rear lens group driving motor 30 may be driven, due to inertia, etc., by more than the AF pulse number by which it is supposed to be driven. Thus when the AF pulse number is less than 50, the start-up and driving are performed from the beginning at the same low speed as in AF sequence 2.

[The Zoom Pulse Counting Process]

Figure 72:
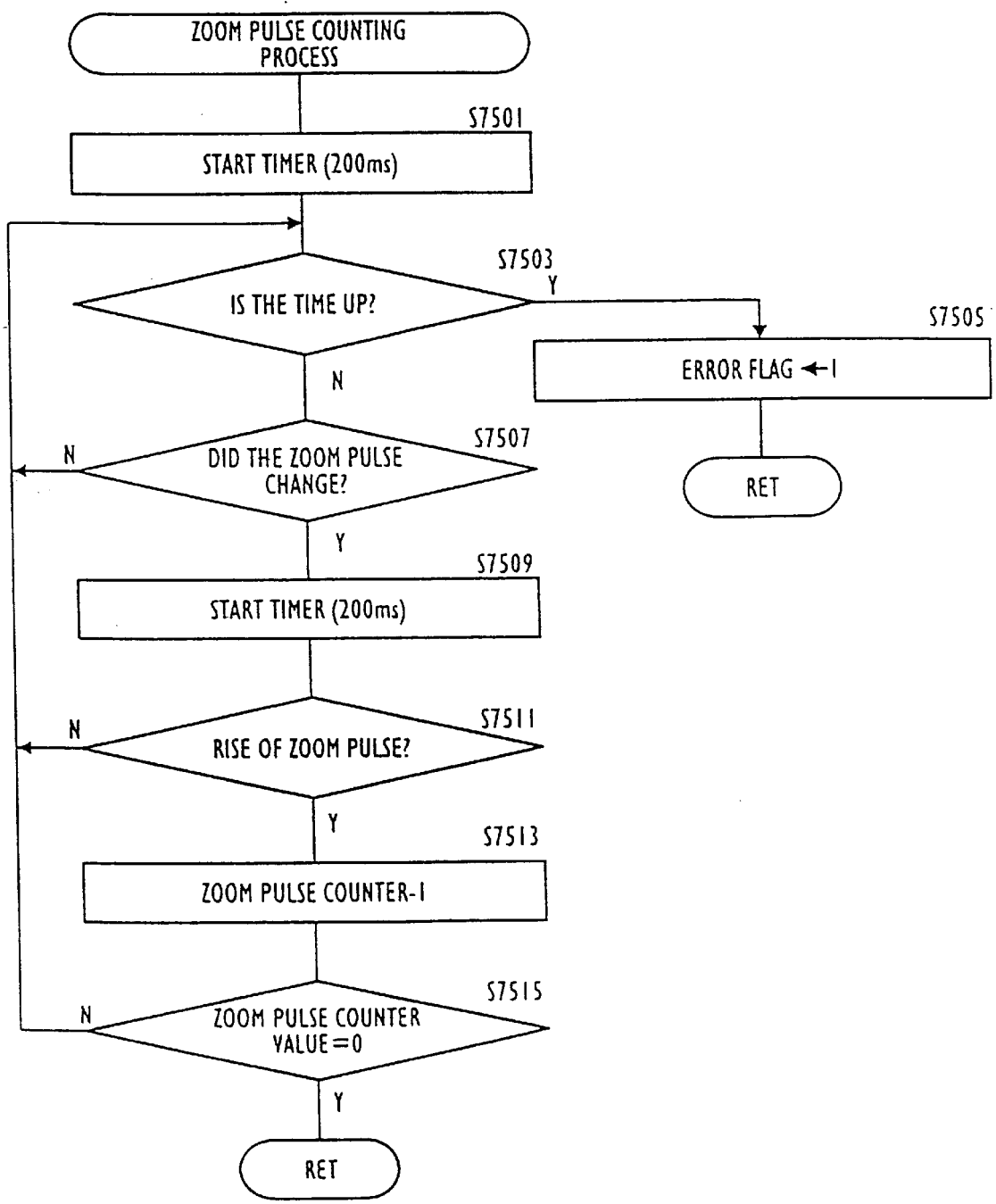
FIG. 72 is a flow chart of a zoom pulse counting process of the zoom lens camera.

FIG. 72 shows a flow chart for the zoom pulse counting process. The zoom pulse counting process is a process in which the previously set zoom pulse counter is decremented by one each time a change in the zoom pulse output from the zoom pulse input circuit 220, is detected within a predetermined period, and which is ended when the count at the zoom pulse counter becomes 0. If a change in the zoom pulse is not detected within the above-mentioned predetermined period, the error flag is set to 1.

At step S7501, the CPU 210 first sets the period of 200 ms at the timer as the period during which the change in the zoom pulse is to be monitored. In the following processes, if there is no change in the zoom pulse within 200 ms, the CPU 210 sets the error flag to 1.

At step S7503, the CPU 210 judges whether the 200 ms timer has expired. If the time has not expired, then at step S7507, it is judged whether there was a change in the zoom pulse based on the output pulse from the zoom pulse input circuit 220 to the CPU 210. Whether the zoom pulse changed is judged here by detecting the change in the pulse both from the H (high) level to the L (low) level and vice versa.

If there is no change in the zoom pulse at step S7507, the CPU 210 returns to the process at step S7503. Therefore, if the change in the zoom pulse is not detected within 200 ms, at step S7503 it is judged that the time expires, and at step S7505 the error flag is set to 1 and control is returned. In other words, a return is performed upon setting the error flag to 1, if the same number of pulses as the value set at the zoom pulse counter before the zoom pulse counting process was called is not detected within the interval during which the zoom pulse counting process is executed.

When the CPU 210 detects a change in the zoom pulse at step S7507, then at step S7509 the timer is reset to 200 ms. If the detected change in the zoom pulse is a rise of the zoom pulse at step S7511, then at step S7513 the zoom pulse counter is decremented by one. Here, the value to be counted, that is, the value corresponding to the amount by which the lenses are to be driven by the whole unit driving motor 25 (i.e., the count of the pulses output by the zoom pulse input circuit 220), is set at the zoom pulse counter before the zoom pulse counting process is executed. When the count of the zoom pulse counter becomes 0 at step S7515, the CPU 210 ends the process. That is, the process is ended normally if the same number of pulses as the value set at the zoom pulse counter before the zoom pulse counting process was called has been counted.

As described above, in the zoom pulse counting process, a return is performed without setting the error flag if the same number of pulses as the value set previously at the zoom pulse counter are counted. On the other hand, a return is performed upon setting the error flag to 1, if the same number of pulses as the value set at the zoom pulse counter by the zoom pulse input circuit 220 could not be counted.

[The AF Drive Check Process]

Figure 73:
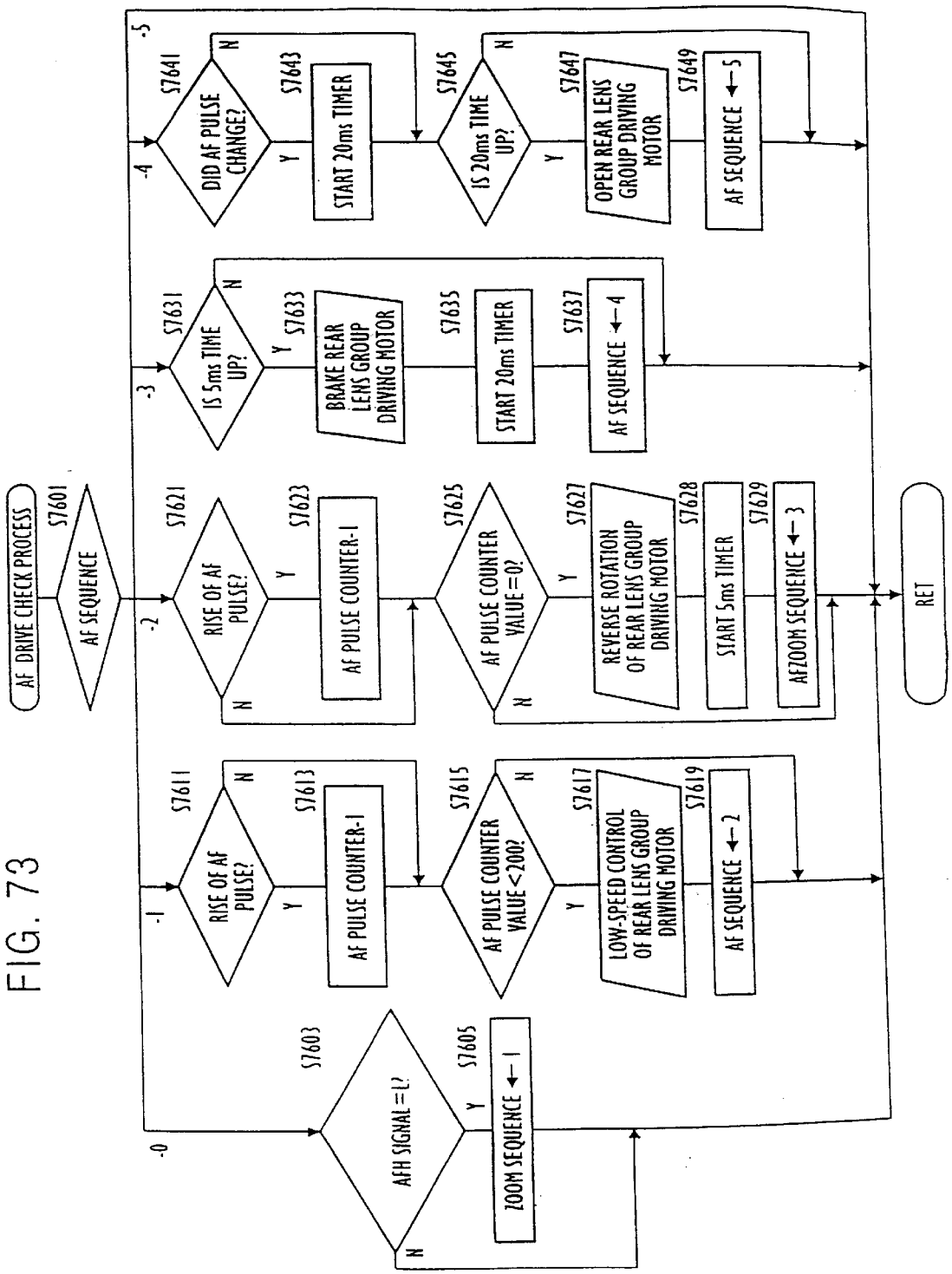
FIG. 73 is a flow chart of an AF driving check process of the zoom lens camera.
Figure 74:
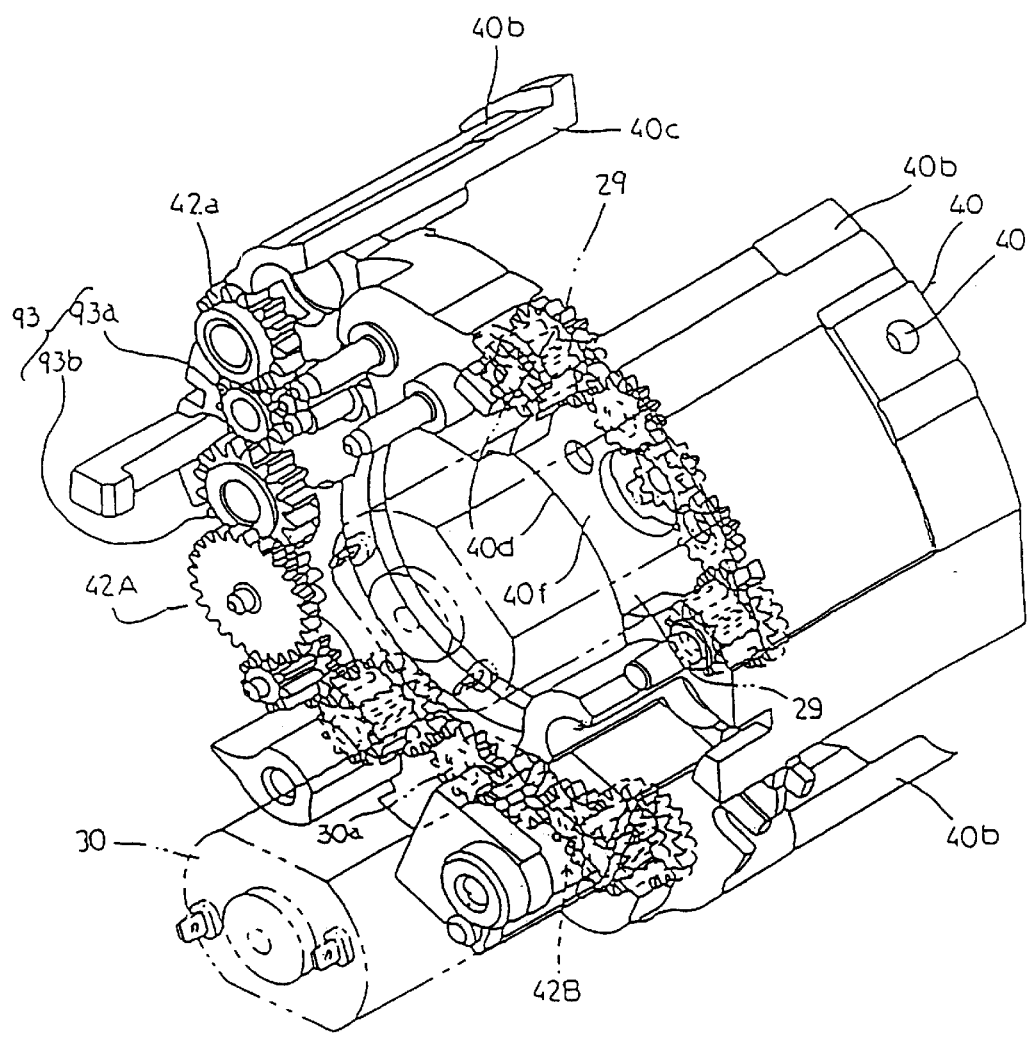
FIG. 74 is a schematic perspective view of a part of the zoom lens barrel.

FIG. 73 shows a flow chart for the AF drive check process. The AF drive check process is a process in which the rear lens group driving motor 30 is controlled so that the rear lens group L2 will be driven based on the value set at the AF pulse counter.

The execution the AF drive check process which branch at step S7601 is processed in accordance with the value of the AF sequence (0 through 5). The AF sequence is an identifier that identifies the state of the operation sequence of the rear lens group driving motor controlling circuit 61. When the AF drive check process is executed for the first time, the rear lens group driving motor 30 is driven, and the AF sequence is set to 0. FIG. 35 shows the relationship between the driving state of the rear lens group driving motor 30 and the AF sequence.

At step S7603, if the value of the AF sequence is 0, the CPU 210 judges whether the AFH (i.e., the "AF home") signal has changed from H (high) to L (low). The AFH signal is H (high) when the rear lens group L2 is positioned at the AF home position, and changes to L (low) when the rear lens group L2 moves away from the AF home position. The movement of the rear lens group L2 based on the AF pulse counter, described below, is executed on the basis of the position at which the AFH signal changes to L. When the AFH signal changes from H to L at step S7603, then at step S7605 the CPU 210 sets the AF sequence to 1, and control is returned. While the AFH signal is H, control is returned while the AF sequence remains at 0.

If the value of the AF sequence is 1, namely, after the change of the AFH signal from H to L is detected, at step S7611 the CPU 210 monitors the rise of the AF pulse. At steps S7611 and S7613, the AF pulse counter is decremented only when the rise of the AF pulse is detected. When the count at the AF pulse counter becomes less than 200 at step S7615, then at step S7617 the CPU 210 switches the rear lens group driving motor 30 to low-speed control, and at step S7619, the value of the AF sequence is set to 2. If the AF pulse counter is 200 or more at step S7615, the AF drive check process is ended and control is performed with the AF sequence remaining at 1. If the DC drive of the rear lens group driving motor 30 is performed from the beginning to the end, the desired AF pulse number may be exceeded due to the influence of inertia, etc. Thus, when the remaining AF pulse number becomes 200, the rear lens group driving motor 30 is driven at low speed through the PWM control.

As described above, when the rear lens group driving motor 30 is started to drive, the AF pulse counter is decremented based on the point at which the AFH signal changes from H to L, and normal DC drive of the rear lens group driving motor 30 is performed until the count at the AF pulse counter becomes 200. While the normal drive of the rear lens group driving motor 30 is being performed, the AF sequence will be 1. When the count at the AF pulse counter becomes less than 200, the rear lens group driving motor 30 is driven under low-speed control. When the rear lens group driving motor 30 comes under low-speed control, the AF sequence is set to 2.

When the AF drive check process is called when the AF sequence is 2, that is, when the rear lens group driving motor 30 is under low-speed control, the processes from step S7621 are executed. In such processes, at step S7621 the CPU 210 monitors the rise of the AF pulse, and if a rise of the AF pulse is detected, at step S7623 the zoom pulse counter is decremented. If the rise of the AF pulse is not detected at step S7621, the process at step S7623 is skipped.

The AF pulse count is decremented by one at a time while the rear lens group L2 is being driven with the rear lens group driving motor 30 being under low-speed control Before the AF pulse count becomes 0, the processes at steps S7621 and S7623 are executed each time the AF drive check process is called. In such a case, the AF sequence will remain at 2. When the AF pulse count becomes 0, by driving the whole rear lens group driving motor 30 counterclockwise at step S7627, the braking processing (i.e., reverse brake) is executed. After starting the counterclockwise driving of the rear lens group driving motor 30, at step S7628, the time of 5 ms, which is the counterclockwise driving period, is set at the timer, and the AF sequence is set to 3 at step S7629. In such a manner, when the AF sequence is 3, the rear lens group driving motor 30 is driven counterclockwise for braking.

When the AF sequence is 3, if the AF driving check processing is called, at step S7631 the CPU 210 judges whether the period of 5 ms has elapsed, and if 5 ms has not elapsed control is returned with the AF sequence remaining at 3. After 5 ms has elapsed, then at step S7633, step S7635 and step S7637, the braking is.activated by short-circuiting the terminals of the rear lens group driving motor 30, and the 20 ms timer is started, and the AF sequence is set to 4, and control is returned.

If the AF drive check process is called when the AF sequence is 4, at step S7641 the CPU 210 monitors whether the AF pulse changes. That is, whether the rear lens group driving motor 30 is rotating under the condition where the brake is acting, is judged according to whether the AF pulse changes within 20 ms.

If the CPU 210 judges, that there is no change in the AF pulse at step S7641, and that the 20 ms timer has expired at step S7645, at steps S7647 and S7649, the control of the rear lens group driving motor 30 is stopped, and the terminals of the motor are brought into the open condition (i.e., undriven condition), and the AF sequence is set to 5. If the change of the AF pulse is detected at step S7641, the 20 ms timer is restarted at step S7643, and it is monitored whether the next change in the AF pulse is detected within 20 ms after the previous change in the AF pulse. At step S7645, a return is performed with the brake acting on the rear lens group driving motor 30 and with the AF sequence remaining at 4 until it is judged that the 20 ms timer has expired.

If the AF drive check process is called when the AF sequence is 5, as shown in the flow chart, the control is returned without executing any processes in the AF drive check process.

As above described, in the AF drive check process, the lenses are firstly moved to the reference position at which the AFH signal becomes L (the AF sequence=0). The rear lens group is then moved by the normal DC drive while the count at the AF pulse counter is. 200 or more (the AF sequence=1), and then moved at low speed by PWM when the count at the AF pulse counter becomes less than 200 (the AF sequence=2). When the count at the AF pulse counter becomes 0, the rear lens group driving motor 30 is driven counterclockwise for 5 ms (the AF sequence=3), and thereafter, braking is performed by short-circuiting the terminals of the rear lens group driving motor 30 (the AF sequence=4). When the rear lens group driving motor 30 comes to a complete stop, its control is ended (the AF sequence=5), and thereafter, the rear lens group driving motor 30 is not controlled (undriven condition is entered), until a new value is set at the AF pulse counter and the AF sequence is set to 0.

A detailed description of the barrier apparatus and the rear lens group driving device in the present embodiment will now be described with reference to FIGS. 74–93.

Figure 87:
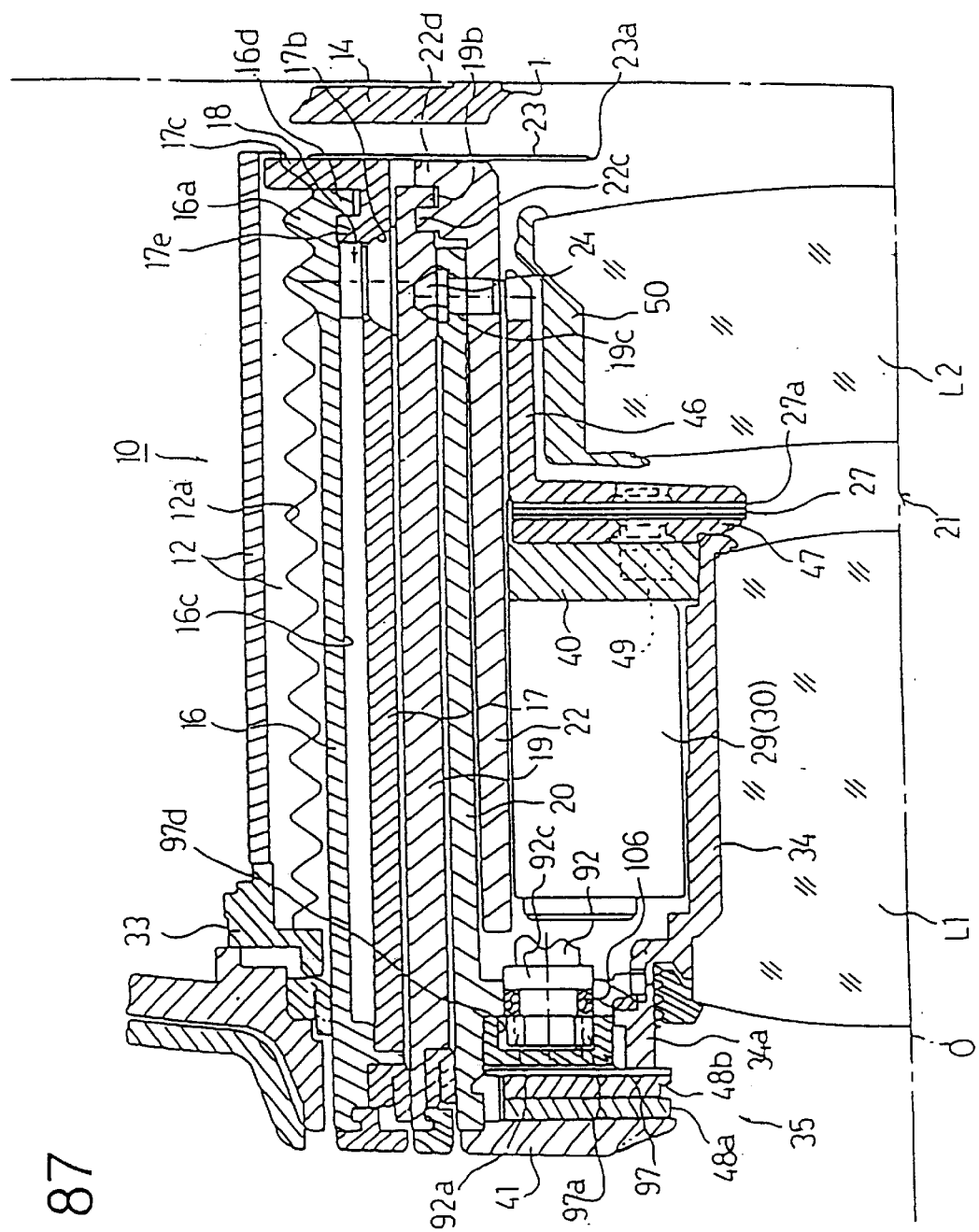
FIG. 87 is a sectional view of an upper part of the zoom lens barrel, illustrating the main parts of a lens barrier apparatus.
Figure 88:
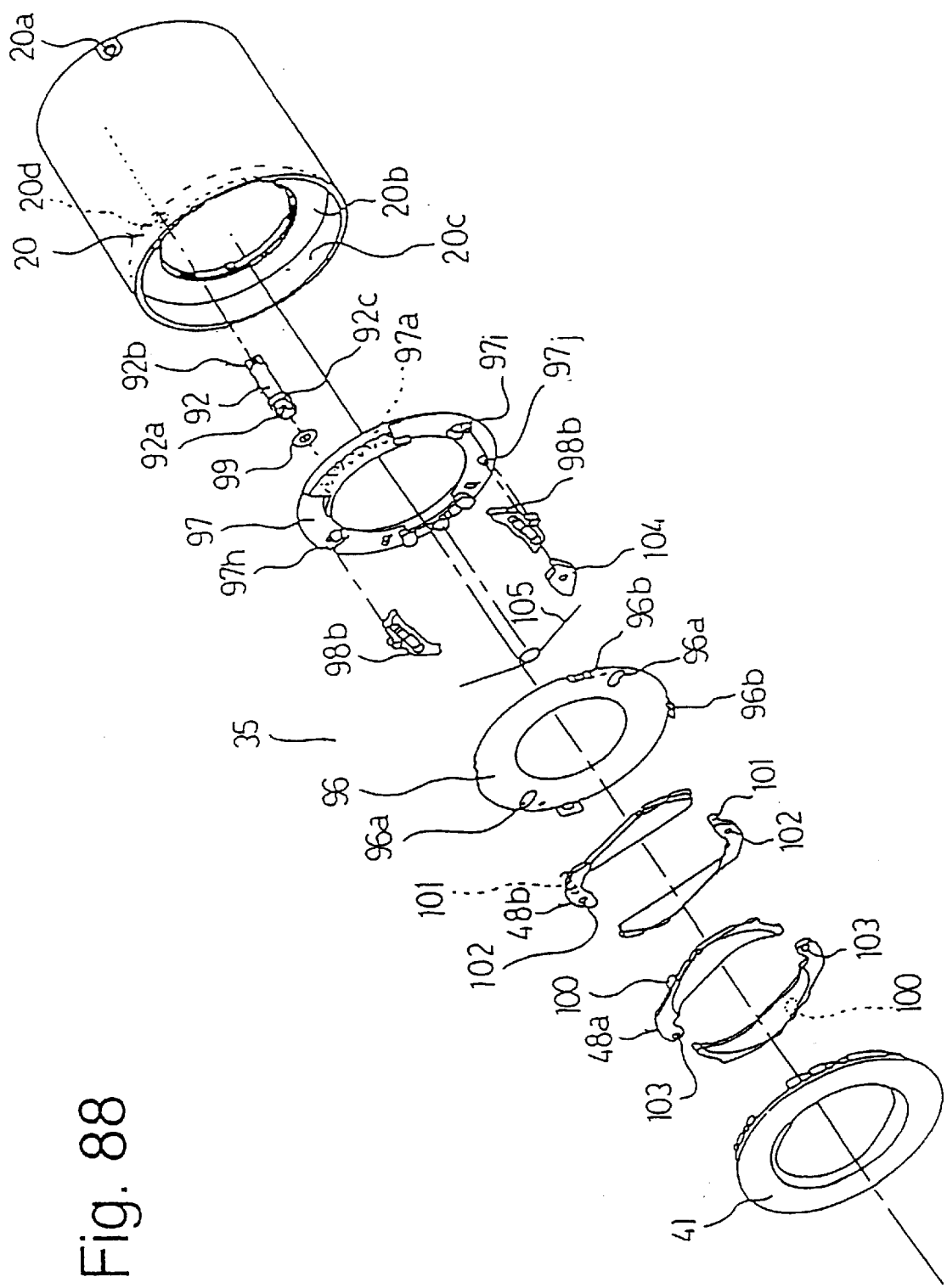
FIG. 88 is an exploded perspective view of the lens barrier apparatus of the zoom lens barrel.

As shown in FIGS. 87 and 88, the lens barrier apparatus 35, equipped with the pair of follower barrier blades 48a and the pair of main barrier blades 48b (four barrier blades in total), is mounted at the front of the first moving barrel 20 positioned at the front of the zoom lens barrel 10. The annular plate 96 is fixed on the periphery of the decorative plate 41 which is fixed to the front end of the first moving barrel 20. Both pairs of barrier blades 48a and 48b are pivotally attached between the decorative plate 41 and the annular plate 96. A barrier driving ring 97 provided with a pair of barrier driving levers 98a and 98b is rotatably mounted between a front end surface 20c of the first moving barrel 20, i.e., in the space surrounded by the first moving barrel 20 and an inner periphery flange 20b formed on the front part of the first moving barrel 20, and the annular plate 96. The barrier driving ring 97 is rotated clockwise and counterclockwise via a barrier coupling gear shaft 92 which rotates upon receiving a rotation from the rear lens group driving motor 30. The barrier coupling gear shaft 92 has a driving gear 92a at its front end, and a driven gear 92b at its rear end. The rotation of the rear lens group driving motor 30 is transmitted to the driven gear 92b via a certain gear train. The barrier driving ring 97 opens and closes the main barrier blades 48b together with the follower barrier blades 48a via the barrier driving levers 98a and 98b which are attached pivotally to the barrier driving ring.

The mechanism of the barrier driving device in the present embodiment will now be described with reference chiefly to FIGS. 87–93. Of the four barrier blades, only one main barrier blade 48b is shown by the chain double-dashed line in the drawings in FIGS. 89–92, for the purpose of illustration.

Figure 75:
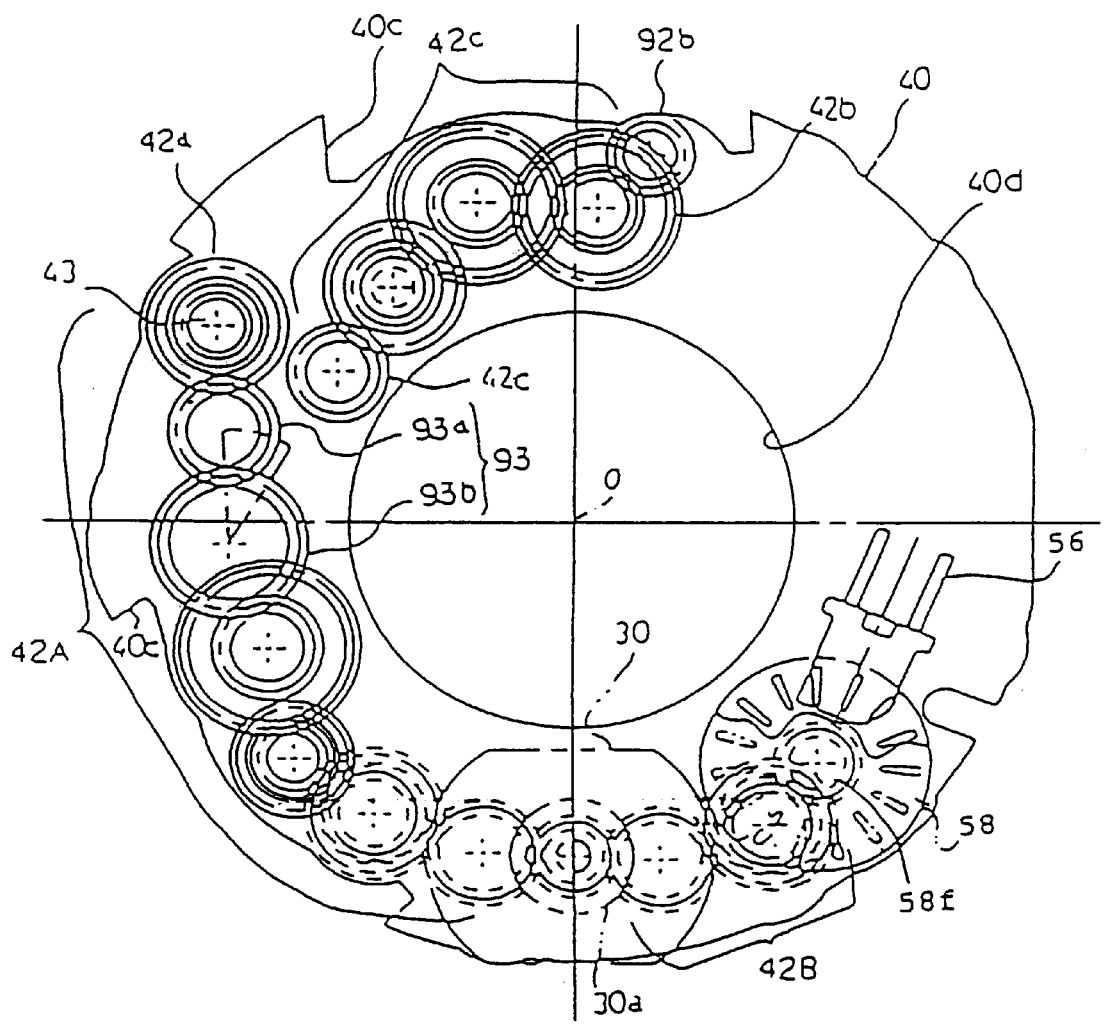
FIG. 75 is a front elevational view of the part shown in FIG. 74.
Figure 76:
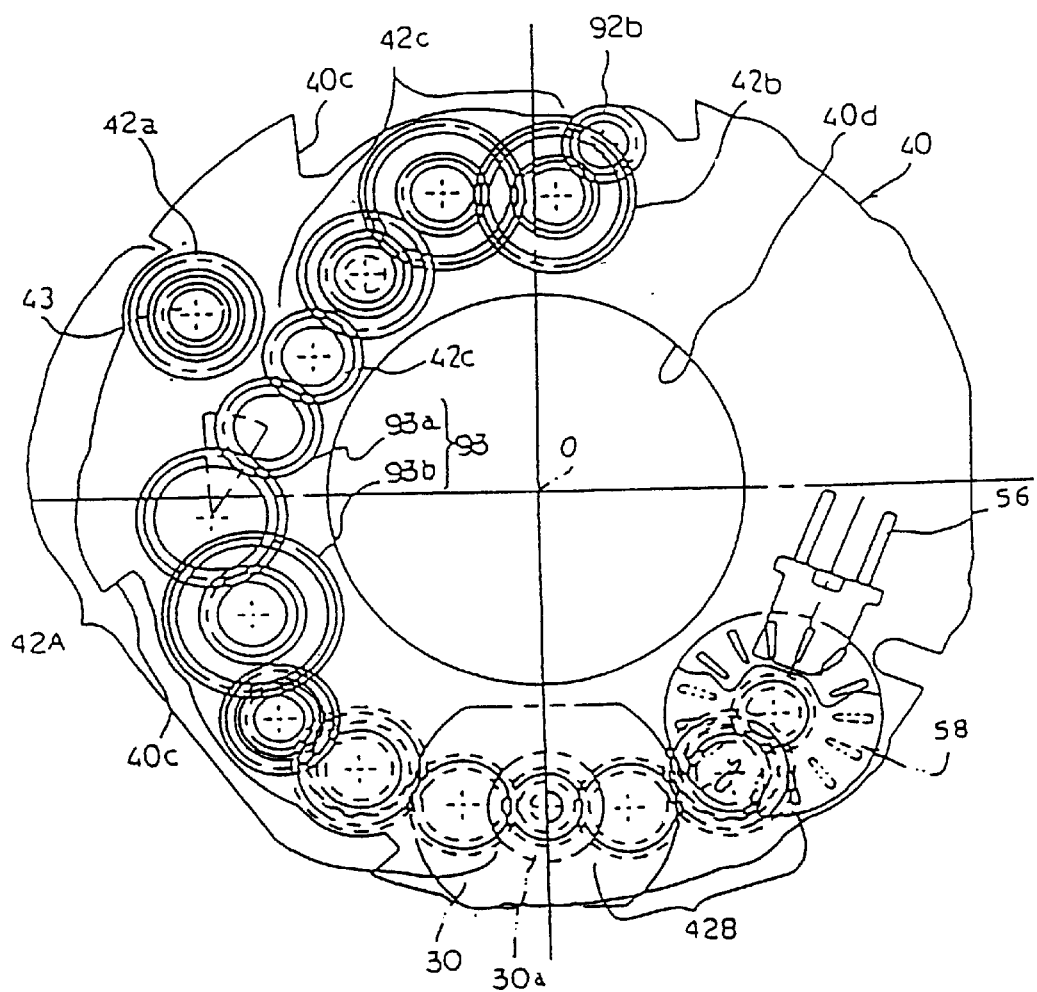
FIG. 76 is a front elevational view of the part shown in FIG. 74, in a different state from the state of FIG. 75.

As shown in FIG. 88, a supporting insertion hole 20d is formed on the inner periphery flange 20b of the first moving barrel 20, at a position opposite to a hollow 111 (see FIG. 8) formed on the presser 53 of the AF/AE shutter unit 21. The barrier coupling gear shaft 92 has a driving gear 92a extending by a predetermined amount from the supporting insertion hole 20d in the condition where the driven gear 92b is inserted through the hollow 111 to engage with a final gear 42b of the barrier opening gear train 42c (i.e., the second gear train), as shown in FIGS. 75 and 76. The driving gear 92a of the barrier coupling gear shaft 92 engages with a sector gear 97a formed on the rear surface of the barrier driving ring 97, as shown in FIG. 87. With the above structure, when the barrier coupling gear shaft 92 rotates clockwise or counterclockwise upon receiving the rotation of the rear lens group driving motor 30, the barrier driving ring 97 is respectively rotated clockwise or counterclockwise about the optical axis O.

Figure 89:
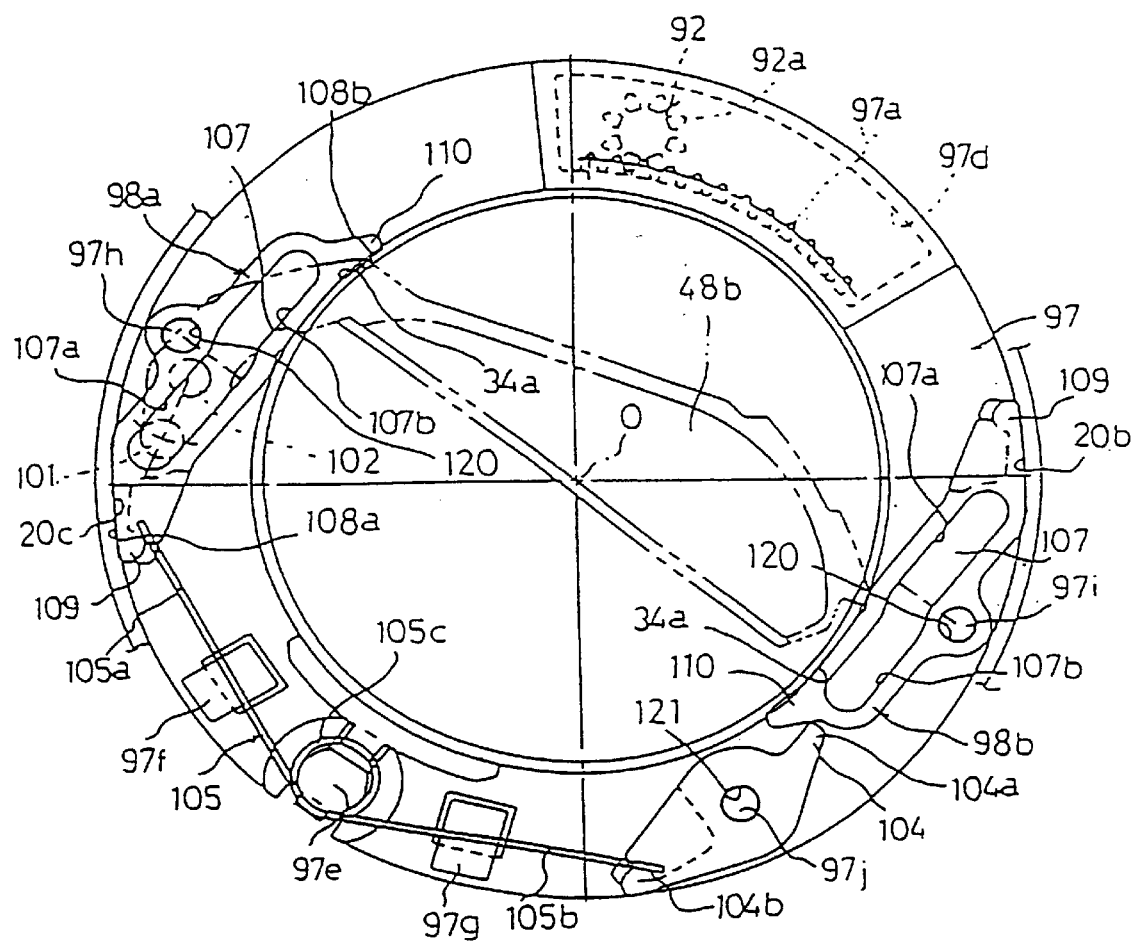
FIG. 89 is a front elevational view of the lens barrier apparatus of the present embodiment, illustrating forced opening sections while main barrier blades are driver to be opened from a closed state.

As shown in FIGS. 87–89, the barrier driving ring 97 is formed in such a manner that the diameter of the outer peripheral rim thereof is slightly smaller than that of the inner peripheral face of the barrel 20c, and that the diameter of the inner peripheral rim thereof is slightly larger than that of the outer periphery of a cylinder part 34a.

On the rear surface of the decorative plate 41, a pair of pivots (now shown) are fixed, with one pivot being positioned substantially opposite the other with respect to the optical axis O. These pivots are rotatably fitted to hollows 102, formed respectively on each of the pair of main barrier blades 48b, and to hollows 103, formed respectively on each of the pair of follower barrier blades 48a. Each main driven barrier blade 48b opens and closes the photographing aperture by rotating with the corresponding follower barrier blade 48a about the corresponding pivot. Each of the pair of main barrier blades 48b is provided with a boss 101 at a position eccentric with respect to its hollow 102. Each boss 101 is inserted through a corresponding opening 96a on the annular plate 96. Each of the pair of follower barrier blades 48a is provided with an engaging projection 100 projecting rearwards in the optical axis O direction, which engage with outer rims (edges) of the corresponding main barrier blade 48b, located on the inner side thereof, in order to follow the opening-closing operation of the main barrier blade 48b.

On the front wall of the barrier driving ring 97, shafts 97h and 97i are fixed with one shaft part being positioned substantially opposite the other one with respect to the optical axis O. Each of the barrier driving levers 98a and 98b is provided with a cam groove 107 (as shown in FIG. 89) into which the boss 101 of the corresponding main barrier blade 48b is fitted. On each barrier driving lever 98a and 98b, shaft grooves 120 are formed at intermediate positions along the length of the cam grooves 107. Also, each of the shafts 97h and 97i is rotatably fitted about the corresponding shaft groove 120. each of the shaft grooves 120 is disposed near the corresponding hollow 102. The barrier driving levers 98a and 98b are respectively provided with engaging parts 109 at one end and engaging parts 110 at the other end.

A coil 105c of a torsion spring 105 is engaged on the front wall of the barrier driving ring 97 at a protrusion 97e provided at a position to one side of the line connecting the pair of hollows 102 of the pair of main barrier blades 48b. The torsion spring 105 is engaged for the purpose of urging the pair of barrier driving levers 98a and 98b to rotate in a clockwise direction. As such, one end 105a thereof is connected with the engaging part 109 at one end of the barrier driving lever 98a. Further, between the torsion spring 105 and one of the barrier driving levers 98b, a reverse lever 104 is positioned to reverse the direction of the force of the torsion spring 105. On the front wall of the barrier driving ring 97, a shaft 97j is fixed between the barrier driving lever 98b and the protrusion 97e, and the reverse lever 104 is rotatably fitted on the shaft 97j. The reverse lever 104 has an engaging part 104b at one end, which is engaged with another end 105b of the torsion spring 105, and another engaging part 104a at the other end, which is engaged with the other end engaging part 110 of the barrier driving lever 98b.

Restricting protrusions 97f and 97g, extending radially outward at predetermined positions, are disposed at both sides of the protrusion 97e of the barrier driving ring 97 in order to restrict the deformation of the end parts 105a and 105b of the torsion spring 105.

The cam grooves 107, provided respectively at the barrier driving levers 98a and 98b, are respectively equipped with a first opening section 107a and a second opening section 107b. Although the first and second opening sections 107a and 107b are somewhat stepped at their middle boundary parts, they are generally arranged to be substantially straight.

During the barrier opening operation when the barrier driving ring 97 rotates from the position at which the barriers are fully closed (i.e., the position shown in FIG. 89) to the intermediate open position (i.e., the position shown in FIG. 90), the first opening section 107a serves as a forcible opening section and forcibly moves the pair of main barrier blades 48b to move in the opening direction. During the barrier closing operation when the barrier driving ring 97 rotates from the intermediate open position (i.e., the position shown in FIG. 90) to the position at which the barriers are fully closed (i.e., the position shown in FIG. 89), the first opening section 107a serves as a spring urging section for urging the pair of main barrier blades 48b in the closing direction by the torsion spring 105.

During the barrier closing operation when the barrier driving ring 97 rotates from the position at which the barriers are fully opened (i.e., the position shown in FIG. 91) to the intermediate open position (i.e., the position shown in FIG. 90), the second opening section 107b serves as a forcible opening section and forcibly moves the pair of main barrier blades 48b in the closing direction. During the barrier opening operation when the barrier driving ring 97 rotates from the intermediate open position (i.e., the position shown in FIG. 90) to the position at which the barriers are fully opened (i.e., the position shown in FIG. 91), the second opening section 107b serves as a spring urging section for urging the pair of main barrier blades 48b in the opening direction by the torsion spring 105.

The barrier driving ring 97 also has the above mentioned sector gear 97a, for rotatably driving the barrier driving ring 97 itself upon receiving the rotation of the barrier coupling gear shaft 92, at the other side of the line joining the pair of hollows 102 of the pair of main barrier blades 48b. The sector gear 97a is formed on an inner periphery of an arched groove 97d provided on the rear surface of the barrier driving ring 97.

The lens barrier apparatus 35, having the above structure, is operated as follows. When the barrier coupling gear shaft 92 rotates in one direction (i.e., the clockwise direction in FIG. 89) in the fully closed position, at which the zoom lens barrel 10 is at the lens housed position, and the various members are positioned as shown in FIG. 89, the barrier driving ring 97 is rotated counterclockwise via the sector gear 97a. During rotation of the barrier driving ring 97, the barrier driving levers 98a and 98b respectively move the pair of main barrier blades 48b as follows.

Figure 90:
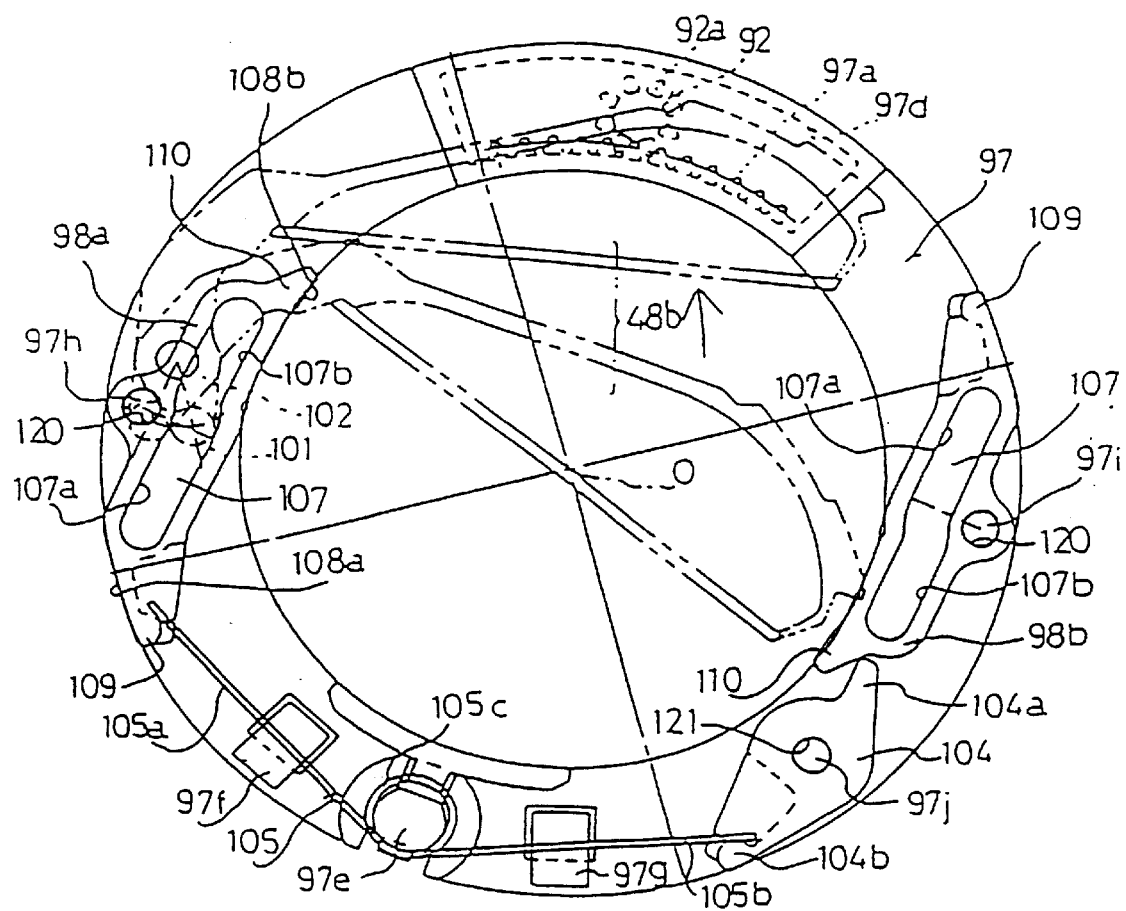
FIG. 90 is a front elevational view of the lens barrier apparatus, illustrating forced opening sections while main barrier blades are driven to be opened from a closed state.
Figure 91:
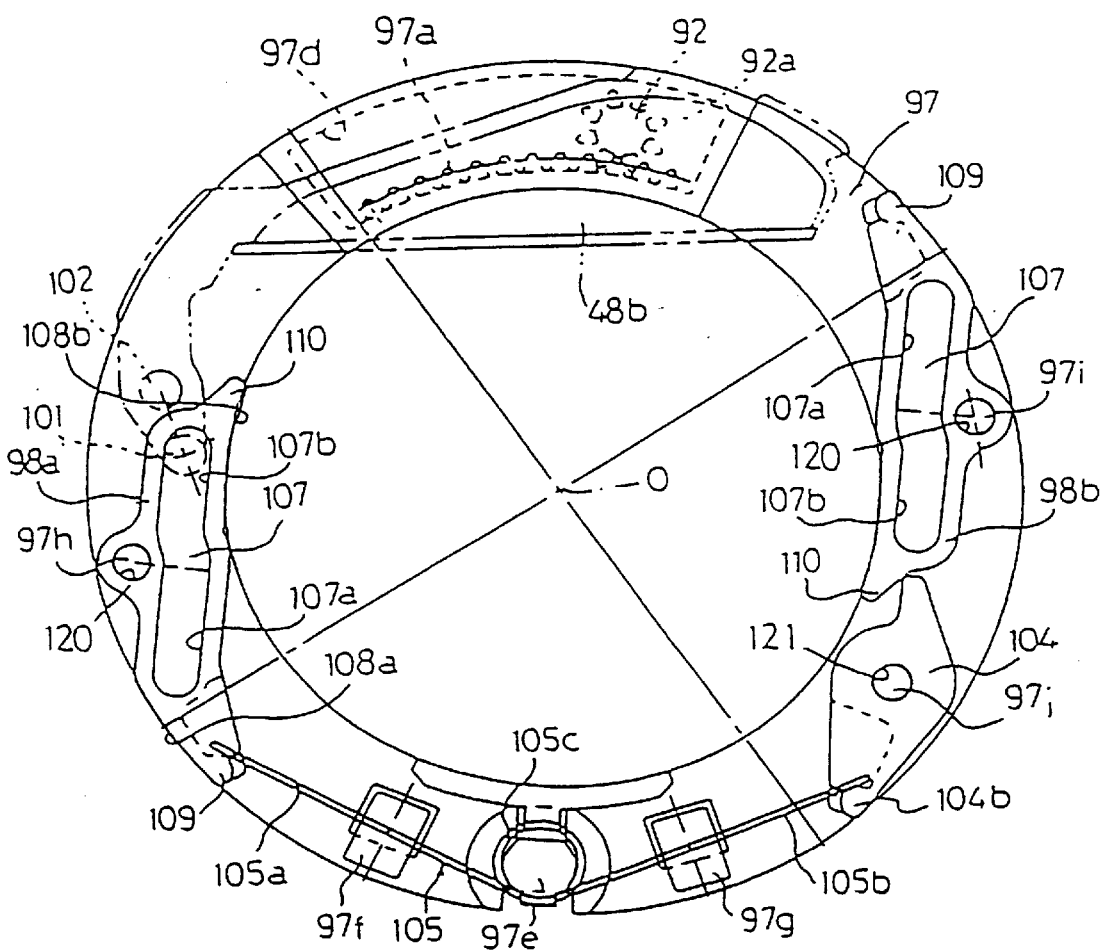
FIG. 91 is a front elevational view of the lens barrier apparatus, illustrating forced opening sections while main barrier blades are driven to be closed from an opened state.
Figure 92:
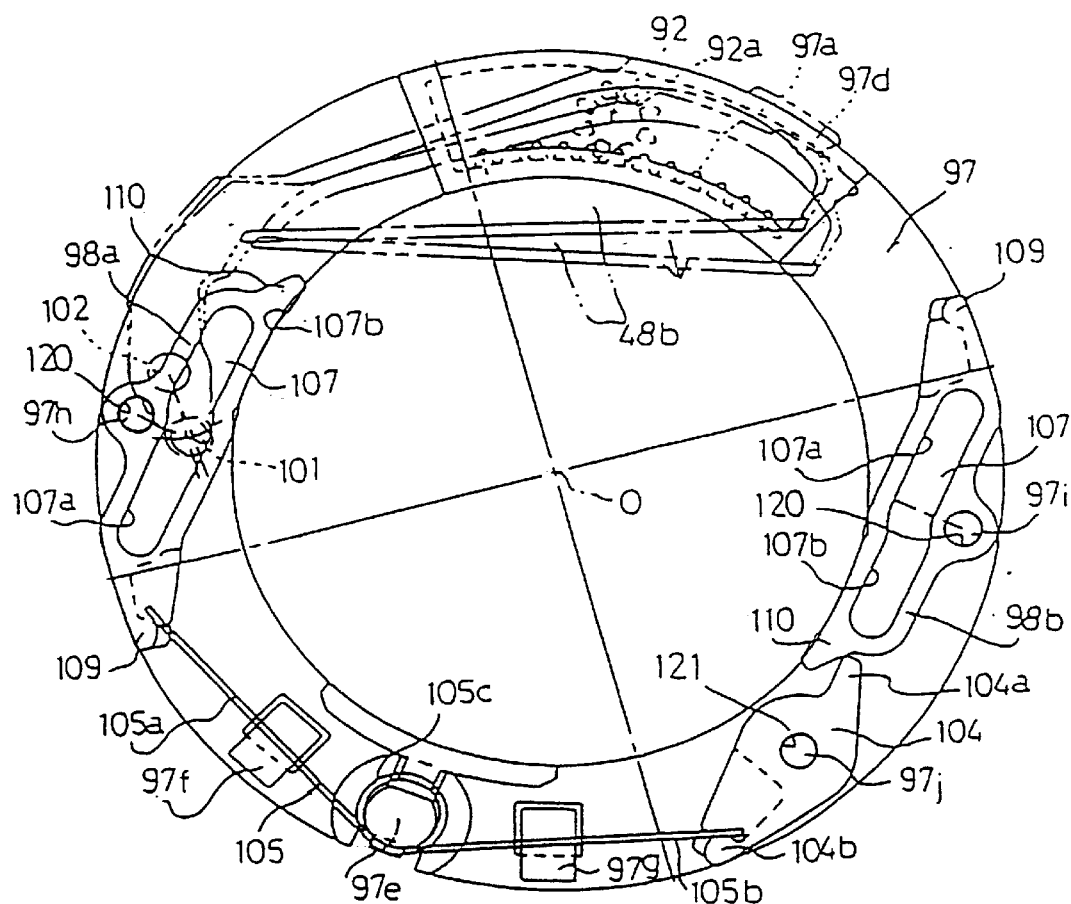
FIG. 92 is a front elevational view of the lens barrier apparatus, illustrating forced opening sections while main barrier blades are driven to be closed from an opened state.
Figure 93:
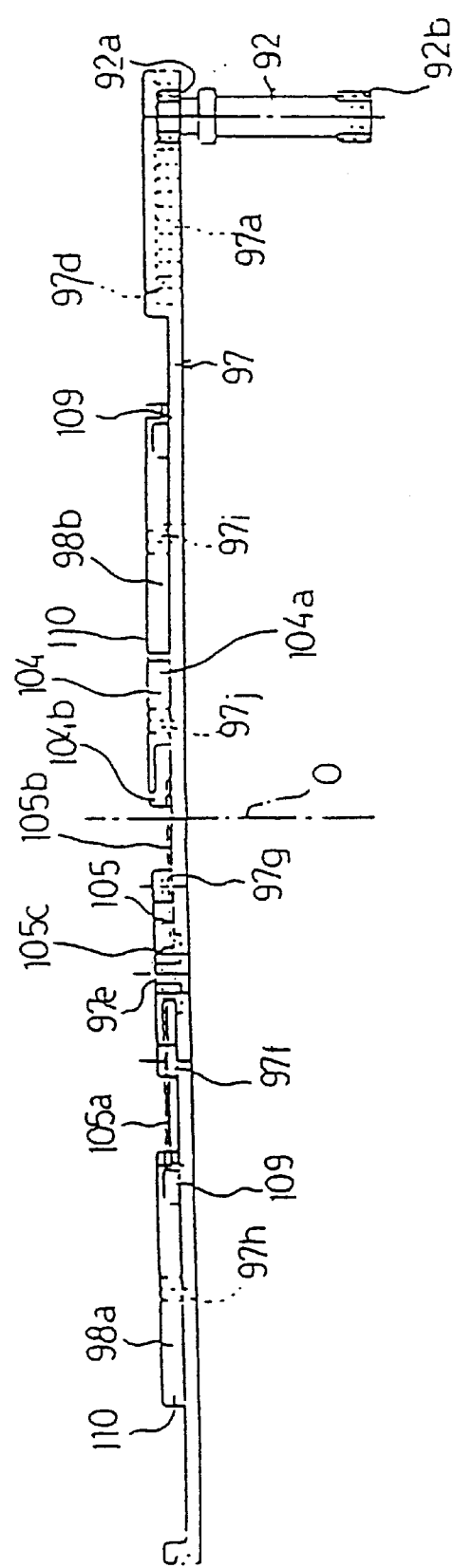
FIG. 93 is a plan view of the lens barrier apparatus provided at the front of the first moving barrel.

In the state as shown in FIG. 89, when the barrier driving ring 97 rotates counterclockwise from the barrier-closed position towards the intermediate open position, each of the barrier driving levers 98a and 98b firstly moves the corresponding boss 101 towards the optical axis O, via the first opening sections 107a of the cam grooves 107, i.e., from the state shown in FIG. 89 to the state shown in FIG. 90. When the barrier driving ring 97 is moved further in the same direction, each of the barrier driving levers 98a and 98b moves the corresponding boss 101 further toward the optical axis O, via the second opening sections 107b of the cam grooves 107, i.e., from the state shown in FIG. 90 to the state shown in FIG. 91. By this movement, both the pair of main barrier blades 48b and the pair of follower barrier blades 48a are brought to the opened condition. When the barrier coupling gear shaft 92 rotates in the opposite direction (i.e., counterclockwise shown in FIG. 91) from the state as shown in FIG. 91, the barrier driving ring 97 is rotated in the clockwise direction via the sector gear 97a, namely in the clockwise direction as shown in FIG. 91. Thereafter, the pair of main barrier blades 48b and the pair of follower barrier blades 48a are both brought to the closed condition through an operation that is the reverse of that of the above-described operation performed when the barrier driving ring 97 is rotated in the counterclockwise direction of FIG. 89.

The mechanism by which the rotation of the rear lens group driving motor 30 is transmitted to the lens barrier apparatus 35 via the barrier coupling gear shaft 92 will now be described in detail with reference to FIGS. 74–87.

Figure 79:
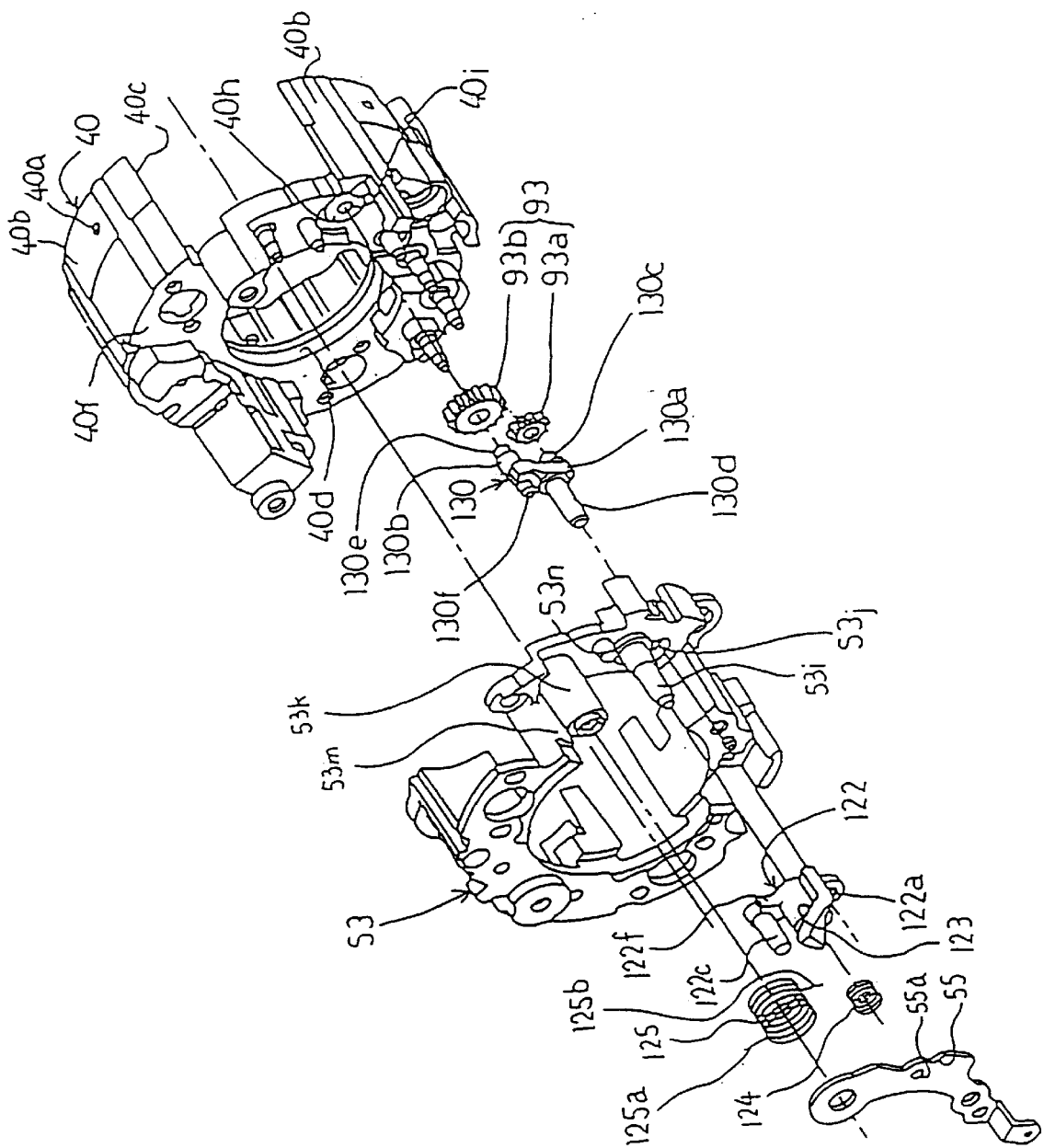
FIG. 79 is an enlarged exploded perspective view of a part of the zoom lens barrel.

As shown in FIG. 79, the shutter mounting plate 40 is provided with an annular part 40f which extends in the direction perpendicular to the optical axis O, and the rear lens group driving motor 30 is fixed to the front surface of the annular part 40f. Provided on the front wall and the rear wall of the annular part 40f are a lens driving gear train 42A which transmits the rotation of a pinion 30a fixed to the rotating shaft of the rear lens group driving motor 30, and an encoder gear train 42B which transmits the rotation of the pinion 30a. The encoder gear train 42B is the gear train used to transmit the rotation of the rear lens group driving motor 30 to a rotation shaft 58f (FIG. 75) of the rotating plate 58, and the rotation of the rear lens group driving motor 30 is always transmitted to the rotation shaft 59f via the encoder gear train 42B. Further, a barrier opening gear train 42C is provided on the annular part 40f, in order to transmit the rotation of the lens driving gear train 42A to the barrier coupling gear shaft 92, so that the lens barrier of the lens barrier apparatus 35, namely the pair of main barrier blades 48b and the pair of follower barrier blades 48a, may be opened or closed.

In the lens gear train 42A, a planetary gear 93 (FIG. 74) consisting of a planet gear 93a and a sun gear 92b is provided. When the zoom lens barrel 10 moves from the lens extended position to the lens housed position, the position of the planetary gear 93 is switched from the position shown in FIG. 75 to the position shown in FIG. 76, via a switching cam 122 (see FIGS. 80–82). The planet gear 93a is engaged with an input gear 42c of the barrier opening gear train 42C in the state shown in FIG. 76, and the planet gear 93a is engaged with the driving gear 42a with which the screw shaft 43 is engaged in the state shown in FIG. 75. The driving gear 42a is the final gear of the lens driving gear train 42A. When the rear lens group driving motor 30 drives forward (clockwise) and in reverse (counterclockwise) in the state shown in FIG. 75, the barrier driving ring 97 is driven clockwise and counterclockwise via the barrier coupling gear shaft 92, and the lens barrier of the lens barrier apparatus 35 is opened and closed. In addition, when the rear lens group driving motor 30 drives forward (clockwise) and in reverse (counterclockwise) in the state shown in FIG. 75, the driving gear 42a is driven clockwise and counterclockwise, and the rear lens group L2 is moved relative to the front lens group L1 via the screw shaft 43.

The planet gear 93a and the sun gear 93b of the planetary gear 93 are supported by a rotation switching member 130 as shown in enlarged form in FIGS. 79–82. The rotation switching member 130 is provided with a base 130a parallel to the annular part 40f. On the rear surface of the base 130a, a primary shaft 130b is fixed at one end, and a secondary shaft 130c is fixed at the other end. On the front surface of the base 130a, a shaft 130f coaxial with the primary shaft 130b is fixed at one end, and a driven shaft 130d approximately coaxial with the secondary shaft 130c is fixed at the other end. The primary shaft 130b, the secondary shaft 130c, the driven shaft 130d and the shaft 130f are all parallel to the optical axis O.

The sun gear 93b is rotatably fitted to the primary shaft 130b, and the planet gear 93a is rotatably fitted to the secondary shaft 130c. The sun gear 93b is fitted into a depressed bearing surface 40h formed on the front face of the annular part 40f, and in this condition, a front end part 130e of the primary shaft 130b is inserted in and rotatably supported by a hole 40i formed in the center of the depressed bearing surface 40h. The shaft 130f is rotatably fitted into a guide hollow (not shown) formed at a position corresponding to the presser 53. It can be understood that with the above structure, when the rotation switching member 130 rotates about the primary shaft 130b, the planet gear 93a switches between the position shown in FIG. 75 and the position shown in FIG. 76.

The driven shaft 130d of the rotation switching member 130 passes through and protrudes towards the front from a guide slot 53j, formed on the presser 53, and is inserted into a hollow 122a of the switching cam 122, supported rotatably by the presser 53.

The switching cam 122 is provided with a shaft insertion hole 122b at the center thereof, and the presser 53 is provided with a shaft 53i which is rotatably fitted into the shaft insertion hole 122b. The shaft 53i is longer than the shaft insertion hole 122b by a predetermined amount and a front end thereof is fitted into the hole 55a of the presser plate 55, fixed to the front of the presser 53. Around the shaft insertion hole 122b, the switching cam 122 is provided with a hole 122a, an engaging pin 122c which extends forward in the optical axis direction, and an engaging cam 122d. On the inner periphery of the front end of the engaging cam 122d, a cam surface 123 is formed. The cam surface 123 is formed as a surface that gradually inclines toward the rear lens group driving motor 30 from a rear end 123a to a front end 123b thereof. When the relative position between the AF/AE shutter unit 21 and the linear guide member 22 becomes a predetermined position, the cam surface 123 engages with the engaging part 22f at the front end of one of the guide legs 22b provided on the linear guide member 22. Therefore, the relative position, in the optical axis direction, between the cam surface 123 of the switching cam 122 and the engaging part 22f of the linear guide member 22, is strictly set.

Figure 77:
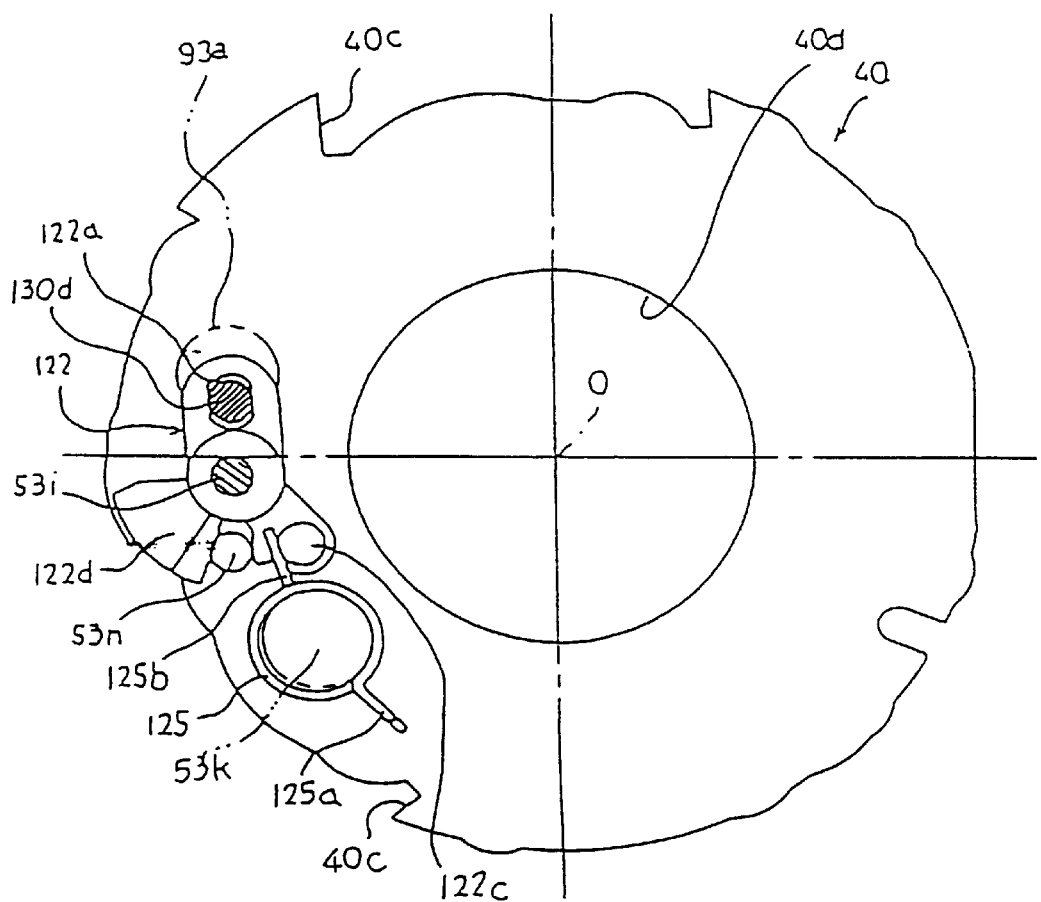
FIG. 77 is a plan view of positions of switching cams in a photographing state.
Figure 78:
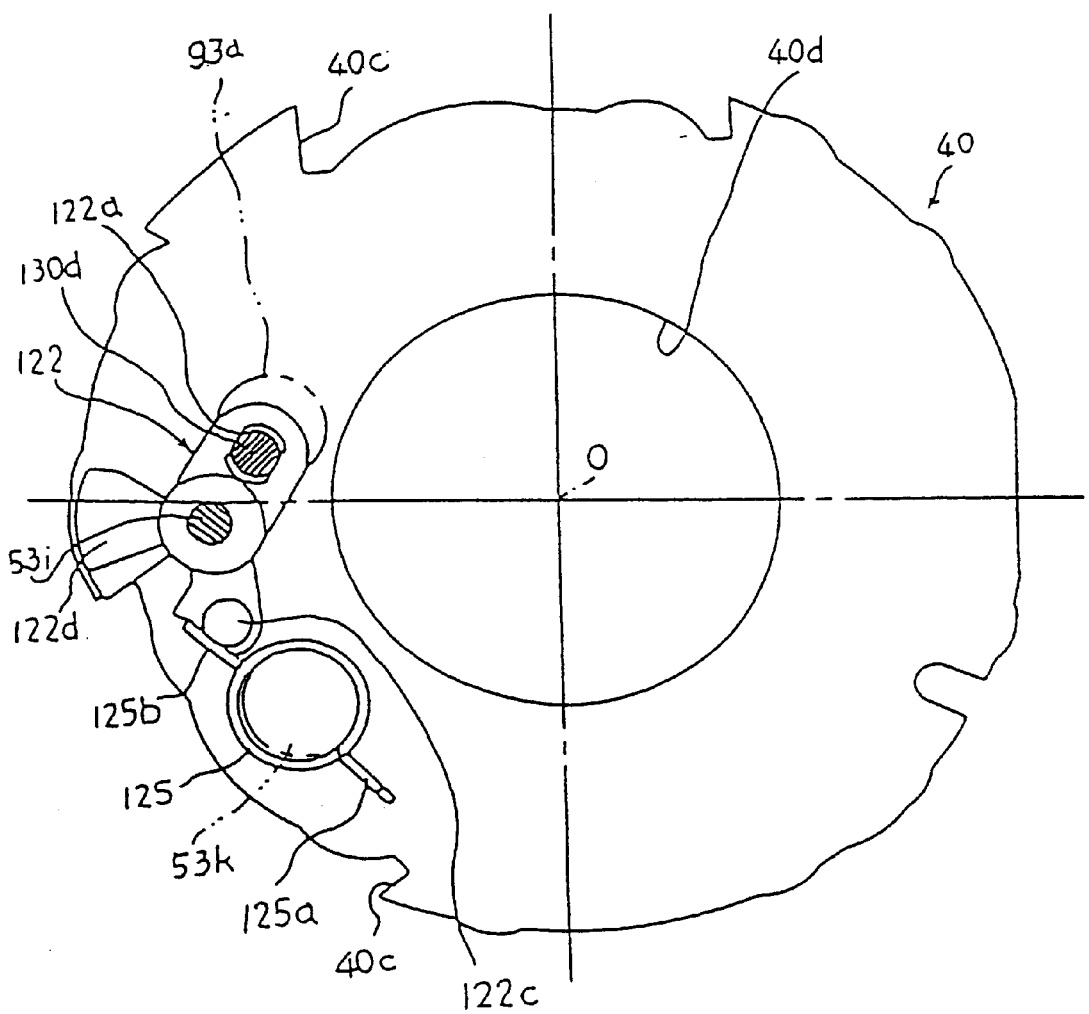
FIG. 78 is a plan view of positions of switching cams in a housed state.
Figure 80:
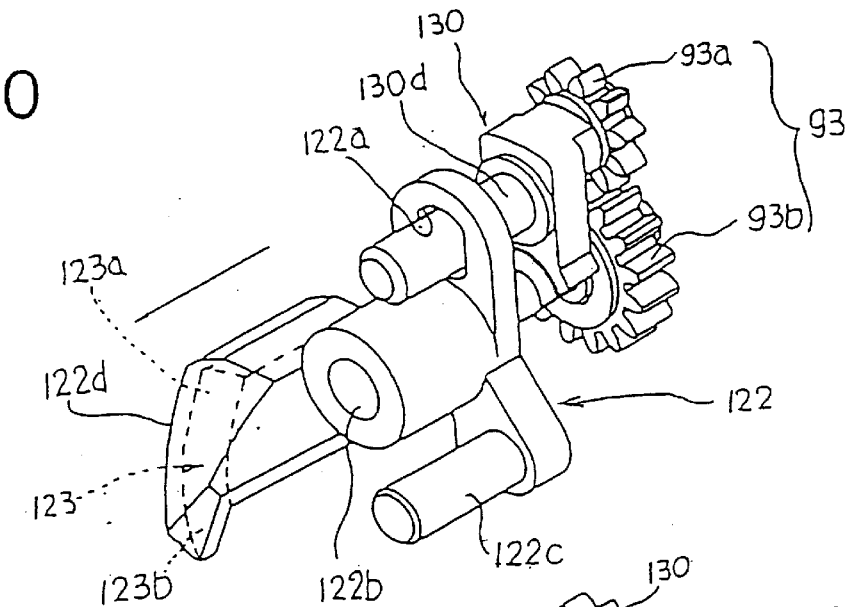
FIG. 80 is an enlarged perspective view of a switching cam, a rotation switching member and a planetary gear.

Between the shaft insertion hole 122b of the switching cam 122 and the presser 55, a coil spring 124, fitted to the shaft 53i, is provided. The switching cam 122 is constantly urged rearwards in the optical axis direction by the coil spring 124. Further, a torsion spring 125 is fitted to a fixing post 53k, fixed on the presser 53 and engages with a screw 127, to fix one end of the presser 55. One end 125a of the torsion spring 125 engages with a fixing part 53m of the presser 53, and another end 125b engages with the engaging pin 122c of the switching cam 122. The switching cam 122 is constantly urged by the torsion spring 125 in the counterclockwise direction with respect to the view of the AF/AE shutter unit 21 from the subject side. In addition, since the driven shaft 130d of the rotation switching member 130 is inserted through the guide slot 53j, the rotation switching member 130 is also urged in the same direction by the torsion spring 125. When the AF/AE shutter unit 21 and the linear guide member 22 are in a mutually separated condition, the switching cam 122 is fitted to the shaft 53i in such a state, as shown in FIG. 77, that an engaging part 122f formed close to the engaging pin 122c is contacted with an engaging projection 53n fixed to the presser 53. Thus, in this condition, the switching cam 122 does not rotate in the clockwise direction with respect to the view of the AF/AE shutter unit 21 from the subject side. At this time, the relative positional relationship between the switching cal 122 and the rotation switching member 130 will be as shown in FIG. 80. From such a state, if the engagement of the engaging projection 53n with the engaging part 122f is released by moving the switching cam 122 forwardly (i.e., in the direction indicated by an arrow in FIG. 80) against the urging force of the coil spring 124, it is possible to rotate clockwise.

Figure 81:
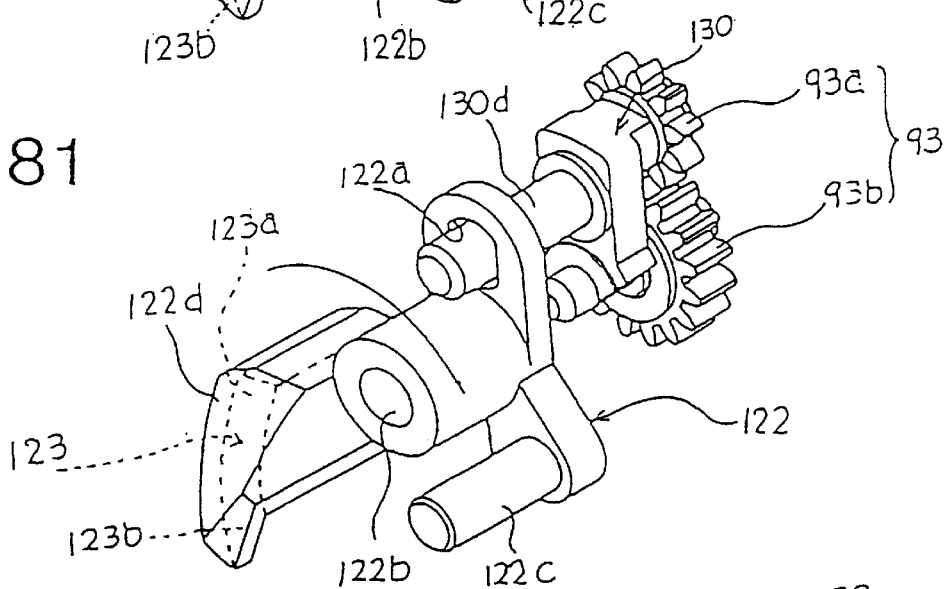
FIG. 81 is an enlarged perspective view of the switching cam, the rotation switching member and the planetary gear, in a different state from the state shown in FIG. 80.
Figure 82:
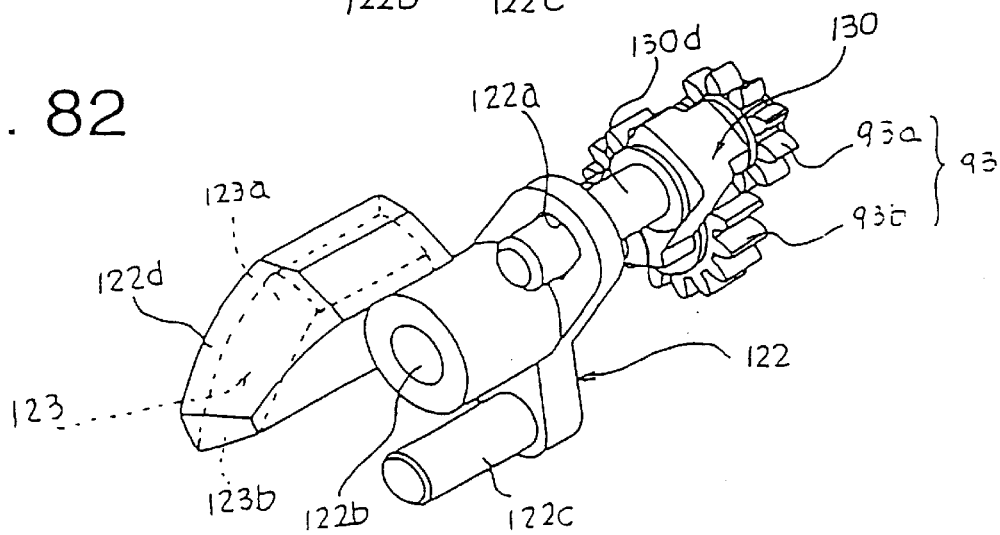
FIG. 82 is an enlarged perspective view of the switching cam, the rotation switching member and the planetary gear, in yet a different state from the states shown in FIGS. 80 and 81.
Figure 83:
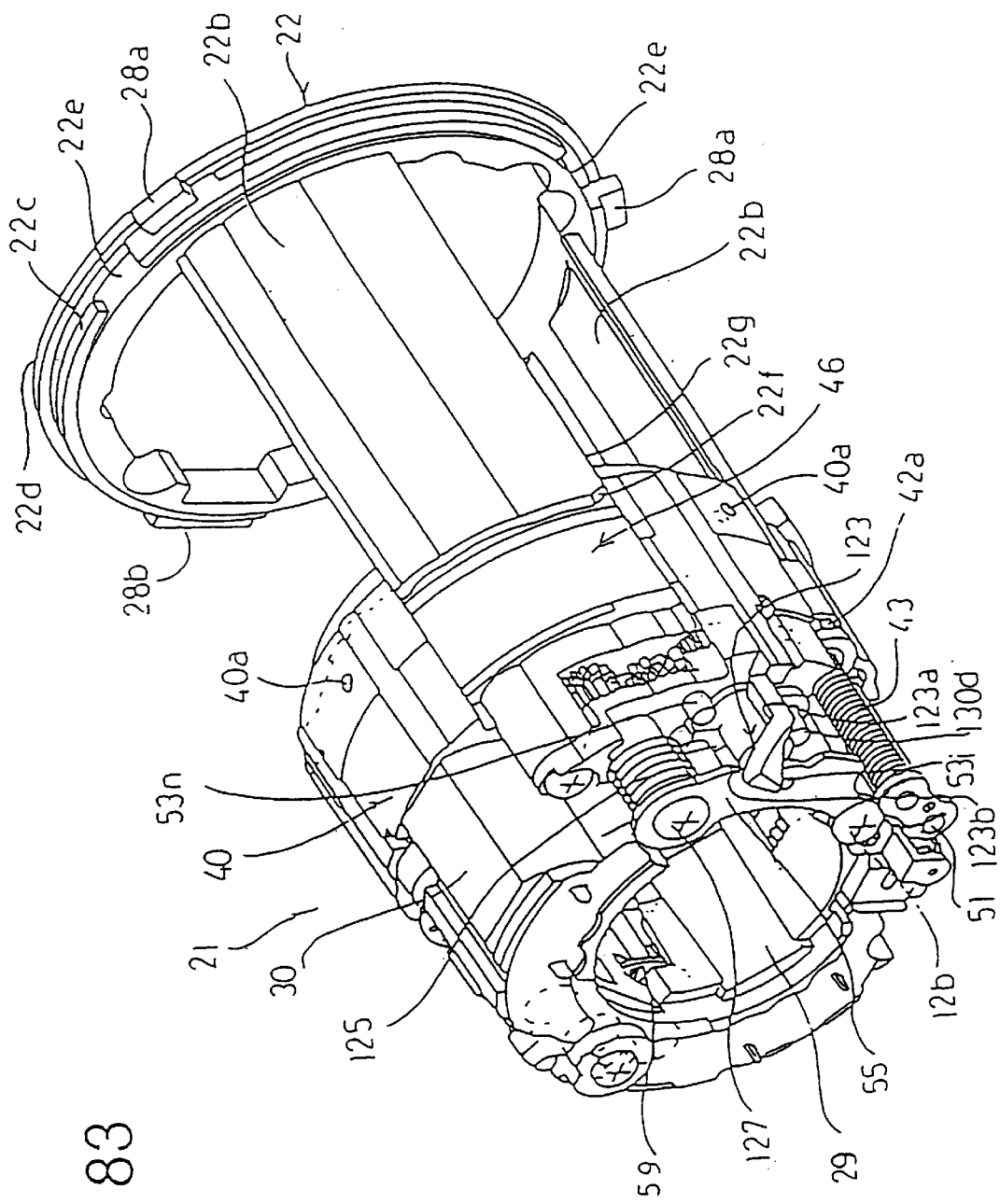
FIG. 83 is a schematic perspective view illustrating outlines of the AF/AE shutter unit and a linear guide member in a photographing state.
Figure 84:
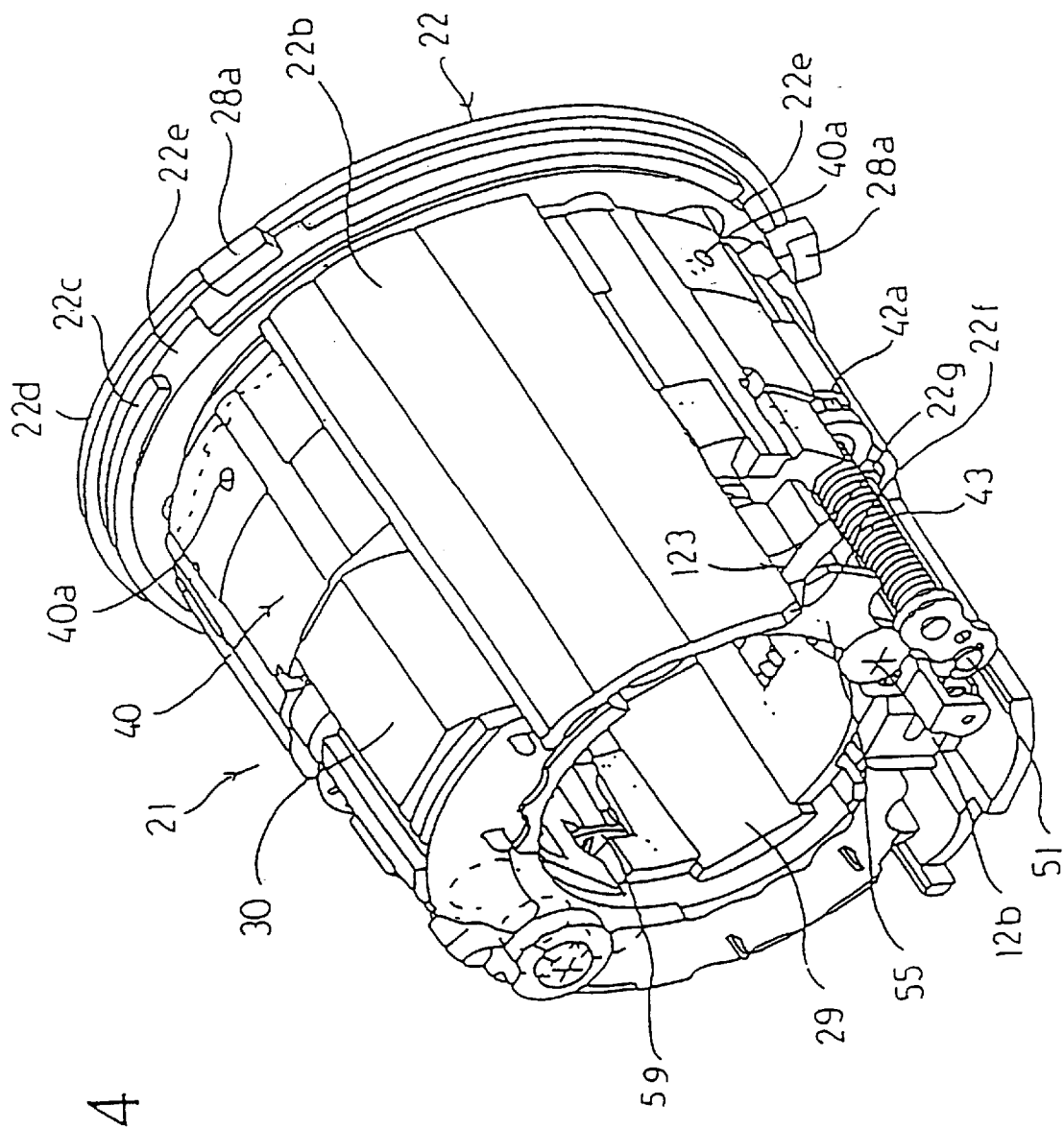
FIG. 84 is a schematic perspective view illustrating outlines of the AF/AE shutter unit and the linear guide member in a housed state.
Figure 85:
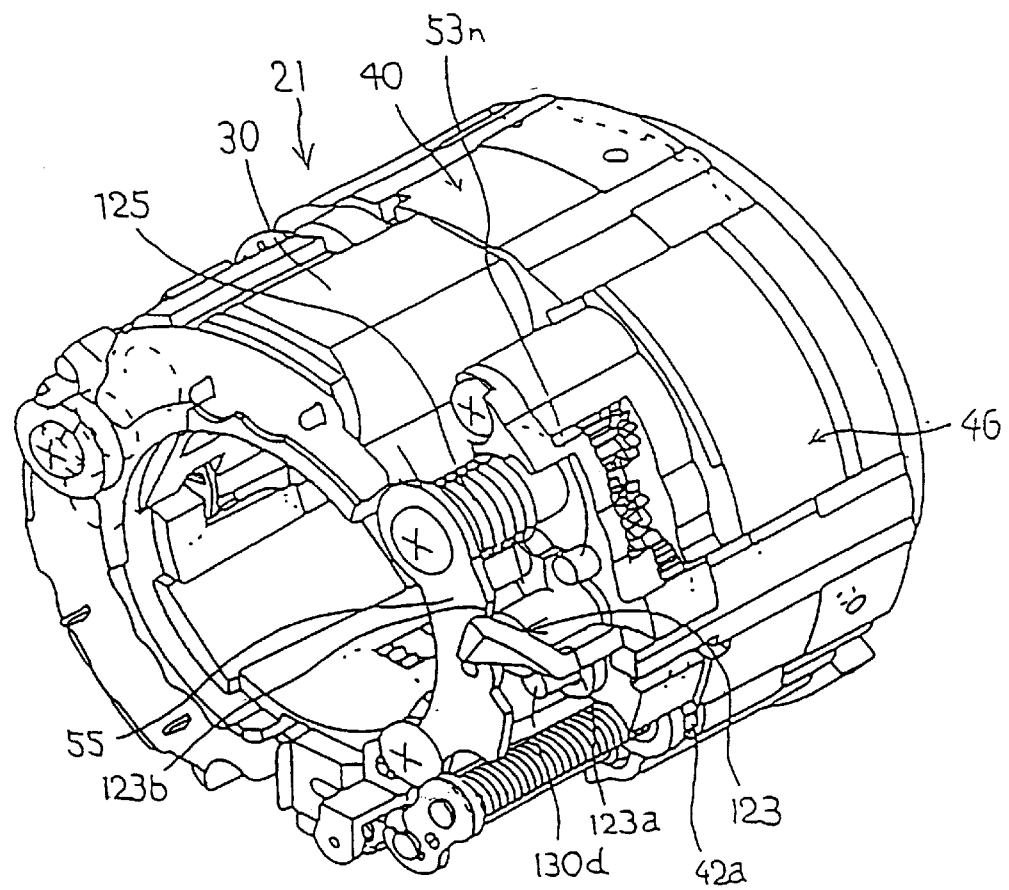
FIG. 85 is a schematic perspective view illustrating an outline of the AF/AE shutter unit shown in FIG. 83.
Figure 86:
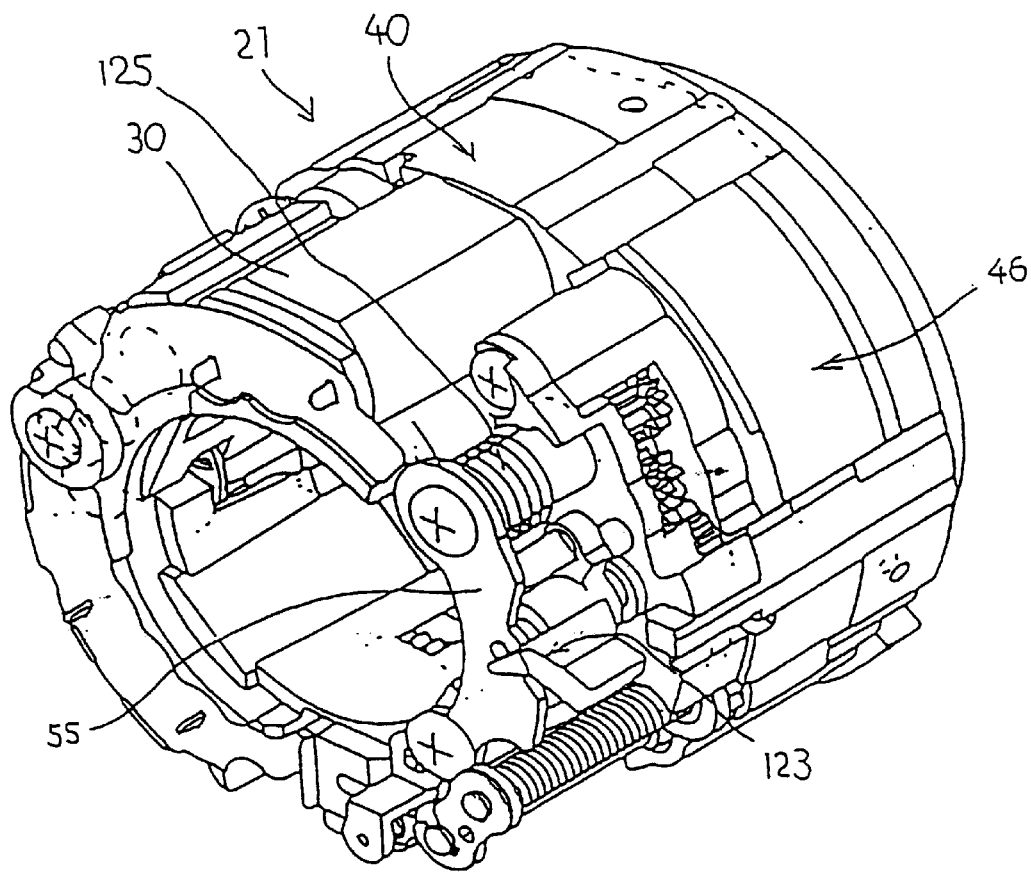
FIG. 86 is a schematic perspective view illustrating an outline of the AF/AE shutter unit shown in FIG. 84.

When the power supply of the camera is turned OFF, and the linear guide member 22 is in the condition shown in FIG. 83 (photographing condition), the transition to the condition shown in FIG. 84, namely to the housed condition, is carried out. In this process, the engaging part 22f of the linear guide member 22 contacts the front end 123b of the cam surface 123, and then when the linear guide member 22 and the AF/AE shutter unit 21 move closer, since the engaging part 22f presses the cam surface 123 forwardly in the optical axis direction, the switching cam 122 is moved forwardly, and the engagement of the engaging projection 53n and the engaging part 122f becomes disengaged. At this time, the switching cam 122 and the rotation switching member 130 will be in the relative positional relationship as shown in FIG. 81.

Thereafter, when the linear guide member 22 and the AF/AE shutter unit 21 move much closer, the switching cam 122 rotates in the clockwise direction (i.e., in the direction shown by the arrow in FIG. 81) with respect to the view of the AF/AE shutter unit 21 from the subject side, while sliding the cam surface 123 against the engaging part 22f of the linear guide member 22. During this rotation, the rotation switching member 130 is also rotated in the same direction via the hole 122a and the driven shaft 130d, and by such a rotation, the engagement of the planet gear 93a with the driving gear 42a is disengaged.

Thereafter, as shown in FIG. 84, when the linear guide member 22 and the AF/AE shutter unit 21 become closest to each other, the engaging cam 122d rides the rims 22g of the guide legs 22b adjacent the engaging part 22f. At this time, the switching cam 122 will be positioned at a position rotated furthest in the clockwise direction with respect to the view of the AF/AE shutter unit 21 from the subject side, and simultaneously, the rotation switching member 130 is also rotated in the same direction, and is positioned at a position rotated furthest in the clockwise direction with respect to the view of the AF/AE shutter unit 21 from the subject side. In this condition, the planet gear 93a engages with the input gear 42c of the barrier opening gear train 42C. When this engagement is set, the rear lens group driving motor controlling circuit 61 rotates the pinion 30a of the rear lens group driving motor 30 in a predetermined direction, and this rotation is transmitted to the lens barrier apparatus 35 via the lens driving gear train 42A, the barrier opening gear train 42C, and the barrier coupling gear shaft 92, and the lens barrier is eventually closed. From the housed state, when the power supply of the camera is turned ON, the rear lens group driving motor controlling circuit 61 firstly rotates the pinion 30a of the rear lens group driving motor 30 in the direction opposite the above-mentioned predetermined direction to open the lens barrier of the lens barrier apparatus 35, and then extend the zoom lens barrel. By this extension, the linear guide member 22 and the AF/AE shutter unit 21 separate away from each other, and therefore the engagement between the guide legs 22b of the linear guide member 22 and the switching cam 122 is disengaged, and the photographing condition shown in FIG. 83 is set. In such a photographing condition, the planet gear 93a is in a state of engagement with the driving gear 42a.

As above described, in the zoo lens barrel 10 in the present embodiment, since the rotation of the rear lens group driving motor 30 is transmitted to the lens barrier apparatus 35 via the specified gear trains, the lens barrier is surely opened and closed.

As it understood from the above description, the present embodiment is provided with at least a front lens group L1 and a rear lens group L2, as well as a whole unit driving motor 25 for moving the front lens group L1 and the rear lens group L2 as a whole, and a rear lens group driving motor 30 for moving the rear lens group L2 with respect to the front lens group L1. When the front lens group L1 and the rear lens group L2 are at a position that is retracted towards the camera body from a predetermined position, the front lens group L1 and the rear lens group L2 are moved forwardly by driving the whole unit driving motor 25, and then the rear lens group L2 is moved rearwardly by driving the rear lens group driving motor 30. Therefore, if any external force is applied to the lens retraction direction to the front lens group L1 and the rear lens group L2 when retracted to the predetermined position, the possibility that the rear lens group L2 collides with a film or an aperture frame 23 of the camera body is lessened, since the rear lens group L2 is moved rearwardly after extension of the front lens group L1 and the rear lens group L2.

Further in the present embodiment, a lens barrier apparatus 35 is provided which is driven to be opened and closed by the rear lens group driving motor 30. In addition, a switching mechanism is further provided, by which, when the front lens group L1 and the rear lens group L2 are at a housed position, the rear lens group driving motor 30 is connected with the lens barrier apparatus 35, and when the front lens group L1 and the rear lens group L2 are extended from a predetermined position by the whole unit driving motor 25, the rear lens group driving motor 30 is connected with the rear lens group L2. When the front lens group LI and the rear lens group L2 are at a predetermined position, after the front lens group L1 and the rear lens group L2 are extended from the predetermined position by the whole unit driving motor 25, and the rear lens group driving motor 30 is driven, therefore a switching of connection of the switching mechanism from the lens barrier apparatus 35 to the rear lens group L2 is surely performed.

The lens barrier apparatus 35 will now be explained in detail. As described above, the lens barrier apparatus 35 is driven by the rotation of the rear lens group driving motor 30. The rotation of the rear lens group driving motor 30, and thus the operation of the lens barrier apparatus 35, is monitored by the CPU 210 based on the output signal of the rear group driving motor encoder. However, for certain aspects of the operation of the lens barrier apparatus, for example, in which only the position of a part is to be sensed, the function of the rear group driving motor encoder could be performed by another type of sensing device such as a limit switch.

As is shown in FIG. 75, the rear group driving motor encoder is comprised of the photointerrupter 56 and the rotating slit plate 58. The rotating slit plate 58 is provided with a plurality of slits arranged at equiangular intervals on its surface. The rotating slit plate 58 is provided on an encoder shaft 58f which is mechanically linked to the rear lens group driving motor 30 through a gear train 42B. In particular, the rotating slit plate 58 is arranged to rotate by less than one full turn during any operations of the rear lens group driving motor 30. The rotating slit plate 58 is positioned with respect to the photointerrupter 56 such that the rotation of the rotating slit plate 58 causes the photointerrupter 56 to output a pulsed signal, the AF pulse signal, in which a pulse is generated as each slit on the rotating slit plate 58 rotates past the photointerrupter 56.

The AF pulse signal is sent to the AF pulse input circuit 222 and the CPU 210 uses the signal to increment or decrement the AF pulse counter accordingly. In this way, the amount of rotation of the rear lens group driving motor 30 is monitored by the CPU 210, both during movement of the rear lens group L2 and during operation of the lens barrier apparatus 35.

A description of how the rear group driving motor encoder is used for fault detection during the barrier opening process and the barrier closing process will now be described with reference to FIGS. 55 and 56.

As described above, in the barrier opening process shown in the flowchart in FIG. 56, the rear lens group driving motor 30 is driven (driven to rotate in reverse) to open the lens barrier apparatus 35 (S3603) and if, for some reason the lens barrier apparatus 35 does not open fully (i.e., the AF pulse counter is not <100 at step S3611), the rear lens group driving motor 30 is driven to close the lens barrier apparatus 35 (driven to rotate forward at step S3619), then again driven to open the lens barrier apparatus 35 (driven to rotate in reverse) a predetermined number of times, in this exemplary case, three times. If the lens barrier apparatus 35 has not opened (i.e., has not been driven by the required number of pulses) after the predetermined number of times, the error flag is set to 1 in step S3617.

Thus, in the lens extension process (FIG. 46), when the barrier opening process is called at step S1401, if the barrier opening process fails, the error flag is set to 1 and the lens extension process is not performed (Y at step S1403). In other words, if the lens barrier apparatus 35 does not open in the barrier opening process, the movement (extension) of the lens from the housed position to a photography enabling position will be disabled. That is, if the lens is at the housed position, the lens will be extended only when the lens barrier apparatus 35 is open.

In the barrier closing process shown in the flowchart in FIG. 55, the rear lens group driving motor 30 is driven (driven to rotate forward) to close the lens barrier apparatus 35 (S3503) and if, for some reason the lens barrier apparatus 35 does not close fully (i.e., the AF pulse counter is not <100 at step S3511), the rear lens group driving motor 30 is driven to open the lens barrier apparatus 35 (driven to rotate in reverse at S3519), then again driven to close the lens barrier apparatus 35 (driven to rotate forward) a predetermined number of times, for example, three times. If the lens barrier apparatus 35 does not close fully (i.e., has not been driven by the required number of pulses) after the predetermined number of times, the error flag is set to 1 at step S3517.

The barrier closing process (FIG. 55) is executed at step S1367 in the lens housing process of FIG. 44. In particular, the barrier closing process is only executed after the lens is housed and the housed code is detected (Y at step S1327 or step S1361). However, if the housed code is not detected at step S1327 or S1361 (i.e., if the lens does not reach the housed position) due to some fault in the lens housing process, the barrier closing process will not be executed since the lens housing process will time out at one of step S1315 or step S1337. Thus, the lens barrier apparatus 35 is closed only when it has been confirmed that the lens has reached the housed position.

As described above, in the barrier opening process, a signal is output in synchronization with the lens barrier opening operation and whether or not the lens barrier apparatus 35 has opened without fail is judged by detecting this output signal. Also, in the barrier closing process, whether the lens barrier apparatus 35 has closed without a failure is judged by detecting a signal that is output in synchronization with the lens barrier closing operation. Thus, even in the case where the barrier opening/closing process does not end normally, the necessary processes (re-execution of the opening/closing process, etc.) can be performed and control can be performed to disable subsequent processes.

Since the lens is not extended unless the lens barrier apparatus 35 opens and since the lens barrier apparatus 35 is not closed unless the lens is housed, it can be guaranteed that the lens barrier apparatus 35 will be open when the lens is at a position that enables photography (when the lens is not housed at the housing position) even when the opening/closing of the lens barrier apparatus 35 and the lens movement process for photography are controlled independently of each other.

A more detailed description of the mechanical operation of the lens barrier apparatus 35 will now be provided with reference to FIGS. 94–97.

When the power switch 212 is turned ON, both the whole unit driving motor 25 and the rear lens group driving motor 30 are driven by a small amount such that the barrier coupling gear shaft 92 is driven. This operation causes the barrier driving ring 97 to rotate in a counterclockwise direction (of FIG. 89) via the sector gear 97a. During the rotation of the barrier driving ring 97, the barrier driving levers 98a and 98b, respectively, move the two main barrier blades 48b in a two-phase opening process as described in the following.

From the condition shown in FIG. 89, the barrier driving ring 97 rotates in the counterclockwise direction to move the main barrier blades 48b from a fully closed position towards an intermediate open position (the first phase). At the start of this rotation, because the boss 101 is positioned in the first opening section 107a of the barrier driving lever 98a, the wall face of the first opening section 107a pushes down on the boss 101 and the boss 101 moves towards the optical axis. Accordingly, the barrier driving lever 98a receives a reaction force in the direction of the arrow A (see FIG. 96) from the boss 101 via the first opening section 107a. Although the reaction force in the direction of arrow A causes a clockwise rotation force (i.e., in the direction of arrow A in FIG. 96) on the barrier driving lever 98a, the barrier driving lever 98a will not rotate since the outer face of the engaging part 109 comes in contact with the inner peripheral face of the front end surface 20c of the first moving barrel 20 and the inner face of the engaging part 110 comes in contact with the outer peripheral face of the cylinder part 34a. The second barrier driving lever 98b operates similarly, due to the effect of the reverse lever 104, and will not rotate in the clockwise direction even when a reaction force from the corresponding boss protrusion 101 acts on the wall face of the first opening section 107a of the barrier driving lever 98b.

In this way, during the first phase of the opening process, the effect of the rotation of the barrier driving ring 97 is to "non-resiliently" drive the two main barrier blades 48b between the fully closed position and the intermediate open position. That is, the main barrier blades 48b will be driven according to the strength of the rear lens group driving motor 30 in order to overcome any external forces that may prevent the main barrier blades 48b from opening. For example, if the barrier blades are accidentally splashed with a sticky substance, such as juice or the like, the barrier blades will still open correctly.

As the barrier driving ring 97 rotates past the intermediate open position, the boss 101 moves past an inflection point E (see FIG. 96) and enters the second phase of the opening process. The boss 101 enters the second opening section 107b and the reaction force from the boss 101 is now directed in the direction of arrow C (see FIG. 96) and tends to rotate the barrier driving lever 98a in the counterclockwise direction. In this phase, although the counterclockwise rotation of the driving lever 98a is not physically restricted, the force in the direction of the arrow C is less than the urging force from the first end part 105a of the torsion spring 105, in the direction of an arrow D, on the engaging part 109. Therefore, the barrier driving lever 98a will not actually rotate and the boss 101 continues to move towards the optical axis due to the effects of the second opening section 107b, thereby causing the main barrier blades 48b to rotate to the position shown in FIG. 91.

Thus, during the second phase of the opening process, the effect of the rotation of the barrier driving ring 97 is to "resiliently" drive the two main barrier blades 48b between the intermediate open position and the fully open position. That is, the main barrier blades 48b will be resiliently driven according to the strength of the torsion spring 105 such that any external force applied to the blades will be resiliently absorbed by rotation of the barrier driving levers 98a and 98b against the spring force of the torsion spring 105 (this effect is shown for barrier driving lever 98a in FIG. 94) so that the barrier blades 48a and 48b will not break. Further, the barrier blades 48a and 48b will spring-back into position when the external force is removed. Similarly, when in the open position, the barrier blades 48a and 48b remain resiliently in position, such that if an external force is applied, the barrier blades will be protected from braking and will spring-back into position when the external force is removed. A particular example is given below with regard to the closing process.

The closing process also has two phases that are similar to those of the opening process. From the condition shown in FIG. 91, the barrier driving ring 97 begins to rotate clockwise towards the intermediate open position (the first phase). At the start of this rotation, because the boss 101 is positioned in the second opening section 107b of the barrier driving lever 98a, the wall face of the second opening section 107b pushes up on the boss 101 and the boss 101 moves away from the optical axis. Accordingly, the barrier driving lever 98a receives a reaction force in the direction of arrow A' (see FIG. 97) from the boss 101 via the second opening section 107b. Although the reaction force in the direction of arrow A' causes a clockwise rotation force (i.e., in the direction of an arrow a' in FIG. 97) on the barrier driving lever 98a, the barrier driving lever 98a will not rotate since its clockwise rotation is restricted by the contacting of the outer face of the engaging part 109 with the inner peripheral face of the front end surface 20c of the first moving barrel 20 and the contacting of the inner face of the engaging part 110 with the outer peripheral face of the cylinder part 34a. The second barrier driving lever 98b operates similarly, due to the effect of the reverse lever 104, and will not rotate in the clockwise direction even when a reaction force from the corresponding boss 101 acts on the wall face of the second opening section 107b of the barrier driving lever 98b.

Similar to the opening process, during the first phase of the closing process, the effect of the rotation of the barrier driving ring 97 is to "non-resiliently" drive the two main barrier blades 48b between the fully opened position and the intermediate open position. That is, the main barrier blades 48b will be driven according to the strength of the rear lens group driving motor 30 to overcome any external forces, as explained above for the opening process.

As the barrier driving ring 97 rotates past the intermediate open position to the fully closed position, the boss 101 moves past an inflection point E' (see FIG. 97) and enters the second phase of the closing process. The boss 101 enters the first opening section 107a and produces a force in the direction of arrow C' (see FIG. 97) that tends to rotate the barrier driving lever 98a in the counterclockwise direction. Again, although the counterclockwise rotation of the driving lever 98a is not physically restricted, the force in the direction of the arrow C' is counteracted by the urging force in the direction of arrow D', caused by the action of the first end part 105a of the torsion spring 105 on the engaging part 109. Therefore, the barrier driving lever 98a will not actually rotate and the boss 101 continues to move towards the optical axis due to the effects of the first opening section 107a, thereby causing the main barrier blades 48b to rotate to the position shown in FIG. 89.

Thus, during the second phase of the closing process, the effect of the rotation of the barrier driving ring 97 is to "resiliently" drive the two main barrier blades 48b between the intermediate open position and the fully closed position. That is, the main barrier blades 48b will be resiliently driven according to the strength of the torsion spring 105 such that any external force applied to the blades will be resiliently absorbed by rotation of the barrier driving levers 98a and 98b against the spring force of the torsion spring 105 (this effect is shown for barrier driving lever 98a in FIG. 95) so that the barrier blades 48a and 48b will not break. Further, the barrier blades 48a and 48b will spring-back into position when the external force is removed. Similarly, when in the closed position, the barrier blades 48a and 48b remain resiliently in position, such that if an external force is applied, the barrier blades will be protected from braking and will spring-back into position when the external force is removed. For example, if a child is handling the camera and inserts a finger between the barrier blades 48a and 48b during or after the closing process, the barrier blades 48a and 48b will be protected from breaking by the resilience of the torsion spring 105 and will be resiliently driven such that when the finger is removed, the barrier blades 48a and 48b will move to the correct closed position due to the force of the torsion spring 105.

With the lens barrier apparatus 35 as described above, each of the opening process and the closing process include two phases, during the first phase the barrier blades 48a and 48b are non-resiliently driven according to the strength of the rear lens group driving motor 30 to overcome external forces and during the second phase the barrier blades 48a and 48b are resiliently driven according to the strength of the torsion spring 105 to protect against breaking. Thus, by selecting the strength of the rear lens group driving motor 30 and the torsion spring accordingly, the operation of the lens barrier apparatus 35 is reliable and the lens barrier apparatus 35 is compact and easy to assemble.

Figure 94:
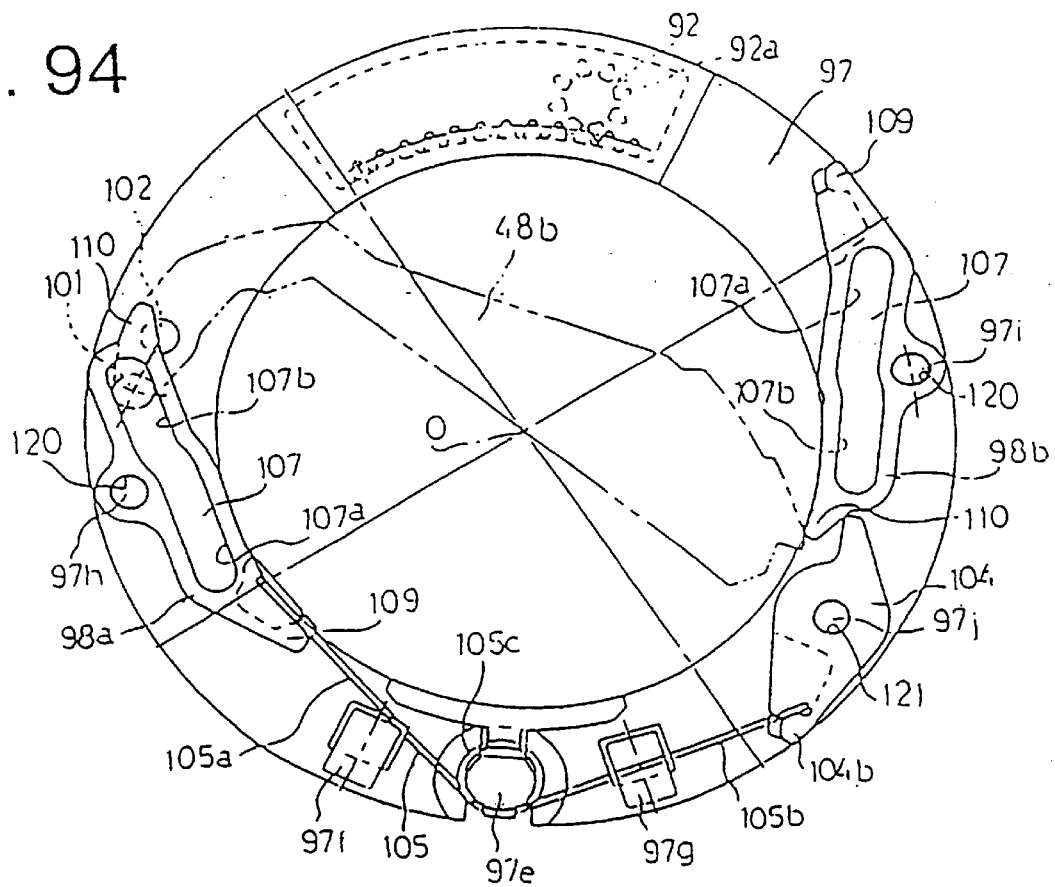
FIG. 94 is a front elevational view of the lens barrier apparatus of the present invention when the main barrier blades are driven by force to be closed from an open state.
Figure 95:
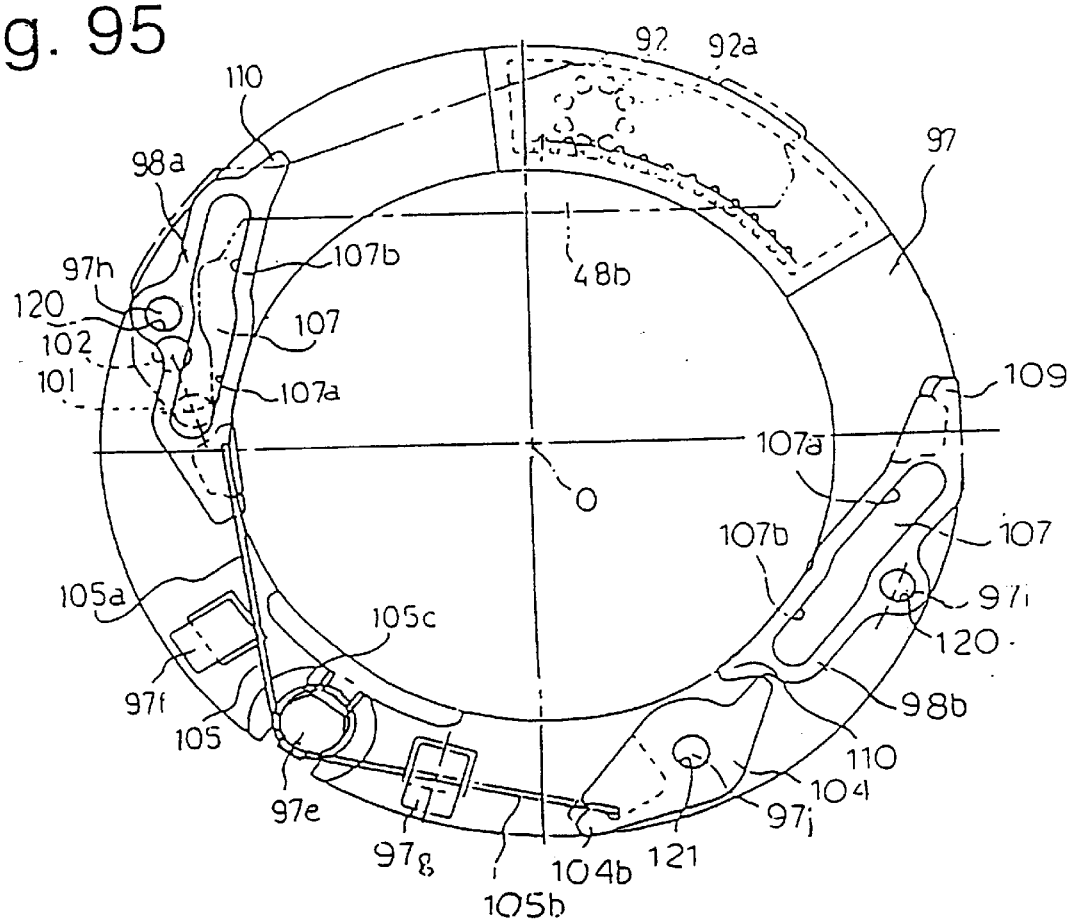
FIG. 95 is a front elevational view of the lens barrier apparatus of the present invention when the main barrier blades are driven by force to be opened from a closed state.
Figure 96:
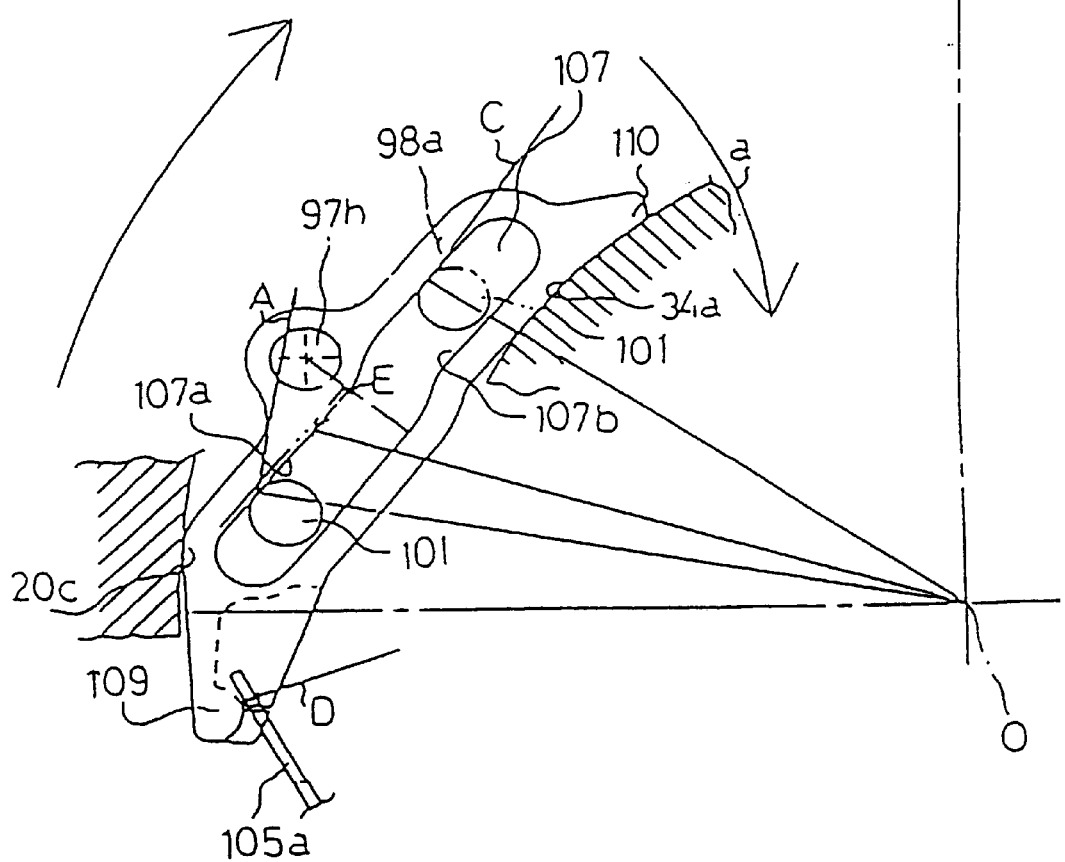
FIG. 96 is a front schematic view of the forces acting on a barrier driving lever for the process in which the main barrier blades are opened from the closed condition.

Further, due to the resilient driving during the second phase of the opening and closing operations, the main barrier blades 48b and other related components are also protected against breaking when the Main barrier blades 48b are set at a fully opened or fully closed position. If an external force in the radial direction is applied to close or open the blades, for example if a child is handling the camera, the external force is relieved by the resulting rotation of the barrier driving lever 98a against the spring force of the torsion spring 105 as shown in FIGS. 94 of 95. In other words, during the second phase and when the Main barrier blades 48b are fully open or closed, the main barrier blades 48b are spring-biased by the torsion spring 105 such that if an external force is applied, the main barrier blades 48b will resiliently absorb the external force rather than breaking and will spring-back to a correct position when the external force is removed.

Furthermore, with the present lens barrier apparatus 35, since the major components of the lens barrier apparatus 35 are disposed in one area of the barrier driving ring 97, for example, the single torsion spring 105 is positioned above or below a line joining the hollows 102 of the two main barrier blades 48b, it is possible to position the sector gear 97a for driving the rotation of the barrier driving ring 97 in the remaining space below or above the line joining the hollows 102.

Furthermore, since a reverse lever 104, which reverses the direction of the force of the torsion spring 105, is interposed between the torsion spring 105 and the barrier driving lever 98b, the barrier driving lever 98a can be urged by the spring directly and the other barrier driving lever 98b can be urged by the spring via the reverse lever 104. By this arrangement, it is possible to dispose the barrier driving levers 98a and 98b and the torsion spring 105 in a smaller area on the barrier driving ring 97 in order to provide space for the sector gear 97a. This positioning of the sector gear 97a ensures that the thickness of the barrier driving ring 97 can be minimized to make the zoom lens barrel 10 more compact.

The operations of the lens barrier apparatus 35 that are performed when the battery is set or changed will now be described. The initial setting or changing of the battery requires a particular control sequence in that, when the battery is removed, the CPU 210 in the camera does not retain an indication of the current condition (open or closed) of the lens barrier apparatus 35.

When the battery is set or changed, the CPU 210 performs the reset process at step S0001 of the main process (see FIG. 41). In the reset process (see FIG. 42), steps S1101 through S1113 are performed as previously described and then the condition of the lens barrier apparatus 35 is detected during the lens housing process (step S1115).

Usually, at the start of the lens housing process (see FIGS. 44 and 45), the lens barrel is extended to the tele side until the currently stored zoom code is detected (steps S1301–S1307). However, in this case, because the lens housing process is executed from within the reset process, the lens barrel has already been extended to a position at which a zoom code in the range 2–6 is detected. That is, at step S1111 in the reset process the AF lens initialization process (see FIG. 43) is called such that the lens barrel is extended to the tele side until a zoom code in the range 2–6 is detected. Thus, in the present case, the lens housing process quickly moves to step S1307 and then, in steps S1309–S1365 the lens barrel is driven to the housed position as previously described herein. When the lens barrel has been retracted to the housed position, the barrier closing process is executed at step S1367.

In the barrier closing process (see FIG. 55), as described above, the rear lens group driving motor 30 is driven (driven to rotate forward) to close the barrier (S3503) and if, for some reason the barrier does not close fully (i.e., the AF pulse counter is not <100 at step S3511), the rear lens group driving motor 30 is driven to open the barrier (driven to rotate in reverse) at S3519, then driven to close the barrier again (driven to rotate forward) a predetermined number of times, in this case, three times. If the barrier is not closed fully (i.e., has not been driven by the required number of pulses) after the predetermined number of times, the error flag is set to 1 at step S3517.

If the operation of the lens barrel and the barrier are performed normally and without fault, the camera operates in accordance with the control process described above as shown in the following examples.

If, when the battery is set, the lens barrel is at the housed position and the barrier is closed, the lens barrel is extended to the wide end (zoom code 2) while the barrier remains closed, the lens barrel is returned to the housed position, and then the barrier is opened and closed once. Thereafter, the lens barrel is placed in a standby condition at the housed position with the lens barrier closed until the power switch is operated.

On the other hand, if, when the battery is set, the lens barrel is stopped at a position between the wide end and the tele end and the barrier is open, the lens barrel is extended towards the tele side until one of the zoom codes between the wide end and the tele end is detected (for example, zoom codes 206), the lens barrel is returned to the housed position, and then the barrier is closed. Similarly, the lens barrel is then placed in a standby condition at the housed position with the lens barrier closed until the power switch is operated.

According to the above-described operation, the open/closed condition of the barrier can be ascertained after the battery is set or changed. Thus, the open/closed condition of the barrier can be determined without providing a specialized sensor for detecting the opening/closing of the barrier.

As described above, if the battery is removed from the camera and the information concerning the open/closed condition of the lens barrier is lost from memory, the open/closed condition is determined immediately upon setting a new battery by operating the lens barrier to open/close. Thus, even in the case in which only dynamic information concerning the opening/closing of the lens barrier is detected, the open/closed condition of the lens barrier can be controlled without providing a sensor or the like to detect static positional information of the lens barrier.

Although the structure and operation of a camera with the lens barrier apparatus 35 of the present invention is described herein with respect to the preferred embodiments, many modifications and changes can be made without departing from the spirit and scope of the invention.

The present disclosure relates to subject matter contained in Japanese Patent Application Nos. HEI 08-012317, filed on Jan. 26, 1996, HEI 08-032522, filed on Feb. 20, 1996, HEI 08-032523, filed on Feb. 20, 1996, HEI 08-034126, filed on Feb. 21, 1996, HEI 08-034822, filed on Feb. 22, 1996, HEI 08-058335, filed on Feb. 21, 1996, and HEI 08-058350, filed on Feb. 21, 1996, which are expressly incorporated herein by reference in their entireties.

What is claimed is:

1. A lens barrier apparatus comprising:

a lens barrier, movable between at least two states, said lens barrier being provided on a front face of a lens barrel and protects a camera lens;

a sensor that sense a state of said lens barrier;

a motor which drives said lens barrier; and a drive controller which operates such that, if during driving of said lens barrier in a first direction, an intended state of said lens barrier is not reached, said controller drives said motor in a second direction, opposite to said first direction, for a predetermined time period and then drives said motor in said first direction again.

* * * * *